US011621290B2

(12) United States Patent
Kawai et al.

(10) Patent No.: US 11,621,290 B2
(45) Date of Patent: Apr. 4, 2023

(54) IMAGING ELEMENT, LAMINATED IMAGING ELEMENT, AND SOLID-STATE IMAGING DEVICE

(71) Applicant: SONY SEMICONDUCTOR SOLUTIONS CORPORATION, Tokyo (JP)

(72) Inventors: Nobuhiro Kawai, Kanagawa (JP); Hideaki Togashi, Nagasaki (JP); Fumihiko Koga, Kanagawa (JP); Tetsuji Yamaguchi, Kanagawa (JP); Shintarou Hirata, Tokyo (JP); Taiichiro Watanabe, Kanagawa (JP); Yoshihiro Ando, Nagasaki (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 227 days.

(21) Appl. No.: 16/643,331

(22) PCT Filed: Jun. 8, 2018

(86) PCT No.: PCT/JP2018/022008
§ 371 (c)(1),
(2) Date: Feb. 28, 2020

(87) PCT Pub. No.: WO2019/044103
PCT Pub. Date: Mar. 7, 2019

(65) Prior Publication Data
US 2021/0082987 A1 Mar. 18, 2021

(30) Foreign Application Priority Data
Aug. 31, 2017 (JP) .............................. JP2017-167586

(51) Int. Cl.
*H01L 27/146* (2006.01)

(52) U.S. Cl.
CPC .. *H01L 27/14638* (2013.01); *H01L 27/14603* (2013.01); *H01L 27/14627* (2013.01); *H01L 27/1462* (2013.01)

(58) Field of Classification Search
CPC ......... H01L 27/14638; H01L 27/14603; H01L 27/14627; H01L 27/1462; H01L 27/14612;
(Continued)

(56) References Cited

U.S. PATENT DOCUMENTS

| 2011/0019042 A1* | 1/2011 | Yamaguchi | ....... H01L 27/14689 257/E31.127 |
| 2011/0156104 A1* | 6/2011 | Yamaguchi | ......... H01L 27/1464 257/222 |

(Continued)

FOREIGN PATENT DOCUMENTS

| JP | 2011-138927 A | 7/2011 |
| JP | 2012-238648 A | 12/2012 |

(Continued)

OTHER PUBLICATIONS

International Search Report issued in connection with PCT/JP2018/022008, dated Sep. 4, 2018 (2 pages).

*Primary Examiner* — Nilufa Rahim
(74) *Attorney, Agent, or Firm* — K&L Gates LLP

(57) ABSTRACT

A solid-state imaging element includes a pixel including a first imaging element, a second imaging element, a third imaging element, and an on-chip micro lens 90. The first imaging element includes a first electrode 11, a third electrode 12, and a second electrode 16. The pixel further includes a third electrode control line VOA connected to the third electrode 12 and a plurality of control lines 62B connected to various transistors included in the second and third imaging elements and different from the third electrode control line VOA. In the pixel, a distance between the center
(Continued)

of the on-chip micro lens 90 included in the pixel and any one of the plurality of control lines 62B included in the pixel is shorter than a distance between the center of the on-chip micro lens 90 included in the pixel and the third electrode control line VOA included in the pixel.

6 Claims, 100 Drawing Sheets

(58) Field of Classification Search
CPC . H01L 27/14647; H01L 27/30; H01L 27/146; H01L 27/14641; H01L 27/14665; H01L 27/307; H04N 5/374
See application file for complete search history.

(56) References Cited

U.S. PATENT DOCUMENTS

| | | | | |
|---|---|---|---|---|
| 2013/0001730 A1* | 1/2013 | Miyanami | ......... | H01L 27/14689 257/443 |
| 2013/0093932 A1* | 4/2013 | Choo | ..................... | H04N 5/378 257/E51.026 |
| 2016/0037098 A1* | 2/2016 | Lee | ....................... | H01L 27/307 257/292 |
| 2016/0191825 A1* | 6/2016 | Sato | .................. | H01L 27/14636 348/250 |
| 2016/0301882 A1* | 10/2016 | Yamashita | ........ | H01L 27/14687 |
| 2017/0187969 A1 | 6/2017 | Kitamori et al. | | |

FOREIGN PATENT DOCUMENTS

| | | |
|---|---|---|
| JP | 2013-012556 A | 1/2013 |
| JP | 2015-028960 A | 2/2015 |
| JP | 2016-127264 A | 7/2016 |
| JP | 2016-201449 A | 12/2016 |
| JP | 2017-143158 A | 8/2017 |
| JP | 2017-157816 A | 9/2017 |
| JP | 2018-060910 A | 4/2018 |
| WO | 2014/027588 A1 | 2/2014 |
| WO | 2014/112279 A1 | 7/2014 |
| WO | WO-2016190217 A1 | 12/2016 |
| WO | WO-2017026109 A1 | 2/2017 |
| WO | WO-2017061082 A1 | 4/2017 |

* cited by examiner

FIG. 20
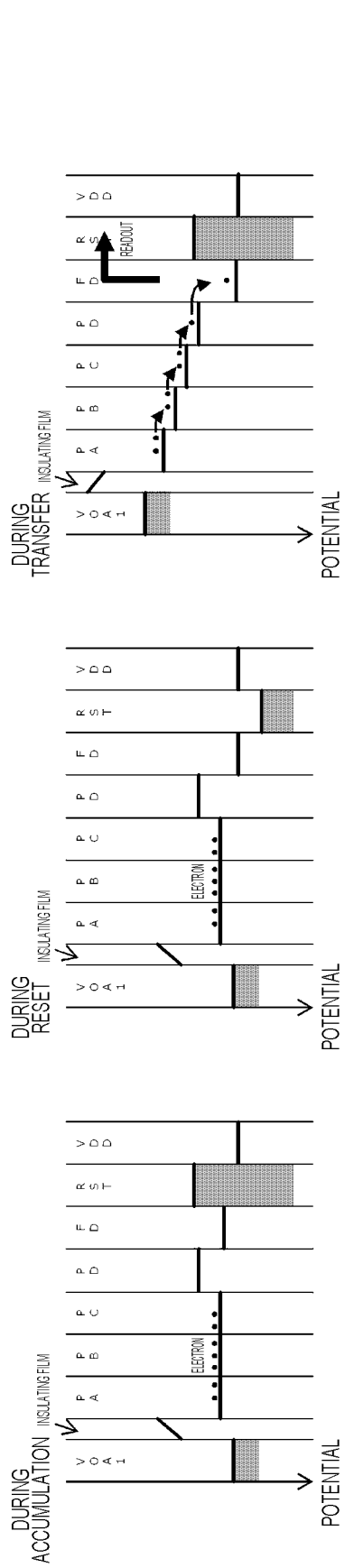
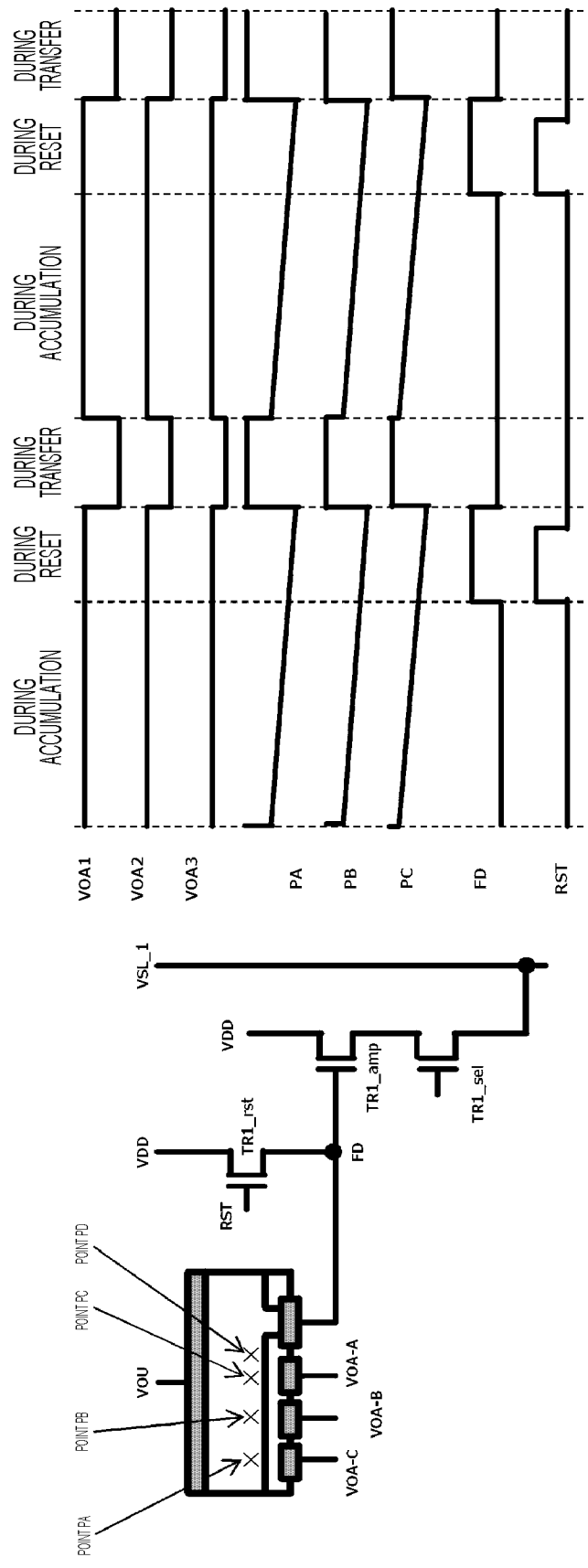

CHARGE ACCUMULATION ELECTRODE 12 SIDE

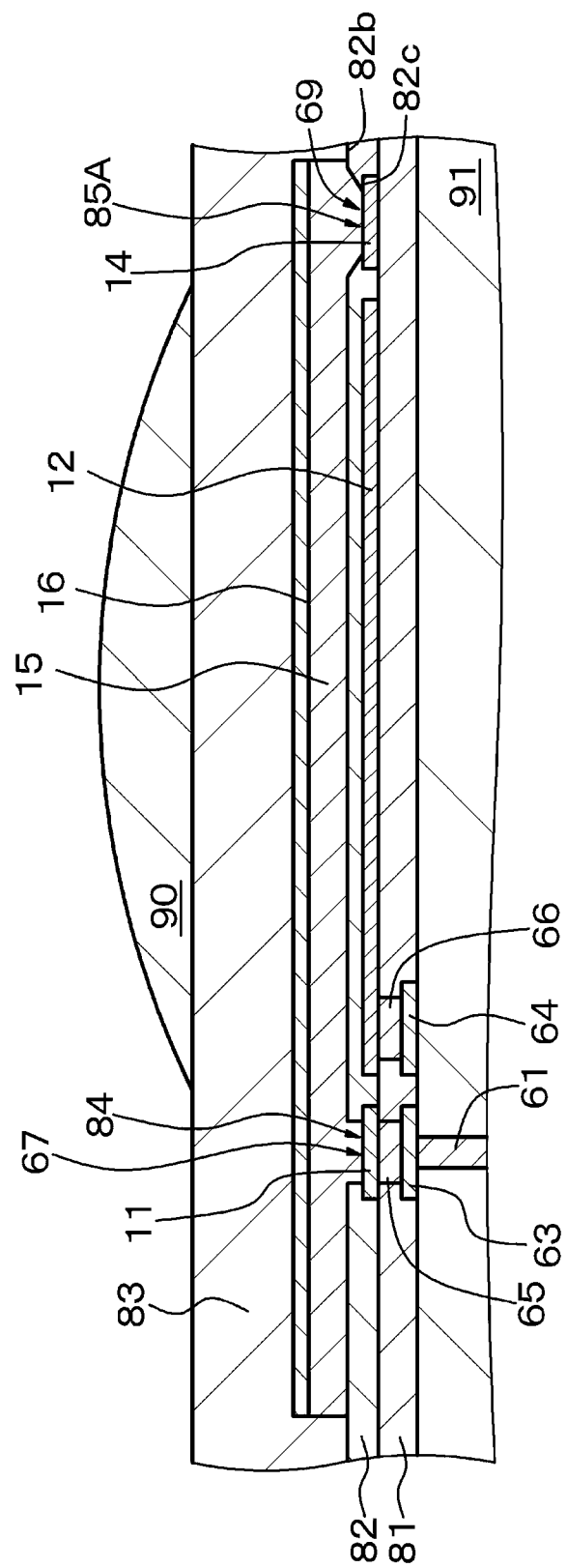

IMAGING ELEMENT, LAMINATED IMAGING ELEMENT, AND SOLID-STATE IMAGING DEVICE

TECHNICAL FIELD

The present disclosure relates to an imaging element, a laminated imaging element, and a solid-state imaging device.

BACKGROUND ART

An imaging element using an organic semiconductor material for a photoelectric conversion layer can photoelectrically convert a specific color (wavelength band). In addition, because of such a characteristic, in a case where the imaging element is used as an imaging element in a solid-state imaging device, it is possible to obtain a structure having sub-pixels laminated (laminated imaging element), not possible with a conventional solid-state imaging device in which each of sub-pixels is constituted by a combination of an on-chip color filter (OCCF) and an imaging element and the sub-pixels are arrayed two-dimensionally (see, for example, Japanese Patent Application Laid-Open No. 2011-138927). Furthermore, there is an advantage that a false color is not generated because demosaic processing is not required. Note that in the following description, an imaging element including a photoelectric conversion unit disposed on or above a semiconductor substrate may be referred to as "first type imaging element" for convenience, a photoelectric conversion unit constituting the first type imaging element may be referred to as "first type photoelectric conversion unit" for convenience, an imaging element disposed in the semiconductor substrate may be referred to as "second type imaging element" for convenience, and a photoelectric conversion unit constituting the second type imaging element may be referred to as "second type photoelectric conversion unit" for convenience.

FIG. 60 illustrates a structure example of a conventional laminated imaging element (laminated solid-state imaging device). In the example illustrated in FIG. 60, a third photoelectric conversion unit 331 and a second photoelectric conversion unit 321 which are second type photoelectric conversion units constituting a third imaging element 330 and a second imaging element 320 which are second type imaging elements, respectively, are laminated and formed in a semiconductor substrate 370. Furthermore, above the semiconductor substrate 370 (specifically, above the second imaging element 320), a first photoelectric conversion unit 311 which is a first type photoelectric conversion unit is disposed. Here, the first photoelectric conversion unit 311 includes a first electrode 311, a photoelectric conversion layer 315 including an organic material, and a second electrode 316, and constitutes a first imaging element 310 which is a first type imaging element. In the second photoelectric conversion unit 321 and the third photoelectric conversion unit 331, for example, blue light and red light are photoelectrically converted due to a difference in absorption coefficient, respectively. Furthermore, in the first photoelectric conversion unit 311, for example, green light is photoelectrically converted.

Charges generated by photoelectric conversion in the second photoelectric conversion unit 321 and the third photoelectric conversion unit 331 are temporarily accumulated in the second photoelectric conversion unit 321 and the third photoelectric conversion unit 331, then transferred to a second floating diffusion layer (floating diffusion) $FD_2$ and a third floating diffusion layer $FD_3$ by a vertical transistor (a gate portion 322 is illustrated) and a transfer transistor (a gate portion 332 is illustrated), and further output to an external readout circuit (not illustrated), respectively. These transistors and floating diffusion layers $FD_2$ and $FD_3$ are also formed in the semiconductor substrate 370.

Charges generated by photoelectric conversion in the first photoelectric conversion unit 311 are accumulated in the first floating diffusion layer $FD_1$ formed in the semiconductor substrate 370 via a contact hole portion 361 and a wiring layer 362. Furthermore, the first photoelectric conversion unit 311 is also connected to a gate portion 318 of an amplification transistor for converting a charge amount into a voltage via the contact hole portion 361 and the wiring layer 362. In addition, the first floating diffusion layer $FD_1$ constitutes apart of a reset transistor (a gate portion 317 is illustrated). Note that reference numeral 371 represents an element isolation region, reference numeral 372 represents an oxide film formed on a surface of the semiconductor substrate 370, reference numerals 376 and 381 represent interlayer insulating layers, reference numeral 383 represents a protective layer, and reference numeral 390 represents an on-chip micro lens.

CITATION LIST

Patent Document

Patent Document 1: Japanese Patent Application Laid-Open No. 2011-138927

SUMMARY OF THE INVENTION

Problems to be Solved by the Invention

By the way, charges generated by photoelectric conversion in the second photoelectric conversion unit 321 and the third photoelectric conversion unit 331 are temporarily accumulated in the second photoelectric conversion unit 321 and the third photoelectric conversion unit 331, and then transferred to the second floating diffusion layer $FD_2$ and the third floating diffusion layer $FD_3$, respectively. Therefore, the second photoelectric conversion unit 321 and the third photoelectric conversion unit 331 can be completely depleted. However, charges generated by photoelectric conversion in the first photoelectric conversion unit 311 are directly accumulated in the first floating diffusion layer $FD_1$. Therefore, it is difficult to completely deplete the first photoelectric conversion unit 311. In addition, as a result, a kTC noise increases, a random noise deteriorates, and the quality of an imaged image deteriorates. Furthermore, there is also a strong demand for transferring charges generated by photoelectric conversion in the first photoelectric conversion unit 311 more easily and reliably. Moreover, there is a strong demand for simplifying and miniaturizing a configuration and a structure in a pixel region in which a plurality of imaging elements is arrayed.

Therefore, a first object of the present disclosure is to provide an imaging element in which a photoelectric conversion unit is disposed on or above a semiconductor substrate, having a configuration and a structure capable of suppressing a reduction in the quality of an imaged image and transferring charges generated by photoelectric conversion more easily and reliably, a laminated imaging element including the imaging element, and a solid-state imaging device including the imaging element or the laminated imaging element. Furthermore, a second object of the present disclosure is to provide a solid-state imaging device including a plurality of imaging elements in each of which a photoelectric conversion unit is disposed on or above a semiconductor substrate, the imaging elements being able to suppress a reduction in the quality of an imaged image, and capable of simplifying and miniaturizing a configuration and a structure in a pixel region in which the plurality of imaging elements is arrayed.

Solutions to Problems

Each of imaging elements according to first to sixth aspects of the present disclosure for achieving the first object described above includes a photoelectric conversion unit formed by laminating a first electrode, a photoelectric conversion layer, and a second electrode.

The photoelectric conversion unit further includes a charge accumulation electrode disposed apart from the first electrode so as to face the photoelectric conversion layer via an insulating layer.

The photoelectric conversion unit includes N (where N≥2) photoelectric conversion unit segments.

The photoelectric conversion layer includes N photoelectric conversion layer segments.

The insulating layer includes N insulating layer segments.

In each of the imaging elements according to the first to third aspects of the present disclosure, the charge accumulation electrode includes N charge accumulation electrode segments.

In each of the imaging elements according to the fourth and fifth aspects of the present disclosure, the charge accumulation electrode includes N charge accumulation electrode segments disposed apart from one another.

The n-th (where n=1, 2, 3 . . . N) photoelectric conversion unit segment includes the n-th charge accumulation electrode segment, the n-th insulating layer segment, and the n-th photoelectric conversion layer segment.

A photoelectric conversion unit segment with a larger value of n is located farther from the first electrode.

In addition, in the imaging element according to the first aspect of the present disclosure, the thickness of an insulating layer segment gradually changes from the first photoelectric conversion unit segment to the N-th photoelectric conversion unit segment.

Furthermore, in the imaging element according to the second aspect of the present disclosure, the thickness of a photoelectric conversion layer segment gradually changes from the first photoelectric conversion unit segment to the N-th photoelectric conversion unit segment.

Furthermore, in the imaging element according to the third aspect of the present disclosure, materials constituting an insulating layer segment are different between adjacent photoelectric conversion unit segments.

Furthermore, in the imaging element according to the fourth aspect of the present disclosure, materials constituting a charge accumulation electrode segment are different between adjacent photoelectric conversion unit segments.

Furthermore, in the imaging element according to the fifth aspect of the present disclosure, the area of a charge accumulation electrode segment is gradually reduced from the first photoelectric conversion unit segment to the N-th photoelectric conversion unit segment. Note that the area may be reduced continuously or stepwise.

The sixth aspect of the present disclosure for achieving the first object described above includes a photoelectric conversion unit formed by laminating a first electrode, a photoelectric conversion layer, and a second electrode.

The photoelectric conversion unit further includes a charge accumulation electrode disposed apart from the first electrode so as to face the photoelectric conversion layer via an insulating layer.

If a lamination direction of the charge accumulation electrode, the insulating layer, and the photoelectric conversion layer is defined as a Z direction, and a direction of separating from the first electrode is defined as an X direction, when a laminated portion where the charge accumulation electrode, the insulating layer, and the photoelectric conversion layer are laminated is cut with a YZ virtual plane, the cross-sectional area of the laminated portion changes depending on a distance from the first electrode. Note that the change in the cross-sectional area may be a continuous change or a step-like change.

The laminated imaging element of the present disclosure for achieving the first object described above includes at least one of the imaging elements according to the first to sixth aspects of the present disclosure.

The solid-state imaging device according to the first aspect of the present disclosure for achieving the second object described above includes a photoelectric conversion unit formed by laminating a first electrode, a photoelectric conversion layer, and a second electrode.

The solid-state imaging device includes a plurality of imaging elements in each of which the photoelectric conversion unit further includes a charge accumulation electrode disposed apart from the first electrode so as to face the photoelectric conversion layer via an insulating layer.

The plurality of imaging elements constitutes an imaging element block.

The first electrode is shared by the plurality of imaging elements constituting the imaging element block.

The solid-state imaging device according to the second aspect of the present disclosure for achieving the second object described above includes a plurality of imaging elements according to the first to seventh aspects of the present disclosure.

The plurality of imaging elements constitutes an imaging element block.

The first electrode is shared by the plurality of imaging elements constituting the imaging element block.

The solid-state imaging device according to the third aspect of the present disclosure for achieving the first object described above includes a plurality of the imaging elements according to the first to sixth aspects of the present disclosure. Furthermore, the solid-state imaging device according to the fourth aspect of the present disclosure for achieving the first object described above includes a plurality of the laminated imaging elements of the present disclosure.

Furthermore, the solid-state imaging element of the present disclosure includes a pixel including:

a first imaging element;

a second imaging element;

a first transfer transistor, a first reset transistor, and a first selection transistor electrically connected to the second imaging element;

a third imaging element;

a second transfer transistor, a second reset transistor, and a second selection transistor electrically connected to the third imaging element; and an on-chip micro lens.

The first imaging element includes a first electrode, a third electrode, and a second electrode facing the first and third electrodes.

The pixel further includes:

a third electrode control line connected to the third electrode; and a plurality of control lines connected to the first transfer transistor, the first reset transistor, the first selection transistor, the second transfer transistor, the second reset transistor, and the second selection transistor, and different from the third electrode control line.

In addition, in the pixel, a distance between the center of the on-chip micro lens included in the pixel and any one of the plurality of control lines included in the pixel is smaller than a distance between the center of the on-chip micro lens included in the pixel and the third electrode control line included in the pixel. As a result, by disposing the third electrode control line in a region as far as possible from the center of the on-chip micro lens, inhibition of incidence of light on the second imaging element and the third imaging element by the third electrode control line is less likely to occur, and sensitivity of the solid-state imaging device can be higher than those in a solid-state imaging device not having this structure.

Furthermore, in the solid-state imaging device of the present disclosure, a pixel includes:

a first imaging element;

a second imaging element;

a third imaging element; and an on-chip micro lens, and each of a distance d1 between the center of an inscribed circle of a charge accumulation electrode and the center of the on-chip micro lens, a distance d2 between the center of an inscribed circle of the second imaging element and the center of the on-chip micro lens, and a distance d3 between the center of an inscribed circle of the third imaging element and the center of the on-chip micro lens is smaller than a distance d4 between the center of an inscribed circle of a first electrode and the center of the on-chip micro lens or a distance d5 between the center of an inscribed circle of a floating diffusion region and the center of the on-chip micro lens. In this way, by disposing the floating diffusion region or the first electrode in a region as far as possible from the center of the on-chip micro lens, the area of each of the second imaging element and the third imaging element can be larger, and sensitivity of the solid-state imaging device can be higher than those in a solid-state imaging device not having this structure.

Furthermore, the solid-state imaging element of the present disclosure includes a pixel including:

a first imaging element;

a first floating diffusion region electrically connected to the first imaging element;

a second imaging element;

a second floating diffusion region electrically connected to the second imaging element;

a third imaging element;

a third floating diffusion region electrically connected to the third imaging element; and an on-chip micro lens.

The first imaging element includes a first electrode, a third electrode, and a second electrode facing the first and third electrodes.

Each of the centers of the first to third floating diffusion layers is disposed outside an inscribed circle of the third electrode, outside an outline of the third electrode, or outside a circumscribed circle of the third electrode. In this way, by disposing the floating diffusion region in a region as far as possible from the center of the on-chip micro lens L, the area of each of the third electrode, the second imaging element, and the third imaging element can be larger, and sensitivity of the solid-state imaging device can be higher than those in a solid-state imaging device not having this structure.

Furthermore, the solid-state imaging element of the present disclosure includes a pixel including:

a first imaging element;

a second imaging element;

a first transfer transistor, a first reset transistor, and a first selection transistor electrically connected to the second imaging element;

a third imaging element;

a second transfer transistor, a second reset transistor, and a second selection transistor electrically connected to the third imaging element; and an on-chip micro lens.

The first imaging element includes a first electrode, a third electrode, and a second electrode facing the first and third electrodes.

The minimum channel length in the first and second transfer transistors, the first and second reset transistors, and the first and second selection transistors is shorter than the minimum distance between the third electrode and the first electrode. In this way, by disposing the floating diffusion region in a region as far as possible from the center of the on-chip micro lens, the area of each of the third electrode, the second imaging element, and the third imaging element can be larger, and sensitivity of the solid-state imaging device can be higher than those in a solid-state imaging device not having this structure.

Furthermore, the solid-state imaging device of the present disclosure includes: in a pixel, a first imaging element;

a second imaging element;

a third imaging element; and an on-chip micro lens.

The first imaging element includes a first electrode, a third electrode, and a second electrode facing the first and third electrodes.

The area of the third electrode is larger than that of the third imaging element. In this way, by making the area of the third electrode larger than that of the third imaging element, sensitivity to green light can be higher than that of a solid-state imaging device not having this structure. Note that the area of the third electrode is preferably smaller than that of the second imaging element.

Effects of the Invention

The imaging elements according to the first to sixth aspects of the present disclosure, the imaging element of the present disclosure constituting the laminated imaging element of the present disclosure, and the imaging element of the present disclosure constituting the solid-state imaging devices according to the first to fourth aspects of the present disclosure each include a charge accumulation electrode disposed apart from the first electrode so as to face a photoelectric conversion layer via an insulating layer. Therefore, when a photoelectric conversion unit is irradiated with light and the light is photoelectrically converted in the photoelectric conversion unit, charges of the photoelectric conversion layer can be accumulated. Therefore, at the time of start of exposure, a charge accumulation portion can be completely depleted and the charge can be erased. As a result, it is possible to suppress occurrence of a phenomenon that a kTC noise increases, a random noise deteriorates, and the quality of an imaged image deteriorates. Furthermore, in the imaging elements according to the first to sixth aspects of the present disclosure, the laminated imaging element of the present disclosure applying the imaging elements, and the solid-state imaging devices according to the first to fourth aspects of the present disclosure, the thickness of an insulating layer segment is defined, or the thickness of a photoelectric conversion layer segment is defined, or the materials constituting the insulating layer segments are different, or the materials constituting charge accumulation electrode segments are different, or the area of the charge accumulation electrode segment is defined, or the cross-sectional area of the laminated portion is defined. Therefore, a kind of charge transfer gradient is formed, and charges generated by photoelectric conversion can be transferred to the first electrode more easily and reliably. In addition, as a result, it is possible to prevent generation of afterimages and transfer residuals. Moreover, in the solid-state imaging devices according to the first and second aspects of the present disclosure, since the first electrode is shared by the plurality of imaging elements constituting the imaging element block, the configuration and structure in a pixel region in which a plurality of imaging elements is arrayed can be simplified and miniaturized. Note that effects described here are merely illustrative, and are not restrictive. Furthermore, an additional effect may be present.

BRIEF DESCRIPTION OF DRAWINGS

FIG. 20 is a diagram schematically illustrating a potential state at each part during an operation of the imaging element of Example 5.

FIG. 51 is an enlarged schematic partial cross-sectional view of a portion of a charge discharge electrode and the like of another modification of the imaging element and the laminated imaging element of Example 11.

MODE FOR CARRYING OUT THE INVENTION

Figure 1:
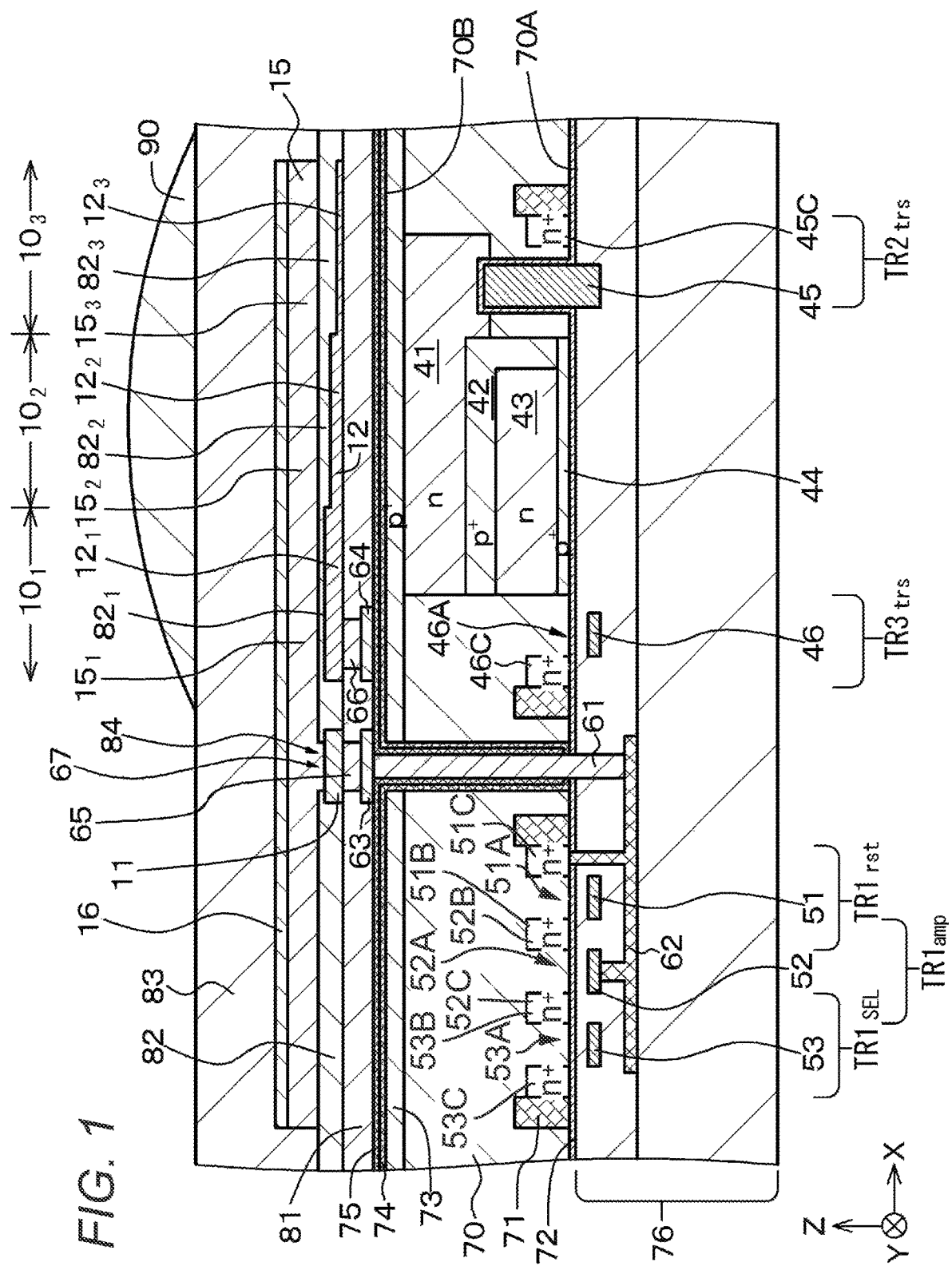
FIG. 1 is a schematic partial cross-sectional view of an imaging element and a laminated imaging element of Example 1.

Hereinafter, the present disclosure will be described on the basis of Examples with reference to the drawings. However, the present disclosure is not limited to Examples, and various numerical values and materials in Example are illustrative. Note that description will be made in the following order.

1. General description on imaging elements according to first to sixth aspects of the present disclosure, laminated imaging element of the present disclosure, and solid-state imaging devices according to first to fourth aspects of the present disclosure 2. Example 1 (imaging elements according to the first and sixth aspects of the present disclosure, laminated imaging element of the present disclosure, and solid-state imaging device according to the fourth aspect of the present disclosure)

3. Example 2 (imaging elements according to the second and sixth aspects of the present disclosure)

4. Example 3 (imaging element according to the third aspect of the present disclosure)

5. Example 4 (imaging element according to the fourth aspect of the present disclosure)

6. Example 5 (imaging element according to the fifth aspect of the present disclosure)

7. Example 6 (imaging element according to the sixth aspect of the present disclosure)

8. Example 7 (solid-state imaging devices according to the first and second aspects of the present disclosure)

9. Example 8 (modification of Example 7)

10. Example 9 (modification of Examples 1 to 6)

11. Example 10 (modification of Examples 1 to 6 and 9)

12. Example 11 (modification of Examples 1 to 6, 9, and 10)

13. Example 12

14. Others

<General Description on Imaging Elements According to First to Sixth Aspects of the Present Disclosure, Laminated Imaging Element of the Present Disclosure, and Solid-State Imaging Devices According to First to Fourth Aspects of the Present Disclosure>

In the solid-state imaging devices according to the first and second aspects of the present disclosure, a transfer control electrode can be disposed among a plurality of imaging elements constituting an imaging element block. The transfer control electrode may be formed, on a first electrode side, at the same level as the first electrode or a charge accumulation electrode or at a different level therefrom. Alternatively, the transfer control electrode may be formed, on a second electrode side, at the same level as the second electrode or at a different level therefrom. Moreover, each of the solid-state imaging devices according to the first and second aspects of the present disclosure including the preferable forms can have a form in which one on-chip micro lens is disposed above one imaging element, or can have a form in which an imaging element block is constituted by two imaging elements, and one on-chip micro lens is disposed above the imaging element block.

In the solid-state imaging devices according to the first and second aspects of the present disclosure, one floating diffusion layer is disposed for a plurality of imaging elements. Here, the plurality of imaging elements disposed for one floating diffusion layer may be constituted by a plurality of first type imaging elements described later, or may be constituted by at least one first type imaging element and one or more second type imaging elements described later. In addition, by appropriately controlling the timing of a charge transfer period, the plurality of imaging elements can share one floating diffusion layer. The plurality of imaging elements is operated in cooperation and connected as an imaging element block to a drive circuit described later. That is, the plurality of imaging elements constituting the imaging element block is connected to one drive circuit. However, the charge accumulation electrode is controlled for each of the imaging elements. Furthermore, the plurality of imaging elements can share one contact hole portion. As for an arrangement relationship between the first electrode shared by the plurality of imaging elements and the charge accumulation electrodes of the imaging elements, there is also a case where the first electrode is disposed adjacent to the charge accumulation electrodes of the imaging elements. Alternatively, there is also a case where the first electrode is disposed adjacent to some of the charge accumulation electrodes of the plurality of imaging elements, and is not disposed adjacent to the remaining charge accumulation electrodes of the plurality of imaging elements. In this case, transfer of charges from the rest of the plurality of imaging elements to the first electrode is transfer via some of the plurality of imaging elements. A distance between a charge accumulation electrode constituting an imaging element and a charge accumulation electrode constituting an imaging element (referred to as "distance A" for convenience) is preferably longer than a distance between a first electrode and a charge accumulation electrode in an imaging element adjacent to the first electrode (referred to as "distance B" for convenience) in order to ensure transfer of charges from each of the imaging elements to the first electrode. Furthermore, a value of the distance A is preferably longer as an imaging element is located farther from the first electrode.

In each of the imaging elements according to the first to fifth aspects of the present disclosure, a photoelectric conversion unit segment with a larger value of n is located farther from the first electrode, and it is determined on the basis of the X direction whether or not a photoelectric conversion unit segment is located apart from the first electrode. Furthermore, in the imaging element according to the sixth aspect of the present disclosure, the direction of separating from the first electrode is defined as the X direction, and the "X direction" is defined as follows. That is, a pixel region in which a plurality of imaging elements or laminated imaging elements is arrayed includes a plurality of pixels regularly arrayed two-dimensionally, that is, in the X and Y directions. In a case where the planar shape of the pixel is rectangular, a direction in which a side closest to the first electrode extends is defined as the Y direction, and a direction orthogonal to the Y direction is defined as the X direction. Alternatively, in a case where the planar shape of the pixel is an arbitrary shape, the overall direction including a line segment or a curve closest to the first electrode is defined as the Y direction, and a direction orthogonal to the Y direction is defined as the X direction.

The second electrode located on a light incident side is preferably common to a plurality of imaging elements. That is, the second electrode can be a so-called solid electrode. The photoelectric conversion layer may be common to a plurality of imaging elements. That is, one photoelectric conversion layer may be formed in the plurality of imaging elements, or may be disposed for each of the imaging elements.

In each of the imaging elements according to the first and second aspects of the present disclosure, the N photoelectric conversion layer segments are disposed continuously, the N insulating layer segments are also disposed continuously, and the N charge accumulation electrode segments are also disposed continuously. In each of the imaging elements according to the third to fifth aspects of the present disclosure, the N photoelectric conversion layer segments are disposed continuously. Furthermore, in each of the imaging elements according to the fourth and fifth aspects of the present disclosure, the N insulating layer segments are disposed continuously. Meanwhile, in the imaging element according to the third aspect of the present disclosure, the N insulating layer segments are disposed so as to correspond to the respective photoelectric conversion unit segments. Moreover, in each of the imaging elements according to the fourth and fifth aspects of the present disclosure, and in some cases, in the imaging element according to the third aspect of the present disclosure, the N charge accumulation electrode segments are disposed so as to correspond to the respective photoelectric conversion unit segments. In addition, in each of the imaging elements according to the first to sixth aspects of the present disclosure, the same potential is applied to all the charge accumulation electrode segments. Alternatively, in each of the imaging elements according to the fourth and fifth aspects of the present disclosure, and in some cases, in the imaging element according to the third aspect of the present disclosure, different potentials may be applied to the N charge accumulation electrode segments.

The imaging elements according to the first to sixth aspects of the present disclosure, the imaging elements according to the first to sixth aspects of the present disclosure constituting the laminated imaging element of the present disclosure, and an imaging element constituting the solid-state imaging devices according to the first and second aspects of the present disclosure including the above preferable forms or the solid-state imaging devices according to the third and fourth aspects of the present disclosure (these imaging elements may be collectively referred to as "imaging element and the like of the present disclosure") can have a form in which a semiconductor substrate is further included, and a photoelectric conversion unit is disposed above the semiconductor substrate. Note that the first electrode, the charge accumulation electrode, and the second electrode are connected to a drive circuit described later.

Moreover, the imaging element and the like of the present disclosure including the various preferable forms described above can have a form in which the first electrode extends in an opening formed in the insulating layer to be connected to the photoelectric conversion layer. Alternatively, a form can be adopted in which the photoelectric conversion layer extends in an opening formed in the insulating layer to be connected to the first electrode.

In this case, a form can be adopted in which an edge of a top surface of the first electrode is covered with the insulating layer, the first electrode is exposed on a bottom surface of the opening, and when a surface of the insulating layer in contact with the top surface of the first electrode is referred to as a first surface, and a surface of the insulating layer in contact with a portion of the photoelectric conversion layer facing the charge accumulation electrode is referred to as a second surface, a side surface of the opening has an inclination widening from the first surface toward the second surface. Moreover, a form can be adopted in which the side surface of the opening having an inclination widening from the first surface toward the second surface is located on the charge accumulation electrode side. Note that a form is included in which another layer is formed between the photoelectric conversion layer and the first electrode (for example, a form in which a material layer suitable for charge accumulation is formed between the photoelectric conversion layer and the first electrode).

Moreover, the imaging element and the like of the present disclosure including the various preferable forms described above can have a configuration in which a control unit disposed on a semiconductor substrate and having a drive circuit is further included, the first electrode and the charge accumulation electrode are connected to the drive circuit, in a charge accumulation period, the drive circuit applies a potential $V_{11}$ to the first electrode and applies a potential $V_{12}$ to the charge accumulation electrode, and charges are accumulated in the photoelectric conversion layer, and in a charge transfer period, the drive circuit applies a potential $V_{21}$ to the first electrode and applies a potential $V_{22}$ to the charge accumulation electrode, and the charges accumulated in the photoelectric conversion layer are read out by the control unit via the first electrode. However, in a case where the potential of the first electrode is higher than that of the second electrode, $V_{12} \geq V$ and $V_{22} < V_{21}$ are satisfied, and in a case where the potential of the first electrode is lower than that of the second electrode, $V_{12} \geq V_{11}$ and $V_{22} > V_{21}$ are satisfied.

Hereinafter, a case where the potential of the first electrode is higher than that of the second electrode will be described. However, in a case where the potential of the first electrode is lower than that of the second electrode, a potential level only needs to be reversed.

In the imaging element according to the first aspect of the present disclosure, the thickness of an insulating layer segment gradually changes from the first photoelectric conversion unit segment to the N-th photoelectric conversion unit segment. However, the thickness of an insulating layer segment may increase or decrease gradually, thereby forming a kind of charge transfer gradient.

In a case where the charges to be accumulated are electrons, it is only required to adopt a configuration in which the thickness of an insulating layer segment gradually increases. In a case where the charges to be accumulated are holes, it is only required to adopt a configuration in which the thickness of an insulating layer segment gradually decreases. Then, in these cases, when a state of $|V_{12}| \geq |V_{11}|$ is reached in a charge accumulation period, the n-th photoelectric conversion unit segment can accumulate more charges than the (n+1)-th photoelectric conversion unit segment, a stronger electric field is applied to the n-th photoelectric conversion unit segment than to the (n+1)-th photoelectric conversion unit segment, and a flow of charges from the first photoelectric conversion unit segment to the first electrode can be reliably prevented. Then, when a state of $|V_{22}| < |V_{21}|$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element according to the second aspect of the present disclosure, the thickness of a photoelectric conversion layer segment gradually changes from the first photoelectric conversion unit segment to the N-th photoelectric conversion unit segment. However, the thickness of a photoelectric conversion layer segment may increase or decrease gradually, thereby forming a kind of charge transfer gradient.

In a case where the charges to be accumulated are electrons, it is only required to adopt a configuration in which the thickness of a photoelectric conversion layer segment gradually increases. In a case where the charges to be accumulated are holes, it is only required to adopt a configuration in which the thickness of a photoelectric conversion layer segment gradually decreases. Then, in a case where the thickness of a photoelectric conversion layer segment gradually increases, when a state of $V_{12} \geq V_{11}$ is reached in a charge accumulation period, and in a case where the thickness of a photoelectric conversion layer segment gradually decreases, when a state of $V_{12} \leq V_{11}$ is reached in a charge accumulation period, a stronger electric field is applied to the n-th photoelectric conversion unit segment than to the (n+1)-th photoelectric conversion unit segment, and a flow of charges from the first photoelectric conversion unit segment to the first electrode can be reliably prevented. Then, in a charge transfer period, in a case where the thickness of a photoelectric conversion layer segment gradually increases, when a state of $V_{22}<V_{21}$ is reached, and in a case where the thickness of a photoelectric conversion layer segment gradually decreases, when a state of $V_{22}>V_{21}$ is reached, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element according to the third aspect of the present disclosure, materials constituting an insulating layer segment are different between adjacent photoelectric conversion unit segments, and this forms a kind of charge transfer gradient. A value of the relative dielectric constant of a material constituting an insulating layer segment preferably decreases gradually from the first photoelectric conversion unit segment to the N-th photoelectric conversion unit segment. Then, by adopting such a configuration, in a charge accumulation period, when a state of $V_{12} \geq V_{11}$ is reached, the n-th photoelectric conversion unit segment can accumulate more charges than the (n+1)-th photoelectric conversion unit segment. Then, when a state of $V_{22}<V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element according to the fourth aspect of the present disclosure, materials constituting a charge accumulation electrode segment are different between adjacent photoelectric conversion unit segments, and this forms a kind of charge transfer gradient. A value of work function of a material constituting an insulating layer segment preferably increases gradually from the first photoelectric conversion unit segment to the N-th photoelectric conversion unit segment. In addition, by adopting such a configuration, a potential gradient which is advantageous for signal charge transfer can be formed without depending on whether the voltage is positive or negative.

In the imaging element according to the fifth aspect of the present disclosure, the area of a charge accumulation electrode segment is gradually reduced from the first photoelectric conversion unit segment to the N-th photoelectric conversion unit segment, and this forms a kind of charge transfer gradient. Therefore, when a state of $V_{12} \geq V_{11}$ is reached in a charge accumulation period, the n-th photoelectric conversion unit segment can accumulate more charges than the (n+1)-th photoelectric conversion unit segment. Then, when a state of $V_{22}<V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

In the imaging element according to the sixth aspect of the present disclosure, the cross-sectional area of the laminated portion changes depending on a distance from the first electrode, and this forms a kind of charge transfer gradient. Specifically, by adopting a configuration in which the thickness of the cross section of the laminated portion is constant and the width of the cross section of the laminated portion becomes narrower as the laminated portion goes away from the first electrode, as described in the imaging element according to the fifth aspect of the present disclosure, when a state of $V_{12} \geq V_{11}$ is reached in a charge accumulation period, a region close to the first electrode can accumulate more charges than a region far from the first electrode. Therefore, when a state of $V_{22}<V_{21}$ is reached in a charge transfer period, a flow of charges from a region close to the first electrode to the first electrode and a flow of charges from a region far from the first electrode to the region close to the first electrode can be reliably ensured. Meanwhile, by adopting a configuration in which the width of the cross section of the laminated portion is constant, and the thickness of the cross section of the laminated portion, specifically, the thickness of an insulating layer segment gradually increases, as described in the imaging element according to the first aspect of the present disclosure, when a state of $V_{12} \geq V_{11}$ is reached in a charge accumulation period, a region close to the first electrode can accumulate more charges than a region far from the first electrode, a stronger electric field is applied to the region close to the first electrode than to the region far from the first electrode, and a flow of charges from the region close to the first electrode to the first electrode can be reliably prevented. Then, when a state of $V_{22}<V_{21}$ is reached in a charge transfer period, a flow of charges from a region close to the first electrode to the first electrode and a flow of charges from a region far from the first electrode to the region close to the first electrode can be reliably ensured. Furthermore, by adopting a configuration in which the thickness of a photoelectric conversion layer segment gradually increases, as described in the imaging element according to the second aspect of the present disclosure, when a state of $V_{12} \geq V_{11}$ is reached in a charge accumulation period, a stronger electric field is applied to the region close to the first electrode than to the region far from the first electrode, and a flow of charges from the region close to the first electrode to the first electrode can be reliably prevented. Then, when a state of $V_{22}<V_{21}$ is reached in a charge transfer period, a flow of charges from a region close to the first electrode to the first electrode and a flow of charges from a region far from the first electrode to the region close to the first electrode can be reliably ensured.

Note that each of the imaging elements according to the fourth and fifth aspects of the present disclosure, and in some cases, the imaging element according to the third aspect of the present disclosure can have a form in which, in a case where different potentials are applied to N charge accumulation electrode segments, in a case where the potential of the first electrode is higher than that of the second electrode, in a charge transfer period, a potential applied to a charge accumulation electrode segment located closest to the first electrode (first photoelectric conversion unit segment) is higher than a potential applied to a charge accumulation electrode segment located farthest from the first electrode (N-th photoelectric conversion unit segment), and in a case where the potential of the first electrode is lower than that of the second electrode, in the charge transfer period, the potential applied to the charge accumulation electrode segment located closest to the first electrode (first photoelectric conversion unit segment) is lower than the potential applied to the charge accumulation electrode segment located farthest from the first electrode (N-th photoelectric conversion unit segment).

Moreover, the imaging element and the like of the present disclosure including the various preferable forms and configurations described above can further include a charge discharge electrode connected to the photoelectric conversion layer and disposed apart from the first electrode and the charge accumulation electrode. Note that the image imaging element and the like of the present disclosure having such a form are referred to as "imaging element and the like of the present disclosure including a charge discharge electrode" for convenience. In addition, the imaging element and the like of the present disclosure including a charge discharge electrode can have a form in which the charge discharge electrode is disposed so as to surround the first electrode and the charge accumulation electrode (that is, in a frame shape). The charge discharge electrode can be shared by (common to) a plurality of imaging elements. In addition, in this case, a form can be adopted in which the photoelectric conversion layer extends in a second opening formed in the insulating layer to be connected to the charge discharge electrode, an edge of a top surface of the charge discharge electrode is covered with the insulating layer, the charge discharge electrode is exposed on a bottom surface of the second opening, and when a surface of the insulating layer in contact with the top surface of the charge discharge electrode is referred to as a third surface, and a surface of the insulating layer in contact with a portion of the photoelectric conversion layer facing the charge accumulation electrode is referred to as a second surface, a side surface of the second opening has an inclination widening from the third surface toward the second surface.

Moreover, the imaging element and the like of the present disclosure including a charge discharge electrode can have a configuration in which a control unit disposed on a semiconductor substrate and having a drive circuit is further included, the first electrode, the charge accumulation electrode, and the charge discharge electrode are connected to the drive circuit, in a charge accumulation period, the drive circuit applies a potential $V_{11}$ to the first electrode, applies a potential $V_{12}$ to the charge accumulation electrode, and applies a potential $V_{14}$ to the charge discharge electrode, and charges are accumulated in the photoelectric conversion layer, and in a charge transfer period, the drive circuit applies a potential $V_{21}$ to the first electrode, applies a potential $V_{22}$ to the charge accumulation electrode, and applies a potential $V_{24}$ to the charge discharge electrode, and the charges accumulated in the photoelectric conversion layer are readout by the control unit via the first electrode. However, in a case where the potential of the first electrode is higher than that of the second electrode, $V_{14} > V_{11}$ and $V_{24} < V_{21}$ are satisfied, and in a case where the potential of the first electrode is lower than that of the second electrode, $V_{14} < V_{11}$ and $V_{24} > V_{21}$ are satisfied.

The imaging element and the like of the present disclosure including the various preferable forms and configurations described above can have a configuration in which on the semiconductor substrate, at least a floating diffusion layer and an amplification transistor constituting a control unit are disposed, and the first electrode is connected to the floating diffusion layer and a gate portion of the amplification transistor. In addition, in this case, moreover, a configuration can be adopted in which on the semiconductor substrate, a reset transistor and a selection transistor constituting the control unit are further disposed, the floating diffusion layer is connected to one source/drain region of the reset transistor, and one source/drain region of the amplification transistor is connected to one source/drain region of the selection transistor, and the other source/drain region of the selection transistor is connected to a signal line.

Moreover, the imaging element and the like of the present disclosure including the various preferable forms and configurations described above can have a form in which the charge accumulation electrode is larger than the first electrode. When the area of the charge accumulation electrode is represented by $S_1'$, and the area of the first electrode is represented by $S_1$, $4 \leq S_1'/S_1$ is preferably satisfied although not limited.

Moreover, the imaging element and the like of the present disclosure including the various preferable forms and configurations described above can have a form in which light is incident from the second electrode side, and a light shielding layer is formed on the light incident side of the second electrode. Alternatively, a form can be adopted in which light is incident from the second electrode side, and light is not incident on the first electrode side. In this case, a configuration can be adopted in which a light shielding layer is formed above the first electrode on the light incident side of the second electrode. Alternatively, a configuration can be adopted in which an on-chip micro lens is disposed above the charge accumulation electrode and the second electrode, and light incident on the on-chip micro lens is collected by the charge accumulation electrode. Here, the light shielding layer may be disposed above the light incident side surface of the second electrode, or may be disposed on the light incident side surface of the second electrode. In some cases, a light shielding layer may be formed in the second electrode. Examples of a material constituting the light shielding layer include chromium (Cr), copper (Cu), aluminum (Al), tungsten (W), and a resin that does not transmit light (for example, polyimide resin).

Specific examples of the imaging element of the present disclosure include: an imaging element including a photoelectric conversion layer that absorbs blue light (light of 425 nm to 495 nm) (referred to as "first type blue light photoelectric conversion layer" for convenience) and sensitive to blue light (referred to as "first type blue light imaging element" for convenience); an imaging element including a photoelectric conversion layer that absorbs green light (light of 495 nm to 570 nm) (referred to as "first type green light photoelectric conversion layer" for convenience) and sensitive to green light (referred to as "first type green light imaging element" for convenience); and an imaging element including a photoelectric conversion layer that absorbs red light (light of 620 nm to 750 nm) (referred to as "first type red light photoelectric conversion layer" for convenience) and sensitive to red light (referred to as "first type red light imaging element" for convenience). Furthermore, a conventional imaging element not including a charge accumulation electrode and sensitive to blue light is referred to as "second type blue light imaging element" for convenience, a conventional imaging element not including a charge accumulation electrode and sensitive to green light is referred to as "second type green light imaging element" for convenience, a conventional imaging element not including a charge accumulation electrode and sensitive to red light is referred to as "second type red light imaging element" for convenience, a photoelectric conversion layer constituting the second type blue light imaging element is referred to as "second type blue light photoelectric conversion layer" for convenience, a photoelectric conversion layer constituting the second type green light imaging element is referred to as "second type green light photoelectric conversion layer" for convenience, and a photoelectric conversion layer constituting the second type red light imaging element is referred to as "second type red light photoelectric conversion layer" for convenience.

The laminated imaging element of the present disclosure includes at least one of the imaging elements (photoelectric conversion elements) of the present disclosure. Specific examples thereof include:

[A] a configuration and a structure in which the first type blue photoelectric conversion unit, the first type green light photoelectric conversion unit, and the first type red light photoelectric conversion unit are laminated in the vertical direction, and the control units of the first type blue light imaging element, the first type green light imaging element, and the first type red light imaging element are disposed on a semiconductor substrate;

[B] a configuration and a structure in which the first type blue light photoelectric conversion unit and the first type green light photoelectric conversion unit are laminated in the vertical direction, the second type red light photoelectric conversion unit is disposed below the two first type photoelectric conversion units, and the control units of the first type blue light imaging element, the first type green light imaging element, and the second type red light imaging element are disposed on a semiconductor substrate;

[C] a configuration and a structure in which the second type blue light photoelectric conversion unit and the second type red light photoelectric conversion unit are disposed below the first type green light photoelectric conversion unit, and the control units of the first type green light imaging element, the second type blue light imaging element, and the second type red light imaging element are disposed on a semiconductor substrate; and

[D] a configuration and a structure in which the second type green light photoelectric conversion unit and the second type red light photoelectric conversion unit are disposed below the first type blue light photoelectric conversion unit, and the control units of the first type blue light imaging element, the second type green light imaging element, and the second type red light imaging element are disposed on a semiconductor substrate. Note that the photoelectric conversion units of these imaging elements are preferably disposed in the vertical direction in order of the blue light photoelectric conversion unit, the green light photoelectric conversion unit, and the red light photoelectric conversion unit from the light incident direction, or in order of the green light photoelectric conversion unit, the blue light photoelectric conversion unit, and the red light photoelectric conversion unit from the light incident direction. This is because light having a shorter wavelength is more efficiently absorbed on an incident surface side. Since red has the longest wavelength among the three colors, the red light photoelectric conversion unit is preferably located in the lowermost layer as viewed from the light incident surface. A laminated structure of these imaging elements constitutes one pixel. In addition, a first-type infrared photoelectric conversion unit may be provided. Here, preferably, the photoelectric conversion layer of the first type infrared photoelectric conversion unit includes, for example, an organic material, and is disposed as the lowermost layer of the laminated structure of the first type imaging elements above the second type imaging element. Alternatively, a second type infrared photoelectric conversion unit may be disposed below the first type photoelectric conversion unit.

In the first type imaging element, for example, the first electrode is formed on an interlayer insulating layer disposed on a semiconductor substrate. An imaging element formed on a semiconductor substrate can be a backside irradiation type or a frontside irradiation type.

In a case where the photoelectric conversion layer includes an organic material, the photoelectric conversion layer can have any one of the following four forms.

(1) The photoelectric conversion layer is constituted by a p-type organic semiconductor.

(2) The photoelectric conversion layer is constituted by an n-type organic semiconductor.

(3) The photoelectric conversion layer is constituted by a laminated structure of p-type organic semiconductor layer/n-type organic semiconductor layer. The photoelectric conversion layer is constituted by a laminated structure of p-type organic semiconductor layer/mixed layer (bulk heterostructure) of p-type organic semiconductor and n-type organic semiconductor/n-type organic semiconductor layer. The photoelectric conversion layer is constituted by a laminated structure of a mixed layer (bulk heterostructure) of a p-type organic semiconductor layer/p-type organic semiconductor and an n-type organic semiconductor. The photoelectric conversion layer is constituted by a laminated structure of a mixed layer (bulk heterostructure) of an n-type organic semiconductor layer/p-type organic semiconductor and an n-type organic semiconductor.

(4) The photoelectric conversion layer is constituted by a mixture (bulk heterostructure) of a p-type organic semiconductor and an n-type organic semiconductor.

However, the laminating order can be arbitrarily exchanged.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative. Examples of the n-type organic semiconductor include a fullerene and a fullerene derivative <for example, C60, a fullerene such as C70 or C74 (higher fullerene), an endohedral fullerene, or the like, or a fullerene derivative (for example, a fullerene fluoride, a PCBM fullerene compound, a fullerene multimer, or the like)>, an organic semiconductor with larger (deeper) HOMO and LUMO than a p-type organic semiconductor, and a transparent inorganic metal oxide. Specific examples of the n-type organic semiconductor include a heterocyclic compound containing a nitrogen atom, an oxygen atom, or a sulfur atom. Examples thereof include an organic molecule and an organic metal complex containing a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, and the like in a part of a molecular skeleton thereof, and a subphthalocyanine derivative. Examples of a group and the like contained in the fullerene derivative include: a halogen atom; a linear, branched, or cyclic alkyl group or phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having a chalcogenide; a phosphine group; a phosphone group, and derivatives thereof. The thickness of the photoelectric conversion layer including an organic material (also referred as "organic photoelectric conversion layer") is not limited, but is for example, $1 \times 10^{-8}$ m to $5 \times 10^{-7}$ m, preferably $2.5 \times 10^{-8}$ m to $3 \times 10^{-7}$ m, more preferably $2.5 \times 10^{-8}$ in to $2 \times 10^{-7}$ m, and still more preferably $1 \times 10^{-7}$ m to $1.8 \times 10^{-7}$ m. Note that the organic semiconductor is often classified into a p-type and an n-type. The p-type means that holes are easily transported, and the n-type means that electrons are easily transported without being limited to interpretation that the organic semiconductor has holes or electrons as many thermally-excited carriers like an inorganic semiconductor.

Alternatively, examples of a material constituting the organic photoelectric conversion layer that photoelectrically converts light having a green wavelength include a rhodamine-based dye, a melacyanine-based dye, a quinacridone derivative, a subphthalocyanine dye (subphthalocyanine derivative), and the like. Examples of a material constituting the organic photoelectric conversion layer that photoelectrically converts blue light include a coumarinic acid dye, tris-8-hydryxyquinolialuminium (Alq3), a melacyanine-based dye, and the like. Examples of a material constituting the organic photoelectric conversion layer that photoelectrically converts red light include a phthalocyanine-based dye and a subphthalocyanine-based dye (subphthalocyanine derivative).

Alternatively, examples of the inorganic material constituting the photoelectric conversion layer include crystalline silicon, amorphous silicon, microcrystalline silicon, crystalline selenium, amorphous selenium, a chalcopyrite compound such as CIGS(CuInGaSe), CIS($CuInSe_2$), $CuInS_2$, $CuAS_2$, $CuAlSe_2$, $CuGaS_2$, $CuGaSe_2$, $AgAS_2$, $AgAlSe_2$, $AgInS_2$, or $AgInSe_2$, and a group III-V compound such as GaAs, InP, AlGaAs, InGaP, AlGaInP, or InGaAsP, and further include a compound semiconductor such as CdSe, CdS, $In_2Se_3$, $In_2S_3$, $Bi_2Se_3$, $Bi_2S_3$, ZnSe, ZnS, PbSe, or PbS. In addition, quantum dots including these materials can also be used for the photoelectric conversion layer.

Alternatively, the photoelectric conversion layer can have a laminated structure of a lower semiconductor layer and an upper photoelectric conversion layer. In this way, by disposing the lower semiconductor layer, recombination during charge accumulation can be prevented, transfer efficiency of charges accumulated in the photoelectric conversion layer to the first electrode can be increased, and generation of a dark current can be suppressed. A material constituting the upper photoelectric conversion layer only needs to be selected from the above various materials constituting the photoelectric converting layer appropriately. Meanwhile, as a material constituting the lower semiconductor layer, a material having a large bandgap energy value (for example, a bandgap energy value of 3.0 eV or more) and having a higher mobility than a material constituting the photoelectric conversion layer is preferably used. Specific examples thereof include: an oxide semiconductor material such as IGZO; a transition metal dichalcogenide; silicon carbide; diamond; graphene; a carbon nanotube; and an organic semiconductor material such as a condensed polycyclic hydrocarbon compound or a condensed heterocyclic compound. Alternatively, in a case where the charges to be accumulated are electrons, examples of the material constituting the lower semiconductor layer include a material having an ionization potential larger than an ionization potential of a material constituting the photoelectric conversion layer. In a case where the charges to be accumulated are holes, examples of the material constituting the lower semiconductor layer include a material having an electron affinity smaller than an electron affinity of a material constituting the photoelectric conversion layer. Alternatively, the impurity concentration in the material constituting the lower semiconductor layer is preferably $1 \times 10^{18}$ $cm^{-3}$ or less. The lower semiconductor layer may have a single layer configuration or a multilayer configuration. Furthermore, a material constituting the lower semiconductor layer located above the charge accumulation electrode may be different from a material constituting the lower semiconductor layer located above the first electrode.

A single-plate color solid-state imaging device can be constituted by each of the solid-state imaging devices according to the first to fourth aspects of the present disclosure.

In the solid-state imaging device including a laminated imaging element according to the second or fourth aspect of the present disclosure, unlike a solid-state imaging device including Bayer-array imaging elements (that is, spectroscopy of blue, green, and red light is not performed using a color filter), one pixel is constituted by laminating imaging elements sensitive to light having a plurality of wavelengths in a light incident direction within the same pixel, and therefore it is possible to improve sensitivity and a pixel density per unit volume. Furthermore, an organic material has a high absorption coefficient. Therefore, the film thickness of the organic photoelectric conversion layer can be thinner than that of a conventional Si-based photoelectric conversion layer, and restriction on leakage of light from an adjacent pixel and an incident angle of light is alleviated. Moreover, in the conventional Si-based imaging element, a false color is generated because interpolation processing is performed among pixels of three colors to generate a color signal. However, the solid-state imaging device including a laminated imaging element according to the second or fourth aspect of the present disclosure can suppress generation of a false color. The organic photoelectric conversion layer itself also acts as a color filter. Therefore, color separation can be performed even without disposing the color filter.

Meanwhile, in the solid-state imaging device according to the first, second, or third aspect of the present disclosure, use of a color filter can alleviate a demand on the spectral characteristics of blue, green, and red light, and a mass production property is high. Examples of an array of imaging elements in the solid-state imaging device according to the first, second, or third aspect of the present disclosure include a Bayer array, an interline array, a G stripe RB checkered array, a G stripe RB complete checkered array, a checkered complementary color array, a stripe array, a diagonal stripe array, a primary color chrominance array, a field chrominance sequential array, a frame chrominance sequential array, a MOS-type array, an improved MOS-type array, a frame interleaved array, and a field interleaved array. Here, one imaging element constitutes one pixel (or sub-pixel).

A pixel region in which the plurality of imaging elements of the present disclosure or the plurality of laminated imaging elements of the present disclosure is arrayed includes a plurality of pixels regularly arrayed two-dimensionally. The pixel region usually includes an effective pixel region that actually receives light, amplifies signal charges generated by photoelectric conversion, and reads out the signal charges to a drive circuit, and a black reference pixel region that outputs optical black serving as a black level reference. The black reference pixel region is usually disposed on an outer periphery of an effective pixel region.

The imaging element and the like of the present disclosure including the various preferable forms and configurations described above are irradiated with light, photoelectric conversion occurs in the photoelectric conversion layer, and holes and electrons are carrier-separated. In addition, an electrode from which holes are extracted is referred to as a positive electrode, and an electrode from which electrons are extracted is referred to as a negative electrode. The first electrode may constitute a positive electrode, and the second electrode may constitute a negative electrode. Conversely, the first electrode may constitute a negative electrode, and the second electrode may constitute a positive electrode.

In a case where the laminated imaging element is formed, the first electrode, the charge accumulation electrode, the transfer control electrode, the charge discharge electrode, and the second electrode can each contain a transparent conductive material. Note that the first electrode, the charge accumulation electrode, the transfer control electrode, and the charge discharge electrode may be collectively referred to as "first electrode and the like". Alternatively, in a case where the imaging elements and the like of the present disclosure are disposed in a plane like a Bayer array, for example, the second electrode can contain a transparent conductive material, and the first electrode and the like can contain a metal material. In this case, specifically, the second electrode located on the light incident side can contain a transparent conductive material, and the first electrode and the like can contain, for example, Al—Nd (alloy of aluminum and neodymium) or ASC (alloy of aluminum, samarium, and copper). Note that an electrode containing a transparent conductive material may be referred to as a "transparent electrode". Here, the band gap energy of the transparent conductive material is 2.5 eV or more, and preferably 3.1 eV or more. Examples of the transparent conductive material constituting the transparent electrode include a conductive metal oxide. Specific examples thereof include indium oxide, indium-tin oxide (ITO, including Sn-doped $In_2O_3$, crystalline ITO, and amorphous ITO), Indium-zinc oxide (IZO) obtained by adding indium as a dopant to zinc oxide, indium-gallium oxide (IGO) obtained by adding indium as a dopant to gallium oxide, indium-gallium-zinc oxide (IGZO, In—$GaZnO_4$) obtained by adding indium and gallium as a dopant to zinc oxide, indium-tin-zinc oxide (ITZO) obtained by adding indium and tin as a dopant to zinc oxide, IFO (F-doped $In_2O_3$), tin oxide ($SnO_2$), ATO (Sb-doped $SnO_2$), FTO (F-doped $SnO_2$), zinc oxide (including ZnO doped with another element), aluminum-zinc oxide (AZO) to which aluminum is added to zinc oxide as a dopant, gallium-zinc oxide (GZO) to which gallium is added to zinc oxide as a dopant, titanium oxide ($TiO_2$), niobium-titanium oxide (TNO) to which niobium is added to titanium oxide as a dopant, antimony oxide, a spinel type oxide, and an oxide having a $YbFe_2O_4$ structure. Alternatively, examples of the transparent electrode include a transparent electrode containing gallium oxide, titanium oxide, niobium oxide, nickel oxide, and the like as a base layer. The thickness of the transparent electrode may be $2\times10^{-8}$ m to $2\times10^{-7}$ m, and preferably $3\times10^{-8}$ m to $1\times10^{-7}$ m. In a case where the first electrode needs to be transparent, the charge discharge electrode also preferably contains a transparent conductive material from a viewpoint of simplifying a manufacturing process.

Alternatively, in a case where transparency is not necessary, as a conductive material constituting a positive electrode functioning as an electrode for extracting holes, the positive electrode is preferably constituted by a conductive material having a high work function (for example, $\varphi=4.5$ eV to 5.5 eV). Specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). Meanwhile, as a conductive material constituting a negative electrode functioning as an electrode for extracting electrons, the negative electrode is preferably constituted by a conductive material having a low work function (for example, $\varphi=3.5$ eV to 4.5 eV). Specific examples thereof include an alkali metal (for example, Li, Na, K, or the like), a fluoride thereof, an oxide thereof, an alkaline earth metal (for example, Mg, Ca, or the like), a fluoride thereof, an oxide thereof, aluminum (Al), zinc (Zn), tin (Sn), thallium (T), a sodium-potassium alloy, an aluminum-lithium alloy, a magnesium-silver alloy, a rare earth metal such as indium or ytterbium, and an alloy thereof. Alternatively, examples of a material constituting the positive electrode or the negative electrode include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), an alloy containing these metal elements, a conductive particle containing these metals, a conductive particle of an alloy containing these metals, a polysilicon containing impurities, a carbon material, an oxide semiconductor, and a conductive material such as a carbon nanotube or graphene. A laminated structure of layers containing these elements can be also used. Moreover, examples of the material constituting the positive electrode or the negative electrode include an organic material (conductive polymer) such as poly(3,4-ethylenedioxythiophene)/polystyrene sulfonic acid [PEDOT/PSS]. Furthermore, these conductive materials may be mixed with a binder (polymer) to form a paste or an ink, and the paste or the ink may be cured to be used as an electrode.

As a method for forming a film of the first electrode and the like or the second electrode (positive electrode or negative electrode), a dry method or a wet method can be used. Examples of the dry method include a physical vapor deposition method (PVD method) and a chemical vapor deposition method (CVD method). Examples of a film formation using the principle of the PVD method include a vacuum vapor deposition method using resistance heating or high frequency heating, an electron beam (EB) vapor deposition method, various sputtering methods (magnetron sputtering method, RF-DC coupled bias sputtering method, ECR sputtering method, opposing target sputtering method, or high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and an optical CVD method. Meanwhile, examples of the wet method include an electrolytic plating method, an electroless plating method, a spin coating method, an ink jet method, a spray coating method, a stamping method, a micro contact printing method, a flexographic printing method, an offset printing method, a gravure printing method, and a dipping method. Examples of a patterning method include chemical etching such as shadow masking, laser transfer, or photolithography and physical etching using an ultraviolet ray, a laser, and the like. Examples of a technique for planarizing the first electrode and the like or the second electrode include a laser planarization method, a reflow method, and a chemical mechanical polishing (CMP) method.

Examples of a material constituting the insulating layer include not only an inorganic insulating material exemplified by a metal oxide high dielectric insulating material such as a silicon oxide material; silicon nitride (SiNY); or aluminum oxide ($Al_2O_3$), but also include an organic insulating material (organic polymer) exemplified by a straight chain hydrocarbon having a functional group capable of bonding to a control electrode at one end, such as polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent) such as N-2 (aminoethyl) 3-aminopropyltrimethoxysilane (AEAPTMS), 3-mercaptopropyltrimethoxysilane (MPTMS), or octadecyl trichlorosilane (OTS); a novolac type phenol resin; a fluorine-based resin; octadecanethiol, or dodecyl isocyanate. A combination thereof can be also used. Note that examples of the silicon oxide material include silicon oxide ($SiO_X$), BPSG, PSG, BSG, AsSG, PbSG, silicon oxynitride (SiON), spin on glass (SOG), low dielectric constant material (for example, polyaryl ether, cyclo perfluorocarbon polymer and benzocyclobutene, a cyclic fluorocarbon resin, polytetrafluoroethylene, fluorinated aryl ether, fluorinated polyimide, amorphous carbon, and organic SOG). Materials constituting the various interlayer insulating layers and insulating films only need to be appropriately selected from these materials.

The configuration and structure of the floating diffusion layer, amplification transistor, reset transistor, and selection transistor constituting the control unit can be similar to the configuration and structure of the conventional floating diffusion layer, amplification transistor, reset transistor, and selection transistor, respectively. The drive circuit can also have a well-known configuration and structure.

The first electrode is connected to the floating diffusion layer and a gate portion of the amplification transistor, and a contact hole portion only needs to be formed in order to connect the first electrode to the floating diffusion layer and the gate portion of the amplification transistor. Examples of a material constituting the contact hole portion include polysilicon doped with impurities, a high melting point metal such as tungsten, Ti, Pt, Pd, Cu, TiW, TiN, TiNW, $WSi_2$, or $MoSi_2$, a metal silicide, and a laminated structure of layers containing these materials (for example, Ti/TiN/W).

A first carrier blocking layer may be disposed between the organic photoelectric conversion layer and the first electrode, and a second carrier blocking layer may be disposed between the organic photoelectric conversion layer and the second electrode. Furthermore, a first charge injection layer may be disposed between the first carrier blocking layer and the first electrode, and a second charge injection layer may be disposed between the second carrier blocking layer and the second electrode. Examples of a material constituting an electron injection layer include an alkali metal such as lithium (Li), sodium (Na), or potassium (K), a fluoride thereof, an oxide thereof, an alkaline earth metal such as magnesium (Mg) or calcium (Ca), a fluoride thereof, and an oxide thereof.

Examples of a method for forming films of various organic layers include a dry film formation method and a wet film formation method. Examples of the dry film formation method include a vacuum vapor deposition method using resistance heating, high frequency heating, or electron beam heating, a flash vapor deposition method, a plasma vapor deposition method, an EB vapor deposition method, various sputtering methods (a bipolar sputtering method, a direct current sputtering method, a direct current magnetron sputtering method, a high frequency sputtering method, a magnetron sputtering method, an RF-DC coupled bias sputtering method, an ECR sputtering method, a counter target sputtering method, a high frequency sputtering method, and an ion beam sputtering method), a direct current (DC) method, an RF method, a multi-negative electrode method, an activation reaction method, an electric field vapor deposition method, various ion plating methods such as a high frequency ion plating method and a reactive ion plating method, a laser ablation method, a molecular beam epitaxy method, a laser transfer method, and a molecular beam epitaxy method (MBE method). Furthermore, examples of the CVD method include a plasma CVD method, a thermal CVD method, an MOCVD method, and an optical CVD method. Meanwhile, specific examples of the wet method include a spin coating method; an immersion method; a casting method; a micro-contact printing method; a drop casting method; various printing methods such as a screen printing method, an inkjet printing method, an offset printing method, a gravure printing method, and a flexographic printing method; a stamping method; a spraying method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Note that in the coating method, examples of a solvent include an organic solvent having a no polarity or low polarity, such as toluene, chloroform, hexane, or ethanol. Examples of a patterning method include chemical etching such as shadow masking, laser transfer, or photolithography and physical etching using an ultraviolet ray, a laser, and the like. Examples of a technique for planarizing various organic layers include a laser planarization method and a reflow method.

As described above, the imaging element or the solid-state imaging device may include an on-chip micro lens or a light shielding layer, if necessary, and includes a drive circuit for driving the imaging element or wiring lines. If necessary, a shutter for controlling incidence of light on the imaging element may be disposed, or an optical cut filter may be disposed according to a purpose of the solid-state imaging device.

For example, in a case where the solid-state imaging device is laminated with a readout integrated circuit (ROIC), by superposing a drive substrate on which a readout integrated circuit and a connection portion containing copper (Cu) are formed, and an imaging element in which a connection portion is formed such that the connection portions come into contact with each other, and bonding the connection portions to each other, lamination can be performed, and the connection portions can be bonded to each other using solder bumps and the like.

Example 1

Example 1 relates to imaging elements according to the first and sixth aspects of the present disclosure, the laminated imaging element of the present disclosure, and the solid-state imaging device according to the fourth aspect of the present disclosure.

Figure 2:
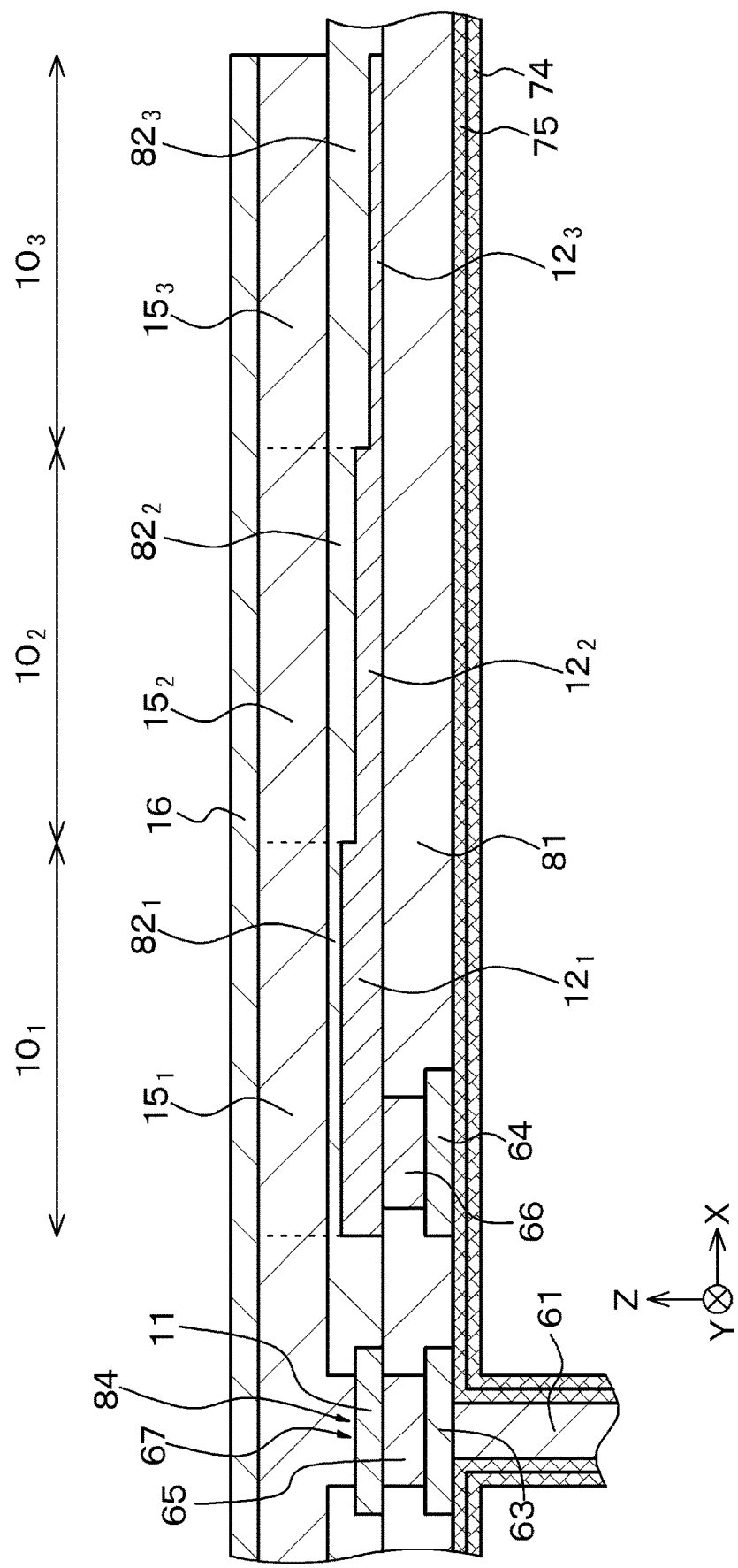
FIG. 2 is a schematic partial cross-sectional view obtained by enlarging a portion where a charge accumulation electrode, a photoelectric conversion layer, and a second electrode are laminated in the imaging element of Example 1.
Figure 3:
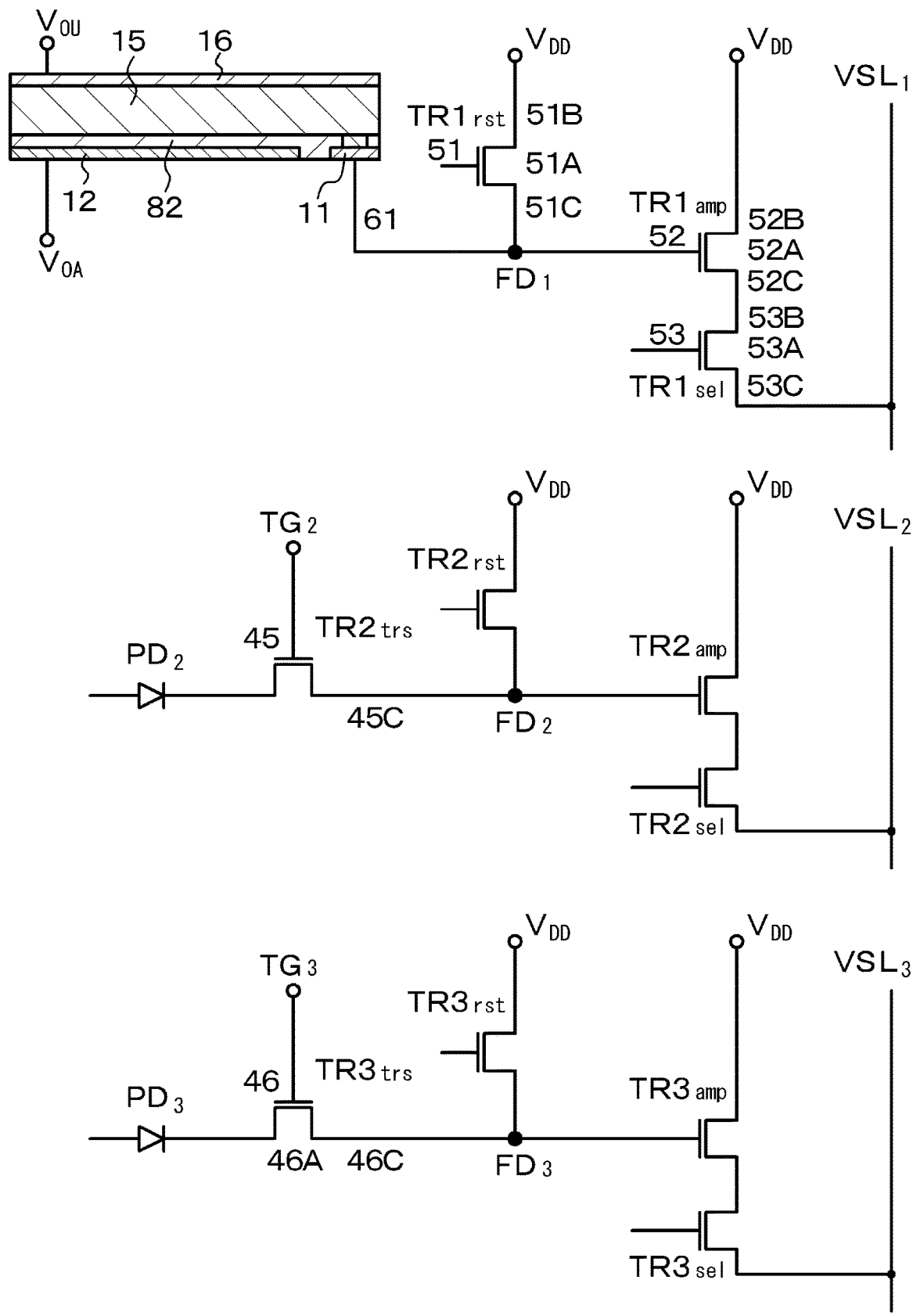
FIG. 3 is an equivalent circuit diagram of the imaging element and the laminated imaging element of Example 1.
Figure 4:
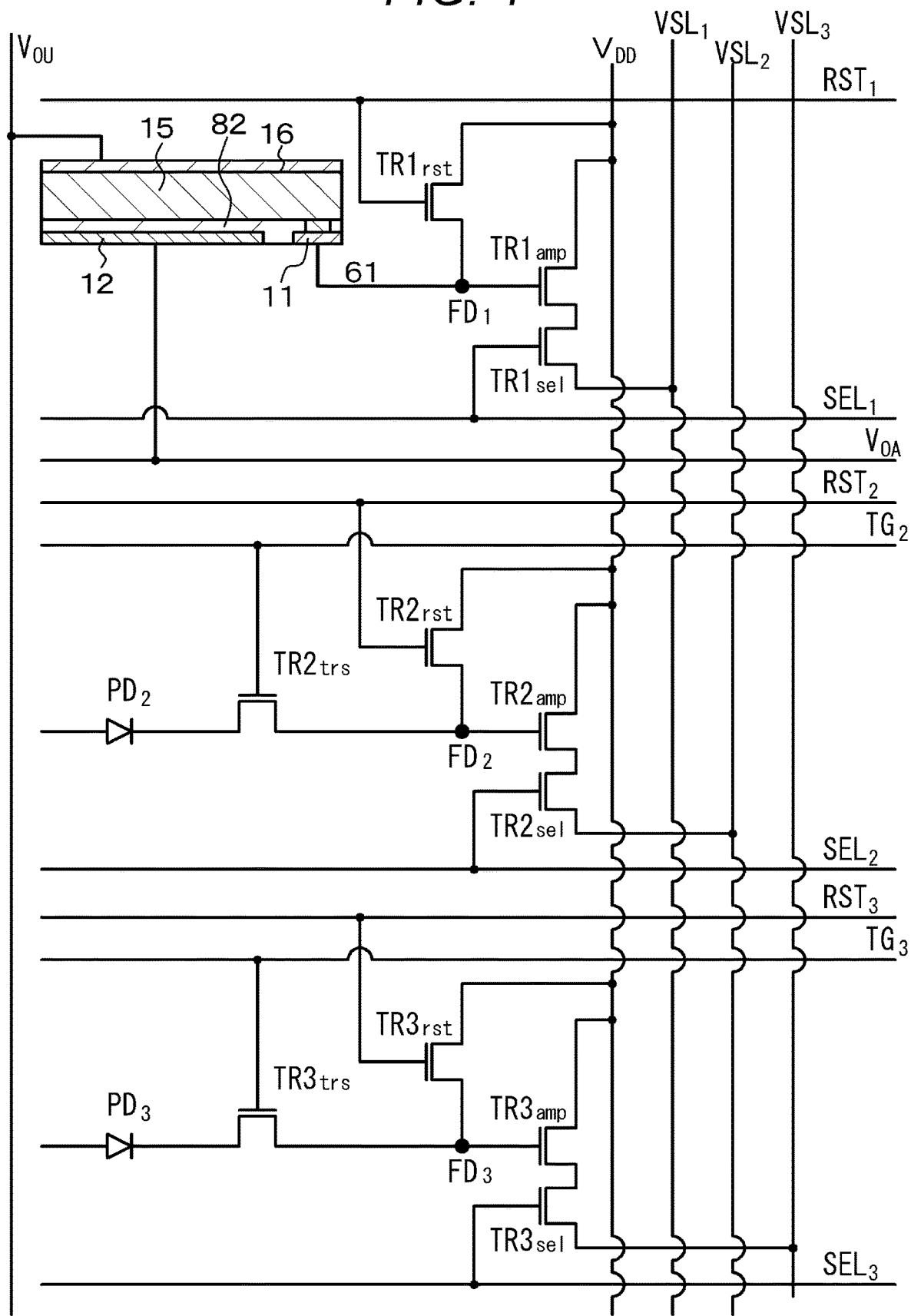
FIG. 4 is an equivalent circuit diagram of the imaging element and the laminated imaging element of Example 1.
Figure 5:
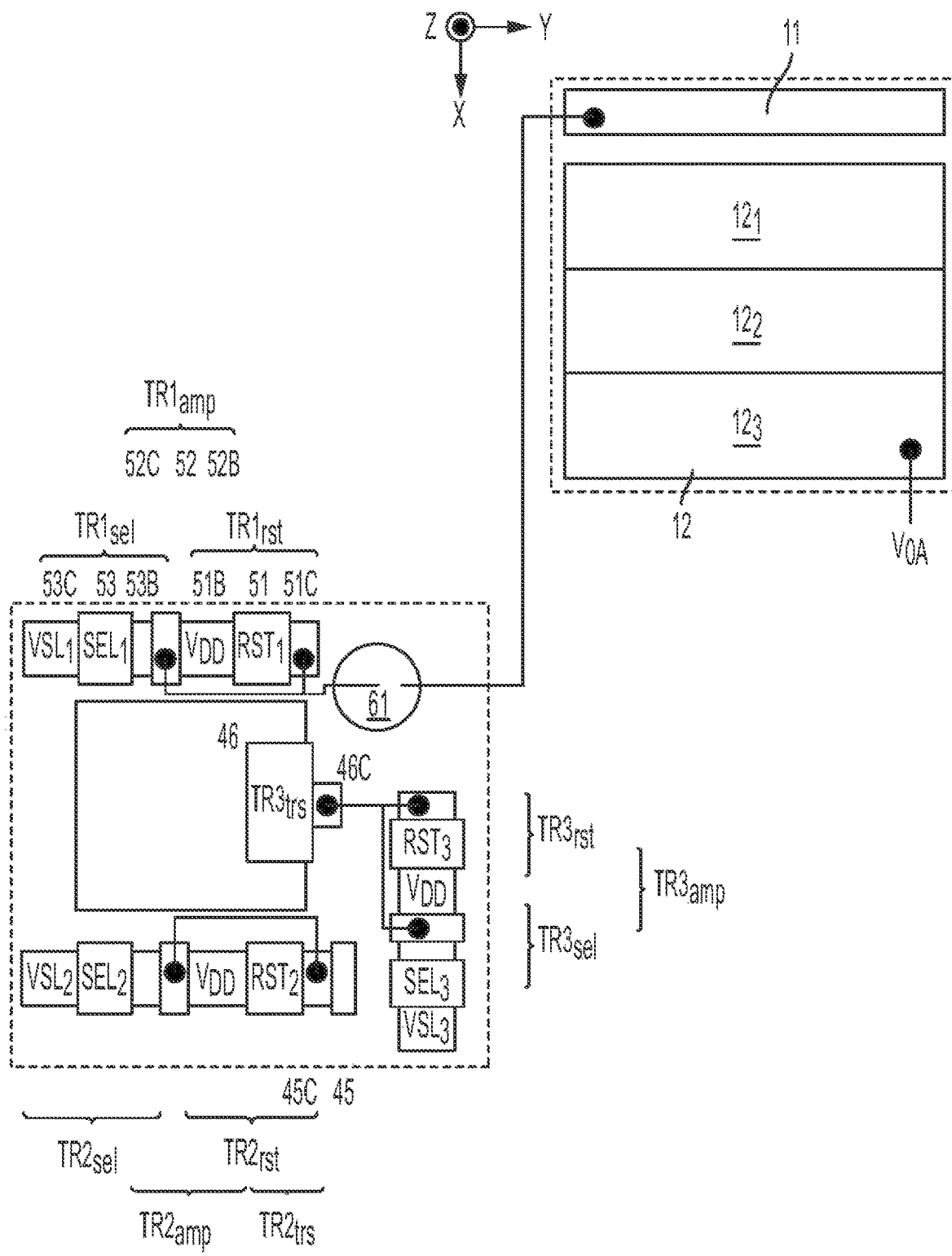
FIG. 5 is a schematic arrangement diagram of a first electrode and a charge accumulation electrode constituting the imaging element of Example 1, and a transistor constituting a control unit.
Figure 6:
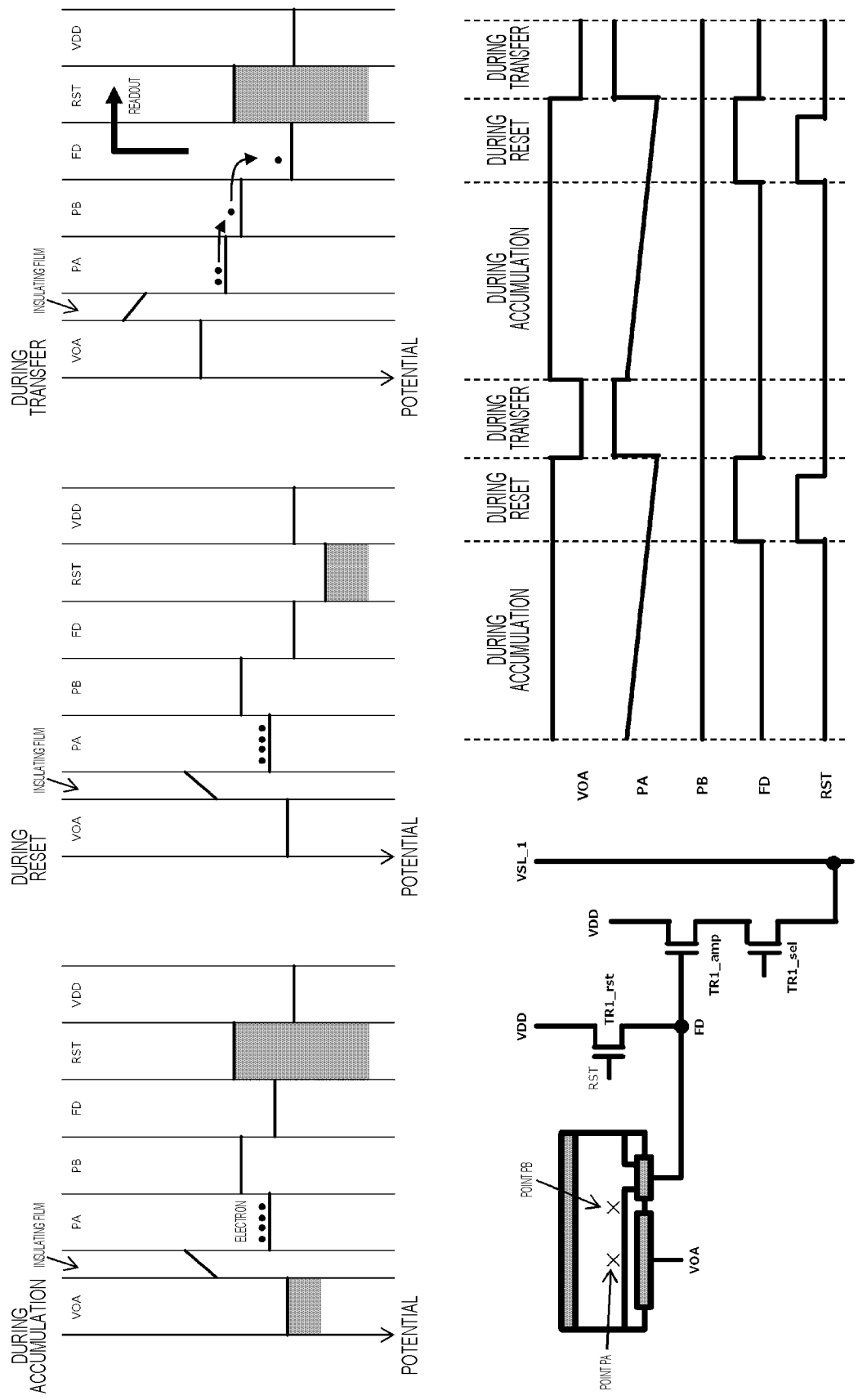
FIG. 6 is a diagram schematically illustrating a potential state at each part during an operation of the imaging element of Example 1.
Figure 7:
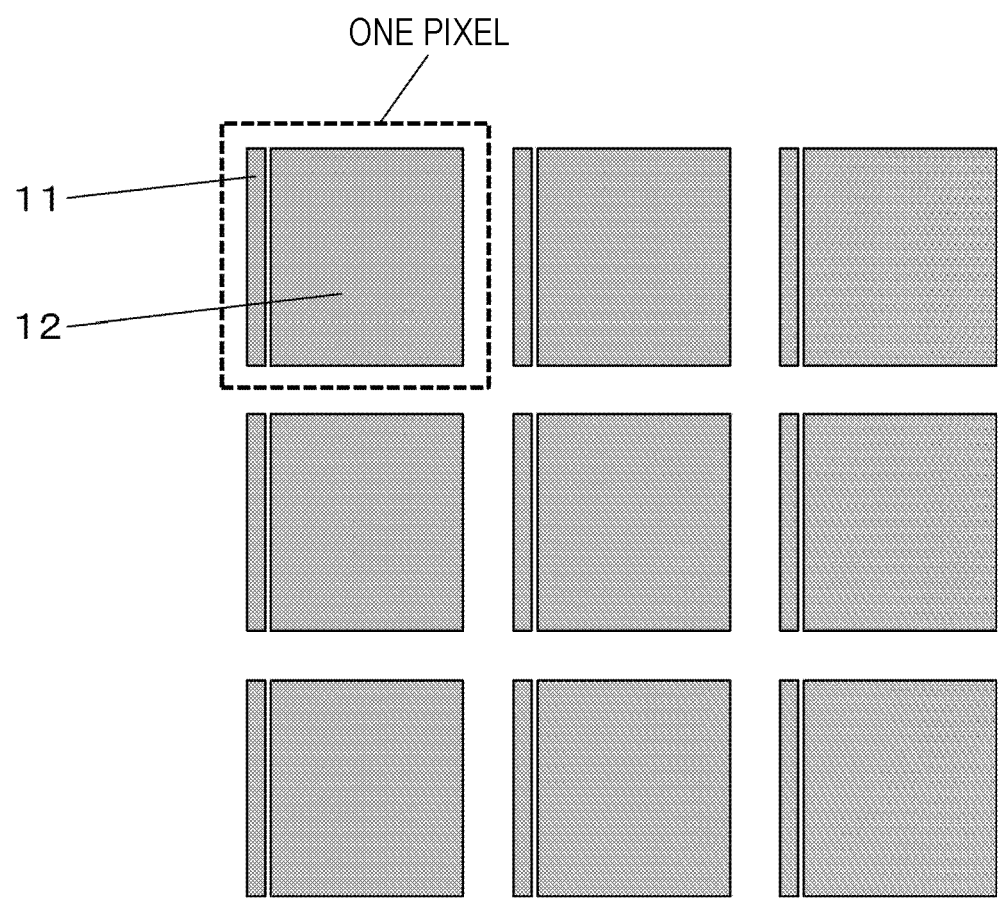
FIG. 7 is a schematic arrangement diagram of a first electrode and a charge accumulation electrode constituting the imaging element of Example 1.
Figure 8:
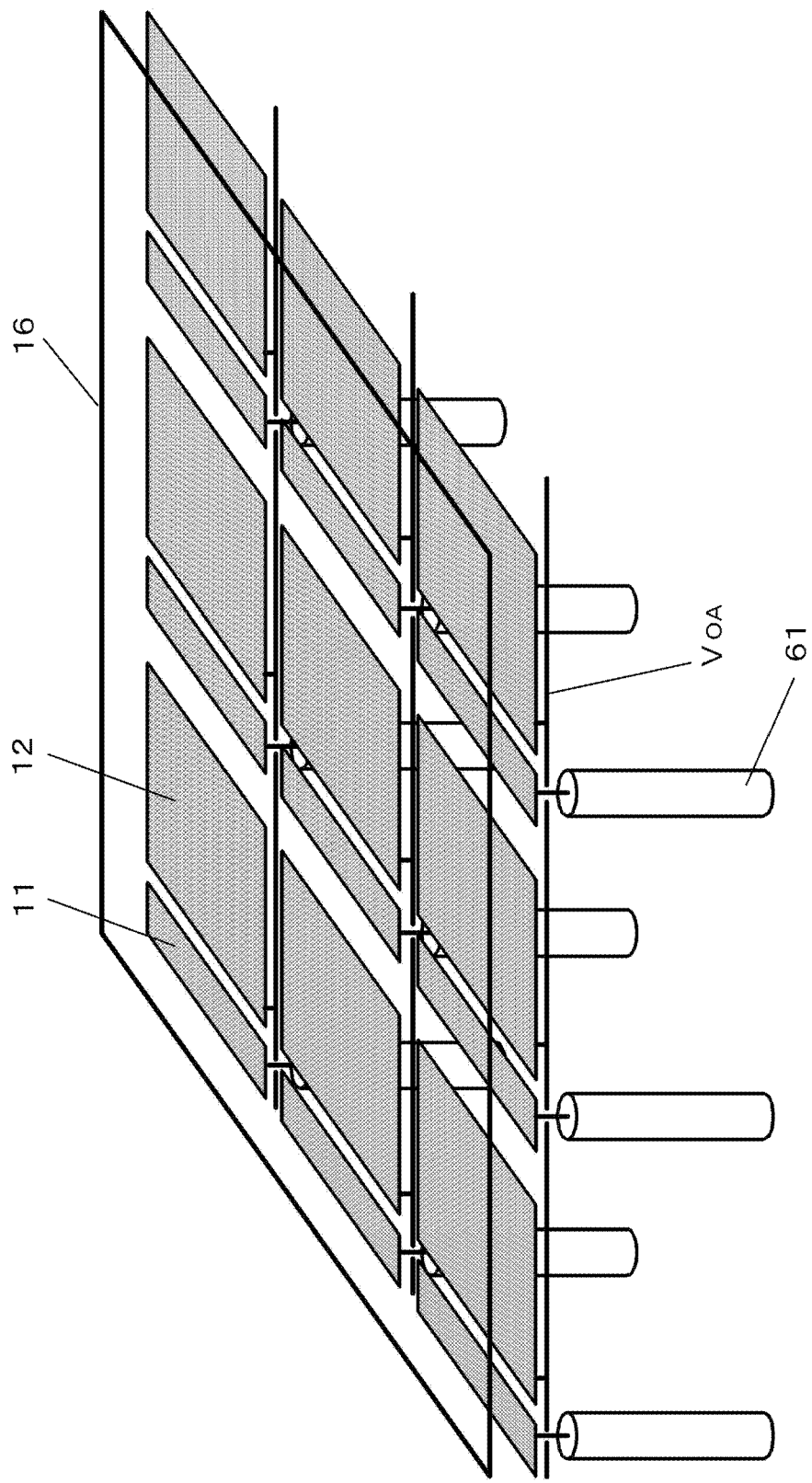
FIG. 8 is a schematic perspective view of a first electrode, a charge accumulation electrode, a second electrode, and a contact hole portion constituting the imaging element of Example 1.
Figure 9:
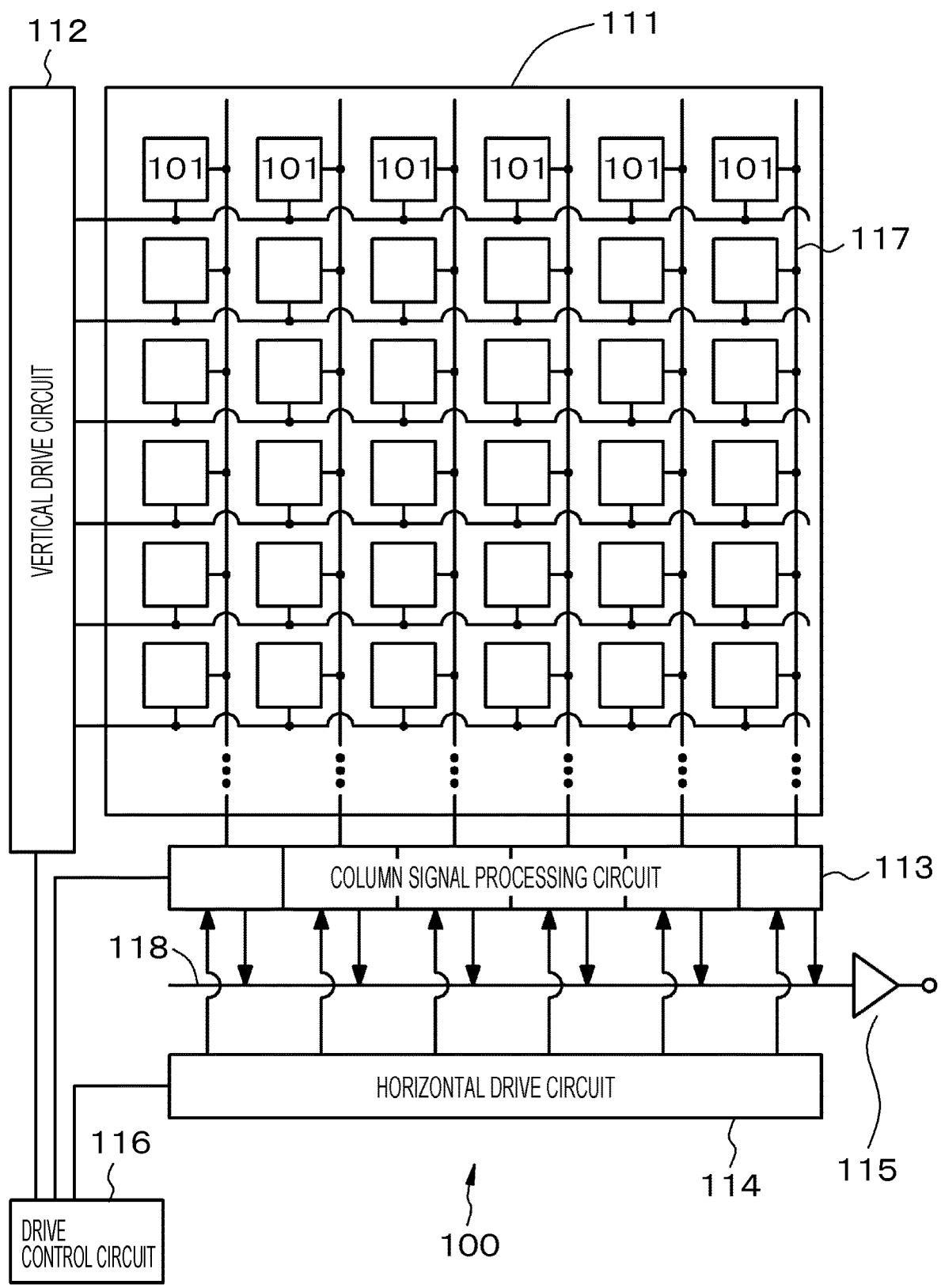
FIG. 9 is a conceptual diagram of a solid-state imaging device of Example 1.

FIG. 1 illustrates a schematic partial cross-sectional view of the imaging element and the laminated imaging element of Example 1. FIG. 2 illustrates a schematic partial cross-sectional view obtained by enlarging a portion where a charge accumulation electrode, a photoelectric conversion layer, and a second electrode are laminated. FIGS. 3 and 4 illustrate an equivalent circuit diagram of the imaging element and the laminated imaging element of Example 1. FIG. 5 illustrates a schematic arrangement diagram of a first electrode and a charge accumulation electrode constituting the imaging element of Example 1, and a transistor constituting a control unit. FIG. 6 schematically illustrates a potential state in each part during operation of the imaging element of Example 1. Furthermore, FIG. 7 illustrates a schematic arrangement diagram of a first electrode and a charge accumulation electrode constituting the imaging element of Example 1. FIG. 8 illustrates a schematic perspective view of a first electrode, a charge accumulation electrode, a second electrode, and a contact hole portion constituting the imaging element of Example 1. FIG. 9 illustrates a conceptual diagram of a solid-state imaging device of Example 1. Note that in FIGS. 3 and 4, the insulating layer segments are illustrated with a constant thickness for simplifying the drawings The imaging element of Example 1 (for example, a green light imaging element described later) or the imaging element of each of Examples 2 to 6 and 9 to 11 described later includes a photoelectric conversion unit formed by laminating a first electrode 11, a photoelectric conversion layer 15, and a second electrode 16. The photoelectric conversion unit further includes a charge accumulation electrode 12 disposed apart from the first electrode 11 so as to face the photoelectric conversion layer 15 via an insulating layer 82.

Furthermore, the laminated imaging element of Example 1 includes at least one of the imaging elements of Examples 1 to 6, and the laminated imaging elements of Examples 1 to 6 each include one of the imaging elements of Example 1.

Moreover, the solid-state imaging device of Example 1 includes a plurality of the laminated imaging elements of Example 1.

Here, in the imaging element of Example 1 or the imaging elements of Examples 2 to 6 and 9 to 11 described later, the photoelectric conversion unit includes N (where N≥2) photoelectric conversion unit segments (specifically, three photoelectric conversion unit segments $10_1$, $10_2$, and $10_3$ in each of Examples), the photoelectric conversion layer 15 includes N photoelectric conversion layer segments (specifically, three photoelectric conversion layer segments $15_1$, $15_2$, and $15_3$ in each of Examples), the insulating layer 82 includes N insulating layer segments (specifically, three insulating layer segments $82_1$, $82_2$, and $82_3$ in each of Examples), in Examples 1 to 3, the charge accumulation electrode 12 includes N charge accumulation electrode segments (specifically, three charge accumulation electrode segments $12_1$, $12_2$, and $12_3$ in each of Examples), in Examples 4 and 5, in some cases, in Example 3, the charge accumulation electrode 12 includes N charge accumulation electrode segments (specifically, three charge accumulation electrode segments $12_1$, $12_2$, and $12_3$ in each of Examples) disposed apart from one another, the n-th (where n=1, 2, 3 . . . N) photoelectric conversion unit segment $10_n$ includes the n-th charge accumulation electrode segment $12_n$, the n-th insulating layer segment $82_n$, and the n-th photoelectric conversion layer segment $15_n$, and a photoelectric conversion unit segment with a larger value of n is located farther from the first electrode 11.

Alternatively, the imaging element of Example 1 or an imaging element of Example 2 or 5 described later includes a photoelectric conversion unit formed by laminating the first electrode 11, the photoelectric conversion layer 15, and the second electrode 16.

The photoelectric conversion unit further includes the charge accumulation electrode 12 disposed apart from the first electrode 11 so as to face the photoelectric conversion layer via the insulating layer 82.

If a lamination direction of the charge accumulation electrode 12, the insulating layer 82, and the photoelectric conversion layer 15 is defined as a Z direction, and a direction of separating from the first electrode 11 is defined as an X direction, when a laminated portion where the charge accumulation electrode 12, the insulating layer 82, and the photoelectric conversion layer 15 are laminated is cut with a YZ virtual plane, the cross-sectional area of the laminated portion changes depending on a distance from the first electrode.

Moreover, in the imaging element of Example 1, the thickness of an insulating layer segment gradually changes from the first photoelectric conversion unit segment $10_1$ to the N-th photoelectric conversion unit segment ION. Specifically, the thickness of an insulating layer segment gradually increases. Alternatively, in the imaging element of Example 1, the width of the cross section of the laminated portion is constant, and the thickness of the cross section of the laminated portion, specifically, the thickness of an insulating layer segment gradually increases depending on a distance from the first electrode 11. Note that the thickness of an insulating layer segment increases stepwise. The thickness of the insulating layer segment 82 in the n-th photoelectric conversion unit segment $10_n$ is constant. When the thickness of the insulating layer segment 82 in the n-th photoelectric conversion unit segment $10_n$ is "1", examples of the thickness of the insulating layer segment $82_{(n+1)}$ in the (n+1)-th photoelectric conversion unit segment $10_{(n+1)}$ include 2 to 10, but are not limited to such values. In Example 1, by gradually reducing the thicknesses of the charge accumulation electrode segments $12_1$, $12_2$, and $12_3$, the thicknesses of the insulating layer segments $82_1$, $82_2$, and $82_3$ are gradually increased. The thicknesses of the photoelectric conversion layer segments $15_1$, $15_2$, and $15_3$ are constant.

In addition, the imaging element of Example 1 or each of the imaging elements of Examples 2 to 6 and 9 to 11 described later further includes a semiconductor substrate (more specifically, a silicon semiconductor layer) 70, and the photoelectric conversion unit is disposed above the semiconductor substrate 70. Furthermore, the imaging element further includes a control unit disposed on the semiconductor substrate 70 and having a drive circuit to which the first electrode 11 is connected. Here, a light incident surface in the semiconductor substrate 70 is defined as an upper side, and the opposite side of the semiconductor substrate 70 is defined as a lower side. A wiring layer 62 including a plurality of wiring lines is disposed below the semiconductor substrate 70. Furthermore, the semiconductor substrate 70 includes at least a floating diffusion layer $FD_1$ and an amplification transistor $TR1_{amp}$ constituting a control unit, and the first electrode 11 is connected to the floating diffusion layer $FD_1$ and a gate portion of the amplification transistor $TR1_{amp}$. The semiconductor substrate 70 further includes a reset transistor $TR1_{rst}$ and a selection transistor $TR1_{sel}$ constituting the control unit. Furthermore, the floating diffusion layer $FD_1$ is connected to one source/drain region of the reset transistor $TR1_{rst}$. One source/drain region of the amplification transistor $TR1_{amp}$ is connected to one source/drain region of the selection transistor $TR1_{sel}$. The other source/drain region of the selection transistor $TR1_{sel}$ is connected to a signal line $VSL_1$. These amplification transistor $TR1_{amp}$, reset transistor $TR1_{rst}$, and selection transistor $TR1_{sel}$ constitute a drive circuit.

Specifically, the imaging element and the laminated imaging element of Example 1 are a backside irradiation type imaging element and a backside irradiation type laminated imaging element, respectively, and each have a structure formed by laminating three imaging elements of a first type green light imaging element of Example 1, including a first type green light photoelectric conversion layer that absorbs green light and sensitive to green light (hereinafter referred to as "first imaging element"), a second type conventional blue light imaging element including a second type blue light photoelectric conversion layer that absorbs blue light and sensitive to blue light (hereinafter referred to as "second imaging element"), and a second type conventional red light imaging element including a second type red light photoelectric conversion layer that absorbs red light and sensitive to red light (hereinafter referred to as "third imaging element"). Here, the red light imaging element (third imaging element) and the blue light imaging element (second imaging element) are disposed in the semiconductor substrate 70, and the second imaging element is located closer to the light incident side than the third imaging element. Furthermore, the green light imaging element (first imaging element) is disposed above the blue light imaging element (second imaging element). One pixel is constituted by the laminated structure of the first imaging element, the second imaging element, and the third imaging element. No color filter is disposed.

In the first imaging element, the first electrode 11 and the charge accumulation electrode 12 are formed on an interlayer insulating layer 81 so as to be separated from each other. The interlayer insulating layer 81 and the charge accumulation electrode 12 are covered with the insulating layer 82. The photoelectric conversion layer 15 is formed on the insulating layer 82, and the second electrode 16 is formed on the photoelectric conversion layer 15. A protective layer 83 is formed on the entire surface including the second electrode 16, and an on-chip micro lens 90 is disposed on the protective layer 83. The first electrode 11, the charge accumulation electrode 12, and the second electrode 16 are each constituted by a transparent electrode containing, for example, ITO (work function: about 4.4 eV). The photoelectric conversion layer 15 is constituted by a layer containing a known organic photoelectric conversion material sensitive to at least green light (for example, an organic material such as a rhodamine-based dye, a meracyanine-based dye, or quinacridone). Furthermore, the photoelectric conversion layer 15 may further include a material layer suitable for charge accumulation. That is, a material layer suitable for charge accumulation may be further formed between the photoelectric conversion layer 15 and the first electrode 11 (for example, in a connection portion 67). The interlayer insulating layer 81, the insulating layer 82, and the protective layer 83 each contain a known insulating material (for example, $SiO_2$ or SiN). The photoelectric conversion layer 15 and the first electrode 11 are connected to each other by the connection portion 67 disposed in the insulating layer 82. In the connection portion 67, the photoelectric conversion layer 15 extends. That is, the photoelectric conversion layer 15 extends in an opening 84 formed in the insulating layer 82 to be connected to the first electrode 11.

The charge accumulation electrode 12 is connected to a drive circuit. Specifically, the charge accumulation electrode 12 is connected to a vertical drive circuit 112 constituting the drive circuit via a connection hole 66, a pad portion 64, and wiring line $V_{OA}$ formed in the interlayer insulating layer 81.

The charge accumulation electrode 12 is larger than the first electrode 11. When the area of the charge accumulation electrode 12 is represented by $S_1'$, and the area of the first electrode 11 is represented by $S_1$, $4 \leq S_1'/S_1$ is preferably satisfied although not limited.

In Example 1, for example, $S_1'/S_1$ was set to 8 although not limited. Note that in Example 1 or Examples 2 to 4 described later, the sizes of three photoelectric conversion unit segments $10_1$, $10_2$, and $10_3$) are the same, and the planar shapes thereof are also the same.

An element isolation region 71 is formed on a first surface (front surface) 70A side of the semiconductor substrate 70. Furthermore, an oxide film 72 is formed on the first surface 70A of the semiconductor substrate 70. Moreover, on the first surface side of the semiconductor substrate 70, the reset transistor $TR1_{rst}$, the amplification transistor $TR1_{amp}$, and the selection transistor $TR1_{sel}$ constituting the control unit of the first imaging element are disposed, and the first floating diffusion layer $FD_1$ is further disposed.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$. One source/drain region 51C of the reset transistor $TR1_{rst}$ also serves as the first floating diffusion layer $FD_1$, and the other source/drain region 51B is connected to a power source $V_{DD}$.

The first electrode 11 is connected to one source/drain region 51C (first floating diffusion layer $FD_1$) of the reset transistor $TR1_{rst}$ via a connection hole 65 and a pad portion 63 formed in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 11 and one source/drain region 51C (first floating diffusion layer $FD_1$) of the reset transistor $TR1_{rst}$ via the wiring layer 62. Furthermore, one source/drain region 52B shares a region with the other source/drain region 51B constituting the reset transistor $TR1_{rst}$ and is connected to the power source $V_{DD}$.

The selection transistor $TR1_{sel}$ includes a gate portion 53, a channel formation region 53A, and source/drain regions 53B and 53C. The gate portion 53 is connected to a selection line $SEL_1$. Furthermore, one source/drain region 53B shares a region with the other source/drain region 52C constituting the amplification transistor $TR1_{amp}$, and the other source/drain region 53C is connected to a signal line (data output line) $VSL_1$ (117).

The second imaging element includes an n-type semiconductor region 41 disposed on the semiconductor substrate 70 as a photoelectric conversion layer. A gate portion 45 of a transfer transistor $TR2_{trs}$ constituted by a vertical transistor extends to the n-type semiconductor region 41 and is connected to a transfer gate line $TG_2$. Furthermore, the second floating diffusion layer $FD_2$ is disposed in a region 45C of the semiconductor substrate 70 near the gate portion 45 of the transfer transistor $TR2_{trs}$. Charges accumulated in the n-type semiconductor region 41 are read out to the second floating diffusion layer $FD_2$ via a transfer channel formed along the gate portion 45.

In the second imaging element, on the first surface side of the semiconductor substrate 70, the reset transistor $TR2_{rst}$, the amplification transistor $TR2_{amp}$, and the selection transistor $TR2_{sel}$ constituting the control unit of the second imaging element are further disposed.

The reset transistor $TR2_{rst}$ includes a gate portion, a channel formation region, and a source/drain region. The gate portion of the reset transistor $TR2_{rst}$ is connected to a reset line $RST_2$. One source/drain region of the reset transistor $TR2_{rst}$ is connected to the power source $V_{DD}$, and the other source/drain region also serves as the second floating diffusion layer $FD_2$.

The amplification transistor $TR2_{amp}$ includes a gate portion, a channel formation region, and a source/drain region. The gate portion is connected to the other source/drain region (second floating diffusion layer $FD_2$) of the reset transistor $TR2_{rst}$. Furthermore, one source/drain region shares a region with one source/drain region constituting the reset transistor $TR2_{rst}$ and is connected to the power source $V_{DD}$.

The selection transistor $TR2_{sel}$ includes a gate portion, a channel formation region, and a source/drain region. The gate portion is connected to a selection line $SEL_2$. Furthermore, one source/drain region shares a region with the other source/drain region constituting the amplification transistor $TR2_{amp}$, and the other source/drain region is connected to a signal line (data output line) $VSL_2$.

The third imaging element includes an n-type semiconductor region 43 disposed on the semiconductor substrate 70 as a photoelectric conversion layer. A gate portion 46 of the transfer transistor $TR3_{trs}$ is connected to a transfer gate line $TG_3$. Furthermore, the third floating diffusion layer $FD_3$ is disposed in a region 46C of the semiconductor substrate 70 near the gate portion 46 of the transfer transistor $TR3_{trs}$. Charges accumulated in the n-type semiconductor region 43 are read out to the third floating diffusion layer $FD_3$ via a transfer channel 46A formed along the gate portion 46.

In the third imaging element, on the first surface side of the semiconductor substrate 70, the reset transistor $TR3_{rst}$, the amplification transistor $TR3_{amp}$, and the selection transistor $TR3_{sel}$ constituting the control unit of the third imaging element are further disposed.

The reset transistor $TR3_{rst}$ includes a gate portion, a channel formation region, and a source/drain region. The gate portion of the reset transistor $TR3_{rst}$ is connected to a reset line $RST_3$. One source/drain region of the reset transistor $TR3_{rst}$ is connected to the power source $V_{DD}$, and the other source/drain region also serves as the third floating diffusion layer $FD_3$.

The amplification transistor $TR3_{amp}$ includes a gate portion, a channel formation region, and a source/drain region. The gate portion is connected to the other source/drain region (third floating diffusion layer $FD_3$) of the reset transistor $TR3_{rst}$. Furthermore, one source/drain region shares a region with one source/drain region constituting the reset transistor $TR3_{rst}$ and is connected to the power source $V_{DD}$.

The selection transistor $TR3_{sel}$ includes a gate portion, a channel formation region, and a source/drain region. The gate portion is connected to the selection line $SEL_3$. Furthermore, one source/drain region shares a region with the other source/drain region constituting the amplification transistor $TR3_{amp}$, and the other source/drain region is connected to a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 constituting a drive circuit, and the signal lines (data output lines) $VSL_1$, $VSL_2$, and $VSL_3$ are connected to a column signal processing circuit 113 constituting the drive circuit.

A $p^+$ layer 44 is disposed between the n-type semiconductor region 43 and the front surface 70A of the semiconductor substrate 70 to suppress generation of a dark current. A $p^+$ layer 42 is formed between the n-type semiconductor region 41 and the n-type semiconductor region 43, and moreover, a part of a side surface of the n-type semiconductor region 43 is surrounded by the $p^+$ layer 42. A $p^+$ layer 73 is formed on a back surface 70B side of the semiconductor substrate 70. An $HfO_2$ film 74 and an insulating film 75 are formed from the $p^+$ layer 73 to a portion where the contact hole portion 61 is to be formed inside the semiconductor substrate 70. In the interlayer insulating layer 76, wiring lines are formed in a plurality of layers, but is not illustrated.

The $HfO_2$ film 74 has negative fixed charges. By forming such a film, generation of a dark current can be suppressed. Note that instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film can be used. Examples of a method for forming these films include a CVD method, a PVD method, and an ALD method.

Hereinafter, with reference to FIG. 6, operation of the imaging element (first imaging element) of Example 1 will be described. Here, the potential of the first electrode 11 is set to be higher than the potential of the second electrode. That is, for example, the first electrode 11 is set to a positive potential, and the second electrode is set to a negative potential. Photoelectric conversion is performed in the photoelectric conversion layer 15, and electrons are read out to the floating diffusion layer. This applies to the other Examples similarly. Note that in the form in which the first electrode 11 is set to a negative potential, the second electrode is set to a positive potential, and holes generated on the basis of photoelectric conversion in the photoelectric conversion layer 15 are read out to the floating diffusion layer, a potential level described below only needs to be reversed.

Figure 21:
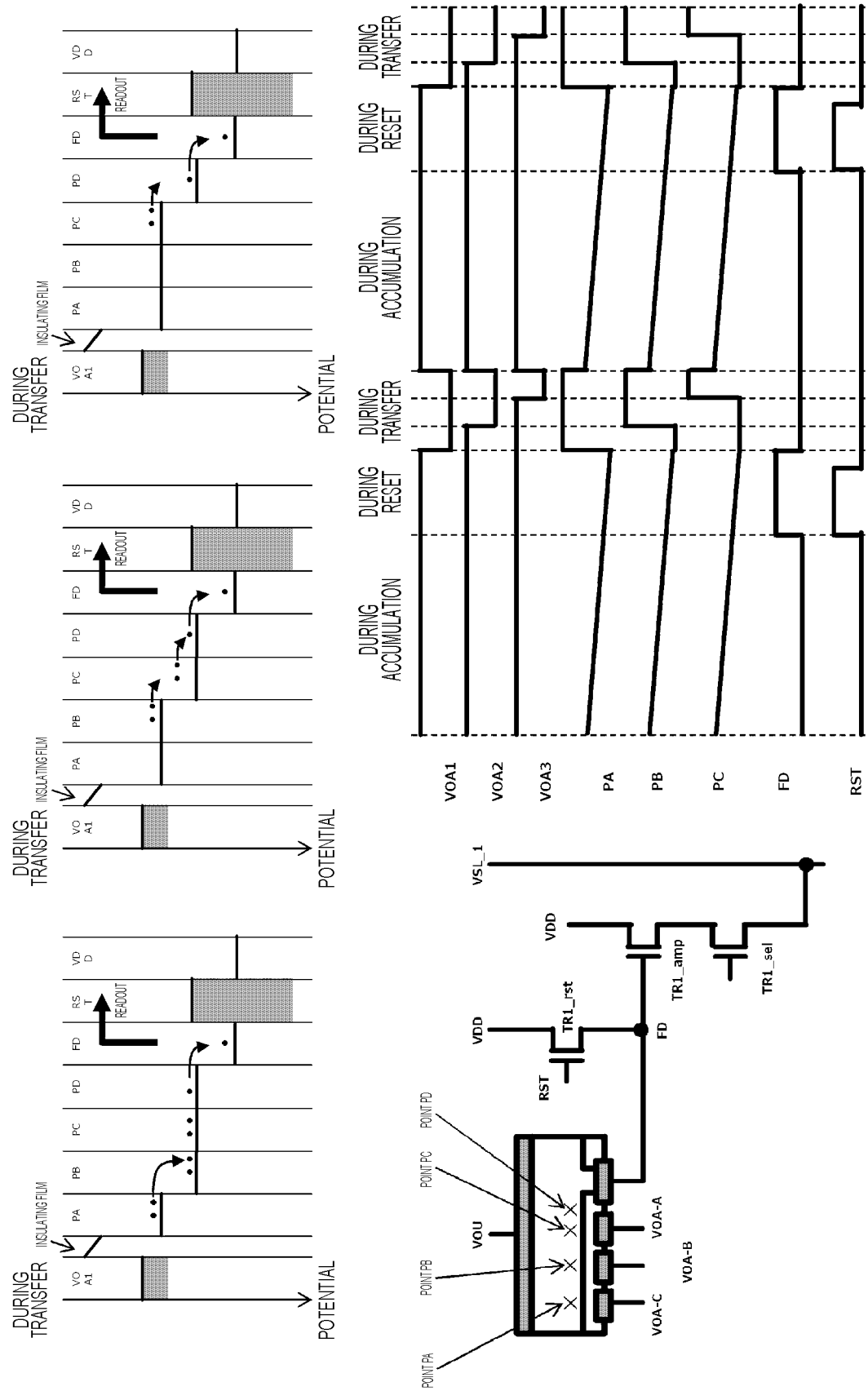
FIG. 21 is a diagram schematically illustrating a potential state at each part during another operation (during transfer) of the imaging element of Example 5.

Reference numerals used in FIG. 6 and FIGS. 20 and 21 in Example 5 described later are as follows.

PA: Potential at point PA in a region of the photoelectric conversion layer 15 facing the charge accumulation electrode 12 or potential at point PA in a region of the photoelectric conversion layer 15 facing the charge accumulation electrode segment $12_3$ PB: Potential at point PB in a region of the photoelectric conversion layer 15 facing a region located between the charge accumulation electrode 12 and the first electrode 11 or potential at point PB in a region of the photoelectric conversion layer 15 facing the charge accumulation electrode segment $12_2$ PC: Potential at point PC in a region of the photoelectric conversion layer 15 facing the first electrode 11 or potential at point PC in a region of the photoelectric conversion layer facing the charge accumulation electrode segment $12_1$ PD: Potential at point PD in a region of the photoelectric conversion layer 15 facing a region located between the charge accumulation electrode segment $12_3$ and the first electrode 11

FD: Potential in the first floating diffusion layer $FD_1$

VOA: Potential in the charge accumulation electrode 12

VOA1: Potential in the first charge accumulation electrode segment $12_1$

VOA2: Potential in the second charge accumulation electrode segment $12_2$

VOA3: Potential in the third charge accumulation electrode segment $12_3$

RST: Potential in the gate portion 51 of the reset transistor $TR1_{rst}$ $V_{DD}$: Potential of power source VSL_1: Signal line (data output line) $VSL_1$ TR1_rst: Reset transistor $TR1_{rst}$ TR1_amp: Amplification transistor $TR1_{amp}$ TR1_sel: Selection transistor $TR1_{sel}$ In a charge accumulation period, the potential $V_{11}$ is applied to the first electrode 11 and the potential $V_{12}$ is applied to the charge accumulation electrode 12 from a drive circuit. Photoelectric conversion occurs in the photoelectric conversion layer 15 by light incident on the photoelectric conversion layer 15. Holes generated by the photoelectric conversion are sent from the second electrode 16 to a drive circuit via the wiring line $V_{OU}$. Meanwhile, the potential of the first electrode 11 is set to be higher than the potential of the second electrode 16, that is, for example, a positive potential is applied to the first electrode 11, and a negative potential is applied to the second electrode 16. Therefore, $V_{12} \geq V_{11}$ is satisfied, preferably $V_{12} \geq V_{11}$ is satisfied. As a result, electrons generated by the photoelectric conversion are attracted to the charge accumulation electrode 12 and stop in a region of the photoelectric conversion layer 15 facing the charge accumulation electrode 12. That is, charges are accumulated in the photoelectric conversion layer 15. Since $V_{12} \geq V_{11}$ is satisfied, electrons generated inside the photoelectric conversion layer 15 are not transferred toward the first electrode 11. As the time for the photoelectric conversion elapses, the potential in the region of the photoelectric conversion layer 15 facing the charge accumulation electrode 12 becomes a more negative value.

In the imaging element of Example 1, the configuration is adopted in which the thickness of an insulating layer segment gradually increases. Therefore, when a state of $|V_{12}| \geq |V_{11}|$ is reached in a charge accumulation period, the n-th photoelectric conversion unit segment $10_n$ can accumulate more charges than the (n+1)-th photoelectric conversion unit segment $10_{(n+1)}$, a stronger electric field is applied to the n-th photoelectric conversion unit segment $10_n$ than to the (n+1)-th photoelectric conversion unit segment $10_{(n+1)}$, and a flow of charges from the first photoelectric conversion unit segment 10 to the first electrode 11 can be reliably prevented.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 11 and the potential $V_{22}$ is applied to the charge accumulation electrode 12 from a drive circuit. Here, $V_{22} < V_{21}$ is satisfied. As a result, electrons that have stopped in the region of the photoelectric conversion layer 15 facing the charge accumulation electrode 12 are read out to the first electrode 11 and further to the first floating diffusion layer $FD_1$. That is, the charges accumulated in the photoelectric conversion layer 15 are read out to the control unit.

More specifically, when a state of $V_{22} < V_{21}$ is reached in a charge transfer period, a flow of charges from the first photoelectric conversion unit segment $10_1$ to the first electrode 11, and a flow of charges from the (n+1)-th photoelectric conversion unit segment $10_{(n+1)}$ to the n-th photoelectric conversion unit segment $10_n$ can be reliably ensured.

In this way, a series of operations including charge accumulation, reset operation, and charge transfer are completed.

The operations of the amplification transistor $TR1_{amp}$ and the selection transistor $TR1_{sel}$ after electrons are read out to the first floating diffusion layer $FD_1$ are the same as the conventional operations of these transistors. Furthermore, a series of operations including charge accumulation, reset operation, and charge transfer of the second imaging element and the third imaging element are similar to a conventional series of operations including charge accumulation, reset operation, and charge transfer. Furthermore, a reset noise of the first floating diffusion layer $FD_1$ can be removed by a correlated double sampling (CDS) process as in prior art.

As described above, in Example 1, or in the imaging elements of Examples 1 to 6 and 9 to 11 described later, since the charge accumulation electrode is included which is disposed apart from the first electrode so as to face the photoelectric conversion layer via the insulating layer, when the photoelectric conversion unit is irradiated with light, and the light is photoelectrically converted in the photoelectric conversion unit, the photoelectric conversion layer, the insulating layer, and the charge accumulation electrode form a kind of capacitor, and charges of the photoelectric conversion layer can be stored. Therefore, at the time of start of exposure, a charge accumulation portion can be completely depleted and the charge can be erased. As a result, it is possible to suppress occurrence of a phenomenon that a kTC noise increases, a random noise deteriorates, and the quality of an imaged image deteriorates. Furthermore, since all the pixels can be reset all at once, a so-called global shutter function can be achieved.

In addition, in the imaging element of Example 1, the thickness of an insulating layer segment gradually changes from the first photoelectric conversion unit segment to the N-th photoelectric conversion unit segment. Alternatively, when a laminated portion where the charge accumulation electrode, the insulating layer, and the photoelectric conversion layer are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

FIG. 9 is a conceptual diagram of the solid-state imaging device of Example 1. A solid-state imaging device 100 of Example 1 includes an imaging region 111 in which the laminated imaging elements 101 are arrayed two-dimensionally, and the vertical drive circuit 112, the column signal processing circuit 113, a horizontal drive circuit 114, an output circuit 115, a drive control circuit 116, and the like as drive circuits (peripheral circuits) of the laminated imaging elements 101. Note that it is not necessary to say that these circuits may include well-known circuits, and also can be formed using other circuit structures (for example, various circuits used in a conventional CCD solid-state imaging device or a CMOS solid-state imaging device). Note that in FIG. 9, the reference number "101" of the laminated imaging element 101 is displayed only in one row.

The drive control circuit 116 generates a clock signal or a control signal as a reference of operations of the vertical drive circuit 112, the column signal processing circuit 113, and the horizontal drive circuit 114 on the basis of a vertical synchronizing signal, a horizontal synchronizing signal, and a master clock. Then, the generated clock signal or control signal is input to the vertical drive circuit 112, the column signal processing circuit 113, and the horizontal drive circuit 114.

For example, the vertical drive circuit 112 is constituted by a shift register, and sequentially selects and scans the laminated imaging elements 101 in the imaging region 111 in a row unit in the vertical direction. Then, a pixel signal (image signal) based on a current (signal) generated according to the amount of light received by each of the laminated imaging elements 101 is sent to the column signal processing circuit 113 via a signal line (data output line) 117, VSL.

For example, the column signal processing circuit 113 is disposed for each column of the laminated imaging elements 101. Image signals output from the laminated imaging elements 101 in one row are subjected to signal processing such as noise removal or signal amplification with a signal from a black reference pixel (not illustrated, but formed around an effective pixel region) for each of the imaging elements. In an output stage of the column signal processing circuit 113, a horizontal selection switch (not illustrated) is connected and disposed between the column signal processing circuit 113 and a horizontal signal line 118.

For example, the horizontal drive circuit 114 is constituted by a shift register. By sequentially outputting a horizontal scanning pulse, the horizontal drive circuit 114 sequentially selects each of the column signal processing circuits 113, and outputs a signal from each of the column signal processing circuits 113 to the horizontal signal line 118.

The output circuit 115 performs signal processing to a signal sequentially supplied from each of the column signal processing circuits 113 via the horizontal signal line 118, and outputs the signal.

Figure 10:
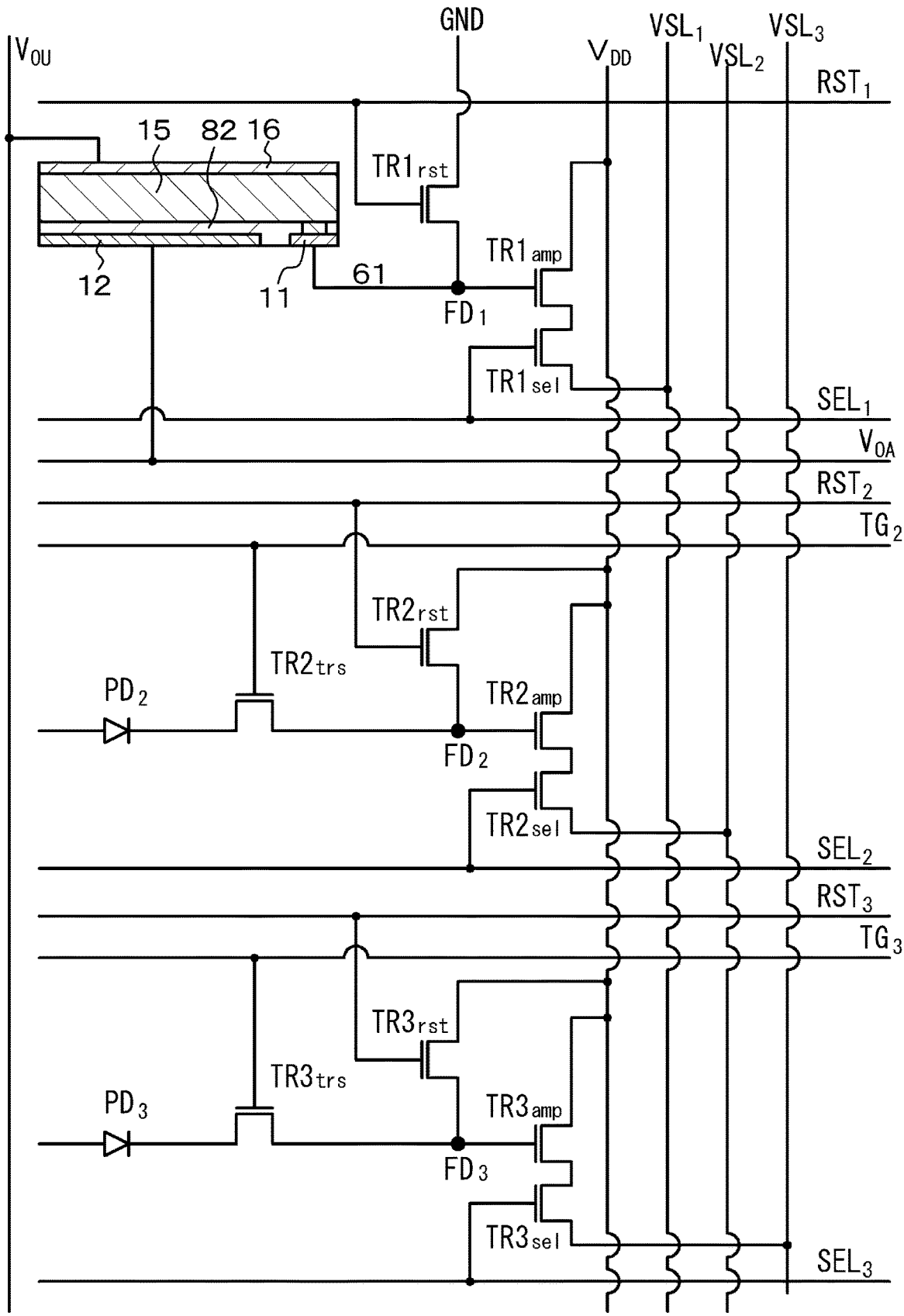
FIG. 10 is an equivalent circuit diagram of a modification of the imaging element and the laminated imaging element of Example 1.
Figure 11:
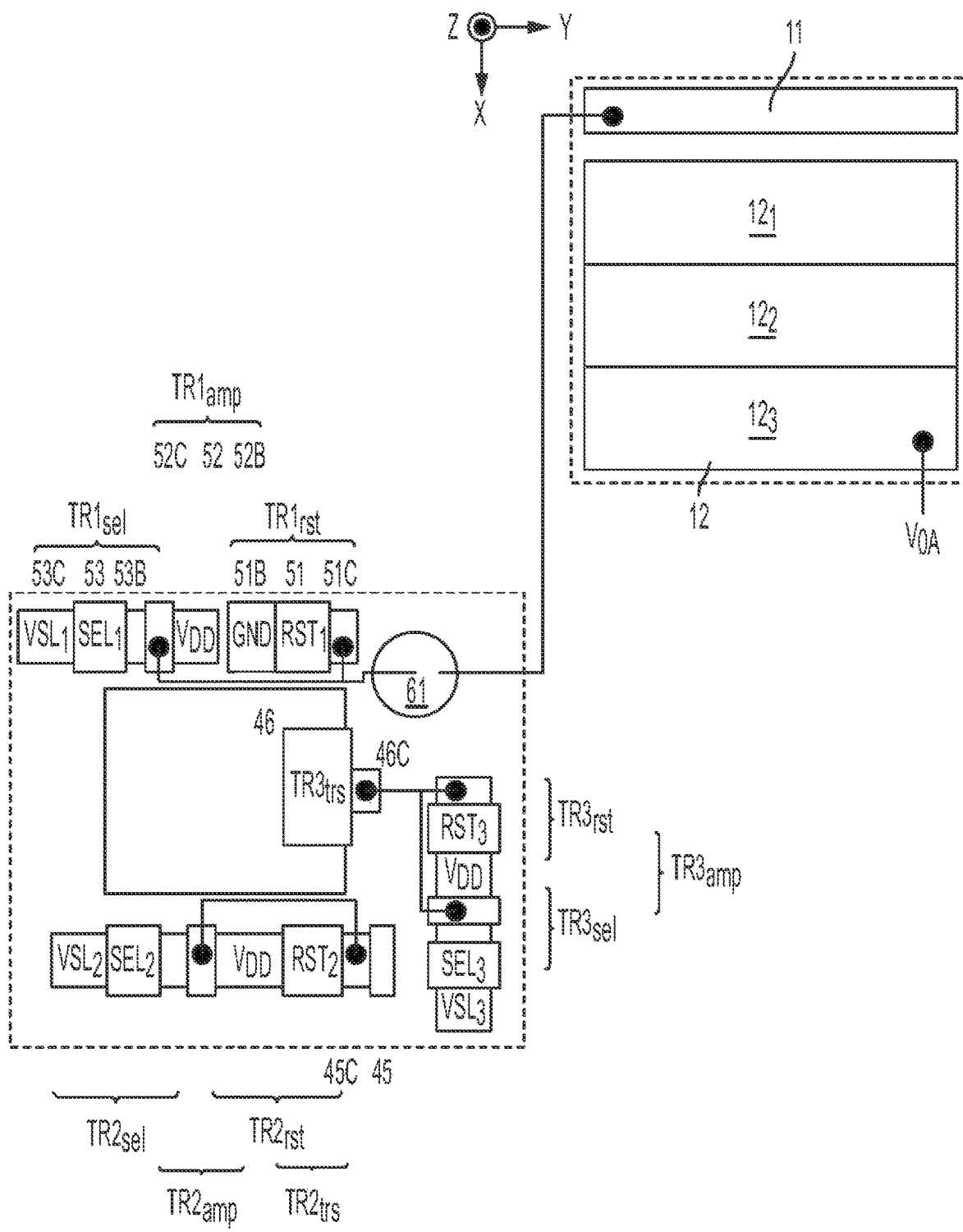
FIG. 11 is a schematic arrangement diagram of a first electrode and a charge accumulation electrode constituting the modification of the imaging element of Example 1 illustrated in FIG. 10, and a transistor constituting a control unit.

As FIG. 10 illustrates an equivalent circuit diagram of a modification of the imaging element and the laminated imaging element of Example 1, and FIG. 11 illustrates a schematic arrangement diagram of the first electrode and the charge accumulation electrode constituting a modification of the imaging element of Example 1, and a transistor constituting the control unit, the other source/drain region 51B of the reset transistor $TR1_{rst}$ may be grounded instead of being connected to the power source $V_{DD}$.

The imaging element and the laminated imaging element of Example 1 can be manufactured, for example, by the following method. That is, first, an SOI substrate is prepared. Then, a first silicon layer is formed on a surface of the SOI substrate on the basis of an epitaxial growth method, and the $p^+$ layer 73 and the n-type semiconductor region 41 are formed on the first silicon layer. Subsequently, a second silicon layer is formed on the first silicon layer on the basis of an epitaxial growth method, and the element isolation region 71, the oxide film 72, $p^+$ layer 42, the n-type semiconductor region 43, and the $p^+$ layer 44 are formed on the second silicon layer. Furthermore, various transistors and the like constituting the control unit of the imaging element are formed on the second silicon layer. The wiring layer 62, the interlayer insulating layer 76, and various wiring lines are further formed thereon, and then the interlayer insulating layer 76 is bonded to a support substrate (not illustrated). Thereafter, the SOI substrate is removed to expose the first silicon layer. Note that the surface of the second silicon layer corresponds to the front surface 70A of the semiconductor substrate 70, and the surface of the first silicon layer corresponds to the back surface 70B of the semiconductor substrate 70. Furthermore, the first silicon layer and the second silicon layer are collectively expressed as the semiconductor substrate 70. Subsequently, an opening for forming the contact hole portion 61 is formed on the back surface 70B side of the semiconductor substrate 70. The $HfO_2$ film 74, the insulating film 75, and the contact hole portion 61 are formed. The pad portions 63 and 64, the interlayer insulating layer 81, the connection holes 65 and 66, the first electrode 11, the charge accumulation electrode 12, and the insulating layer 82 are further formed. Next, the connection portion 67 is opened, and the photoelectric conversion layer 15, the second electrode 16, the protective layer 83, and the on-chip micro lens 90 are formed. As described above, the imaging element and the laminated imaging element of Example 1 can be obtained.

In the imaging element of Example 1, in formation of the first electrode 11, the charge accumulation electrode 12, and the insulating layer 82, first, a conductive material layer for forming the charge accumulation electrode $12_3$ is formed on the interlayer insulating layer 81. The conductive material layer is patterned to leave the conductive material layer in a region where the photoelectric conversion unit segments $10_1$, $10_2$, and $10_3$ and the first electrode 11 are to be formed. Thus, a part of the first electrode 11 and the charge accumulation electrode $12_3$ can be obtained. Next, an insulating layer for forming the insulating layer segment $82_3$ is formed on the entire surface. The insulating layer is patterned and planarized to obtain the insulating layer segment $82_3$. Next, a conductive material layer for forming the charge accumulation electrode $12_2$ is formed on the entire surface. The conductive material layer is patterned to leave the conductive material layer in a region where the photoelectric conversion unit segments $10_1$ and $10_2$ and the first electrode 11 are to be formed. Thus, a part of the first electrode 11 and the charge accumulation electrode $12_2$ can be obtained. Next, an insulating layer for forming the insulating layer segment $82_2$ is formed on the entire surface. The insulating layer is patterned and planarized to obtain the insulating layer segment $82_2$. Next, a conductive material layer for forming the charge accumulation electrode $12_1$ is formed on the entire surface. The conductive material layer is patterned to leave the conductive material layer in a region where the photoelectric conversion unit segments $10_1$ and the first electrode 11 are to be formed. Thus, a part of the first electrode 11 and the charge accumulation electrode $12_1$ can be obtained. Next, an insulating layer is formed on the entire surface. The insulating layer is planarized to obtain the insulating layer segment $82_1$ (insulating layer 82). Then, the photoelectric conversion layer 15 is formed on the insulating layer 82. In this way, the photoelectric conversion unit segments $10_1$, $10_2$, and $10_3$ can be obtained.

Example 2

Figure 12:
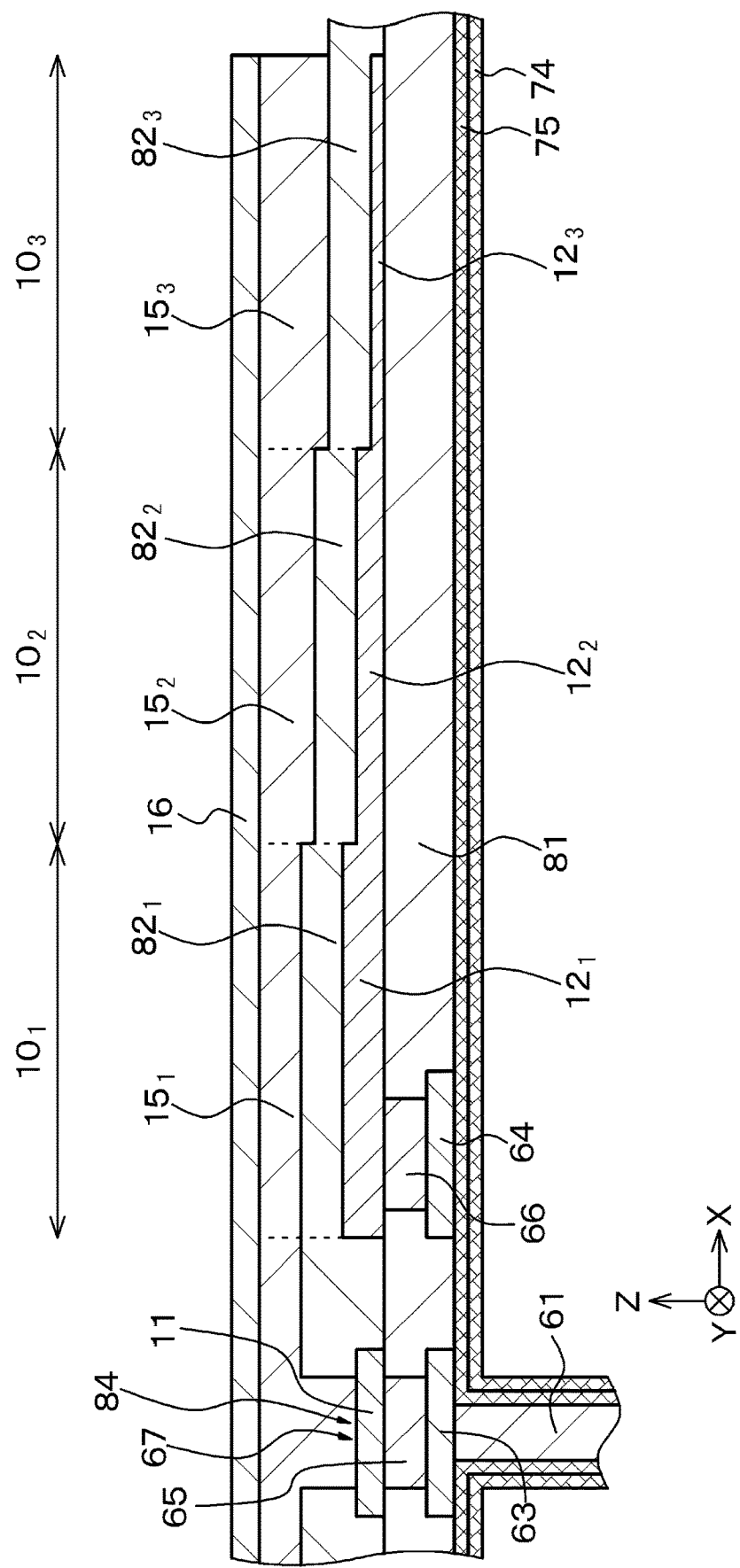
FIG. 12 is a schematic partial cross-sectional view obtained by enlarging a portion where a charge accumulation electrode, a photoelectric conversion layer, and a second electrode are laminated in the imaging element of Example 2.

The imaging element of Example 2 relates to the imaging elements according to the second and sixth aspects of the present disclosure. As FIG. 12 illustrates a schematic partial cross-sectional view in which a portion where the charge accumulation electrode, the photoelectric conversion layer, and the second electrode are laminated is enlarged, in the imaging element of Example 2, the thickness of a photoelectric conversion layer segment gradually changes from the first photoelectric conversion unit segment $10_1$ to the N-th photoelectric conversion unit segment ION. Alternatively, in the imaging element of Example 2, the width of the cross section of the laminated portion is constant, and the thickness of the cross section of the laminated portion, specifically, the thickness of a photoelectric conversion layer segment gradually increases depending on a distance from the first electrode 11. More specifically, the thickness of a photoelectric conversion layer segment gradually increases. Note that the thickness of a photoelectric conversion layer segment increases stepwise. The thickness of the photoelectric conversion layer segment $15_n$ in the n-th photoelectric conversion unit segment In is constant. When the thickness of the photoelectric conversion layer segment $15_n$ in the n-th photoelectric conversion unit segment $10_n$ is "1", examples of the photoelectric conversion layer segment $15_{(n+1)}$ in the (n+1)-th photoelectric conversion unit segment $10_{(n+1)}$ include 2 to 10, but are not limited to such values. In Example 2, by gradually reducing the thicknesses of the charge accumulation electrode segments $12_1$, $12_2$, and $12_3$, the thicknesses of the photoelectric conversion layer segments $15_1$, $15_2$, and $15_3$ are gradually increased. The thicknesses of the insulating layer segments $82_1$, $82_2$, and $82_3$ are constant.

In the imaging element of Example 2, the thickness of a photoelectric conversion layer segment gradually increases. Therefore, when a state of $|V_{12}| \geq |V_{11}|$ is reached in a charge accumulation period, a stronger electric field is applied to the n-th photoelectric conversion unit segment In than to the (n+1)-th photoelectric conversion unit segment $10_{(n+1)}$, and a flow of charges from the first photoelectric conversion unit segment $10_1$ to the first electrode 11 can be reliably prevented. Then, when a state of $V_{22} < V_{21}$ is reached in a charge transfer period, a flow of charges from the first photoelectric conversion unit segment $10_1$ to the first electrode 11, and a flow of charges from the (n+1)-th photoelectric conversion unit segment $10_{(n+1)}$ to the n-th photoelectric conversion unit segment $10_n$ can be reliably ensured.

In this way, in the imaging element of Example 2, the thickness of a photoelectric conversion layer segment gradually changes from the first photoelectric conversion unit segment to the N-th photoelectric conversion unit segment. Alternatively, when a laminated portion where the charge accumulation electrode, the insulating layer, and the photoelectric conversion layer are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

In the imaging element of Example 2, in formation of the first electrode 11, the charge accumulation electrode 12, the insulating layer 82, and the photoelectric conversion layer 15, first, a conductive material layer for forming the charge accumulation electrode $12_3$ is formed on the interlayer insulating layer 81. The conductive material layer is patterned to leave the conductive material layer in a region where the photoelectric conversion unit segments $10_1$, $10_2$, and $10_3$ and the first electrode 11 are to be formed. Thus, a part of the first electrode 11 and the charge accumulation electrode $12_3$ can be obtained. Subsequently, a conductive material layer for forming the charge accumulation electrode $12_2$ is formed on the entire surface. The conductive material layer is patterned to leave the conductive material layer in a region where the photoelectric conversion unit segments $10_1$ and $10_2$ and the first electrode 11 are to be formed. Thus, a part of the first electrode 11 and the charge accumulation electrode $12_2$ can be obtained. Subsequently, a conductive material layer for forming the charge accumulation electrode $12_1$ is formed on the entire surface. The conductive material layer is patterned to leave the conductive material layer in a region where the photoelectric conversion unit segments $10_1$ and the first electrode 11 are to be formed. Thus, a part of the first electrode 11 and the charge accumulation electrode $12_1$ can be obtained. Next, the insulating layer 82 is conformally formed on the entire surface. Then, the photoelectric conversion layer 15 is formed on the insulating layer 82, and the photoelectric conversion layer 15 is planarized. In this way, the photoelectric conversion unit segments $10_1$, $10_2$, and $10_3$ can be obtained.

Example 3

Figure 13:
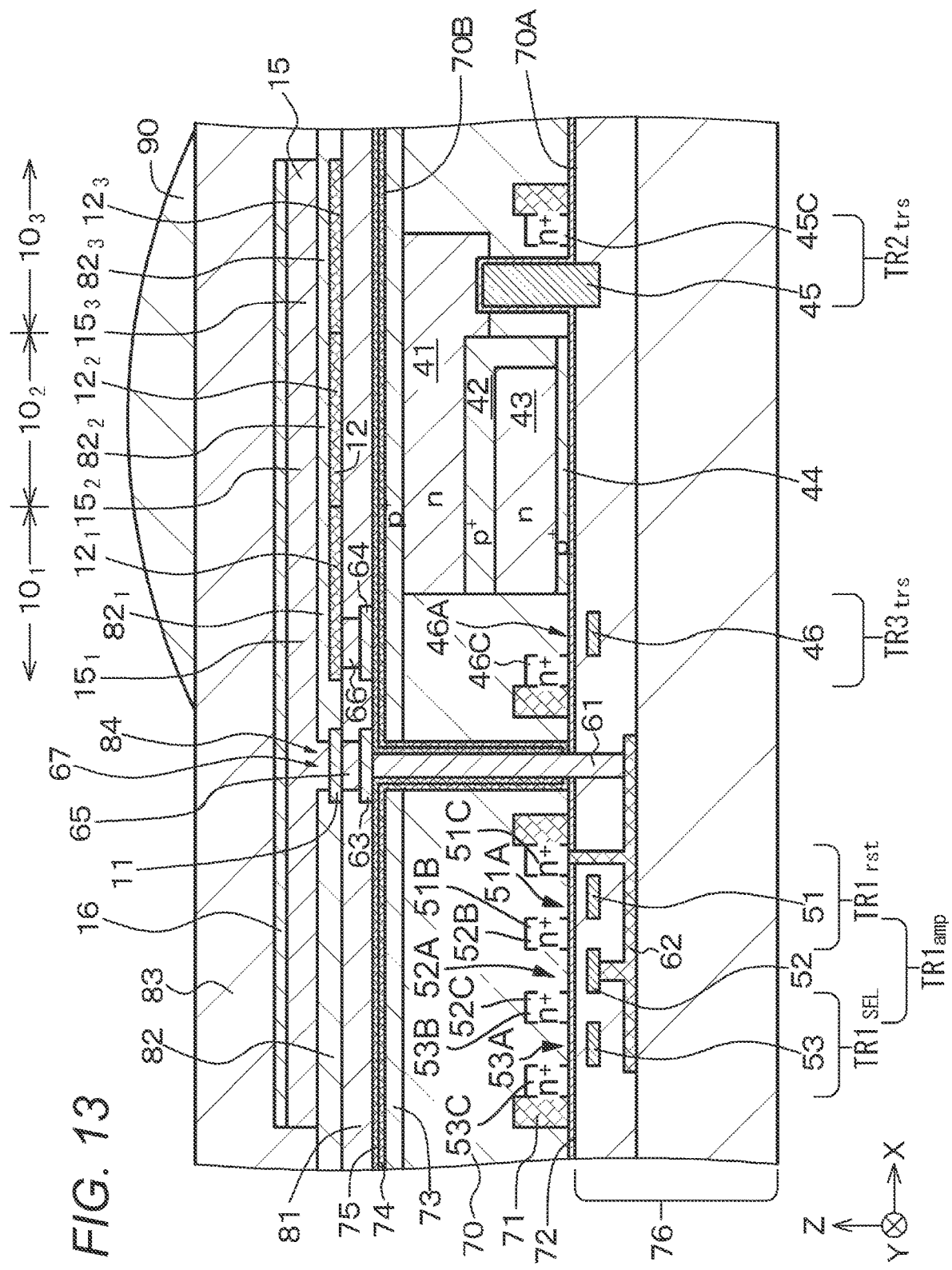
FIG. 13 is a schematic partial cross-sectional view of an imaging element and a laminated imaging element of Example 3.

Example 3 relates to an imaging element according to the third aspect of the present disclosure. FIG. 13 illustrates a schematic partial cross-sectional view of the imaging element and the laminated imaging element of Example 3. In the imaging element of Example 3, materials constituting an insulating layer segment are different between adjacent photoelectric conversion unit segments. Here, a value of the relative dielectric constant of a material constituting an insulating layer segment is gradually reduced from the first photoelectric conversion unit segment $10_1$ to the N-th photoelectric conversion unit segment ION. In the imaging element of Example 3, the same potential may be applied to all the N charge accumulation electrode segments, or different potentials may be applied to the respective N charge accumulation electrode segments. In the latter case, as described in Example 4, the charge accumulation electrode segments $12_1$, $12_2$, and $12_3$ disposed apart from one another only need to be connected to the vertical drive circuit 112 constituting a drive circuit via pad portions $64_1$, $64_2$, and $64_3$.

Then, by adopting such a configuration, a kind of charge transfer gradient is formed. In a charge accumulation period, when a state of $V_{12} \geq V_{11}$ is reached, the n-th photoelectric conversion unit segment can accumulate more charges than the (n+1)-th photoelectric conversion unit segment. Then, when a state of $V_{22}<V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

Example 4

Figure 14:
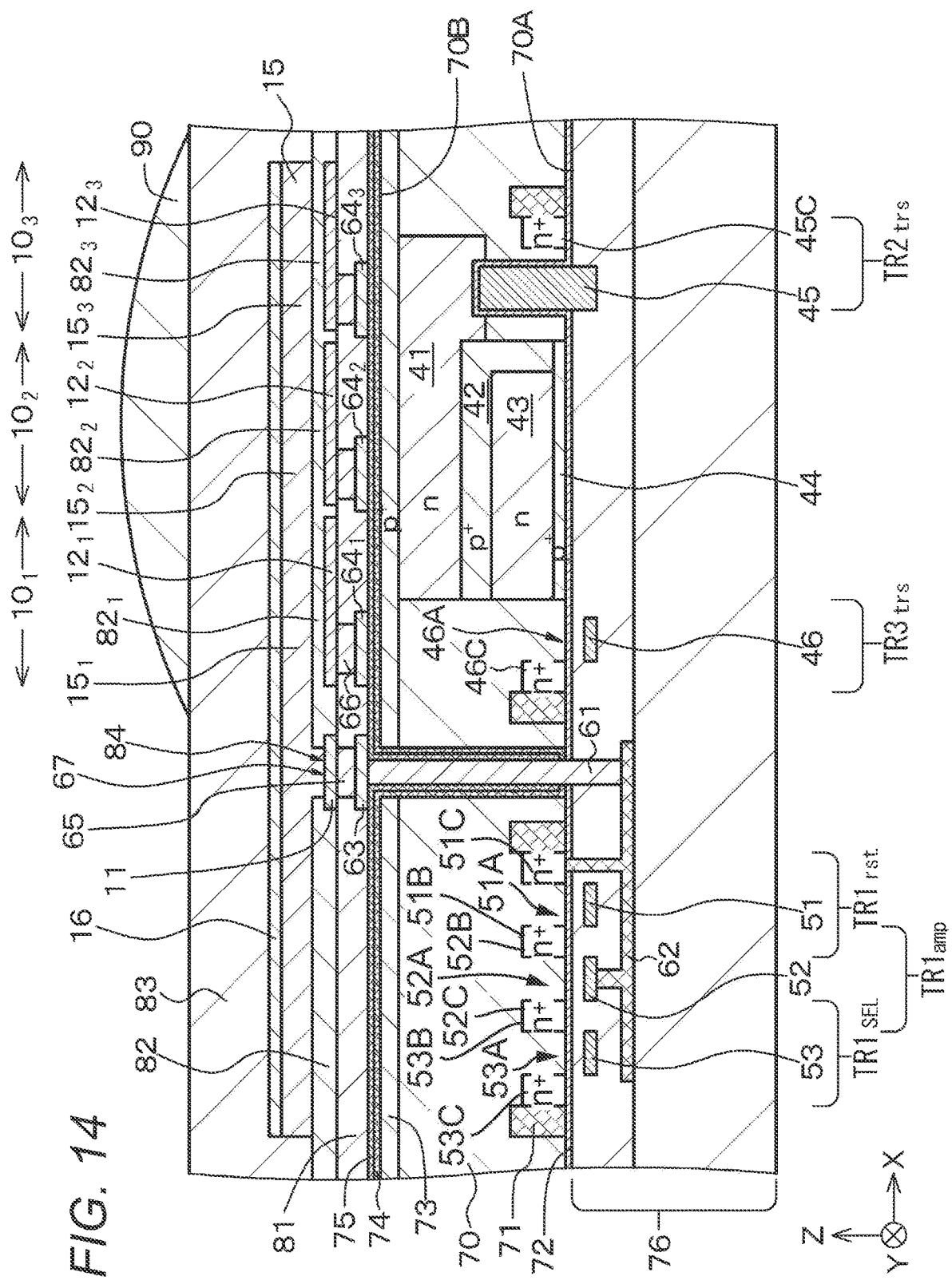
FIG. 14 is a schematic partial cross-sectional view of an imaging element and a laminated imaging element of each of Examples 4 and 5.
Figure 15A:
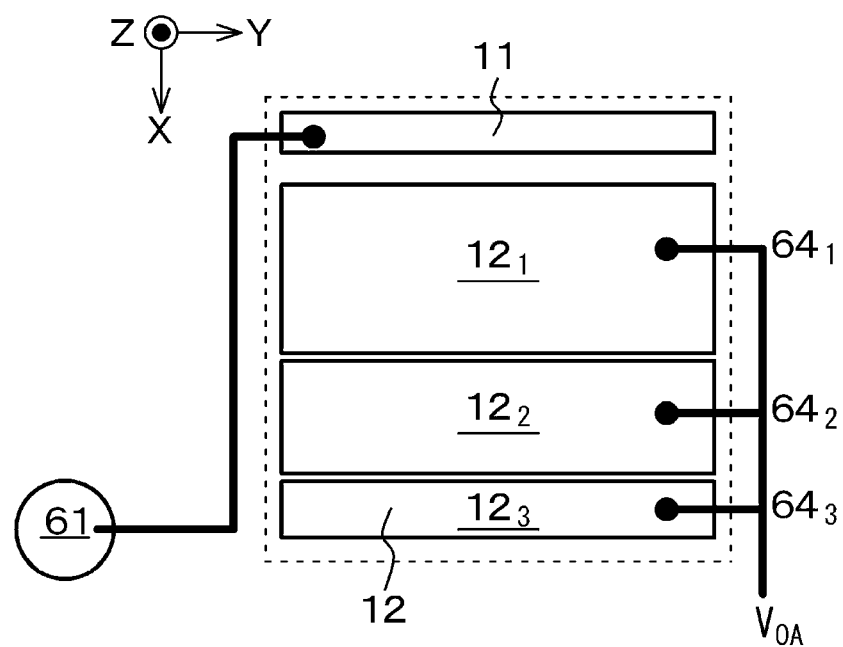
FIGS. 15A and 15B are schematic plan views of charge accumulation electrode segments in Example 5.
Figure 15B:
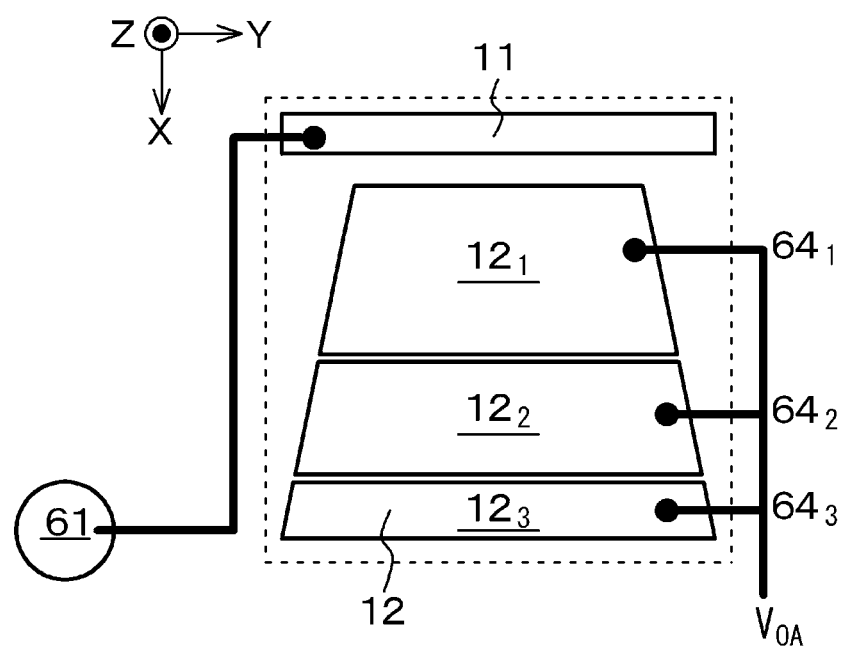
Figure 16A:
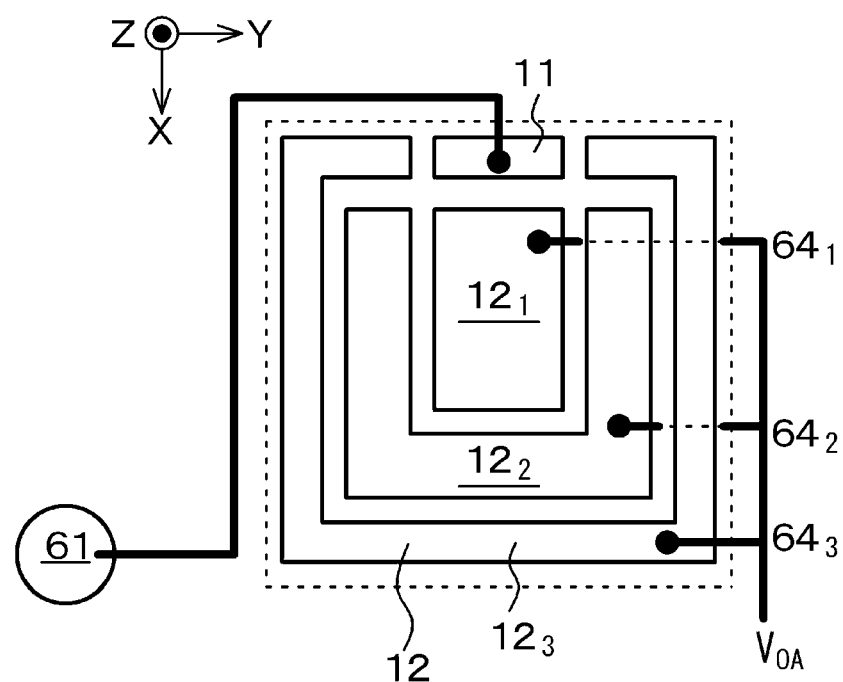
FIGS. 16A and 16B are schematic plan views of charge accumulation electrode segments in Example 5.
Figure 16B:
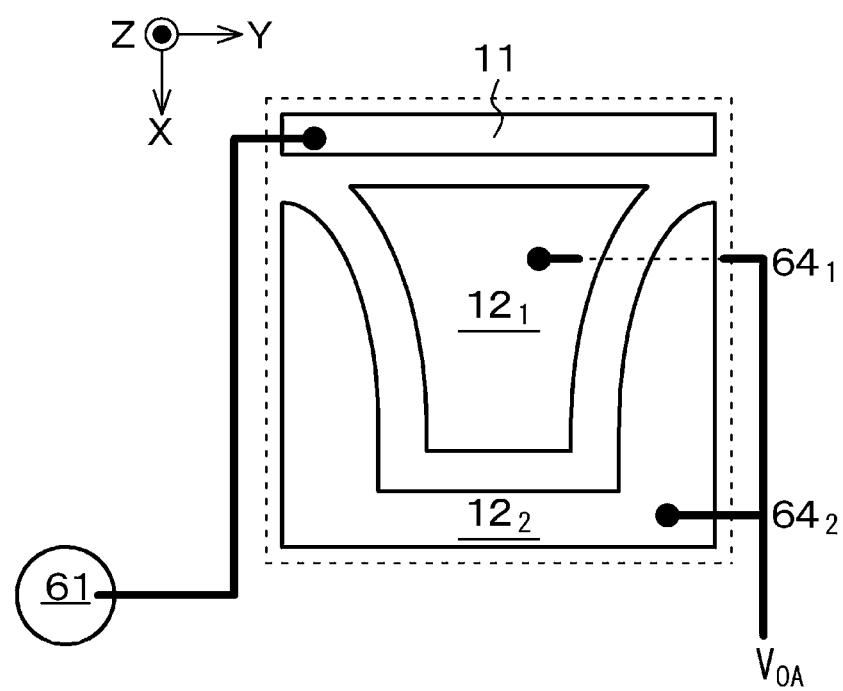

Example 4 relates to an imaging element according to the fourth aspect of the present disclosure. FIG. 14 illustrates a schematic partial cross-sectional view of the imaging element and the laminated imaging element of Example 4. In the imaging element of Example 4, materials constituting a charge accumulation electrode segment are different between adjacent photoelectric conversion unit segments. Here, a value of work function of a material constituting an insulating layer segment is gradually increased from the first photoelectric conversion unit segment $10_1$ to the N-th photoelectric conversion unit segment ION. In the imaging element of Example 4, the same potential may be applied to all the N charge accumulation electrode segments, or different potentials may be applied to the respective N charge accumulation electrode segments. In the latter case, the charge accumulation electrode segments $12_1$, $12_2$, and $12_3$ are connected to the vertical drive circuit 112 constituting a drive circuit via pad portions $64_1$, $64_2$, and $64_3$.

Example 5

Figure 17:
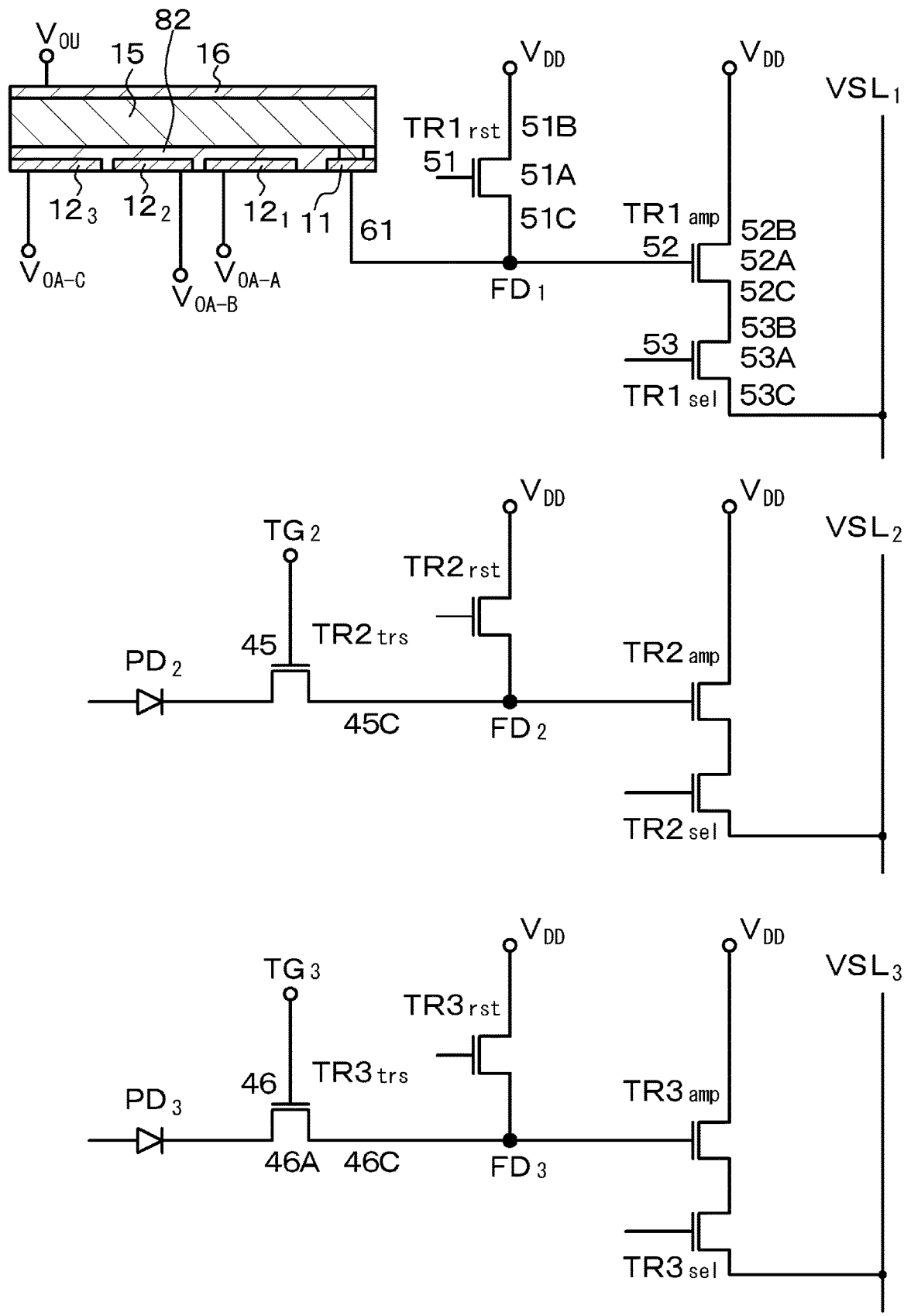
FIG. 17 is an equivalent circuit diagram of the imaging element and the laminated imaging element of Example 5.
Figure 18:
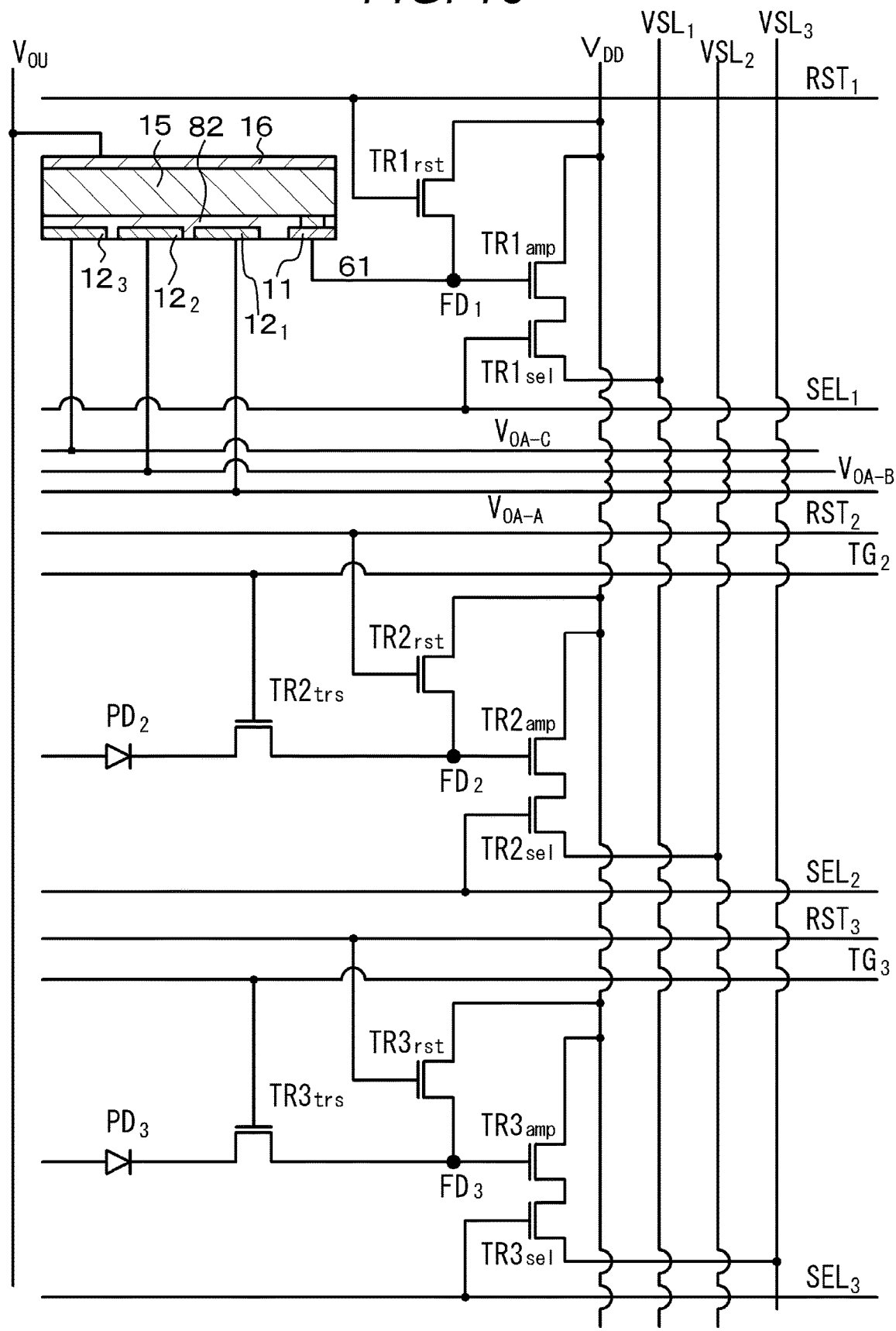
FIG. 18 is an equivalent circuit diagram of the imaging element and the laminated imaging element of Example 5.
Figure 19:
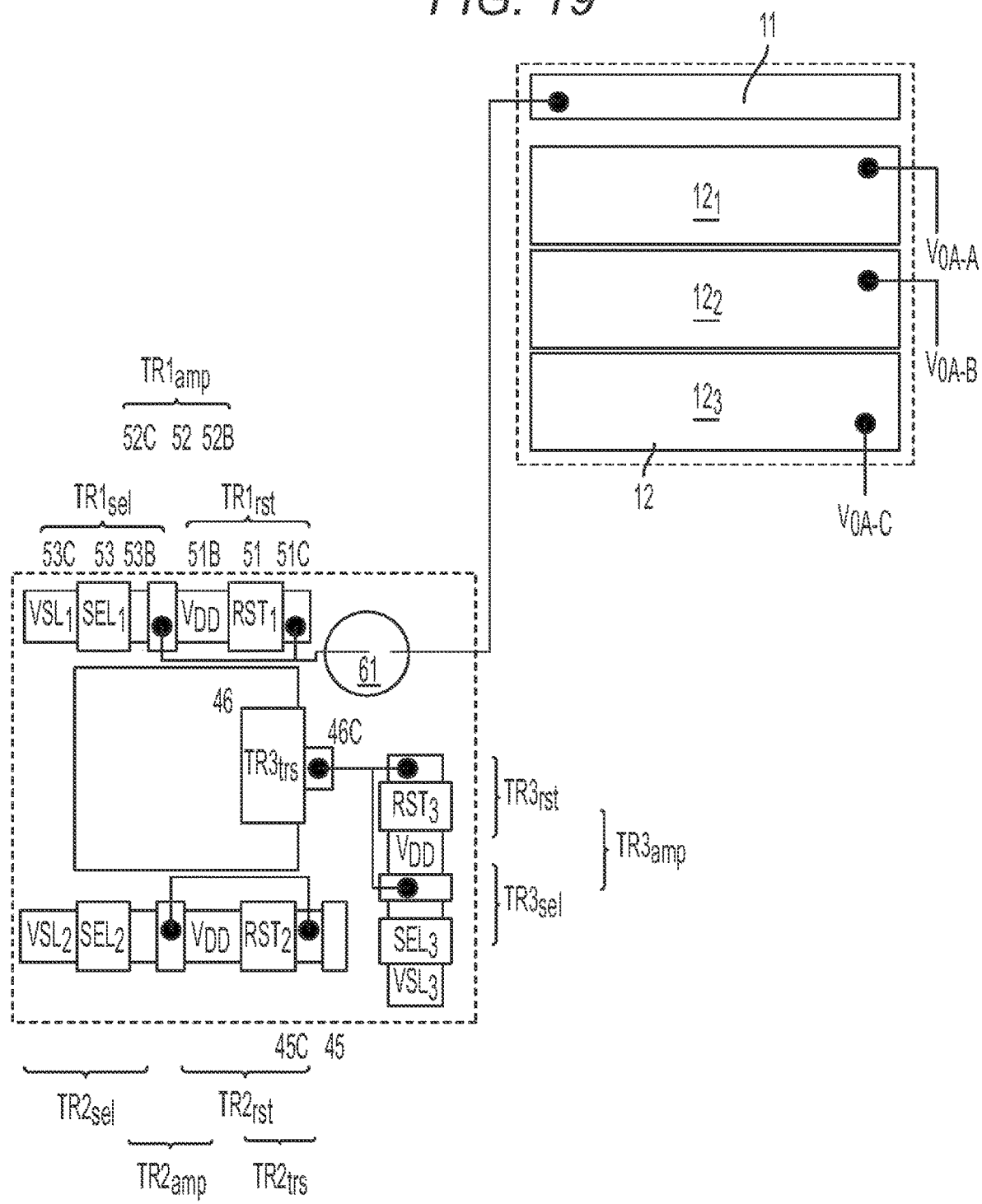
FIG. 19 is a schematic arrangement diagram of a first electrode and a charge accumulation electrode constituting the imaging element of Example 5, and a transistor constituting a control unit.

The imaging element of Example 5 relates to an imaging element according to the imaging element according to the fifth aspect of the present disclosure. FIGS. 15A, 15B, 16A, and 16B illustrate schematic plan views of charge accumulation electrode segments in Example 5. Furthermore, FIGS. 17 and 18 illustrate an equivalent circuit diagram of the imaging element and the laminated imaging element of Example 5. FIG. 19 illustrates a schematic arrangement diagram of a first electrode and a charge accumulation electrode constituting the imaging element of Example 5, and a transistor constituting a control unit. FIGS. 20 and 21 schematically illustrate a potential state in each part during operation of the imaging element of Example 5. A schematic partial cross-sectional view of the imaging element and the laminated imaging element of Example 5 is similar to that illustrated in FIG. 14 or 23. In the imaging element of Example 5, the area of the charge accumulation electrode segment is gradually reduced from the first photoelectric conversion unit segment $10_1$ to the N-th photoelectric conversion unit segment $10_N$. In the imaging element of Example 5, the same potential may be applied to all the N charge accumulation electrode segments, or different potentials may be applied to the respective N charge accumulation electrode segments. In the latter case, as described in Example 4, the charge accumulation electrode segments $12_1$, $12_2$, and $12_3$ disposed apart from one another only need to be connected to the vertical drive circuit 112 constituting a drive circuit via pad portions $64_1$, $64_2$, and $64_3$.

In Example 5, the charge accumulation electrode 12 includes a plurality of charge accumulation electrode segments $12_1$, $12_2$, and $12_3$. The number of charge accumulation electrode segments only needs to be two or more, and is set to "three" in Example 5. In addition, in the imaging element and the laminated imaging element of Example 5, the potential of the first electrode 11 is higher than the potential of the second electrode 16. Therefore, that is, for example, a positive potential is applied to the first electrode 11, and a negative potential is applied to the second electrode 16. Therefore, in a charge transfer period, the potential applied to the charge accumulation electrode segment $12_1$ located closest to the first electrode 11 is higher than the potential applied to the charge accumulation electrode segment $12_3$ located farthest from the first electrode 11. In this way, by applying a potential gradient to the charge accumulation electrode 12, electrons that have stopped in the region of the photoelectric conversion layer 15 facing the charge accumulation electrode 12 are more reliably read out to the first electrode 11 and further to the first floating diffusion layer $FD_1$. That is, the charges accumulated in the photoelectric conversion layer 15 are read out to the control unit.

In the example illustrated in FIG. 20, in a charge transfer period, by satisfying the potential of the charge accumulation electrode segment $12_3$<the potential of the charge accumulation electrode segment $12_2$<the potential of the charge accumulation electrode segment $12_1$, electrons that have stopped in the region of the photoelectric conversion layer are read out to the first floating diffusion layer $FD_1$ all at once. Meanwhile, in the example illustrated in FIG. 21, in a charge transfer period, by gradually changing the potential of the charge accumulation electrode segment $12_3$, the potential of the charge accumulation electrode segment $12_2$, and the potential of the charge accumulation electrode segment $12_1$ (that is, by changing the potential of the charge accumulation electrode segment $12_3$, the potential of the charge accumulation electrode segment $12_2$, and the potential of the charge accumulation electrode segment $12_1$ in a step shape or a slope shape), electrons that have stopped in the region of the photoelectric conversion layer 15 facing the charge accumulation electrode segment $12_3$ are transferred to the region of the photoelectric conversion layer 15 facing the charge accumulation electrode segment $12_2$. Subsequently, electrons that have stopped in the region of the photoelectric conversion layer 15 facing the charge accumulation electrode segment $12_1$ are transferred to the region of the photoelectric conversion layer 15 facing the charge accumulation electrode segment $12_1$. Subsequently, electrons that have stopped in the region of the photoelectric conversion layer 15 facing the charge accumulation electrode segment $12_1$ are reliably read out to the first floating diffusion layer $FD_1$.

Figure 22:
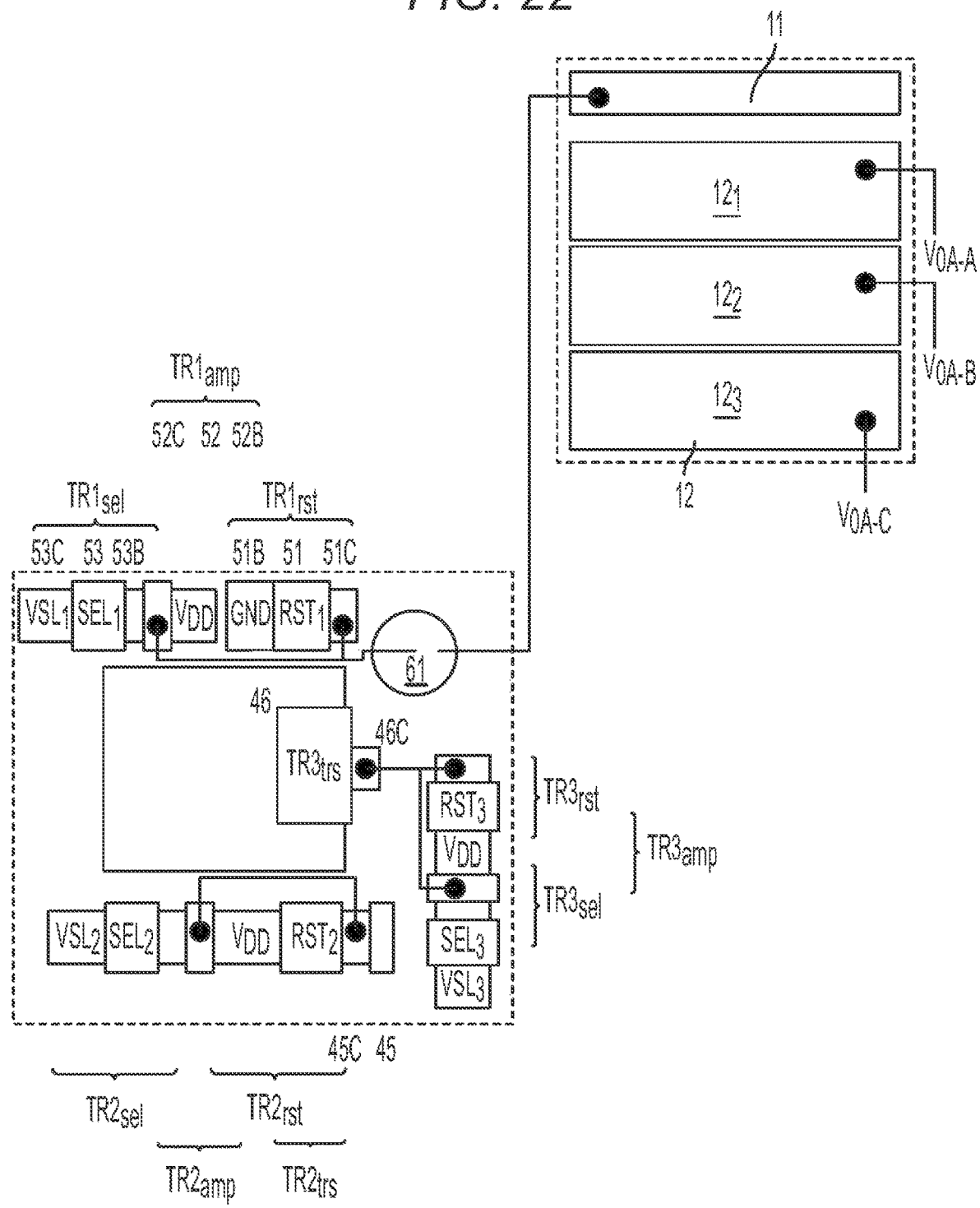
FIG. 22 is a schematic arrangement diagram of a first electrode and a charge accumulation electrode constituting a modification of the imaging element of Example 5.

As FIG. 22 illustrates a schematic arrangement diagram of the first electrode and the charge accumulation electrode constituting a modification of the imaging element of Example 5, and a transistor constituting the control unit, the other source/drain region 51B of the reset transistor $TR1_{rst}$ may be grounded instead of being connected to the power source $V_{DD}$.

Also in the imaging element of Example 5, by adopting such a configuration, a kind of charge transfer gradient is formed. That is, the area of a charge accumulation electrode segment is gradually reduced from the first photoelectric conversion unit segment $10_1$ to the N-th photoelectric conversion unit segment $10_N$. Therefore, when a state of $V_{12}\leq V_{11}$ is reached in a charge accumulation period, the n-th photoelectric conversion unit segment can accumulate more charges than the (n+1)-th photoelectric conversion unit segment. Then, when a state of $V_{22}<V_{21}$ is reached in a charge transfer period, a flow of charges from the first photoelectric conversion unit segment to the first electrode, and a flow of charges from the (n+1)-th photoelectric conversion unit segment to the n-th photoelectric conversion unit segment can be reliably ensured.

Example 6

Figure 23:
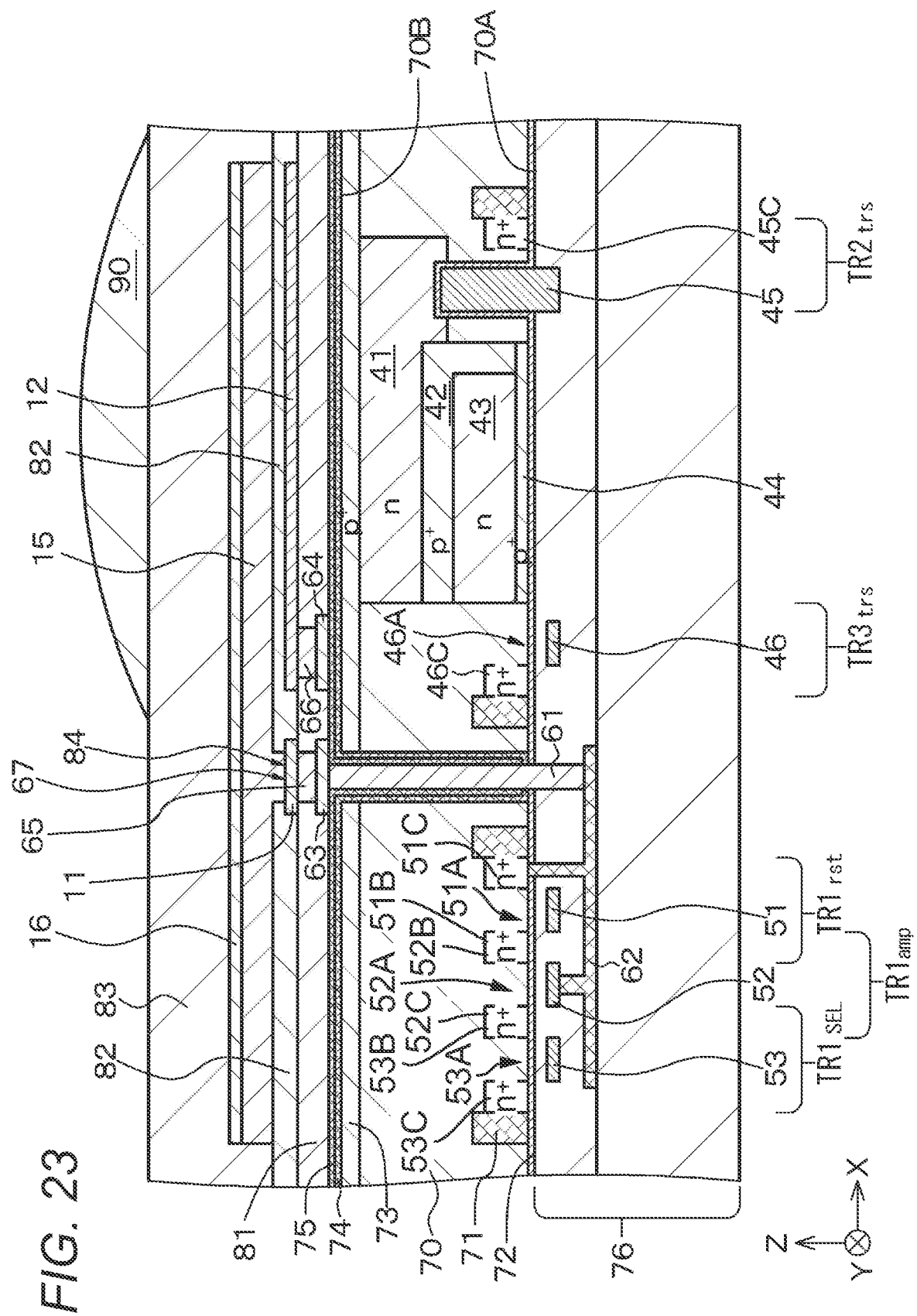
FIG. 23 is a schematic partial cross-sectional view of the imaging element and the laminated imaging element of each of Examples 6 and 5.
Figure 24A:
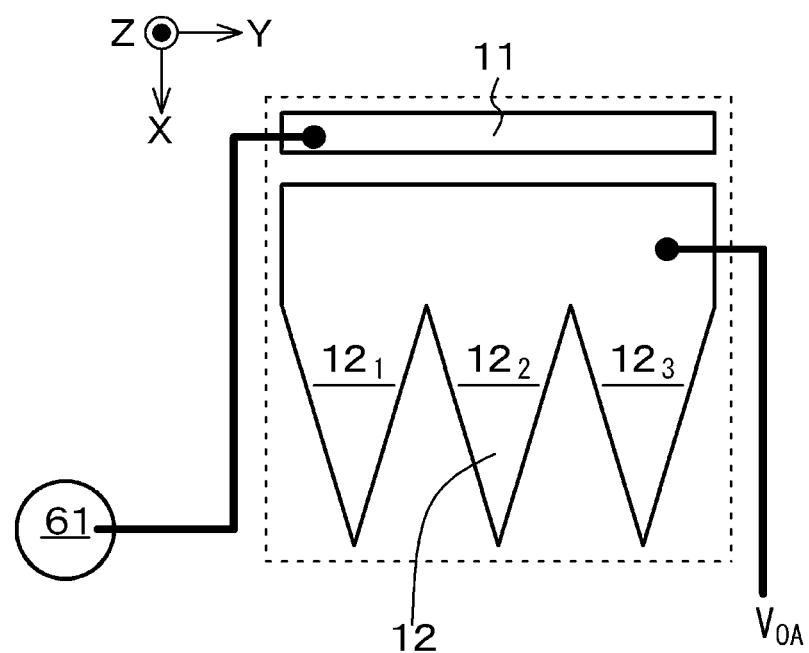
FIGS. 24A and 24B are schematic plan views of charge accumulation electrode segments in Example 6.
Figure 24B:
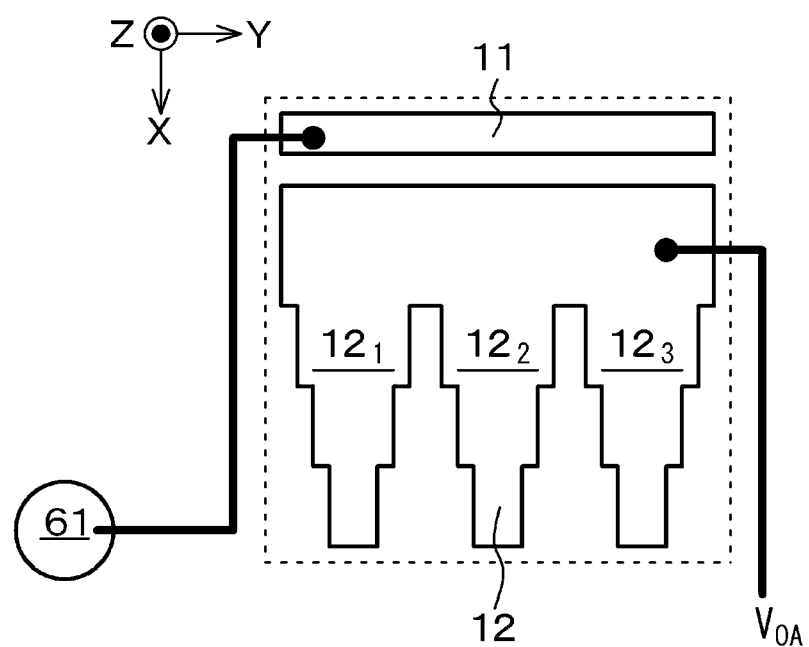

Example 6 relates to an imaging element according to the sixth aspect of the present disclosure. FIG. 23 illustrates a schematic partial cross-sectional view of the imaging element and the laminated imaging element of Example 6. Furthermore, FIGS. 24A and 24B illustrate schematic plan views of charge accumulation electrode segments in Example 6. The imaging element of Example 6 includes a photoelectric conversion unit formed by laminating the first electrode 11, the photoelectric conversion layer 15, and the second electrode 16. The photoelectric conversion unit further includes the charge accumulation electrode 12 disposed apart from the first electrode 11 so as to face the photoelectric conversion layer 15 via the insulating layer 82. In addition, if a lamination direction of the charge accumulation electrode 12, the insulating layer 82, and the photoelectric conversion layer 15 is defined as a Z direction, and a direction of separating from the first electrode 11 is defined as an X direction, when a laminated portion where the charge accumulation electrode 12, the insulating layer 82, and the photoelectric conversion layer 15 are laminated is cut with a YZ virtual plane, the cross-sectional area of the laminated portion changes depending on a distance from the first electrode 11.

Specifically, in the imaging element of Example 6, the thickness of the cross section of the laminated portion is constant, and the width of the cross section of the laminated portion becomes narrower as the laminated portion goes away from the first electrode 11. Note that the width may be continuously narrowed (see FIG. 24A), or may be narrowed stepwise (see FIG. 24B).

In this way, in the imaging element of Example 5, when a laminated portion where the charge accumulation electrode 12, the insulating layer 82, and the photoelectric conversion layer 15 are laminated is cut with a YZ virtual plane, the cross-sectional area of the laminated portion changes depending on a distance from the first electrode. Therefore, a kind of charge transfer gradient is formed, and charges generated by photoelectric conversion can be transferred more easily and reliably.

Example 7

Example 7 relates to solid-state imaging devices according to the first and second aspects of the present disclosure.

The solid-state imaging device of Example 7 includes a photoelectric conversion unit formed by laminating a first electrode 11', the photoelectric conversion layer 15, and the second electrode 16.

The solid-state imaging device of Example 7 includes a plurality of imaging elements in each of which the photoelectric conversion unit further includes a charge accumulation electrode 12' disposed apart from the first electrode 11' so as to face the photoelectric conversion layer 15 via the insulating layer 82.

The plurality of imaging elements constitutes an imaging element block.

The first electrode 11' is shared by the plurality of imaging elements constituting the imaging element block.

Alternatively, the solid-state imaging device of Example 7 includes a plurality of the imaging elements described in Examples 1 to 6.

In Example 7, one floating diffusion layer is disposed for a plurality of imaging elements. In addition, by appropriately controlling the timing of a charge transfer period, the plurality of imaging elements can share one floating diffusion layer. In addition, in this case, the plurality of imaging elements can share one contact hole portion.

Note that the solid-state imaging device of Example 7 has substantially a similar configuration and structure to the solid-state imaging devices described in Examples 1 to 6 except that the first electrode 11' is shared by the plurality of imaging elements constituting an imaging element block.

Figure 25:
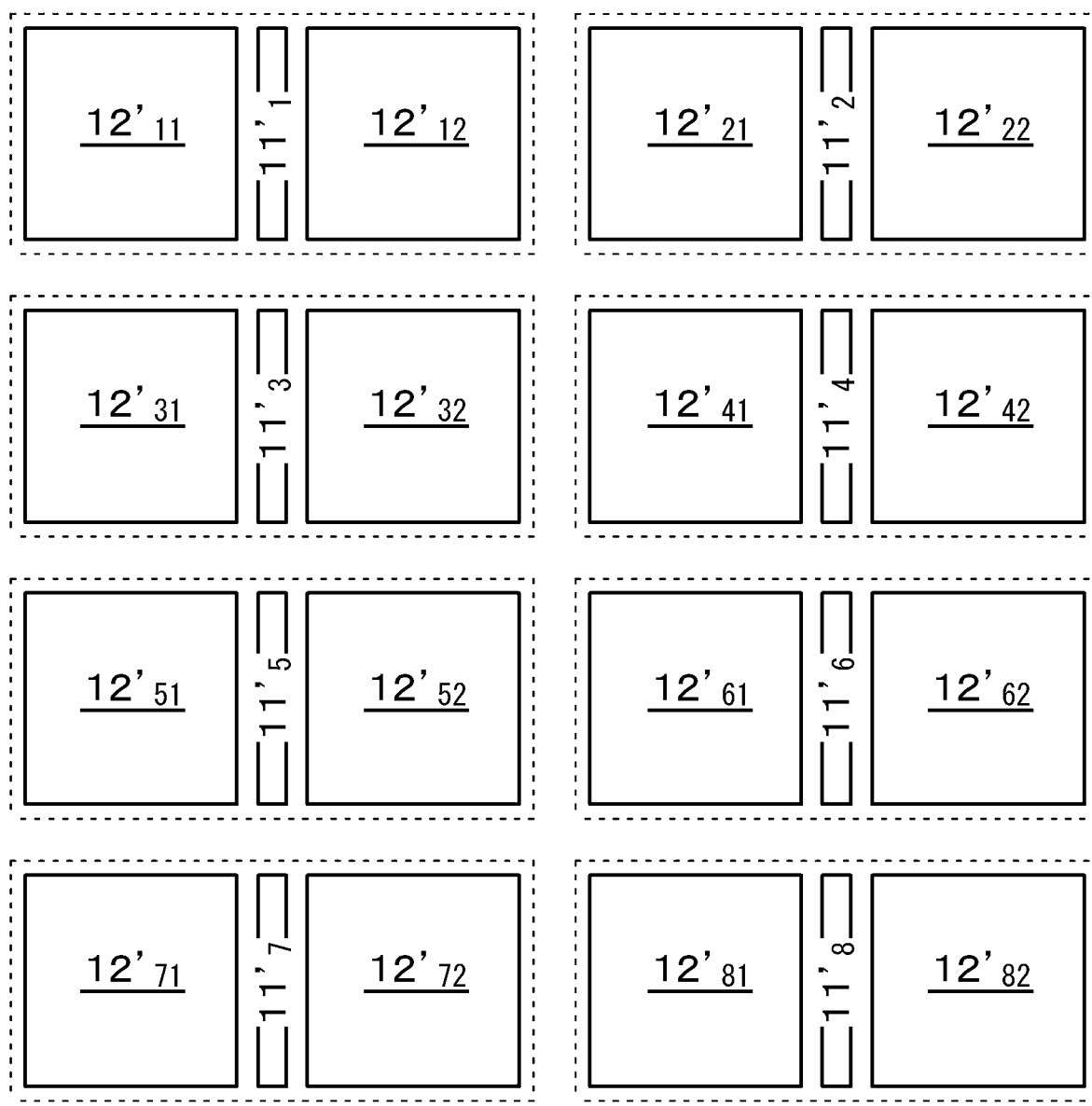
FIG. 25 is a schematic plan view of first electrodes and charge accumulation electrode segments in a solid-state imaging device of Example 7.
Figure 26:
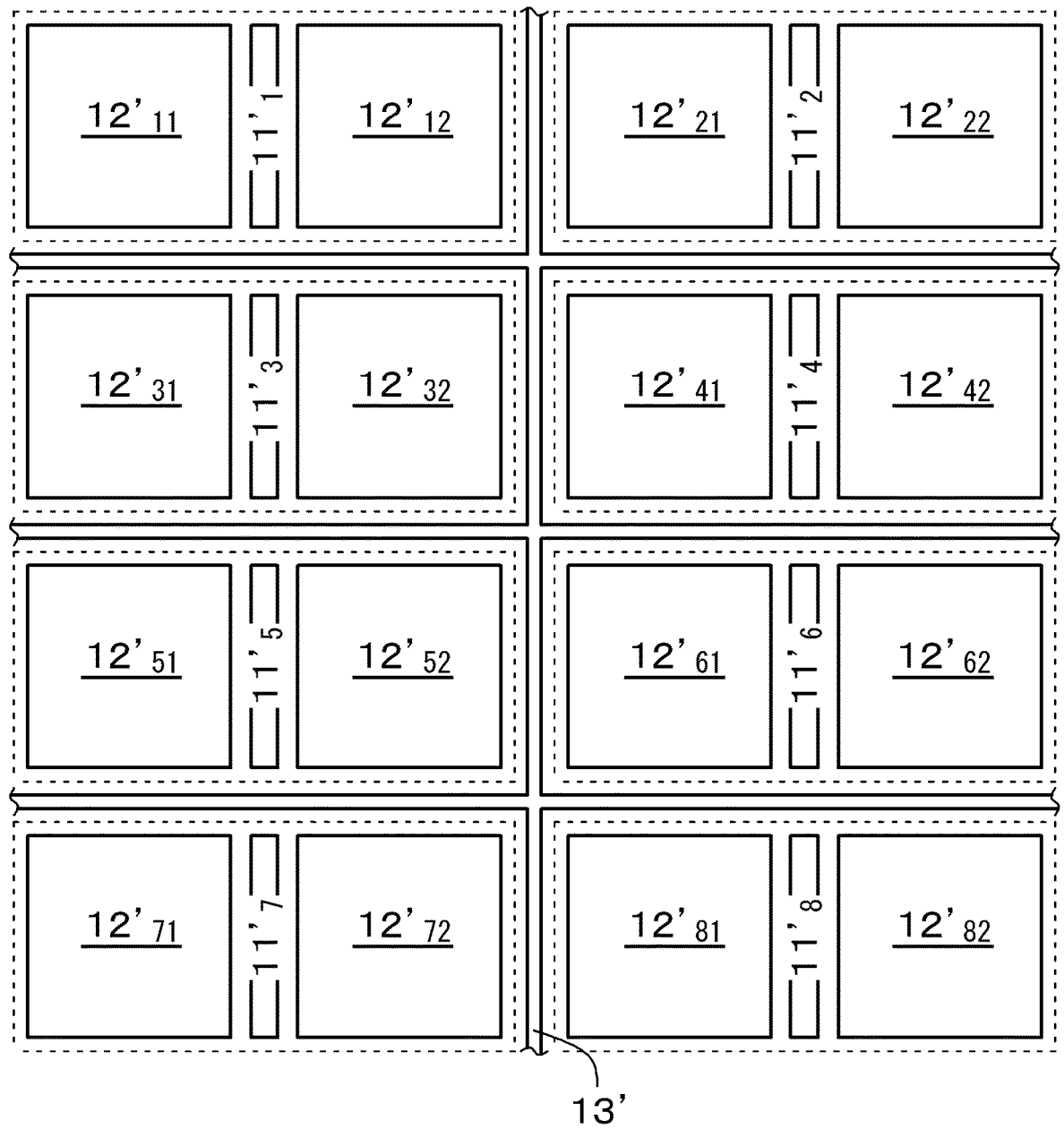
FIG. 26 is a schematic plan view of first electrodes and charge accumulation electrode segments in a first modification of the solid-state imaging device of Example 7.
Figure 27:
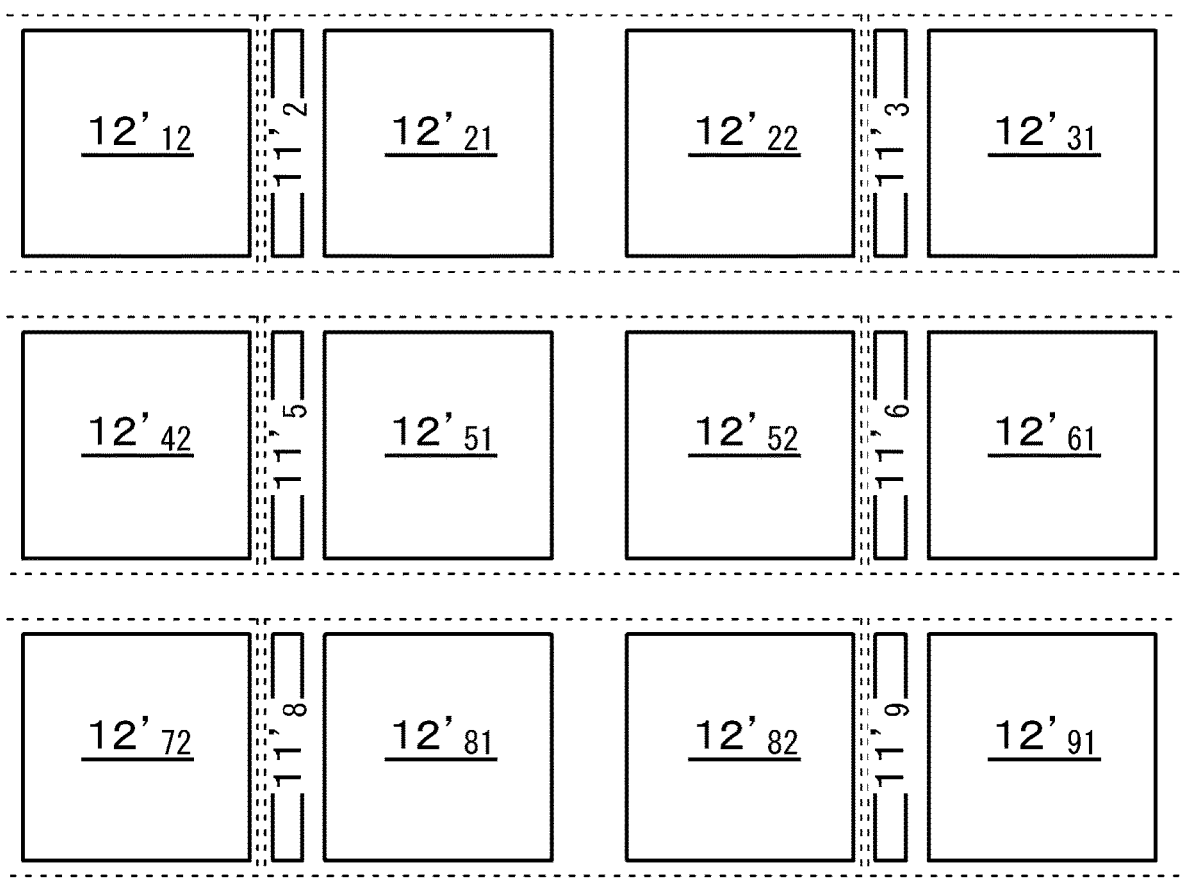
FIG. 27 is a schematic plan view of first electrodes and charge accumulation electrode segments in a second modification of the solid-state imaging device of Example 7.
Figure 28:
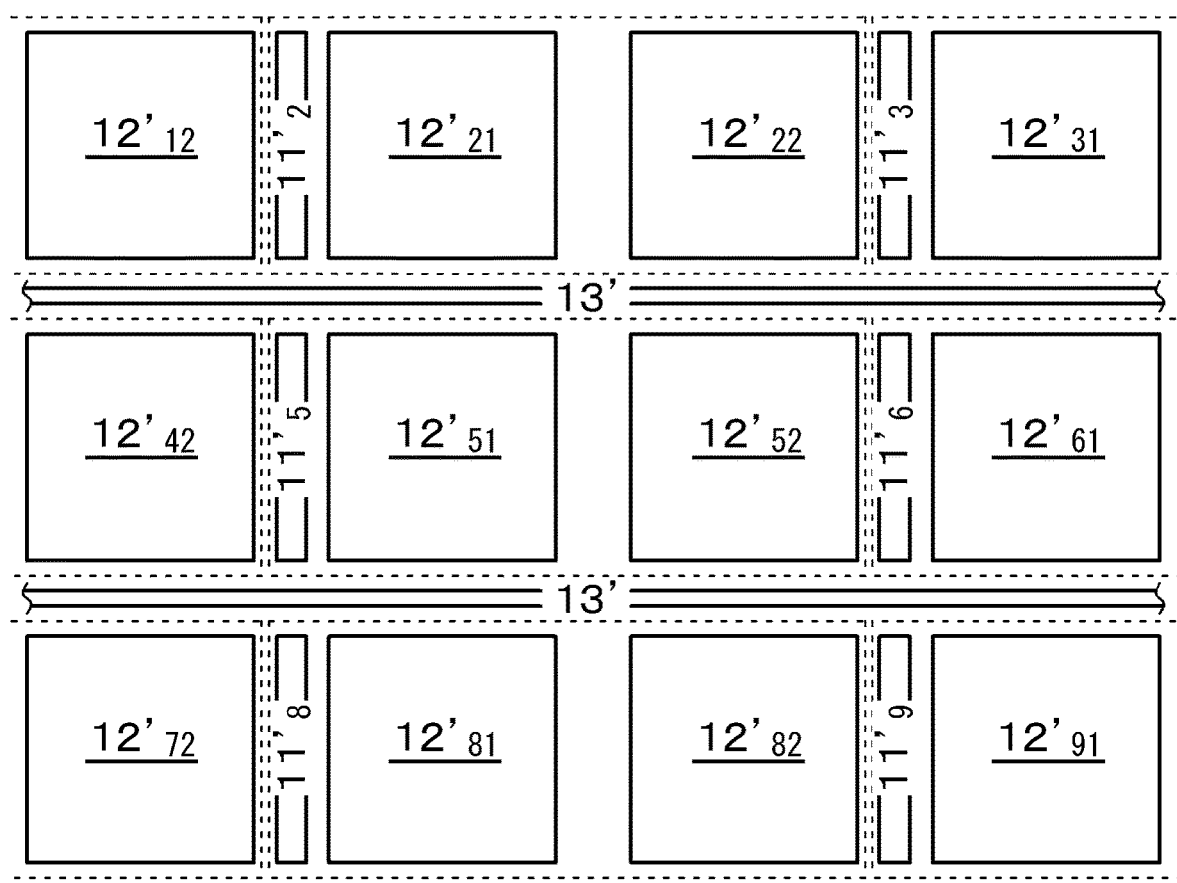
FIG. 28 is a schematic plan view of first electrodes and charge accumulation electrode segments in a third modification of the solid-state imaging device of Example 7.
Figure 29:
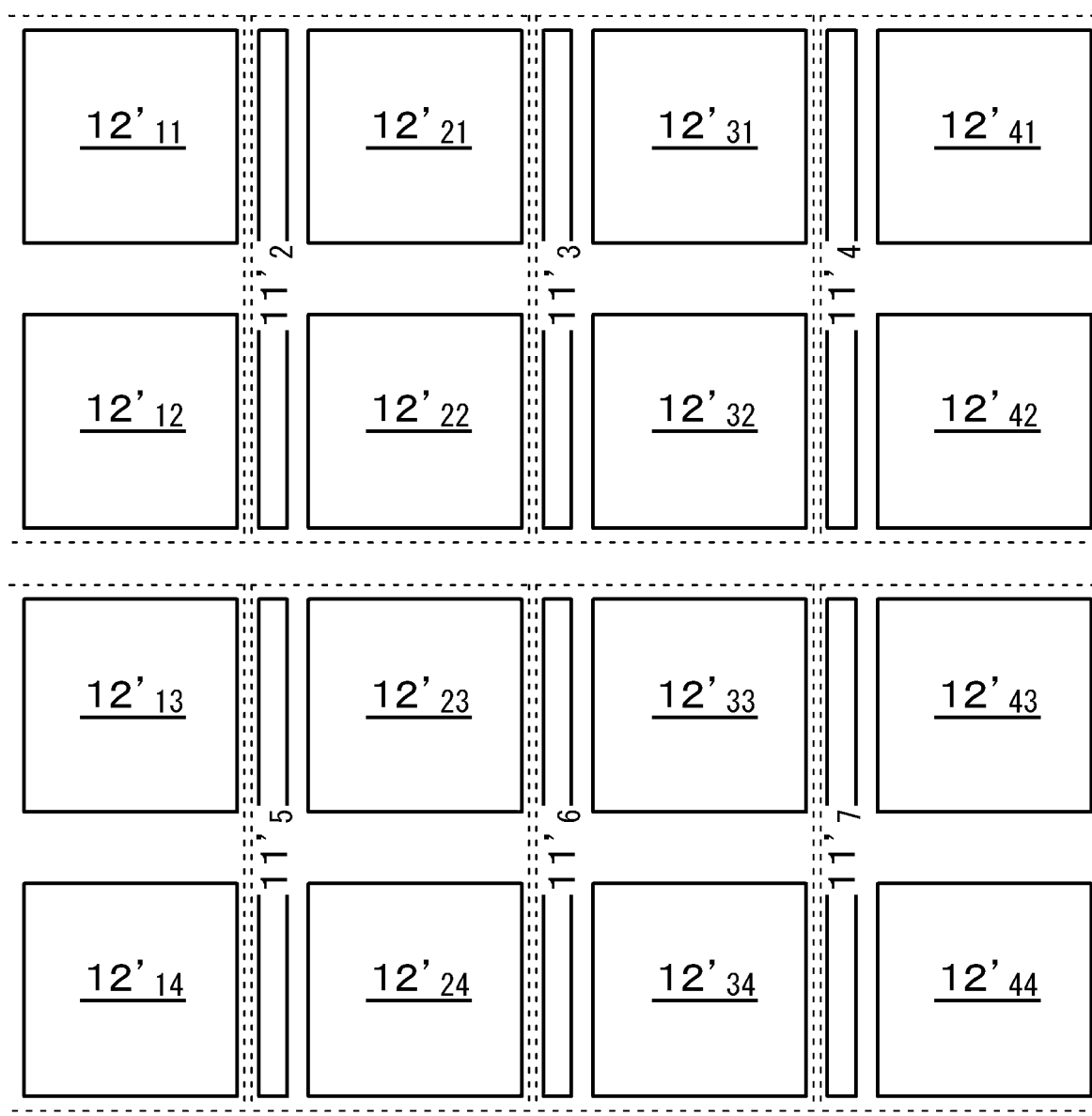
FIG. 29 is a schematic plan view of first electrodes and charge accumulation electrode segments in a fourth modification of the solid-state imaging device of Example 7.
Figure 30:
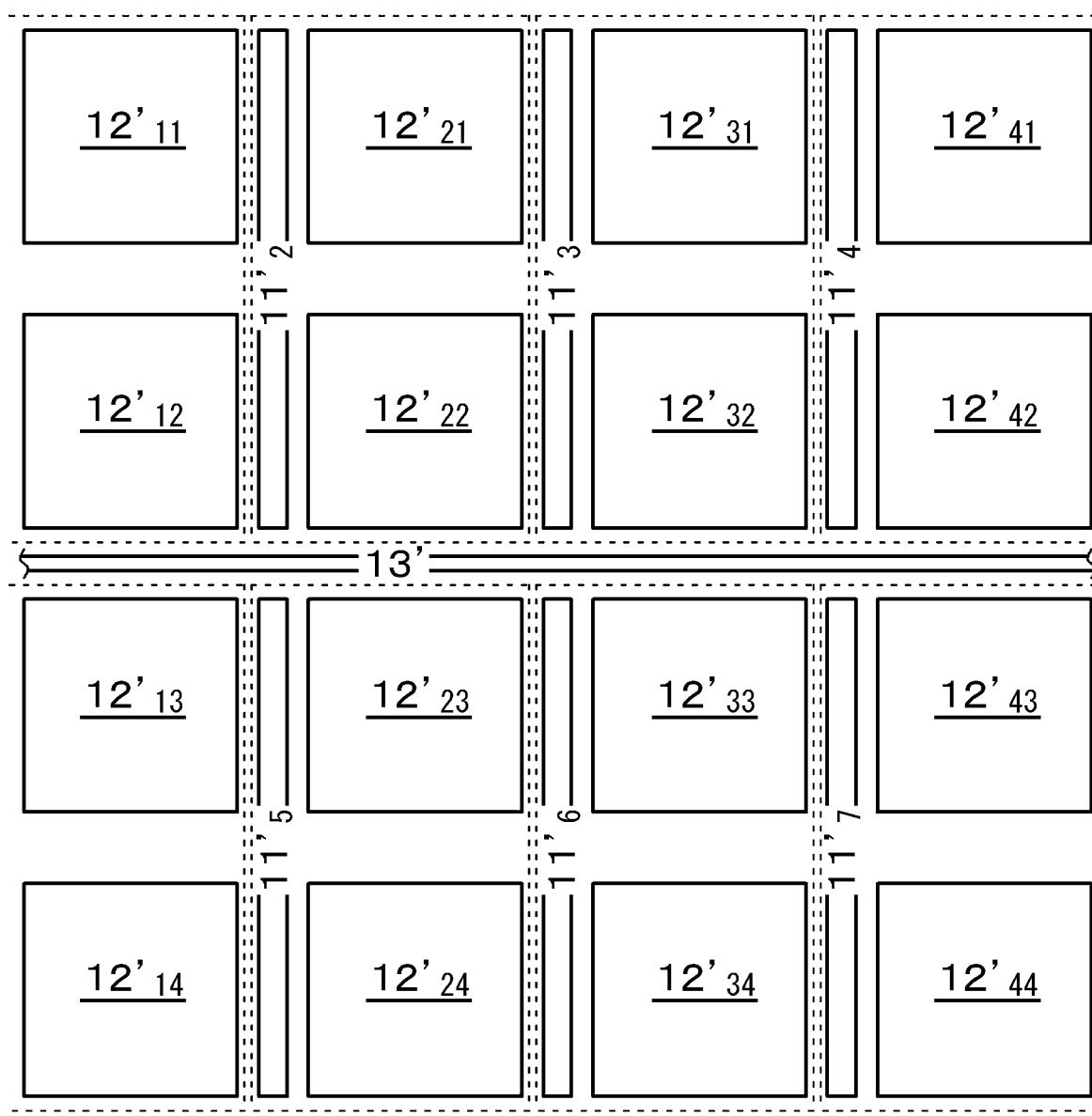
FIG. 30 is a schematic plan view of first electrodes and charge accumulation electrode segments in a fifth modification of the solid-state imaging device of Example 7.

The arrangement state of the first electrode 11' and the charge accumulation electrode 12' in the solid-state imaging device of Example 7 is schematically illustrated in FIG. 25 (Example 7), FIG. 26 (first modification of Example 7), FIG. 27 (second modification of Example 7), FIG. 28 (third modification of Example 7), and FIG. 29 (fourth modification of Example 7). FIGS. 25, 26, 29, and 30 illustrate 16 imaging elements, and FIGS. 27 and 28 illustrate 12 imaging elements. In addition, two imaging elements constitute an imaging element block. The imaging element block is surrounded by a dotted line. The subscripts attached to the first electrodes 11' and the charge accumulation electrodes 12' are described in order to distinguish the first electrodes 11' and the charge accumulation electrodes 12' from one another, respectively. This applies to the following description similarly. Furthermore, one on-chip micro lens (not illustrated in FIGS. 25 to 34) is disposed above one imaging element. In addition, in one imaging element block, two charge accumulation electrodes 12' are disposed with the first electrode 11' interposed therebetween (see FIGS. 25 and 26). Alternatively, one first electrode 11' is disposed so as to face two charge accumulation electrodes 12' arranged in parallel (see FIGS. 29 and 30). That is, the first electrode is disposed adjacent to the charge accumulation electrode of each imaging element. Alternatively, the first electrode is disposed adjacent to some of the charge accumulation electrodes of the plurality of imaging elements, and is not disposed adjacent to the remaining charge accumulation electrodes of the plurality of imaging elements (see FIGS. 27 and 28). In this case, transfer of charges from the rest of the plurality of imaging elements to the first electrode is transfer via some of the plurality of imaging elements. The distance A between a charge accumulation electrode constituting an imaging element and a charge accumulation electrode constituting an imaging element is preferably longer than the distance B between a first electrode and a charge accumulation electrode in an imaging element adjacent to the first electrode in order to ensure the transfer of charges from each of the imaging elements to the first electrode. Furthermore, a value of the distance A is preferably longer as an imaging element is located farther from the first electrode. Furthermore, in examples illustrated in FIGS. 26, 28, and 30, a transfer control electrode 13' is disposed among a plurality of imaging elements constituting an imaging element block. By disposing the transfer control electrode 13', it is possible to reliably suppress transfer of charges in the imaging element blocks located with the transfer control electrode 13' interposed therebetween. Note that when a potential applied to the transfer control electrode 13' is referred to as $V_{13}$, $V_{12} > V_{13}$ (for example, $V_{12\text{-}2} > V_{13}$) only needs to be satisfied.

The transfer control electrode 13' may be formed, on the first electrode side, at the same level as the first electrode 11' or the charge accumulation electrode 12' or at a different level (specifically, at a level lower than the first electrode 11' or the charge accumulation electrode 12'). In the former case, since a distance between the transfer control electrode 13' and the photoelectric conversion layer can be shortened, the potential can be easily controlled. Meanwhile, the latter case is advantageous for miniaturization because a distance between the transfer control electrode 13' and the charge accumulation electrode 12' can be shortened.

Hereinafter, an operation of an imaging element block constituted by the first electrode 11'$_2$ and the two two charge accumulation electrodes 12'$_{21}$ and 12'$_{22}$ will be described.

In a charge accumulation period, a potential $V_a$ is applied to the first electrode 11'$_2$ and a potential $V_A$ is applied to the charge accumulation electrodes 12'$_{21}$ and 12'$_{22}$ from a drive circuit. Photoelectric conversion occurs in the photoelectric conversion layer 15 by light incident on the photoelectric conversion layer 15. Holes generated by the photoelectric conversion are sent from the second electrode 16 to a drive circuit via the wiring line $V_{OU}$. Meanwhile, the potential of the first electrode 11'$_2$ is set to be higher than the potential of the second electrode 16, that is, for example, a positive potential is applied to the first electrode 11'$_2$, and a negative potential is applied to the second electrode 16. Therefore, $V_A \geq V_a$ is satisfied, preferably $V_A > V_a$ is satisfied. As a result, electrons generated by the photoelectric conversion are attracted to the charge accumulation electrodes 12'$_{21}$ and 12'$_{22}$ and stop in a region of the photoelectric conversion layer 15 facing the charge accumulation electrodes 12'$_{21}$ and 12'$_{22}$. That is, charges are accumulated in the photoelectric conversion layer 15. Since $V_A > V_a$ is satisfied, electrons generated inside the photoelectric conversion layer 15 are not transferred toward the first electrode 11'$_2$. As the time for the photoelectric conversion elapses, the potential in the region of the photoelectric conversion layer 15 facing the charge accumulation electrodes 12'$_{21}$ and 12'$_{22}$ becomes a more negative value.

In a later stage of the charge accumulation period, a reset operation is performed. As a result, the potential of the first floating diffusion layer is reset, and the potential of the first floating diffusion layer becomes the potential $V_{DD}$ of the power source.

After the reset operation is completed, charges are read out. That is, in a charge transfer period, a potential $V_b$ is applied to the first electrode 11'$_2$, a potential $V_{21-B}$ is applied to the charge accumulation electrode 12'$_{21}$, and a potential $V_{22-B}$ is applied to the charge accumulation electrode 12'$_{22}$ from a drive circuit. Here, $V_{21-B} < V_b < V_{22-B}$ is satisfied. As a result, electrons that have stopped in the region of the photoelectric conversion layer 15 facing the charge accumulation electrode 12'$_{21}$ are read out to the first electrode 11'$_2$ and further to the first floating diffusion layer. That is, the charges accumulated in the region of the photoelectric conversion layer 15 facing the charge accumulation electrode 12'$_{21}$ are read out to the control unit. When readout is completed, $V_{22-B} < V_{21-B} < V_b$ is satisfied. Note that in examples illustrated in FIGS. 29 and 30, $V_{22-B} < V_b < V_{21-B}$ may be satisfied. As a result, electrons that have stopped in the region of the photoelectric conversion layer 15 facing the charge accumulation electrode 12'$_{22}$ are read out to the first electrode 11'$_2$ and further to the first floating diffusion layer. Furthermore, in the examples illustrated in FIGS. 27 and 28, the electrons that have stopped in the region of the photoelectric conversion layer facing the charge accumulation electrode 12'$_{22}$ may be read out to the first floating diffusion layer via the first electrode 11'3 adjacent to the charge accumulation electrode 12'$_{22}$. In this way, the charges accumulated in the region of the photoelectric conversion layer 15 facing the charge accumulation electrode 12'$_{22}$ are read out to the control unit. Note that when readout of the charges accumulated in the region of the photoelectric conversion layer facing the charge accumulation electrode 12'$_{21}$ is completed, the potential of the first floating diffusion layer may be reset.

Figure 35A:
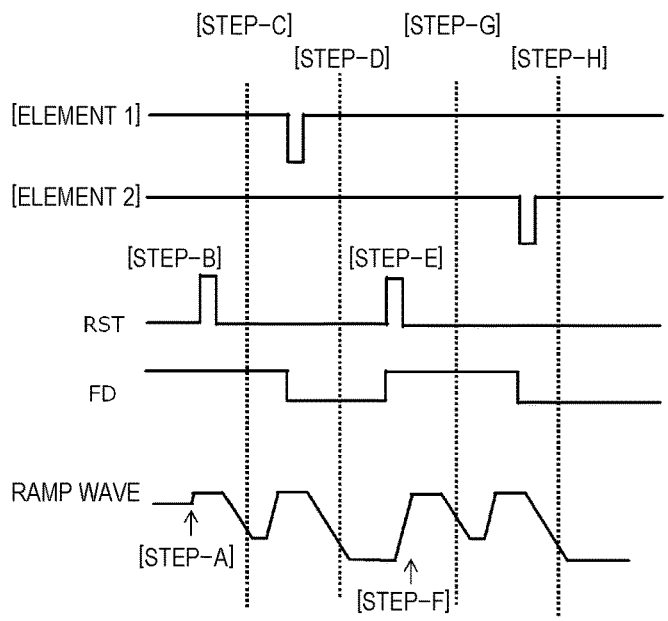
FIGS. 35A, 35B, and 35C are charts each illustrating a readout driving example in an imaging element block of Example 7.

FIG. 35A illustrates a readout driving example in the imaging element block of the Example 7.

Through the following steps A to H, signals from two imaging elements corresponding to the charge accumulation electrode 12'$_{21}$ and the charge accumulation electrode 12'$_{22}$ are read out.
[Step-A]
Input of an auto zero signal to a comparator
[Step-B]
Reset operation of one shared floating diffusion layer
[Step-C]
P-phase readout and transfer of charges to the first electrode 11'$_2$ in an imaging element corresponding to the charge accumulation electrode 12'$_{21}$
[Step-D]
D-phase readout and transfer of charge to the first electrode 11'$_2$ in an imaging element corresponding to the charge accumulation electrode 12'$_{21}$
[Step-E]
Reset operation of one shared floating diffusion layer
[Step-F]
Input of an auto zero signal to a comparator
[Step-G]
P-phase readout and transfer of charges to the first electrode 11'$_2$ in an imaging element corresponding to the charge accumulation electrode 12'$_{22}$
[Step-H]
D-phase readout and transfer of charges to the first electrode 11'$_2$ in an imaging element corresponding to the charge accumulation electrode 12'$_{22}$ On the basis of a correlated double sampling (CDS) process, a difference between the P-phase readout in [step-C] and the D-phase readout in [step-D] is a signal from an imaging element corresponding to the charge accumulation electrode 12'$_{21}$, and a difference between the P-phase readout in [step-G] and the D-phase readout in [step-H] is a signal from an imaging element corresponding to the charge accumulation electrode 12'$_{22}$.

Figure 35B:
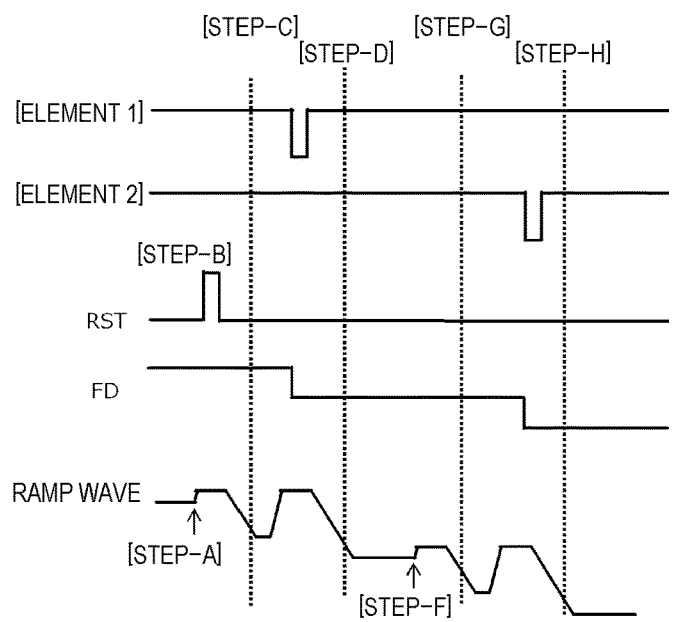
Figure 35C:
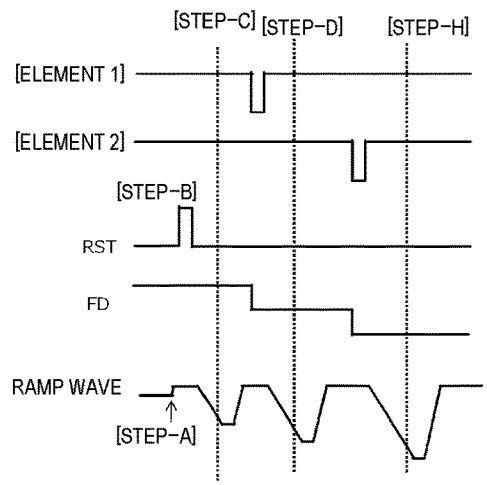
Figure 36:
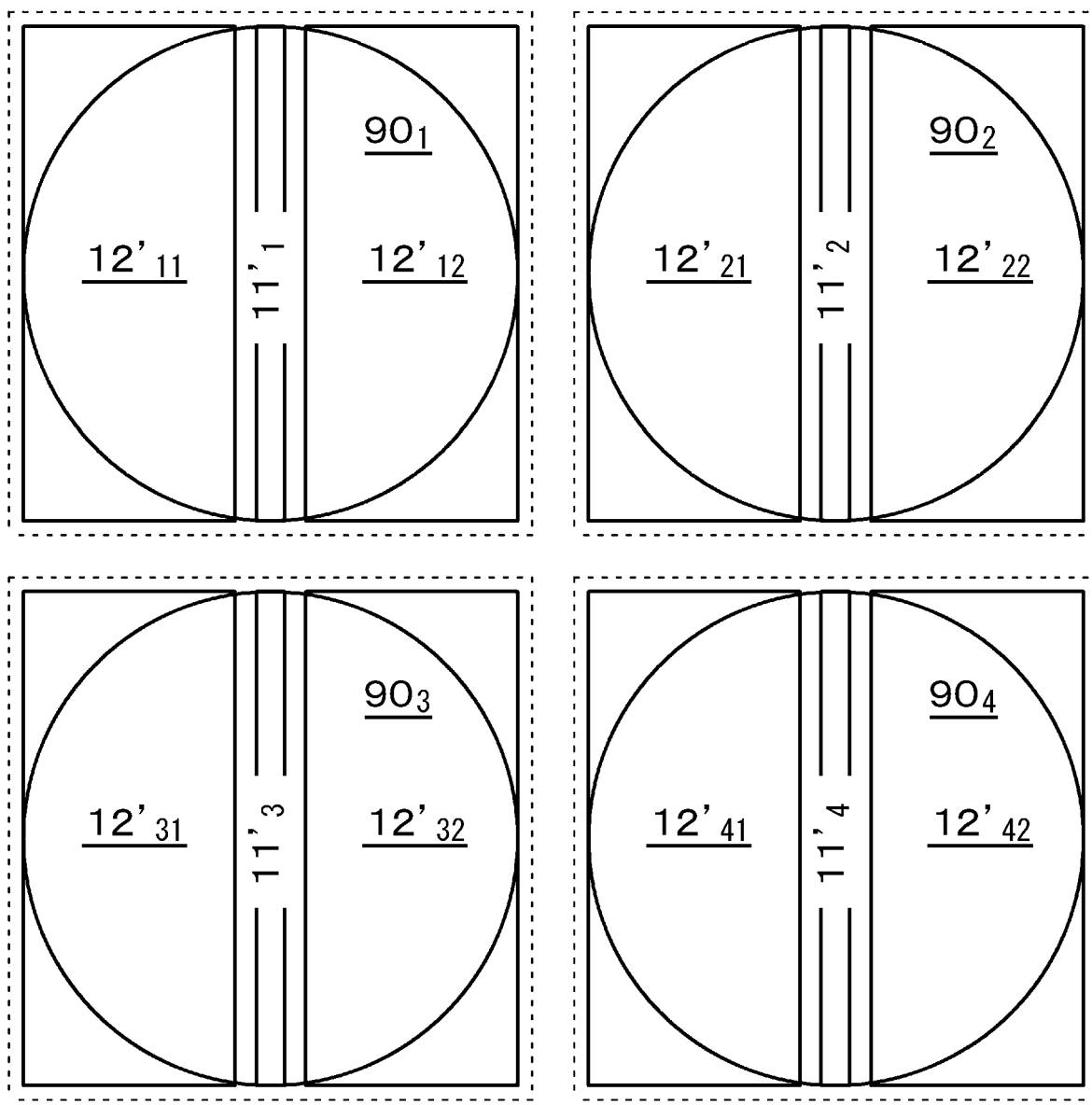
FIG. 36 is a schematic plan view of first electrodes and charge accumulation electrode segments in a solid-state imaging device of Example 8.
Figure 37:
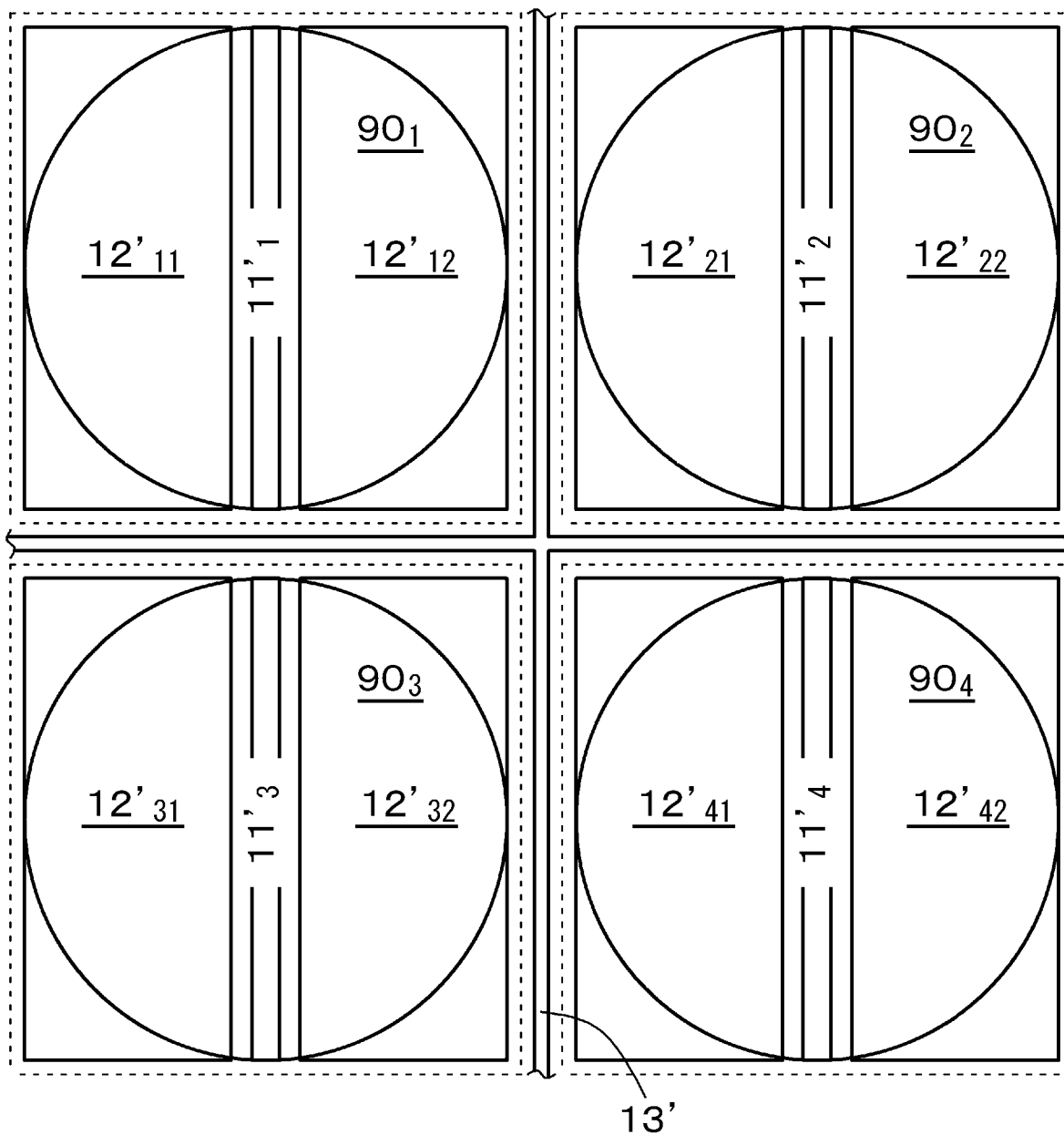
FIG. 37 is a schematic plan view of first electrodes and charge accumulation electrode segments in a modification of the solid-state imaging device of Example 8.
Figure 38:
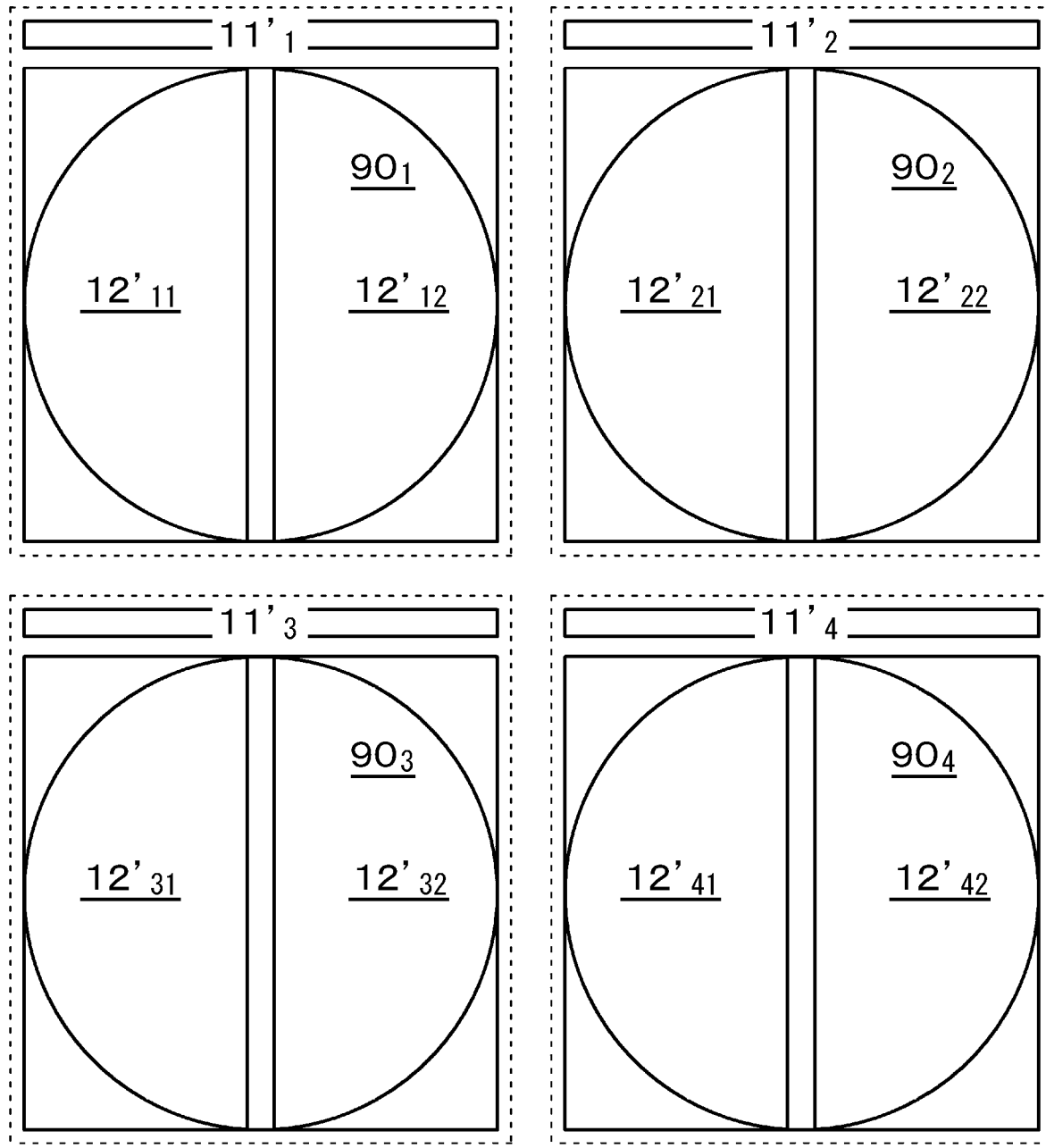
FIG. 38 is a schematic plan view of first electrodes and charge accumulation electrode segments in a modification of the solid-state imaging device of Example 8.
Figure 39:
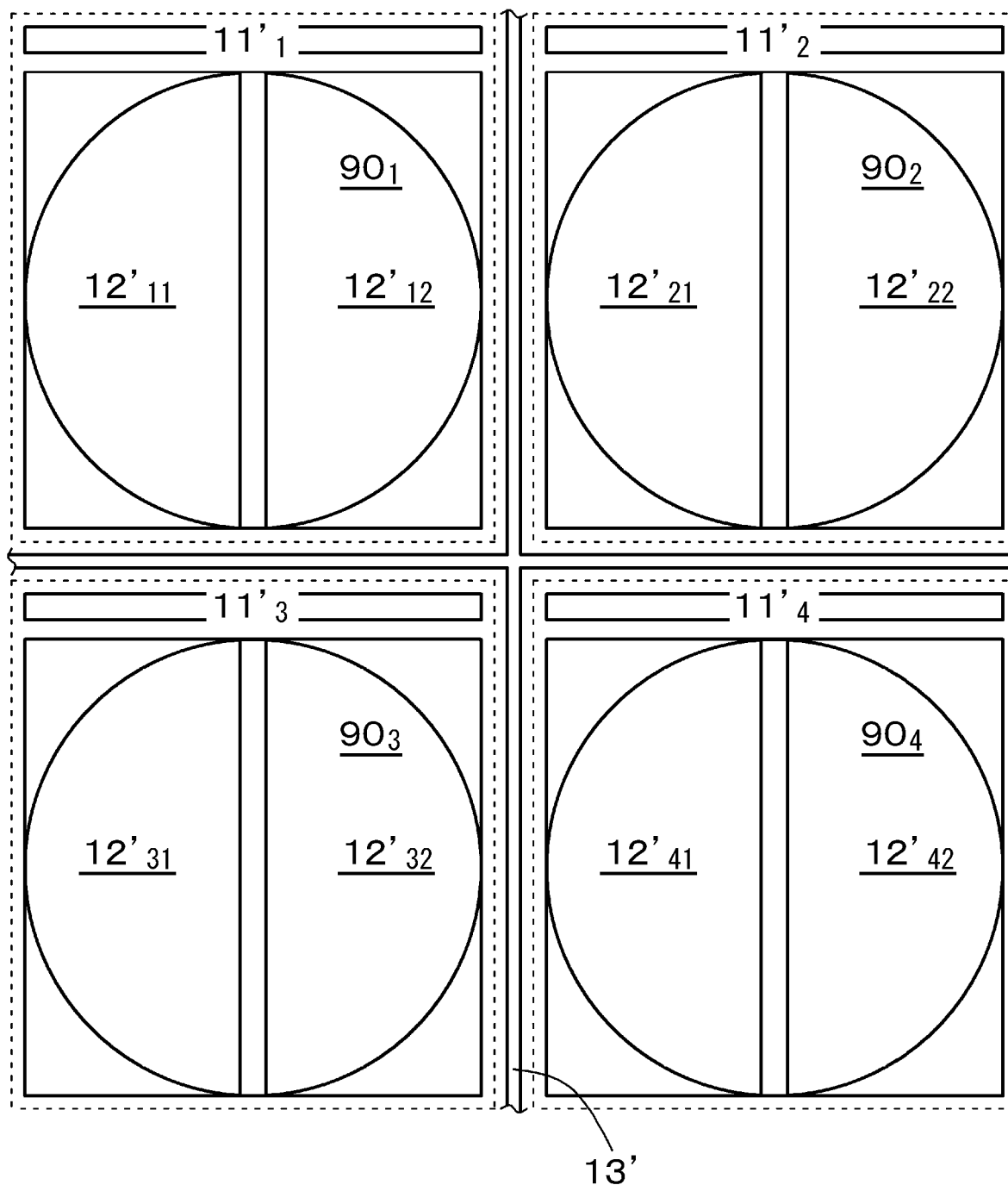
FIG. 39 is a schematic plan view of first electrodes and charge accumulation electrode segments in a modification of the solid-state imaging device of Example 8.

Note that the operation of [Step-E] may be omitted (see FIG. 35B). Furthermore, the operation of [Step-F] may be omitted. In this case, the operation of [Step-G] can be further omitted (see FIG. 35C). A difference between the P-phase readout in [step-C] and the D-phase readout in [step-D] is a signal from an imaging element corresponding to the charge accumulation electrode 12'$_{21}$, and a difference between the D-phase readout in [step-D] and the D-phase readout in [step-H] is a signal from an imaging element corresponding to the charge accumulation electrode 12'$_{22}$.

Figure 31:
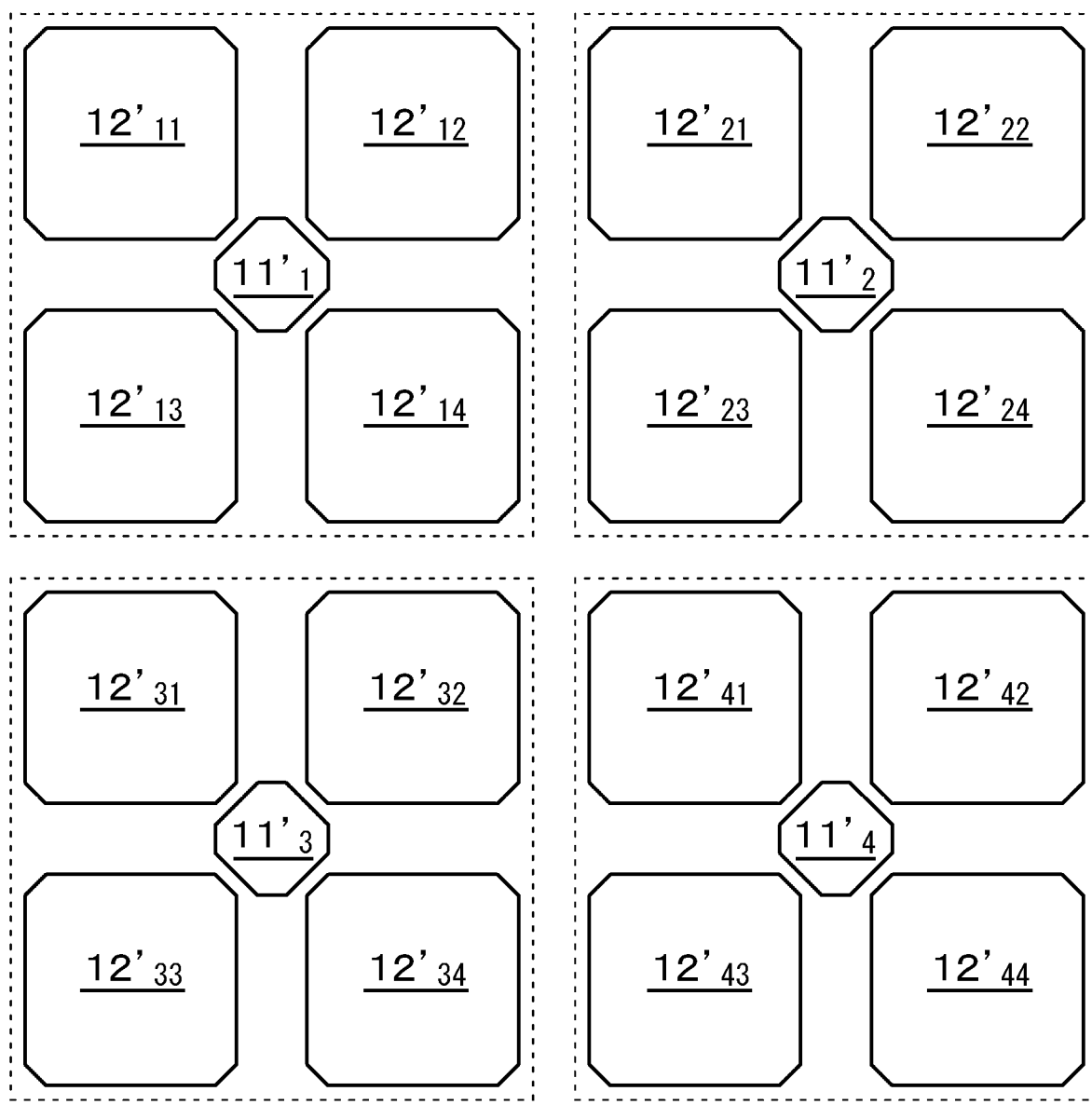
FIG. 31 is a schematic plan view of first electrodes and charge accumulation electrode segments in a sixth modification of the solid-state imaging device of Example 7.
Figure 32:
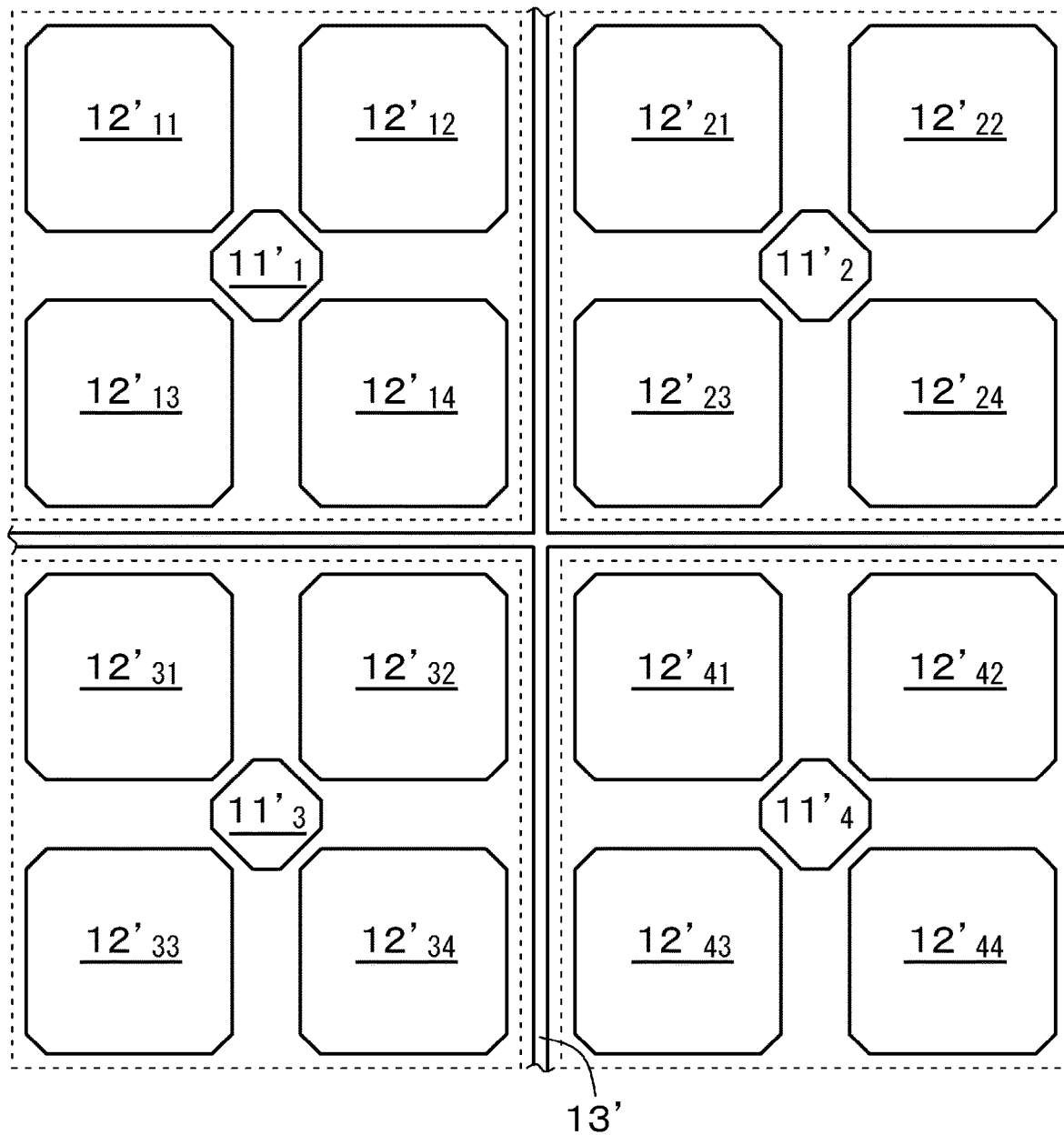
FIG. 32 is a schematic plan view of first electrodes and charge accumulation electrode segments in a seventh modification of the solid-state imaging device of Example 7.

In the modifications illustrated in FIG. 31 (sixth modification of Example 7) and FIG. 32 (seventh modification of Example 7) schematically illustrating the arrangement state of the first electrode 11' and the charge accumulation electrode 12', an imaging element block includes four imaging elements. The operations of these solid-state imaging devices can be substantially similar to the operations of the solid-state imaging devices illustrated in FIGS. 25 to 30.

Figure 33:
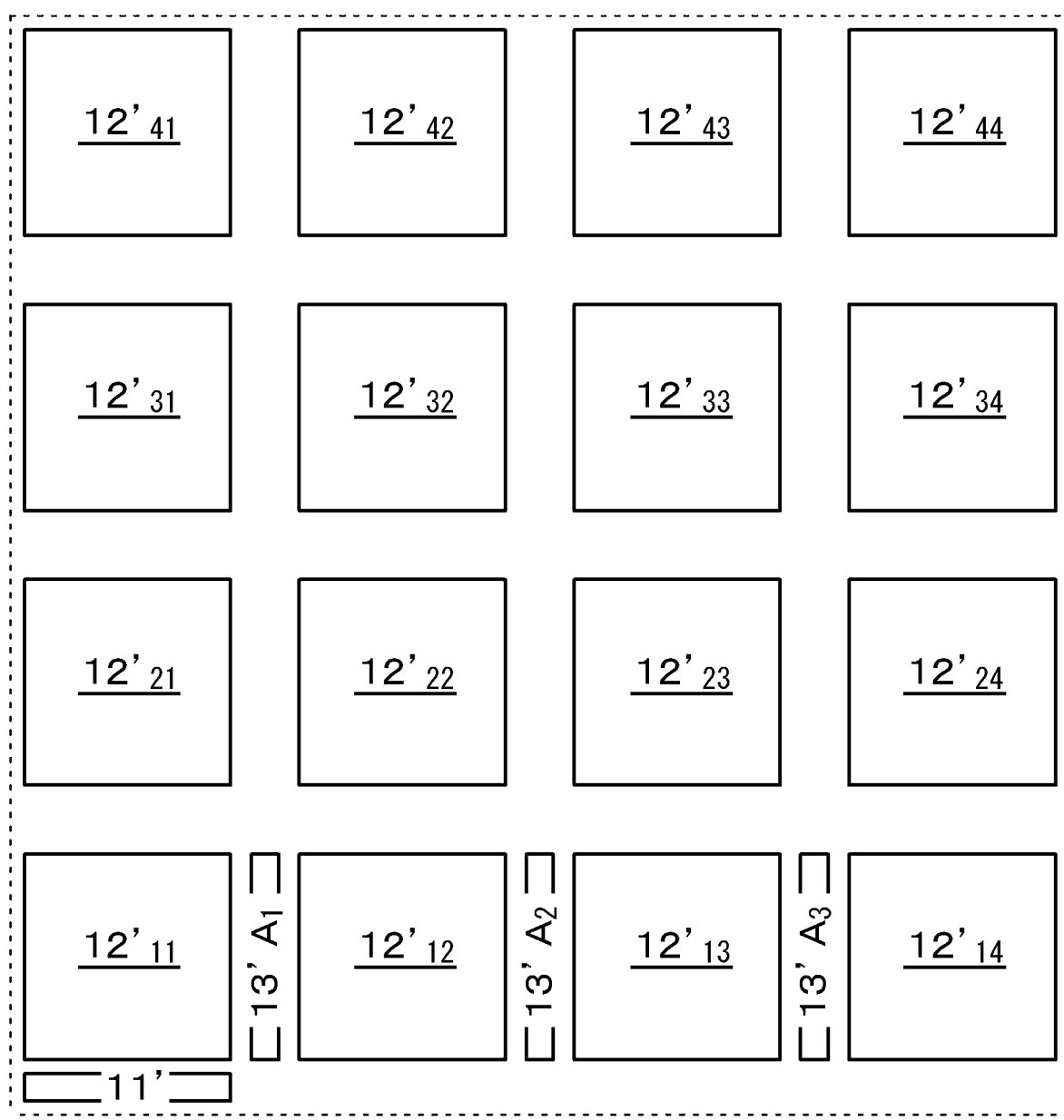
FIG. 33 is a schematic plan view of a first electrode and charge accumulation electrode segments in an eighth modification of the solid-state imaging device of Example 7.
Figure 34:
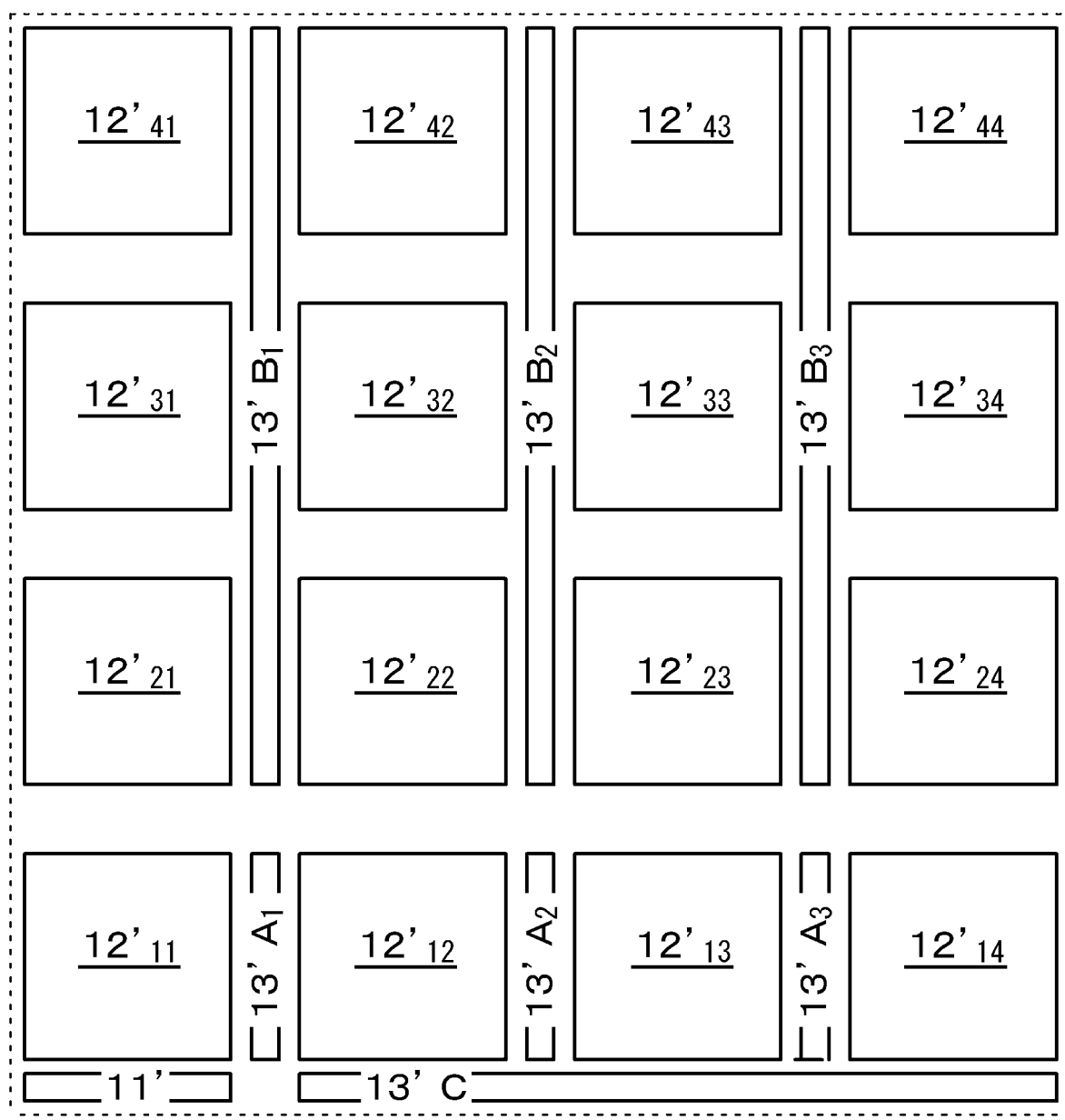
FIG. 34 is a schematic plan view of a first electrode and charge accumulation electrode segments in a ninth modification of the solid-state imaging device of Example 7.

In the eighth and ninth modifications illustrated in FIGS. 33 and 34 schematically illustrating the arrangement state of the first electrode 11' and the charge accumulation electrode 12', an imaging element block includes sixteen imaging elements. As illustrated in FIGS. 33 and 34, transfer control electrodes 13'A$_1$, 13'A$_2$, and 13'A$_3$ are disposed between the charge accumulation electrode 12'$_{11}$ and the charge accumulation electrode $12'_{12}$, between the charge accumulation electrode $12'_{12}$ and the charge accumulation electrode $12'_{13}$, and between the charge accumulation electrode $12'_{13}$ and the charge accumulation electrode $12'_{14}$, respectively. Furthermore, as illustrated in FIG. 34, transfer control electrodes $13'B_1$, $13'B_2$, and $13'B_3$ are disposed between the charge accumulation electrodes $12'_{21}$, $12'_{31}$, and $13'_{41}$ and the charge accumulation electrodes $12'_{22}$, $12'_{32}$, and $13'_{42}$, between the charge accumulation electrodes $12'_{22}$, $12'_{32}$, and $13'_{42}$ and the charge accumulation electrodes $12'_{23}$, $12'_{33}$, and $13'_{43}$, and between the charge accumulation electrodes $12'_{23}$, $12'_{33}$, and $13'_{43}$ and the charge accumulation electrodes $12'_{24}$, $12'_{34}$, and $13'_{44}$, respectively. Moreover, a transfer control electrode $13'C$ is disposed between imaging element blocks. In addition, in these solid-state imaging devices, by controlling the 16 charge accumulation electrodes 12', the charges accumulated in the photoelectric conversion layer 15 can be read out from the first electrode 11'.

[Step-10]

Specifically, first, the charges accumulated in the region of the photoelectric conversion layer 15 facing the charge accumulation electrode $12'_{11}$ are read out from the first electrode 11'. Next, the charges accumulated in the region of the photoelectric conversion layer 15 facing the charge accumulation electrode $12'_{12}$ are read out from the first electrode 11' via the region of the photoelectric conversion layer 15 facing the charge accumulation electrode $12'_{11}$. Next, the charges accumulated in the region of the photoelectric conversion layer 15 facing the charge accumulation electrode $12'_{13}$ are read out from the first electrode 11' via the regions of the photoelectric conversion layer 15 facing the charge accumulation electrodes $12'_{12}$ and $12'_{11}$.

[Step-20]

Thereafter, the charges accumulated in the region of the photoelectric conversion layer 15 facing the charge accumulation electrode $12'_{21}$ are transferred to the region of the photoelectric conversion layer 15 facing the charge accumulation electrode $12'_{11}$. The charges accumulated in the region of the photoelectric conversion layer 15 facing the charge accumulation electrode $12'_{22}$ are transferred to the region of the photoelectric conversion layer 15 facing the charge accumulation electrode $12'_{12}$. The charges accumulated in the region of the photoelectric conversion layer 15 facing the charge accumulation electrode $12'_{23}$ are transferred to the region of the photoelectric conversion layer 15 facing the charge accumulation electrode $12'_{13}$. The charges accumulated in the region of the photoelectric conversion layer 15 facing the charge accumulation electrode $12'_{24}$ are transferred to the region of the photoelectric conversion layer 15 facing the charge accumulation electrode $12'_{14}$.

[Step-21]

The charges accumulated in the region of the photoelectric conversion layer 15 facing the charge accumulation electrode $12'_{31}$ are transferred to the region of the photoelectric conversion layer 15 facing the charge accumulation electrode $12'_{21}$. The charges accumulated in the region of the photoelectric conversion layer 15 facing the charge accumulation electrode $12'_{32}$ are transferred to the region of the photoelectric conversion layer 15 facing the charge accumulation electrode $12'_{22}$. The charges accumulated in the region of the photoelectric conversion layer 15 facing the charge accumulation electrode $12'_{33}$ are transferred to the region of the photoelectric conversion layer 15 facing the charge accumulation electrode $12'_{23}$. The charges accumulated in the region of the photoelectric conversion layer 15 facing the charge accumulation electrode $12'_{34}$ are transferred to the region of the photoelectric conversion layer 15 facing the charge accumulation electrode $12'_{24}$.

[Step-22]

The charges accumulated in the region of the photoelectric conversion layer 15 facing the charge accumulation electrode $12'_{41}$ are transferred to the region of the photoelectric conversion layer 15 facing the charge accumulation electrode $12'_{31}$. The charges accumulated in the region of the photoelectric conversion layer 15 facing the charge accumulation electrode $12'_{42}$ are transferred to the region of the photoelectric conversion layer 15 facing the charge accumulation electrode $12'_{32}$. The charges accumulated in the region of the photoelectric conversion layer 15 facing the charge accumulation electrode $12'_{43}$ are transferred to the region of the photoelectric conversion layer 15 facing the charge accumulation electrode $12'_{33}$. The charges accumulated in the region of the photoelectric conversion layer 15 facing the charge accumulation electrode $12'_{44}$ are transferred to the region of the photoelectric conversion layer 15 facing the charge accumulation electrode $12'_{34}$.

[Step-30]

Then, by executing [step-10] again, the charges accumulated in the region of the photoelectric conversion layer 15 facing the charge accumulation electrode $12'_{21}$, the charges accumulated in the region of the photoelectric conversion layer 15 facing the charge accumulation electrode $12'_{22}$, the charges accumulated in the region of the photoelectric conversion layer 15 facing the charge accumulation electrode $12'_{23}$, and the charges accumulated in the region of the photoelectric conversion layer 15 facing the charge accumulation electrode $12'_{24}$ can be read out via the first electrode 11'.

[Step-40]

Thereafter, the charges accumulated in the region of the photoelectric conversion layer 15 facing the charge accumulation electrode $12'_{21}$ are transferred to the region of the photoelectric conversion layer 15 facing the charge accumulation electrode $12'_{11}$. The charges accumulated in the region of the photoelectric conversion layer 15 facing the charge accumulation electrode $12'_{22}$ are transferred to the region of the photoelectric conversion layer 15 facing the charge accumulation electrode $12'_{12}$. The charges accumulated in the region of the photoelectric conversion layer 15 facing the charge accumulation electrode $12'_{23}$ are transferred to the region of the photoelectric conversion layer 15 facing the charge accumulation electrode $12'_{13}$. The charges accumulated in the region of the photoelectric conversion layer 15 facing the charge accumulation electrode $12'_{24}$ are transferred to the region of the photoelectric conversion layer 15 facing the charge accumulation electrode $12'_{14}$.

[Step-41]

The charges accumulated in the region of the photoelectric conversion layer 15 facing the charge accumulation electrode $12'_{31}$ are transferred to the region of the photoelectric conversion layer 15 facing the charge accumulation electrode $12'_{21}$. The charges accumulated in the region of the photoelectric conversion layer 15 facing the charge accumulation electrode $12'_{32}$ are transferred to the region of the photoelectric conversion layer 15 facing the charge accumulation electrode $12'_{22}$. The charges accumulated in the region of the photoelectric conversion layer 15 facing the charge accumulation electrode $12'_{33}$ are transferred to the region of the photoelectric conversion layer 15 facing the charge accumulation electrode $12'_{23}$. The charges accumulated in the region of the photoelectric conversion layer 15 facing the charge accumulation electrode $12'_{34}$ are transferred to the region of the photoelectric conversion layer 15 facing the charge accumulation electrode $12'_{24}$.

[Step-50]

Then, by executing [step-10] again, the charges accumulated in the region of the photoelectric conversion layer 15 facing the charge accumulation electrode $12'_{31}$, the charges accumulated in the region of the photoelectric conversion layer 15 facing the charge accumulation electrode $12'_{32}$, the charges accumulated in the region of the photoelectric conversion layer 15 facing the charge accumulation electrode $12'_{33}$, and the charges accumulated in the region of the photoelectric conversion layer 15 facing the charge accumulation electrode $12'_{34}$ can be read out via the first electrode 11'.

[Step-60]

Thereafter, the charges accumulated in the region of the photoelectric conversion layer 15 facing the charge accumulation electrode $12'_{21}$ are transferred to the region of the photoelectric conversion layer 15 facing the charge accumulation electrode $12'_{11}$. The charges accumulated in the region of the photoelectric conversion layer 15 facing the charge accumulation electrode $12'_{22}$ are transferred to the region of the photoelectric conversion layer 15 facing the charge accumulation electrode $12'_{12}$. The charges accumulated in the region of the photoelectric conversion layer 15 facing the charge accumulation electrode $12'_{23}$ are transferred to the region of the photoelectric conversion layer 15 facing the charge accumulation electrode $12'_{13}$. The charges accumulated in the region of the photoelectric conversion layer 15 facing the charge accumulation electrode $12'_{24}$ are transferred to the region of the photoelectric conversion layer 15 facing the charge accumulation electrode $12'_{14}$.

[Step-70]

Then, by executing [step-10] again, the charges accumulated in the region of the photoelectric conversion layer 15 facing the charge accumulation electrode $12'_{41}$, the charges accumulated in the region of the photoelectric conversion layer 15 facing the charge accumulation electrode $12'_{42}$, the charges accumulated in the region of the photoelectric conversion layer 15 facing the charge accumulation electrode $12'_{43}$, and the charges accumulated in the region of the photoelectric conversion layer 15 facing the charge accumulation electrode $12'_{44}$ can be read out via the first electrode 11'.

In the solid-state imaging device of Example 7, since the first electrode is shared by the plurality of imaging elements constituting the imaging element block, the configuration and structure in a pixel region in which a plurality of imaging elements is arrayed can be simplified and miniaturized. Note that the plurality of imaging elements disposed for one floating diffusion layer may be constituted by a plurality of first type imaging elements, or may be constituted by at least one first type imaging element and one or more second type imaging elements.

Example 8

Example 8 is a modification of Example 7. In the solid-state imaging device of Example 8 illustrated in FIGS. 36, 37, 38, and 39 schematically illustrating the arrangement state of the first electrode 11' and the charge accumulation electrode 12', an imaging element block includes two imaging elements. In addition, one on-chip micro lens 90 is disposed above an imaging element block. Note that in the examples illustrated in FIGS. 37 and 39, the transfer control electrode 13' is disposed among the plurality of imaging elements constituting an imaging element block.

For example, photoelectric conversion layers corresponding to the charge accumulation electrodes $12'_{11}$, $12'_{21}$, $12'_{31}$, and $12'_{41}$ constituting an imaging element block are highly sensitive to incident light from the upper right in the drawings. Furthermore, photoelectric conversion layers corresponding to the charge accumulation electrodes $12'_{12}$, $12'_{22}$, $12'_{32}$, and $12'_{42}$ constituting an imaging element block are highly sensitive to incident light from the upper left in the drawing. Therefore, for example, by combining an imaging element including the charge accumulation electrode $12'_{11}$ with an imaging element including the charge accumulation electrode $12'_{12}$, an image plane phase difference signal can be acquired. Furthermore, if a signal from an imaging element including the charge accumulation electrode $12'_{11}$ is added to a signal from an imaging element including the charge accumulation electrode $12'_{12}$, one imaging element can be constituted by a combination with these imaging elements. In the example illustrated in FIG. 36, the first electrode $11'_1$ is disposed between the charge accumulation electrode $12'_{11}$ and the charge accumulation electrode $12'_{12}$. However, as in the example illustrated in FIG. 38, by disposing one first electrode $11'_1$ so as to face the two charge accumulation electrodes $12'_n$ and $12'_{12}$ arranged in parallel, the sensitivity can be further improved.

Example 9

Figure 40:
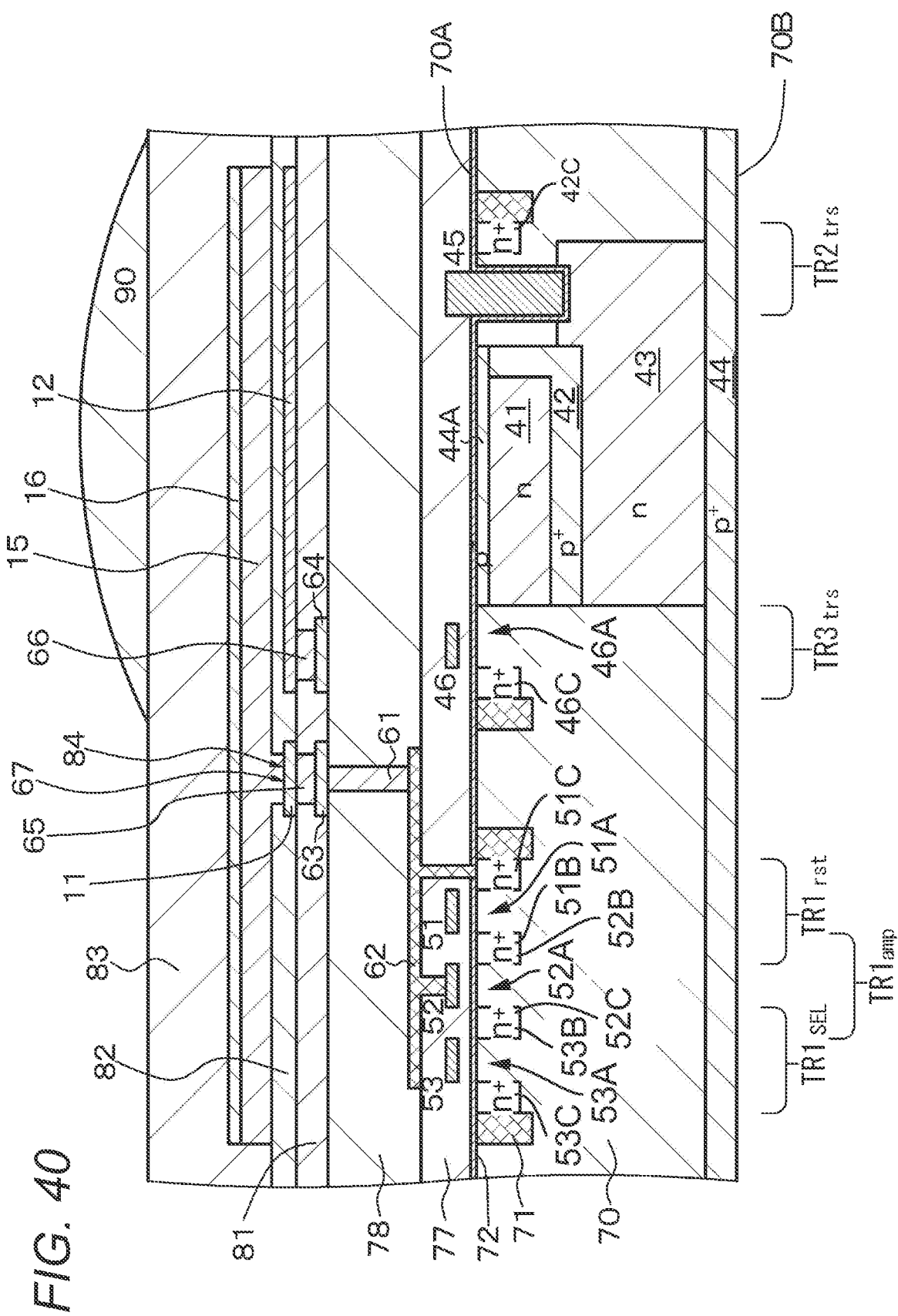
FIG. 40 is a schematic partial cross-sectional view of an imaging element and a laminated imaging element of Example 9.

Example 9 is a modification of Examples 1 to 6. The imaging element and the laminated imaging element of Example 9, illustrated in the schematic partial cross-sectional view of FIG. 40, are a frontside irradiation type imaging element and a frontside irradiation type laminated imaging element, respectively, and each have a structure formed by laminating three imaging elements of a first type green light imaging element of each of Examples 1 to 6, including a first type green light photoelectric conversion layer that absorbs green light and sensitive to green light (first imaging element), a second type conventional blue light imaging element including a second type blue light photoelectric conversion layer that absorbs blue light and sensitive to blue light (second imaging element), and a second type conventional red light imaging element including a second type red light photoelectric conversion layer that absorbs red light and sensitive to red light (third imaging element). Here, the red light imaging element (third imaging element) and the blue light imaging element (second imaging element) are disposed in the semiconductor substrate 70, and the second imaging element is located closer to the light incident side than the third imaging element. Furthermore, the green light imaging element (first imaging element) is disposed above the blue light imaging element (second imaging element).

Note that in FIGS. 40, 41, 42, 43, 44, 45, 48, 49, 51, 52, 53, 54, 55, and 56, the photoelectric conversion unit segments are not illustrated, and the charge accumulation electrode 12, the insulating layer 82, and the photoelectric conversion layer 15 are illustrated in order to simplify the drawings.

On the front surface 70A side of the semiconductor substrate 70, various transistors constituting a control unit are disposed as in Example 1. These transistors can have substantially similar configurations and structures to the transistors described in Example 1. Furthermore, the semiconductor substrate 70 includes the second imaging element and the third imaging element, and these imaging elements can have substantially similar configurations and structures to the second imaging element and the third imaging element described in Example 1.

Interlayer insulating layers 77 and 78 are formed on the front surface 70A of the semiconductor substrate 70. On the interlayer insulating layer 78, the photoelectric conversion unit (first electrode 11, photoelectric conversion layer 15, and second electrode 16), the charge accumulation electrode 12, and the like constituting each of the imaging elements of Examples 1 to 6 are disposed.

In this way, the configuration and structure of the imaging element and the laminated imaging element of Example 9 can be similar to the configuration and structure of the imaging elements and the laminated imaging elements of Examples 1 to 6 except for being the frontside irradiation type. Therefore, detailed description thereof is omitted.

Example 10

Example 10 is a modification of Examples 1 to 9.

Figure 41:
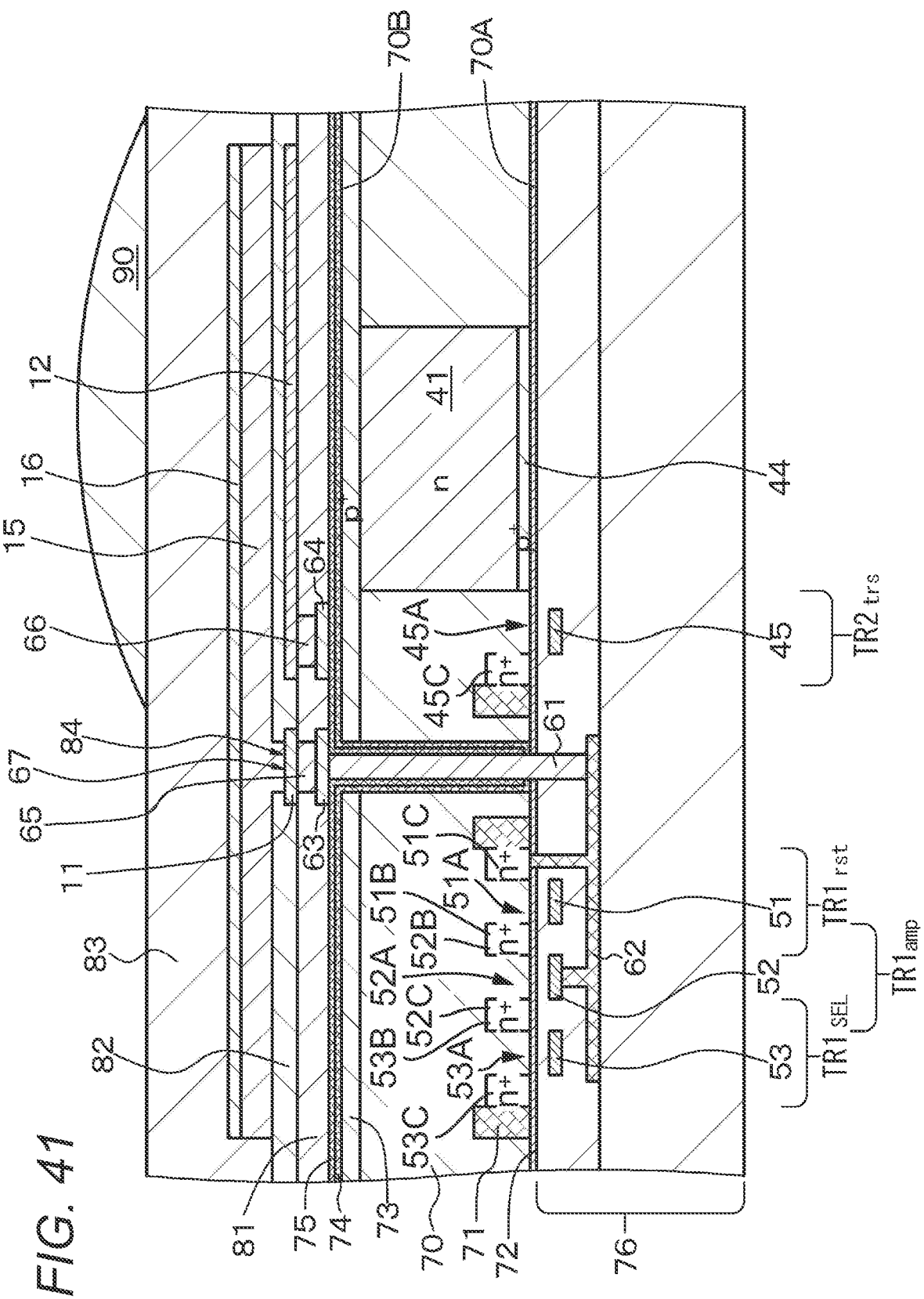
FIG. 41 is a schematic partial cross-sectional view of an imaging element and a laminated imaging element of Example 10.
Figure 42:
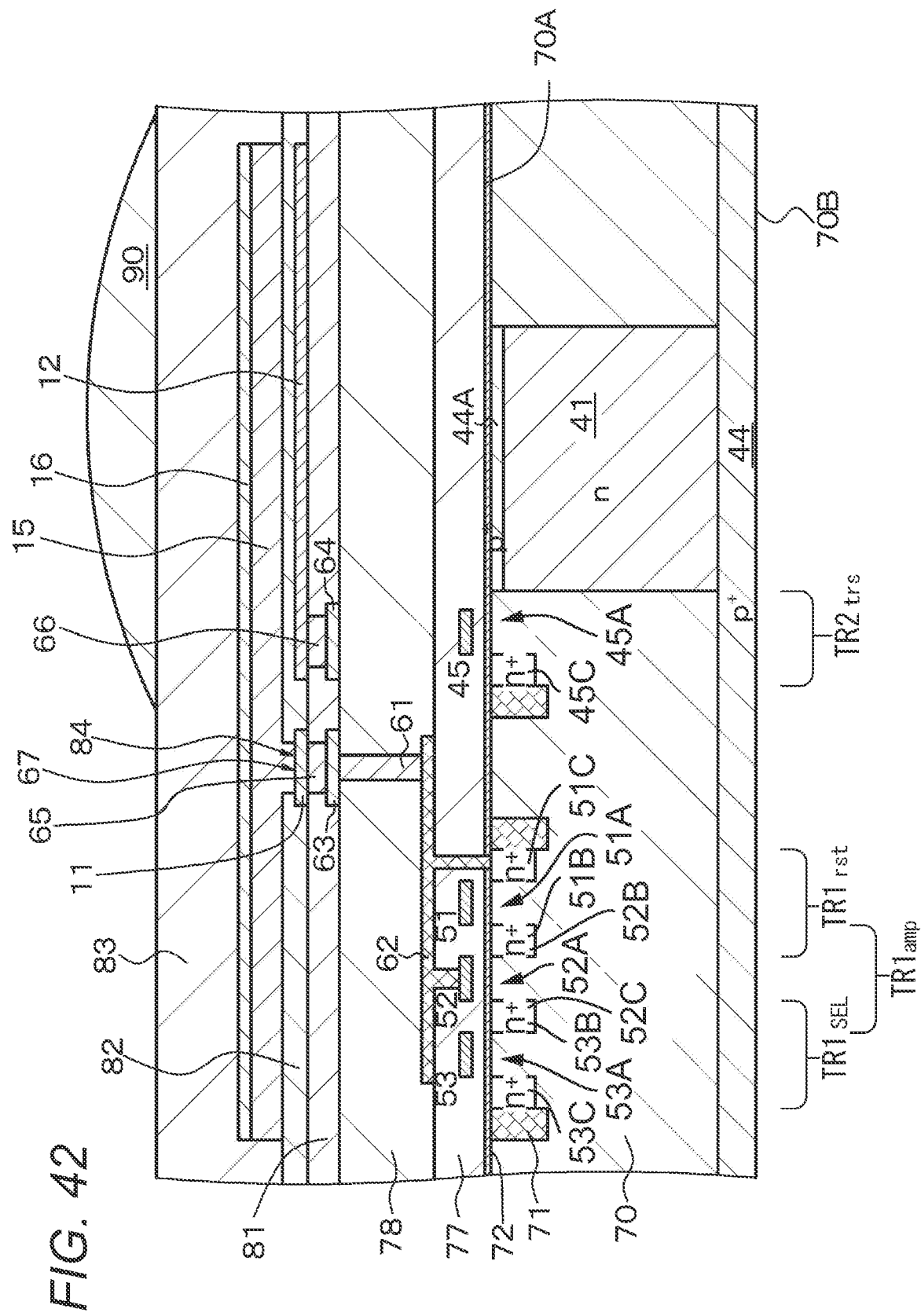
FIG. 42 is a schematic partial cross-sectional view of a modification of the imaging element and the laminated imaging element of Example 10.

An imaging element and a laminated imaging element of Example 10, illustrated in the schematic partial cross-sectional view of FIG. 41, are a backside irradiation type imaging element and a backside irradiation type laminated imaging element, respectively, and each have a structure formed by laminating two imaging elements of the first type first imaging element of Examples 1 to 6 and the second type second imaging element. Furthermore, modifications of the imaging element and the laminated imaging element of Example 10, illustrated in the schematic partial cross-sectional view of FIG. 42, are a frontside irradiation type imaging element and a frontside irradiation type laminated imaging element, respectively, and each have a structure formed by laminating two imaging elements of the first type first imaging element of Examples 1 to 6 and the second type second imaging element. Here, the first imaging element absorbs primary color light, and the second imaging element absorbs complementary color light. Alternatively, the first imaging element absorbs white light, and the second imaging element absorbs infrared rays.

Figure 43:
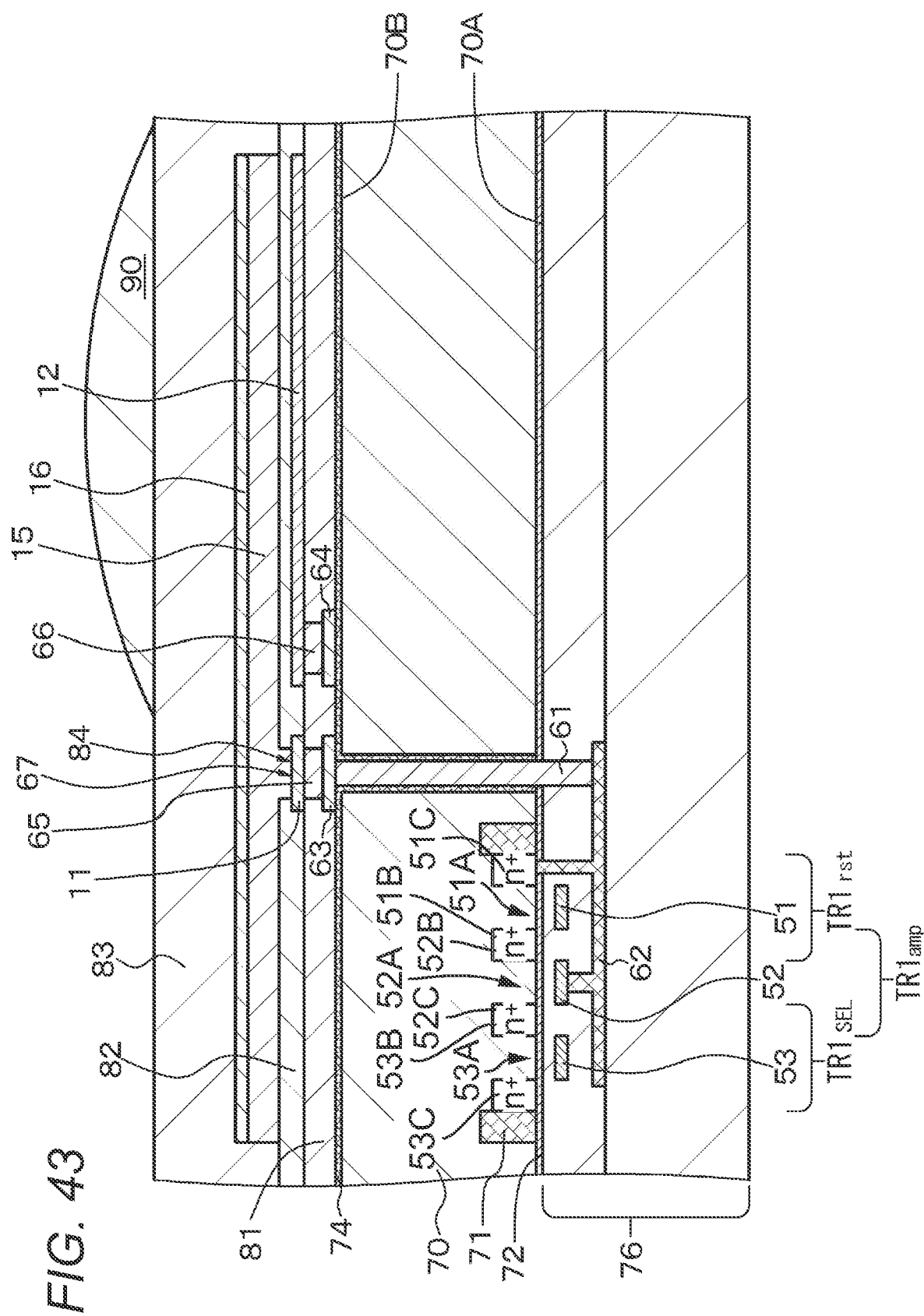
FIG. 43 is a schematic partial cross-sectional view of another modification of the imaging element of Example 10.
Figure 44:
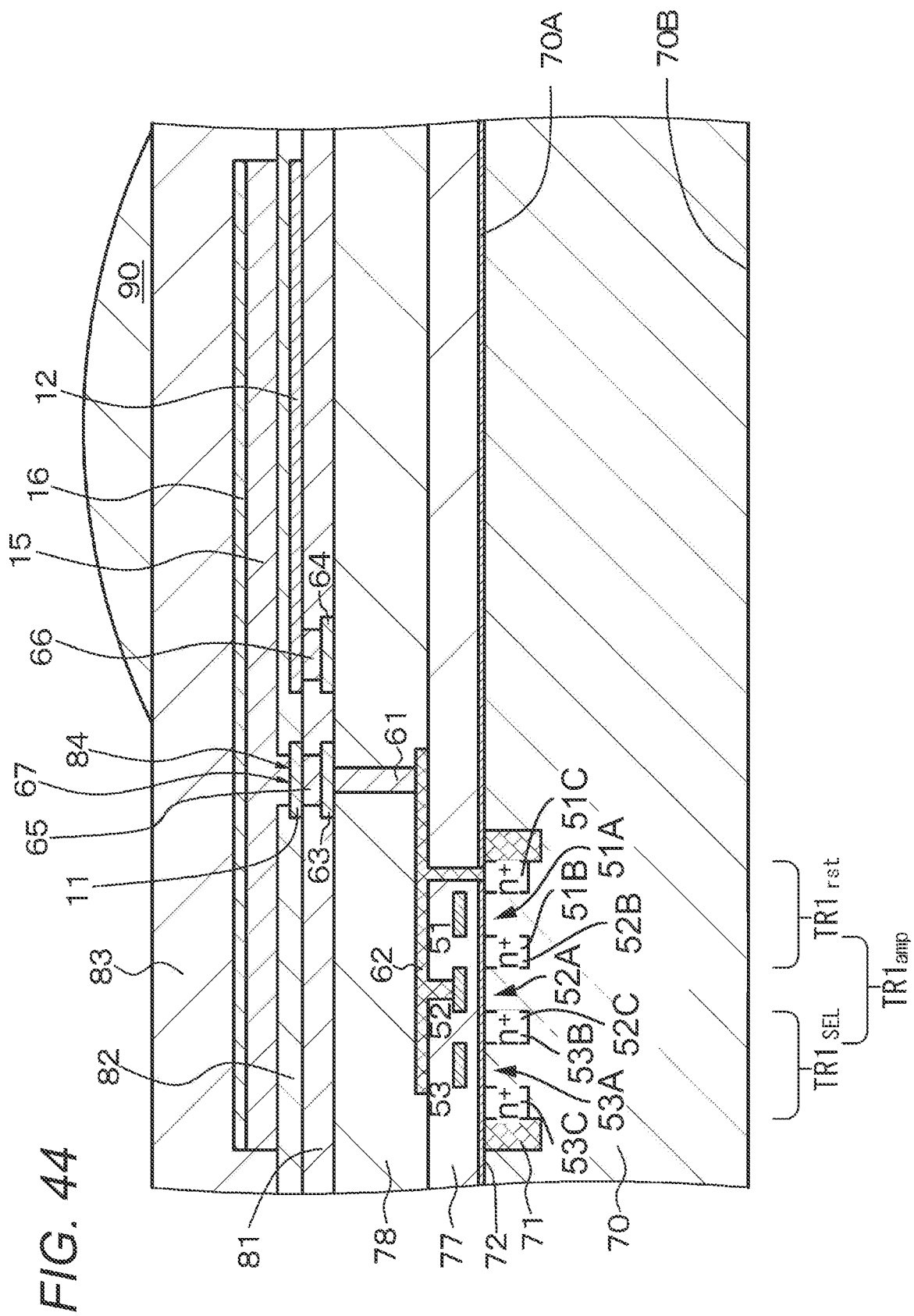
FIG. 44 is a schematic partial cross-sectional view of still another modification of the imaging element of Example 10.

A modification of the imaging element of Example 10, illustrated in the schematic partial cross-sectional view of FIG. 43, is a backside irradiation type imaging element, and is constituted by the first type first imaging elements of Examples 1 to 6. Furthermore, a modification of the imaging element of Example 10, illustrated in the schematic partial cross-sectional view of FIG. 44, is a frontside irradiation type imaging element, and is constituted by the first type first imaging elements of Examples 1 to 6. Here, the first imaging element is constituted by three types of imaging elements of an imaging element that absorbs red light, an imaging element that absorbs green light, and an imaging element that absorbs blue light. Moreover, the solid-state imaging device according to the third aspect of the present disclosure is constituted by a plurality of these imaging elements. As an arrangement of the plurality of imaging elements, a Bayer array can be cited. On the light incident side of each imaging element, a color filter for performing blue, green, and red spectroscopy is disposed as necessary.

Note that instead of disposing one first type imaging element of any one of Examples 1 to 6, a form can be adopted in which two first type imaging elements of any one of Examples 1 to 6 are laminated (that is, a form in which two photoelectric conversion units are laminated, and a control unit for the two imaging elements is disposed on a semiconductor substrate), or a form can be adopted in which three first type imaging elements of any one of Examples 1 to 6 are laminated (that is, a form in which three photoelectric conversion units are laminated, and a control unit for the three imaging elements is disposed on a semiconductor substrate). Examples of the laminated structure of the first type imaging element and the second type imaging element are illustrated in the following table.

| | First type | Second type | Reference drawing |
|---|---|---|---|
| Backside irradiation type and Frontside irradiation type | 1 Green | 2 Blue + Red | FIGS. 1 and 11 |
| | 1 Primary color | 1 Complementary color | FIGS. 12 and 13 |
| | 1 White | 1 Infrared rays | |
| | 1 Blue, Green, or Red | 0 | FIGS. 14 and 15 |
| | 2 Green + Infrared rays | 2 Blue + Red | |
| | 2 Green + Blue | 1 Red | |
| | 2 White + Infrared rays | 0 | |
| | 3 Green + Blue + Red | 2 Bluegreen (Emerald color) + Infrared rays | |
| | 3 Green + Blue + Red | 1 Infrared rays | |
| | 3 Blue + Green + Red | 0 | |

Example 11

Figure 45:
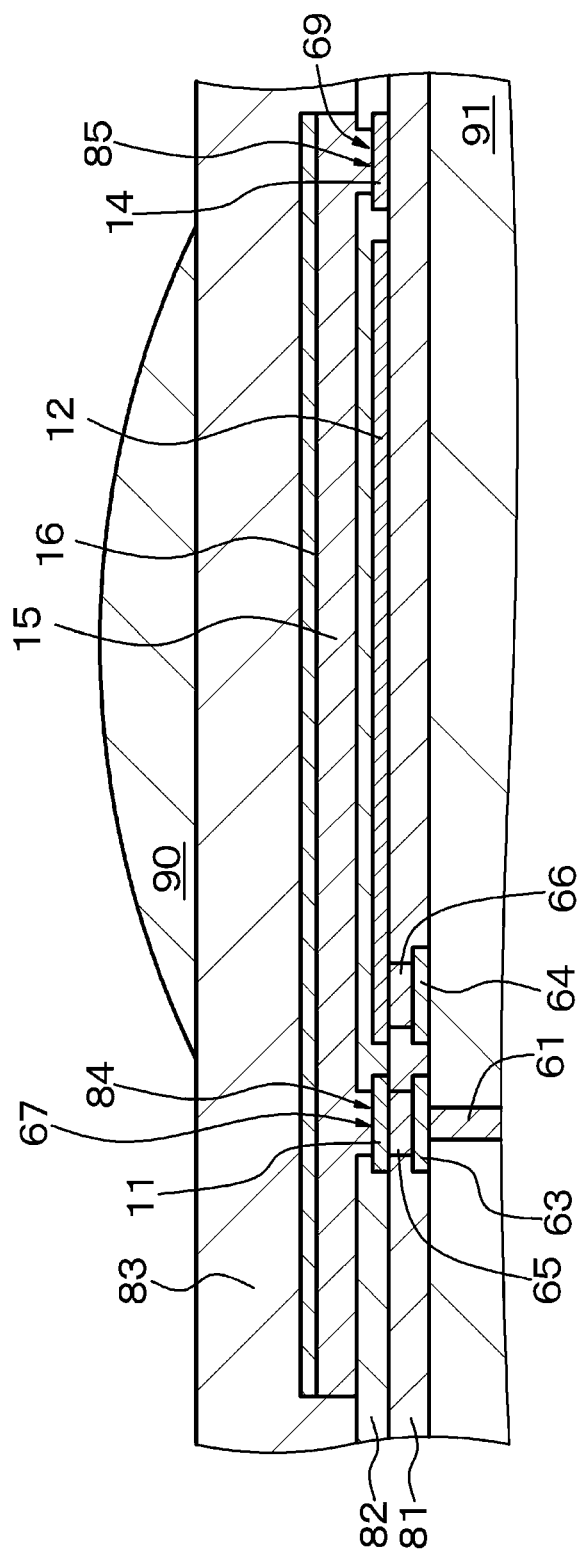
FIG. 45 is a schematic partial cross-sectional view of a part of an imaging element and a laminated imaging element of Example 11.
Figure 46:
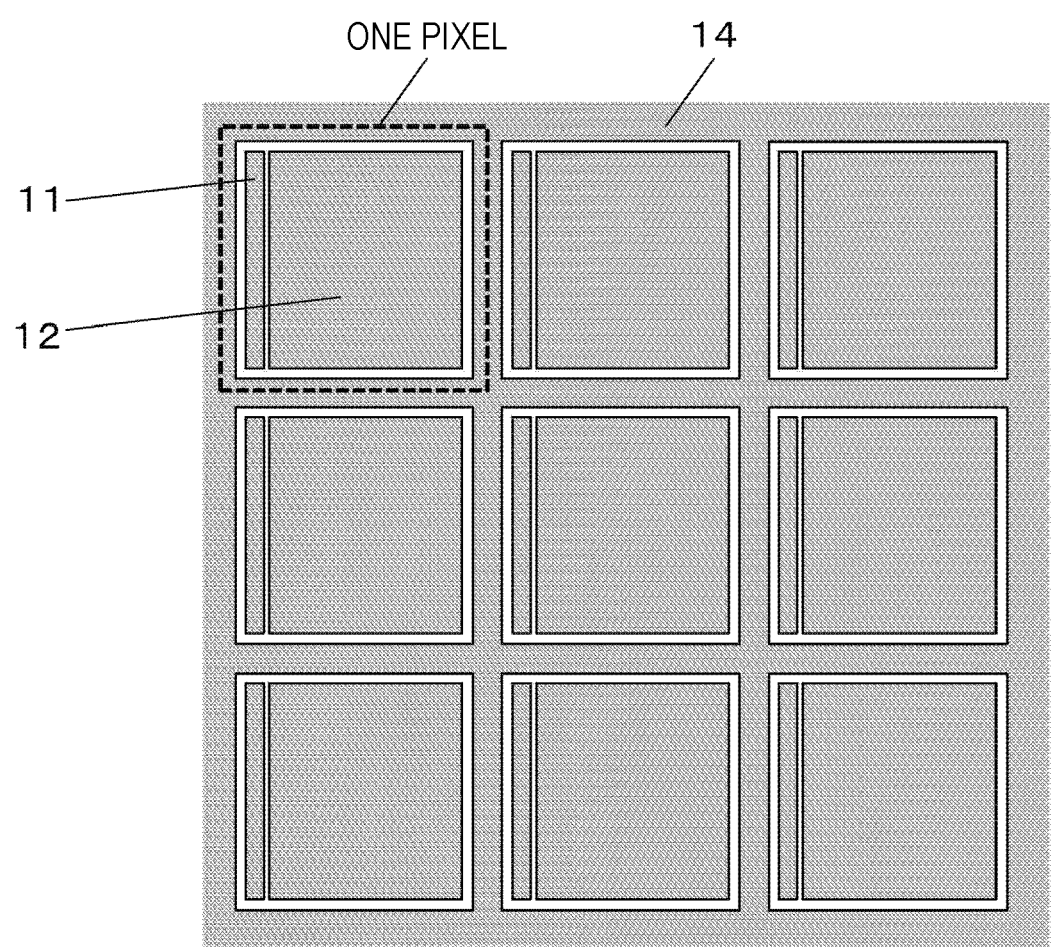
FIG. 46 is a schematic arrangement diagram of a first electrode, a charge accumulation electrode, and a charge discharge electrode constituting the imaging element of Example 11.
Figure 47:
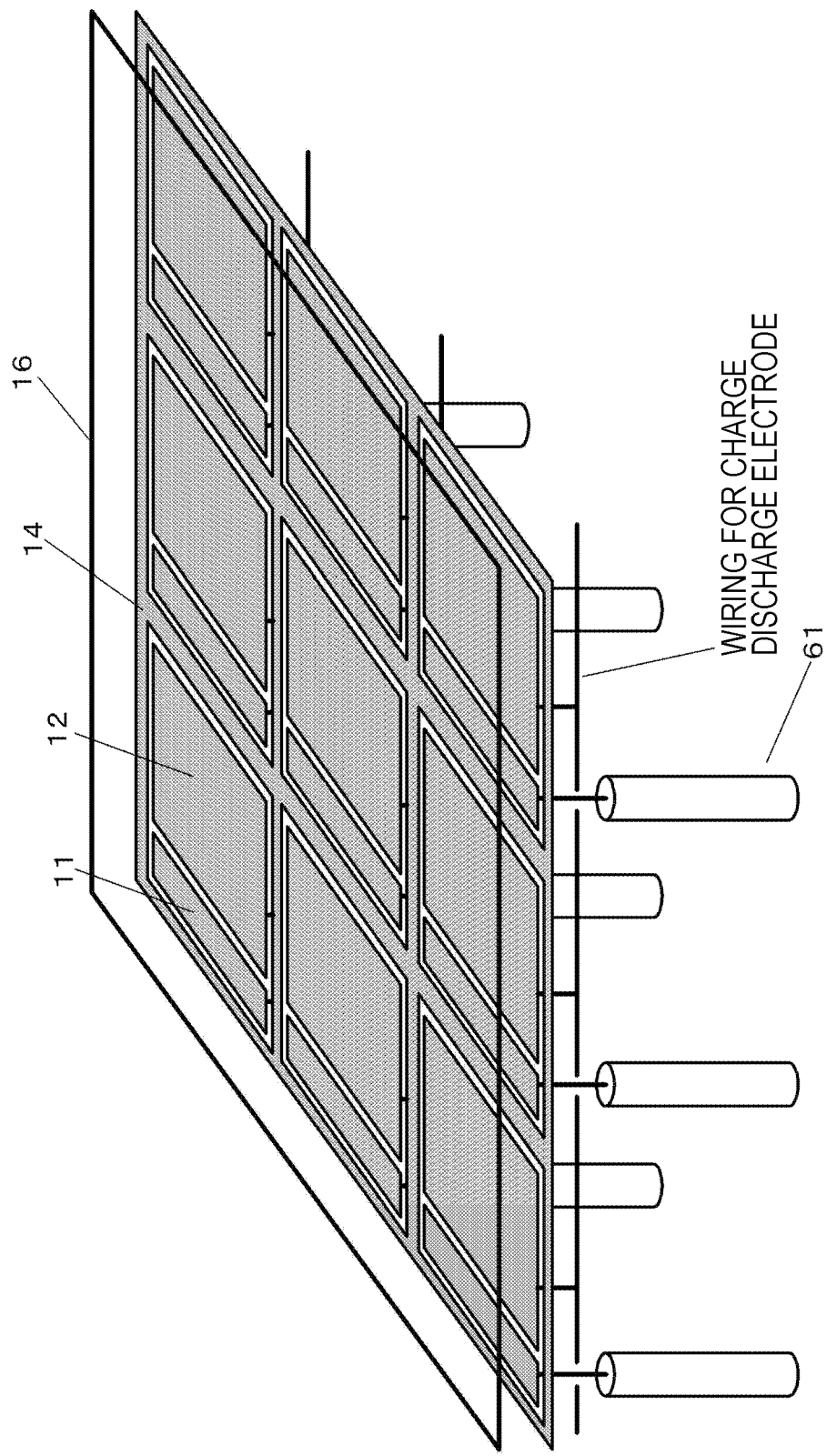
FIG. 47 is a schematic perspective view of a first electrode, a charge accumulation electrode, a charge discharge electrode, a second electrode, and a contact hole portion constituting the imaging element of Example 11.

Example 11 is a modification of Examples 1 to 10, and relates to an imaging element and the like of the present disclosure including a charge discharge electrode. FIG. 45 illustrates a schematic partial cross-sectional view of a part of the imaging element and the laminated imaging element of Example 11. FIG. 46 illustrates a schematic arrangement diagram of a first electrode, a charge accumulation electrode, and a charge discharge electrode constituting the imaging element of Example 11. FIG. 47 illustrates a schematic perspective view of a first electrode, a charge accumulation electrode, a charge discharge electrode, a second electrode, and a contact hole portion constituting the imaging element of Example 11.

The imaging element and the laminated imaging element of Example 11 further include a charge discharge electrode 14 connected to the photoelectric conversion layer 15 via a connection portion 69 and disposed apart from the first electrode 11 and the charge accumulation electrode 12. Here, the charge discharge electrode 14 is disposed so as to surround the first electrode 11 and the charge accumulation electrode 12 (that is, in a frame shape). The charge discharge electrode 14 is connected to a pixel drive circuit constituting a drive circuit. In the connection portion 69, the photoelectric conversion layer 15 extends. That is, the photoelectric conversion layer 15 extends in a second opening 85 formed in the insulating layer 82 to be connected to the charge discharge electrode 14. The charge discharge electrode 14 is shared by (common to) a plurality of imaging elements.

In Example 11, in a charge accumulation period, the potential $V_{11}$ is applied to the first electrode 11, the potential $V_{12}$ is applied to the charge accumulation electrode 12, and the potential $V_{14}$ is applied to the charge discharge electrode 14 from a drive circuit, and charges are accumulated in the photoelectric conversion layer 15. Photoelectric conversion occurs in the photoelectric conversion layer 15 by light incident on the photoelectric conversion layer 15. Holes generated by the photoelectric conversion are sent from the second electrode 16 to a drive circuit via the wiring line $V_{OU}$. Meanwhile, the potential of the first electrode 11 is set to be higher than the potential of the second electrode 16, that is, for example, a positive potential is applied to the first electrode 11, and a negative potential is applied to the second electrode 16. Therefore, $V_{14}<V_{11}$ (for example, $V_{12}>V_{14}>V_{11}$) is satisfied. As a result, electrons generated by the photoelectric conversion are attracted to the charge accumulation electrode 12 and stop in a region of the photoelectric conversion layer facing the charge accumulation electrode 12. Transfer of the electrons toward the first electrode 11 can be prevented reliably. However, electrons that are not sufficiently attracted to the charge accumulation electrode 12 or cannot be accumulated in the photoelectric conversion layer 15 (so-called overflowed electrons) are sent to a drive circuit via the charge discharge electrode 14.

In a later stage of the charge accumulation period, a reset operation is performed. As a result, the potential of the first floating diffusion layer $FD_1$ is reset, and the potential of the first floating diffusion layer $FD_1$ becomes the potential $V_{DD}$ of the power source.

After the reset operation is completed, charges are read out. That is, in a charge transfer period, the potential $V_{21}$ is applied to the first electrode 11, the potential $V_{22}$ is applied to the charge accumulation electrode 12, and the potential $V_{24}$ is applied to the charge discharge electrode 14 from a drive circuit. Here, $V_{24}<V_{21}$ (for example, $V_{24}<V_{22}<V_{21}$) is satisfied. As a result, electrons that have stopped in the region of the photoelectric conversion layer 15 facing the charge accumulation electrode 12 are reliably read out to the first electrode 11 and further to the first floating diffusion layer $FD_1$. That is, the charges accumulated in the photoelectric conversion layer 15 are read out to the control unit.

In this way, a series of operations including charge accumulation, reset operation, and charge transfer are completed.

The operations of the amplification transistor $TR1_{amp}$ and the selection transistor $TR1_{sel}$ after electrons are read out to the first floating diffusion layer $FD_1$ are the same as the conventional operations of these transistors. Furthermore, for example, a series of operations including charge accumulation, reset operation, and charge transfer of the second imaging element and the third imaging element are similar to a conventional series of operations including charge accumulation, reset operation, and charge transfer.

In Example 11, so-called overflowed electrons are sent to a drive circuit via the charge discharge electrode 14. Therefore, leakage to a charge accumulation portion of an adjacent pixel can be suppressed, and occurrence of blooming can be suppressed. In addition, this can improve imaging performance of the imaging element.

Example 12

As additional Example of the present disclosure, Example 12 will be described with reference to FIGS. 61 to 96.

Figure 56:
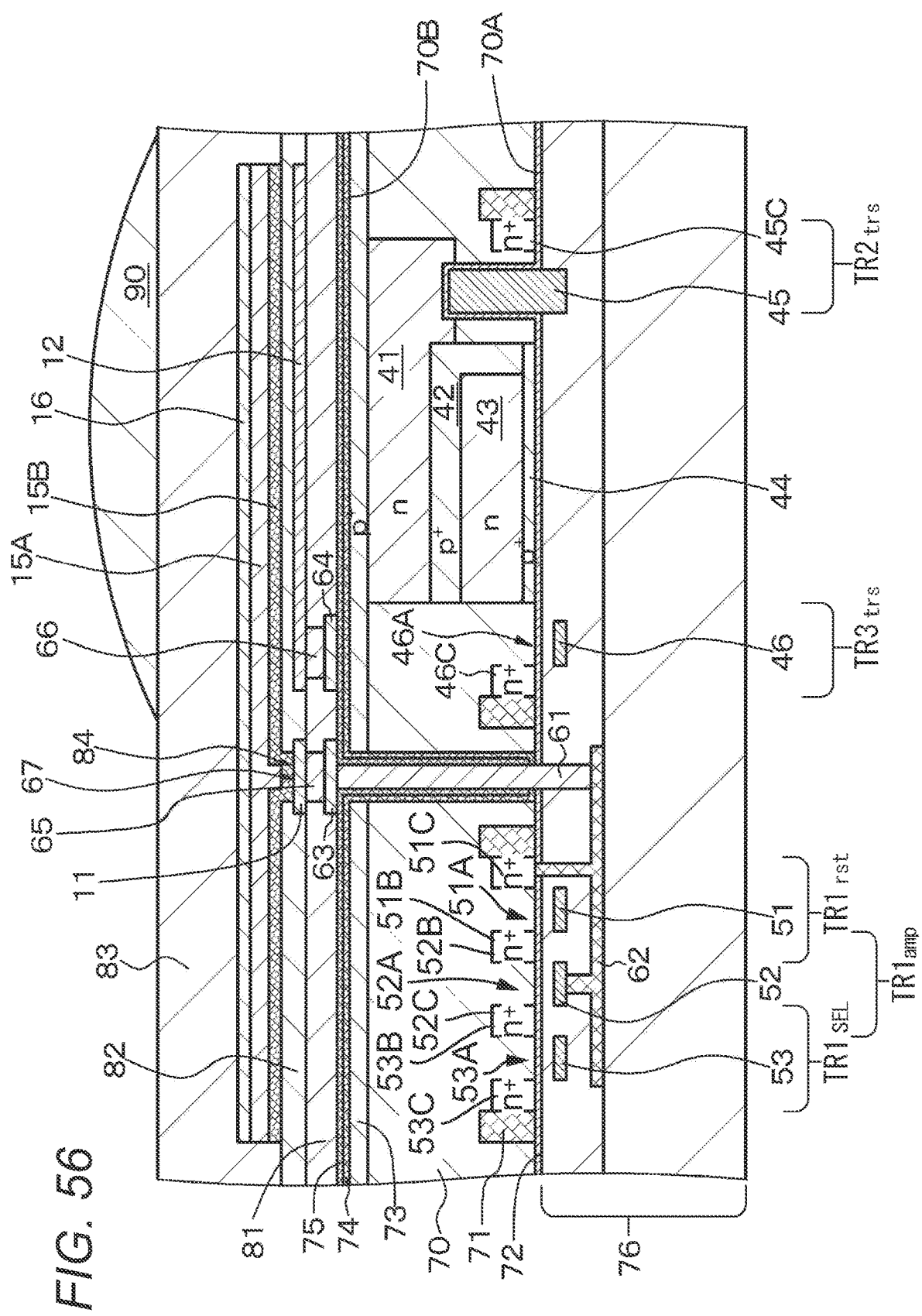
FIG. 56 is a schematic partial cross-sectional view of still another modification of the imaging element and the laminated imaging element of Example 1.

The solid-state imaging device 100 of First Example and a modification thereof described with reference to FIGS. 1 to 9 and 56 includes the imaging region 111 in which the laminated imaging elements 101 as repeating units are arrayed two-dimensionally as illustrated in FIG. 9. In addition, as for the laminated imaging element 101 as a repeating unit, (1) FIG. 3 illustrates equivalent circuits of the first to third imaging elements 102 to 104 included in the laminated imaging element 101, (2) FIG. 4 illustrates an equivalent circuit of the entire laminated imaging element 101 including the first to third imaging elements 102 to 104, (3) FIG. 5 illustrates a layout on the first surface of the semiconductor substrate 70 of a transistor included in the laminated imaging element 101, and (4) FIGS. 1 and 56 illustrate cross-sectional views of the laminated imaging element 101.

The solid-state imaging device 100 disclosed as Example 12 is different from Example 1 in the configuration on the equivalent circuit, the cross-sectional structure, and the planar structure. Each of these differences will be described.

<Cross-Sectional Structure>

Figure 61:
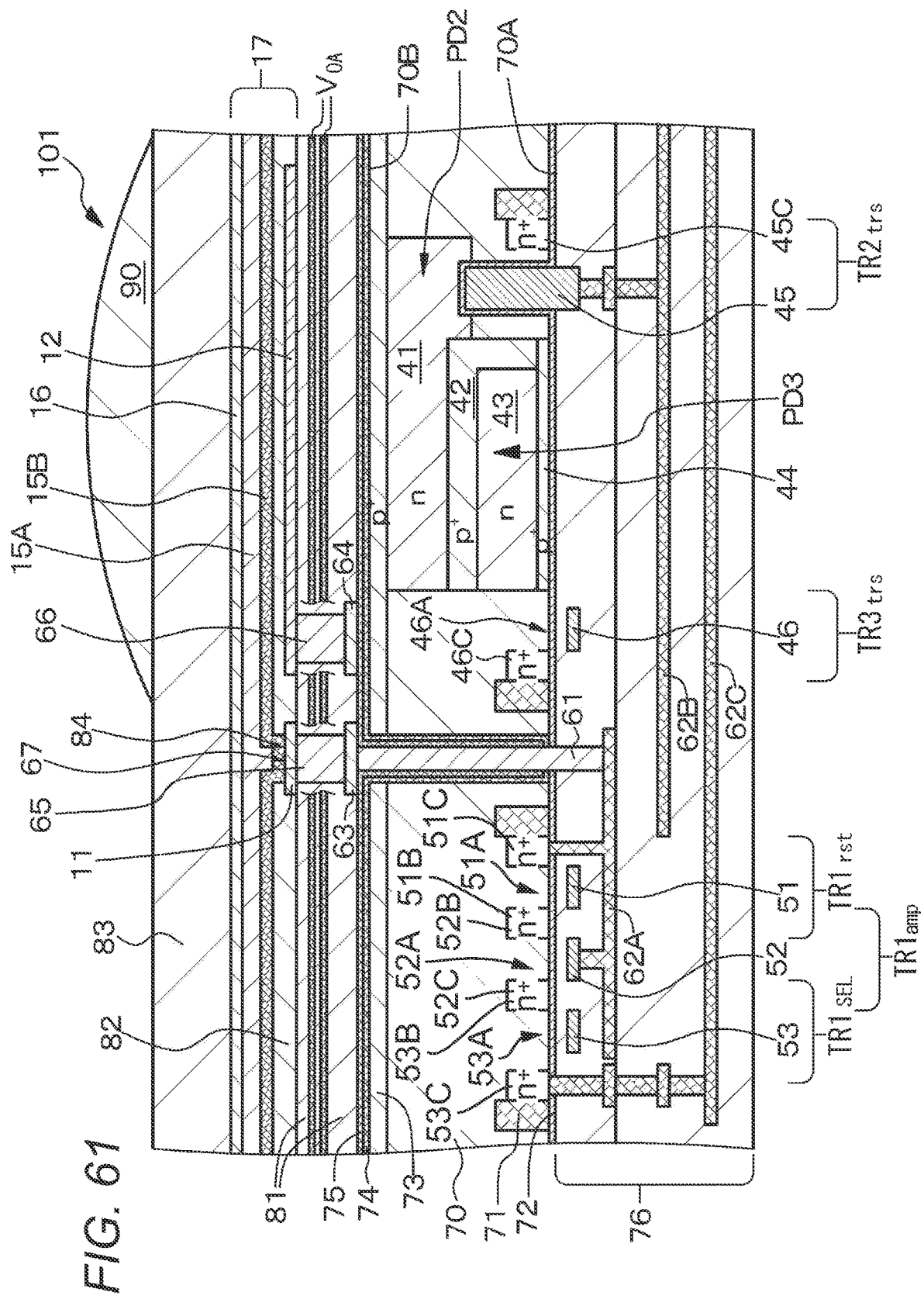
FIG. 61 is a schematic partial cross-sectional view of a laminated imaging element of Example 12.

FIG. 61 is a diagram illustrating a cross-sectional structure of the laminated imaging element 101 included in the solid-state imaging device 100 of Example 12.

The cross-sectional structure of the laminated imaging element 101 of Example 12 illustrated in FIG. 61 is basically the same as that of the laminated imaging element 101 that is a modification of Example 1 illustrated in FIG. 56. That is, one laminated imaging element 101 (in other words, laminated imaging element 101 for one pixel) is formed by laminating:

(1) one on-chip micro lens 90;

(2) one photoelectric conversion unit 17 constituting the first imaging element 102, including the first electrode 11, the charge accumulation electrode 12, the insulating layer 82, a semiconductor layer 15B, a photoelectric conversion layer 15A, and the second electrode 16;

(3) one PD2 constituting the second imaging element 103; and (4) one PD3 constituting the third imaging element 104.

However, as for description in the drawings, the cross-sectional structure of the laminated imaging element 101 of Example 12 illustrated in FIG. 61 is different from that of the laminated imaging element 101 that is a modification of Example 1 illustrated in FIG. 56 in the following points.

(1) In the laminated imaging element 101 illustrated in FIG. 56, the second electrode 16, the photoelectric conversion layer 15B, and the semiconductor layer 15A have outer edges in the horizontal direction of the drawing. Meanwhile, in the laminated imaging element 101 of Example 12, the second electrode 16, the photoelectric conversion layer 15B, and the semiconductor layer 15A extend across a plurality of the laminated imaging elements 101 (in other words, laminated imaging elements 101 for a plurality of pixels). More preferably, the second electrode 16, the photoelectric conversion layer 15B, and the semiconductor layer 15A extend across the entire imaging region (in other words, pixel array region) 111 included in the solid-state imaging device 100. In the laminated imaging element 101 illustrated in FIG. 61, the second electrode 16, the photoelectric conversion layer 15B, and the semiconductor layer 15A do not have outer edges in the horizontal direction of the drawing. However, the second electrode 16, the photoelectric conversion layer 15B, and the semiconductor layer 15A or the photoelectric conversion layer 15 can extend across the laminated imaging elements 101 for a plurality of pixels, and the cell configuration can also be applied to all Examples of the present disclosure and modifications thereof. Therefore, a difference in the configuration described above for these films is not an essential difference between the laminated imaging element 101 of Example 12 illustrated in FIG. 61 and the laminated imaging element 101 that is a modification of Example 1 illustrated in FIG. 56.

(2) In the laminated imaging element 101 illustrated in FIG. 56, the charge accumulation electrode 12 is driven via the connection hole 66, the pad portion 64, and the drive wiring line VOA of the charge accumulation electrode illustrated in FIG. 8, formed between the charge accumulation electrode 12 and the contact hole portion 61 using a metal wiring layer that is the same layer as the pad portion 64 and extending across a plurality of pixels. Meanwhile, the laminated imaging element 101 of Example 12 is formed by laminating two sets of a conductor wiring layer that can be used for signal wiring lines or a supply line of a specific voltage and a connection structure thereto in a lamination direction of the laminated imaging element 101 in the interlayer insulating layer 81 between the one surface 70B located on the light incident side of the semiconductor substrate 70 and the photoelectric conversion unit 17. However, the configuration including the above-described laminated two sets of a wiring layer and a connection structure thereto can also be applied to all Examples of the present disclosure and modifications thereof. Therefore, a difference in the configuration described above for the wiring lines and the connection structure is not an essential difference between the laminated imaging element 101 of Example 12 illustrated in FIG. 61 and the laminated imaging element 101 that is a modification of Example 1 illustrated in FIG. 56.

(3) In the laminated imaging element 101 illustrated in FIG. 56, in the interlayer insulating layer 76 disposed below the other surface 70A located on the opposite side to the light incidence of the semiconductor substrate 70 (in the opposite direction to the light incidence surface), the wiring layer 62 is described as a wiring layer in the drawing. Meanwhile, the laminated imaging element 101 of Example 12 includes at least three wiring layers in the interlayer insulating layer 76. In FIG. 61, three wiring layers 62A to 62C and a connection structure thereto are illustrated in the interlayer insulating layer 76. However, the configuration including the above-described plurality of wiring layers and a connection structure thereto can also be applied to all Examples of the present disclosure and modifications thereof. Therefore, a difference in the configuration described above for the wiring lines and the connection structure is not an essential difference between the laminated imaging element 101 of Example 12 illustrated in FIG. 61 and the laminated imaging element 101 that is a modification of Example 1 illustrated in FIG. 56.

(4) In the laminated imaging element 101 illustrated in FIG. 1, the photoelectric conversion unit includes N photoelectric conversion unit segments. Therefore, the thickness of the insulating layer 82 disposed between the charge accumulation electrode 12 and the photoelectric conversion layer 15 and the thickness of the charge accumulation electrode 12 vary depending on a distance from the first electrode. Meanwhile, the laminated imaging element 101 of Example 12 may include the N photoelectric conversion unit segments, or do not have to include the photoelectric conversion unit segments, and the thicknesses of the insulating layer 82 and the charge accumulation electrode 12 may be constant without depending on a distance from the first electrode.

<Equivalent Circuit>

Figure 62:
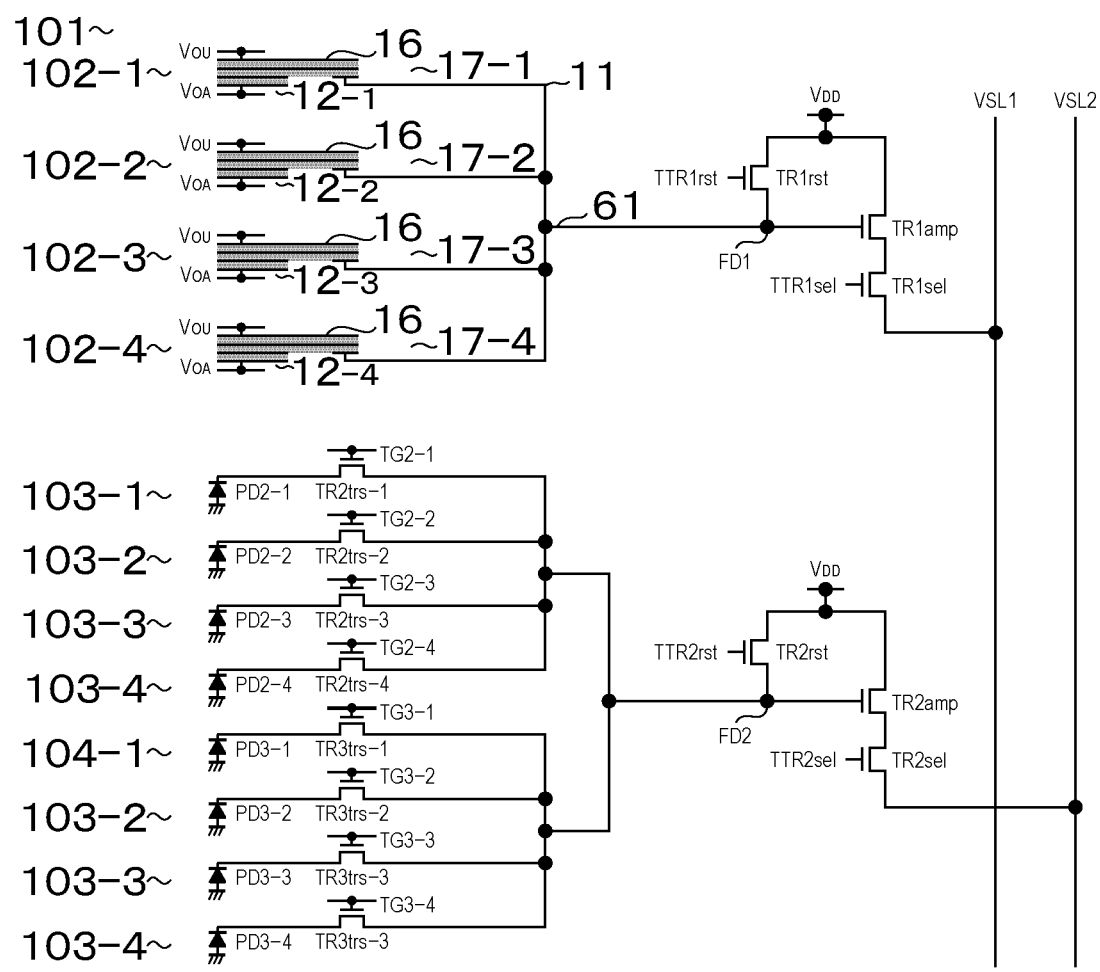
FIG. 62 is an equivalent circuit diagram of the laminated imaging elements for four pixels in Example 12.

FIG. 62 illustrates an equivalent circuit for four laminated imaging elements 101 included in the solid-state imaging device 100 of Example 12, in other words, an equivalent circuit for four pixels.

In the laminated imaging element 101 of Example 1 illustrated in FIGS. 3 and 4, one pixel includes one first imaging element 102, one second imaging element 103, and one third imaging element 104.

(1) The first imaging element 102 includes: the photoelectric conversion unit 17 including the first electrode 11, the charge accumulation electrode 12, the insulating layer 82, the photoelectric conversion layer 15, and the second electrode 16; one reset transistor TR1rst, one amplification transistor TR1amp, and one selection transistor TR1sel that are pixel transistors constituting the first imaging element 102; and further the first floating diffusion layer FD1 connected to the photoelectric conversion unit 17.

(2) The second imaging element 103 includes: a photodiode PD2 including an n-type semiconductor region 41; one transfer transistor TR2trs, one reset transistor TR2rst, one amplification transistor TR2amp, and one selection transistor TR2sel that are pixel transistors constituting the second imaging element 103; and further the second floating diffusion layer FD2 connected to the transfer transistor TR2trs.

(3) The third imaging element 104 includes: a photodiode PD3 including an n-type semiconductor region 43; one transfer transistor TR3trs, one reset transistor TR3rst, one amplification transistor TR3amp, and one selection transistor TR3sel that are pixel transistors constituting the third imaging element 104; and further the third floating diffusion layer FD3 connected to the transfer transistor TR3trs.

Meanwhile, in the laminated imaging element 101 of Example 12 illustrated in FIG. 62, the plurality of first to third imaging elements 102 to 104 included in the laminated imaging elements 101 for a plurality of pixels shares the pixel transistor and the floating diffusion layer constituting the imaging element.

A specific configuration of the laminated imaging element 101 of Example 12 will be described with reference to FIG. 62.

The laminated imaging elements 101 for four pixels illustrated in FIG. 62 include four first imaging elements 102, four second imaging elements 103, and four third imaging elements 104.

Each of the four first imaging elements 102 includes one photoelectric conversion unit 17, that is, the four first imaging elements 102 include four photoelectric conversion units 17 in total. The four photoelectric conversion units 17 are connected to one first floating diffusion layer FD1.

One reset transistor TR1rst1 and a power source line Vdd are connected in series to the one first floating diffusion layer FD1. Apart from this, one amplification transistor TR1amp, one selection transistor TR1sel, and a signal line (data output line) VSL1 are connected in series to the first floating diffusion layer FD1.

The four charge accumulation electrodes 12 included in the four photoelectric conversion units 17, the above-described one reset transistor TR1rst, the above-described one amplification transistor TR1amp, and the above-described one selection transistor TR1sel constitute one set of control units (first control units) for performing readout operation and reset operation for the four first imaging elements 102.

The four first imaging elements 102 included in the laminated imaging elements 101 for four pixels illustrated in FIG. 62 share the one set of control units (first control units) except for the charge accumulation electrode 12. When charges generated in the photoelectric conversion units 17 included in the four first imaging elements 102 are read out, the charges are sequentially read out using the first control unit in a time-division manner.

Each of the four second imaging elements 103 included in the laminated imaging elements 101 for four pixels illustrated in FIG. 62 includes one photodiode PD2, that is, the four second imaging elements 103 include four photodiodes PD2 in total. The four photodiodes PD2 are connected to one second floating diffusion layer FD2 via four transfer transistors TR2trs.

Each of the four third imaging elements 104 included in the laminated imaging elements 101 for four pixels illustrated in FIG. 62 includes one photodiode PD3, that is, the four third imaging elements 104 include four photodiodes PD3 in total. The four photodiodes PD3 are also connected to the one third floating diffusion layer FD2 via four transfer transistors TR3trs.

One reset transistor TR2rst and a power source line Vdd are connected in series to the one second floating diffusion layer FD2. Apart from this, one amplification transistor TR2amp, one selection transistor TR2sel, and a signal line (data output line) VSL2 are connected in series to the second floating diffusion layer FD2.

The four transfer transistors TR2trs, the four transfer transistors TR3trs, the above-described one reset transistor TR2rst, the above-described one amplification transistor TR2amp, and the above-described one selection transistor TR2sel constitute one set of control units (second control units) for performing readout operation and reset operation for the four second imaging elements 103 and the four third imaging elements 104.

The four second imaging elements 103 and the four third imaging elements 104 included in the laminated imaging elements 101 for four pixels illustrated in FIG. 62 share the one set of control units (second control units) except for the transfer transistor TR2trs and the transfer transistor TR3trs. When charges generated in the photodiodes PD2 included in the four second imaging elements 103 and the photodiodes PD3 included in the four third imaging elements 104 are read out, the charges are sequentially read out using the second control unit in a time-division manner.

In this way, in Example 12 illustrated in FIG. 62, the laminated imaging elements 101 for four pixels share one set of first control units and one set of second control units except for the charge accumulation electrode 12, the transfer transistor TR2trs, and the transfer transistor TR3trs. More specifically, the one reset transistor TR1rst, the one amplification transistor TR1amp, and the one selection transistor TR1sel constitute one set of first control units, and the one reset transistor TR2rst, the one amplification transistor TR2amp, and the one selection transistor TR2sel constitute one set of second control units. The one set of first control units and the one set of second control units are shared by the laminated imaging elements 101 for four pixels.

In Example 12 of the present disclosure, by using the laminated imaging elements 101 for four pixels as one repeating unit and arraying a plurality of the repeating units two-dimensionally on the equivalent circuit described in FIG. 62, a pixel array 111 included in the solid-state imaging device 100 is formed.

In Example 12 of the present disclosure, the one set of first control units and the one set of second control units are shared by the laminated imaging elements 101 for four pixels. For this reason, the configuration of Example 12 requires a smaller number of transistors than the configuration in which the laminated imaging element 101 for one pixel independently includes a control unit as in Example 1 described in FIGS. 3 and 4. As a result, there is an effect that it is easy to achieve high integration of the laminated imaging element 101 and the solid-state imaging device 100 using the laminated imaging element 101.

<Planar Structure>

Figure 63:
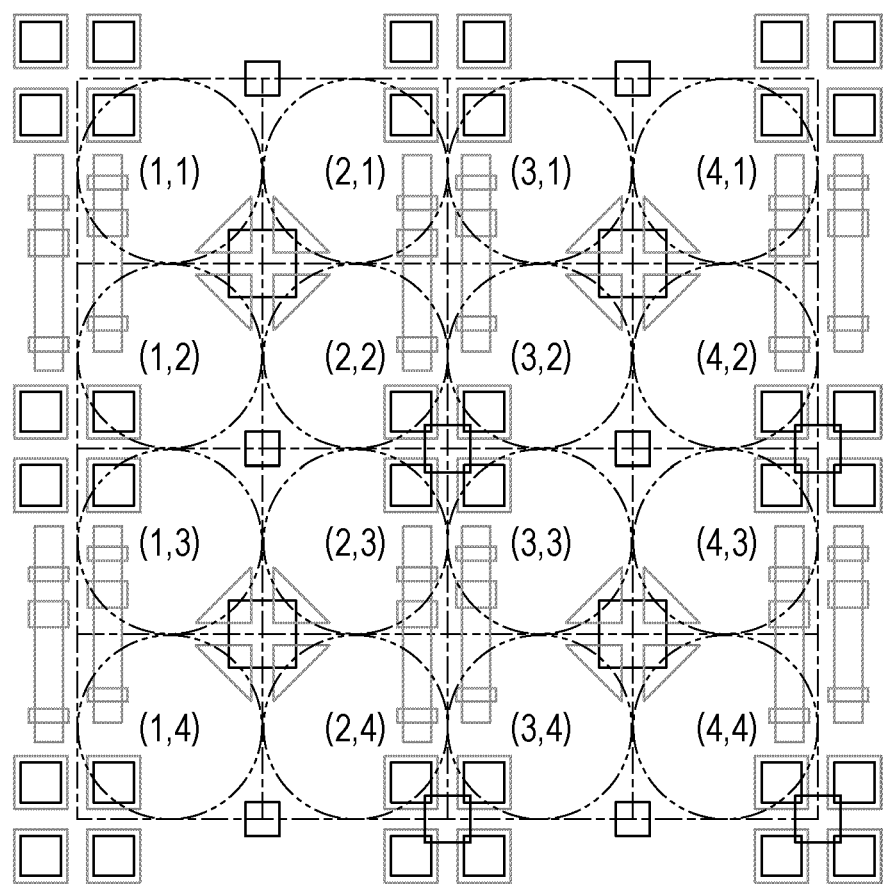
FIG. 63 is a diagram illustrating a partial planar structure of a pixel array included in a solid-state imaging device of Example 12.

FIG. 63 is a diagram illustrating a partial planar structure of the pixel array 111 included in the solid-state imaging device 100 of Example 12. FIG. 63 illustrates a planar structure of the laminated imaging elements 101 for four pixels in each of a row direction and a column direction, for 16 pixels in total.

More specifically, in FIG. 63, (1) an active region of a pixel transistor included in the first to third imaging elements 102 to 104 of the laminated imaging element 101, formed on one surface 70A of the semiconductor substrate 70, is indicated by a thin solid line, (2) a gate electrode of a pixel transistor included in the first to third imaging elements 102 to 104 of the laminated imaging element 101, formed on the one surface 70A of the semiconductor substrate 70, is indicated by a thin solid line, (3) the on-chip micro lens 90 included in the laminated imaging element 101 is indicated by a thin two-dot chain line, (4) a line serving as an outer edge of one pixel of the laminated imaging element 101, that is, a pixel boundary line is indicated by a thin one-dot chain line, and (5) a pixel position (coordinates) of each pixel in a row direction and a column direction in the pixel array is represented in a format (X,Y).

As described above, in Example 12 of the present disclosure, by using the laminated imaging elements 101 for four pixels as one repeating unit and arraying a plurality of the repeating units two-dimensionally on the equivalent circuit described in FIG. 62, the pixel array 111 included in the solid-state imaging device 100 is formed.

Figure 64:
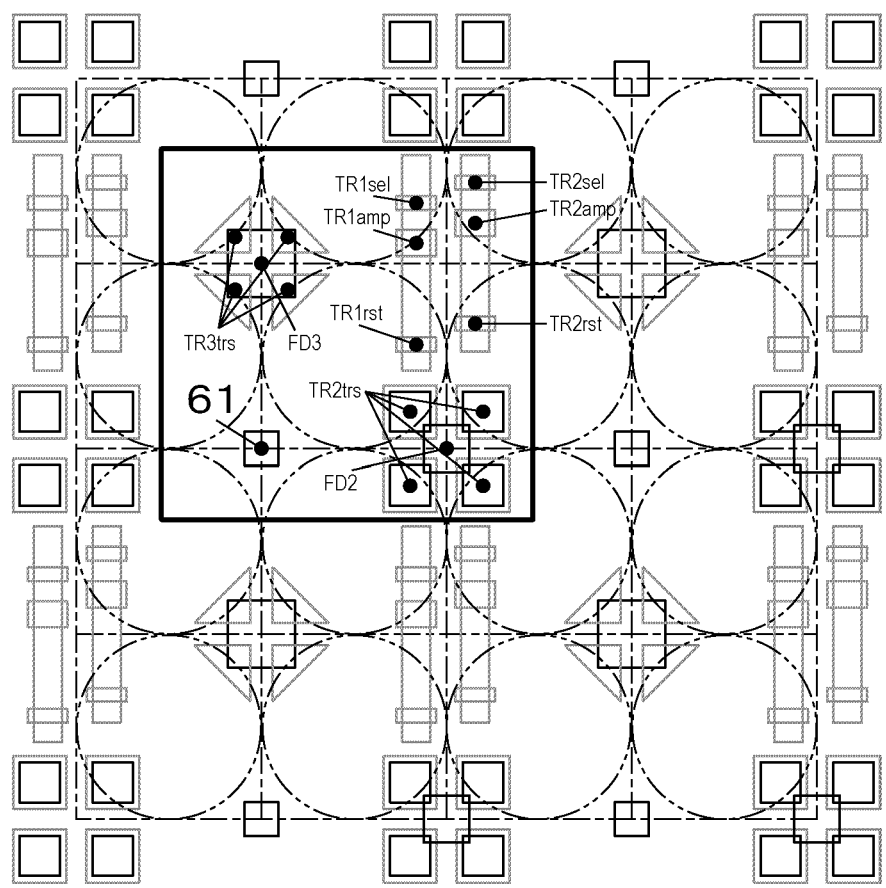
FIG. 64 is a diagram indicating the outline of one repeating unit by a bold line in a diagram similar to FIG. 63 and also indicating the positions of transistors included in one repeating unit.

FIG. 64 is a diagram illustrating the outline of the one repeating unit described above by a bold line in a diagram similar to FIG. 63 and also illustrating the positions of transistors included in the one repeating unit described above.

Figure 65:
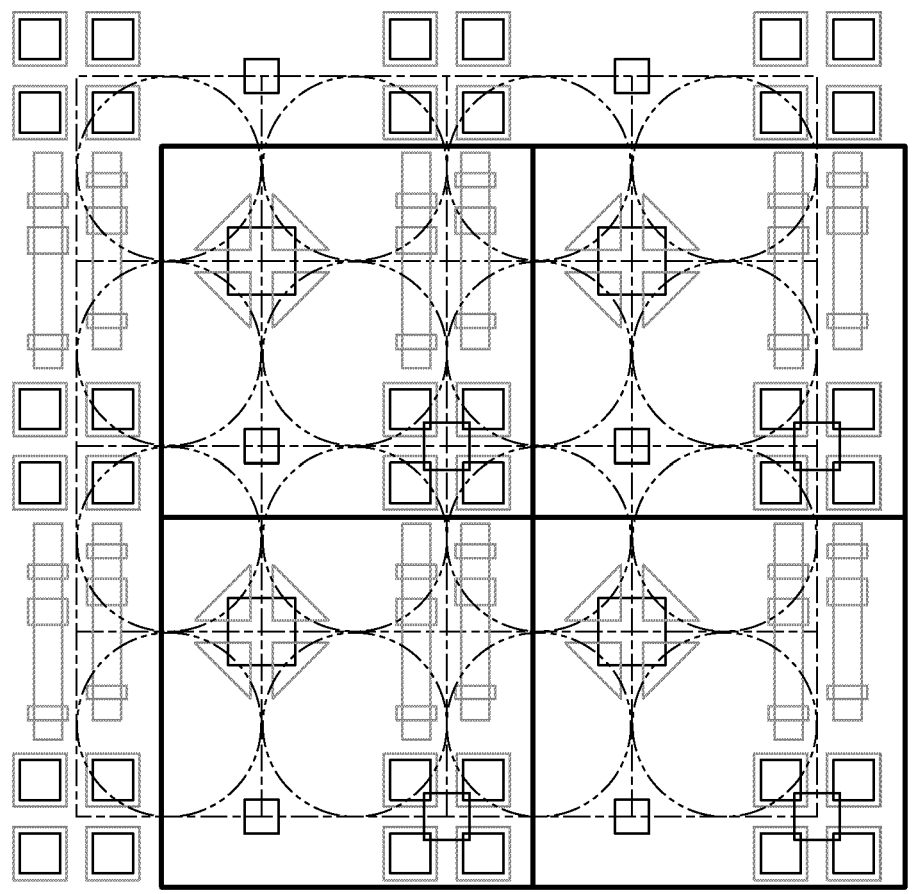
FIG. 65 is a diagram illustrating how the repeating unit illustrated in FIG. 64 is repeatedly arranged in both the row direction and the column direction of a pixel array 111 in a diagram similar to FIG. 63.

FIG. 65 is a diagram illustrating how the above-described repeating unit illustrated in FIG. 64 is repeatedly arranged in both the row direction and the column direction of the pixel array 111 in a diagram similar to FIG. 63.

Figure 66:
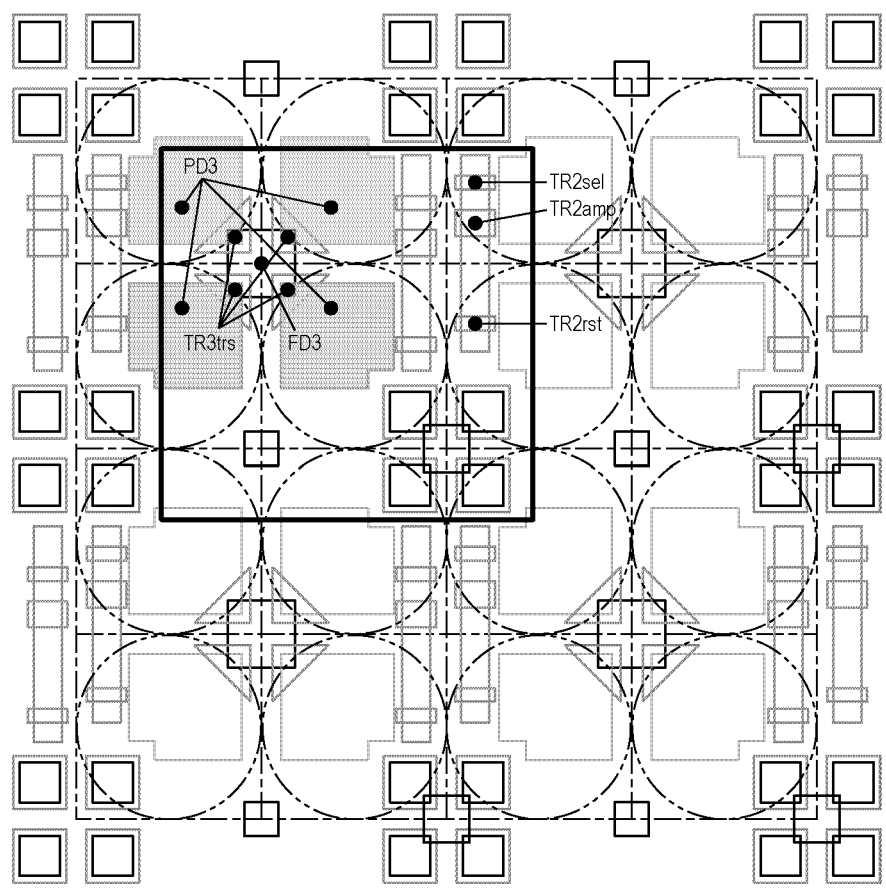
FIG. 66 is a diagram in which the planar shape of a photodiode included in a third imaging element is additionally indicated by a bold line in a diagram similar to FIG. 64.

FIG. 66 is a diagram in which the planar shape of the photodiode PD3 included in the third imaging element is additionally indicated by a bold line in a diagram similar to FIG. 64. In FIG. 66, since the laminated imaging elements 101 for 16 pixels are illustrated, the photodiodes PD3 included therein are also illustrated for 16 pixels.

Moreover, FIG. 66 also illustrates the positions of eight transistors included in one repeating unit indicated by a bold line and used for operation of reading out charges generated in the photodiode PD3 included in the third imaging element, and operation of resetting the second floating diffusion layer FD2 included in the repeating unit, that is, four transfer transistors TR3trs, one reset transistor TR2rst, one amplification transistor TR2amp, and one selection transistor TR2sel.

Moreover, FIG. 66 illustrates four photodiodes PD3 to be subjected to charge readout operation by being connected to a transistor included in one repeating unit indicated by a bold line among the photodiodes PD3 for 16 pixels illustrated in FIG. 66 by shading.

As can be seen with reference to FIGS. 63, 64, and 66, in Example 12, using a transistor included in one repeating unit indicated by a bold line in FIGS. 64 and 66, charges of four photodiodes PD3 included in pixels at positions (1,1), (1,2), (2,1), and (2,2) illustrated in FIG. 63 are read out.

Figure 67:
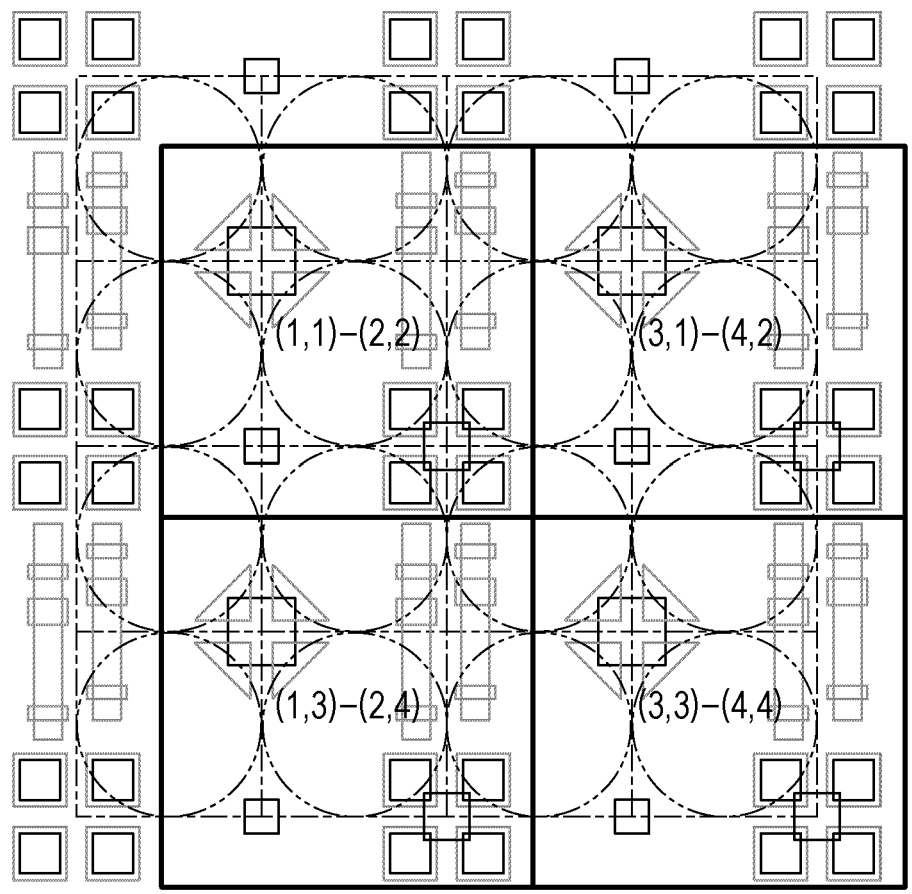
FIG. 67 is a diagram illustrating the position of a pixel illustrated in FIG. 63 from which charges of four photodiodes are read out using a transistor included in the repeating unit indicated by a bold line in FIG. 65.

FIG. 67 is a diagram illustrating the position of a pixel illustrated in FIG. 63 from which charges of four photodiodes PD3 are read out using a transistor included in the repeating unit indicated by a bold line in FIG. 65.

As described with reference to FIG. 66, the four photodiodes PD3 to be subjected to readout operation using a transistor included in a repeating unit indicated by a bold line in FIG. 66 are photodiodes PD3 for two pixels in the row direction of the pixel array 111 and two pixels in the column direction thereof, for 2×2 pixels in total, located at (1,1), (1,2), (2,1), and (2,2) in the coordinates illustrated in FIG. 63.

In FIG. 67, a repeating unit at the same position as the repeating unit illustrated in FIG. 66 is described as (1,1)-(2,2), and using a transistor included in this repeating unit, charges of the photodiode PD3 for 2×2 pixels located at (1,1), (1,2), (2,1), and (2,2) are read out. Moreover, FIG. 67 illustrates the position of a pixel from which charges of photodiodes PD3 are read out in each repeating unit. In each repeating unit included in the pixel array 111 illustrated in FIG. 67, charge of the photodiode PD3 for 2×2 pixels located at (2n+1,2n+1), (2n+1,2n+2), (2n+2,2n+1), and (2n+2,2n+2), (where n=0,1,2, . . . ) are read out.

Figure 68:
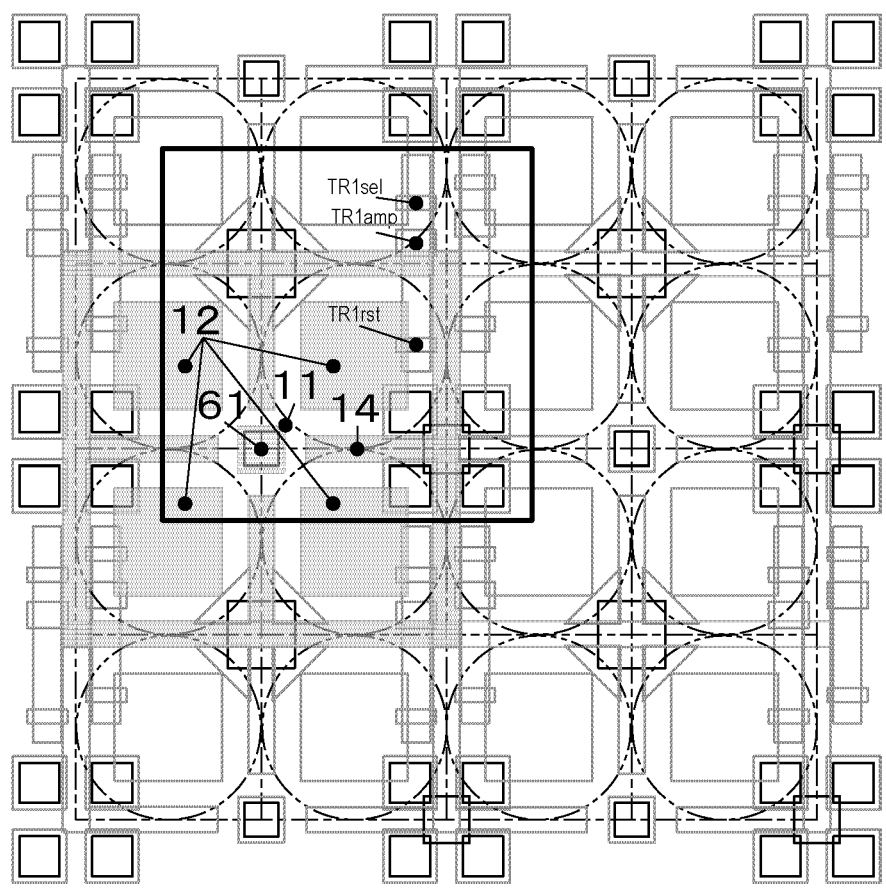
FIG. 68 is a diagram in which the planar shape of a charge accumulation electrode included in a photoelectric conversion unit included in a first imaging element is additionally indicated by a bold line in a diagram similar to FIG. 64.

FIG. 68 is a diagram in which the planar shape of the charge accumulation electrode 12 included in the photoelectric conversion unit 17 in the first imaging element is additionally indicated by a bold line in a diagram similar to FIG. 64. In FIG. 68, since the laminated imaging elements 101 for 16 pixels are illustrated, the charge accumulation electrodes 12 included therein are also illustrated for 16 pixels.

Here, in the laminated imaging element 101 of Example 12, as described with reference to FIG. 62, the laminated imaging elements 101 for four pixels serving as a repetition unit include the four first imaging elements 102, and the four photoelectric conversion units 17 included in the four first imaging elements 102 are connected to one first floating diffusion layer FD1. More specifically, each of the four photoelectric conversion units 17 does not include one first electrode 11 and one charge accumulation electrode 12. Each of the four photoelectric conversion units 17 includes one charge accumulation electrode 12. Meanwhile, as for the first electrode 11, the four photoelectric conversion units 17 share one first electrode 11. As illustrated in FIG. 61, the one shared first electrode 11 is connected to a through silicon via (TSV) 61 penetrating one silicon substrate via laminated two sets of a wiring layer and a connection structure thereto, further connected to the wiring layer 62 formed below one surface 70A of the semiconductor substrate 70 via the through silicon via 61, and further connected to one first floating diffusion layer FD1 (51C) formed on one surface 70A of the semiconductor substrate 70 via the wiring layer 62. FIG. 68 also illustrates one first electrode 11 shared by the four photoelectric conversion units 17 and one through silicon via 61.

Moreover, FIG. 68 also illustrates the positions of four transistors included in one repeating unit indicated by a bold line and used for operation of reading out charges generated in the photoelectric conversion unit 17 included in the first imaging element, and operation of resetting the first floating diffusion layer FD1 included in the repeating unit, that is, one reset transistor TR1rst, one amplification transistor TR1amp, and one selection transistor TR1sel.

Moreover, FIG. 66 illustrates the charge accumulation electrodes 12 included in the four photoelectric conversion units 17 to be subjected to charge readout operation by being connected to a transistor included in one repeating unit indicated by a bold line among the charge accumulation electrodes 12 for 16 pixels illustrated in FIG. 66 by shading.

As can be seen with reference to FIGS. 63, 64, and 68, in Example 12, using a transistor included in one repeating unit indicated by a bold line in FIGS. 64 and 66, charges are read out from the four photoelectric conversion units 17 included in pixels at positions (1,2), (1,3), (2,2), and (2,3) illustrated in FIG. 63.

Figure 69:
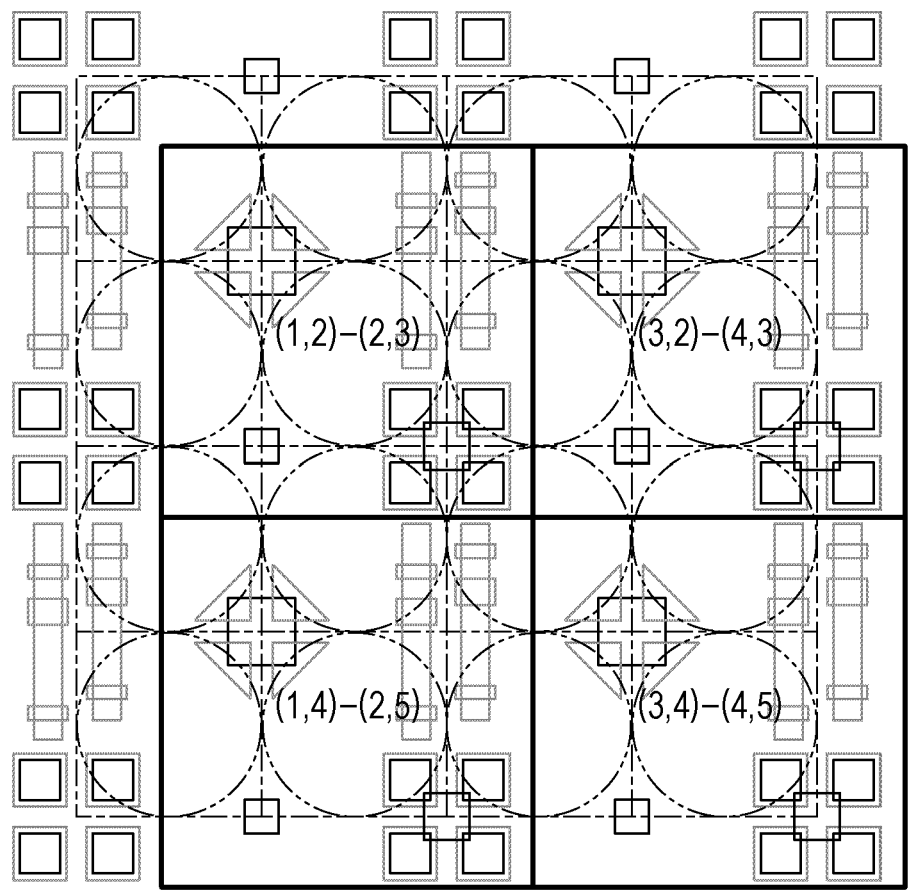
FIG. 69 is a diagram illustrating the position of a pixel illustrated in FIG. 63 from which charges of four photoelectric conversion units are read out using a transistor included in the repeating unit indicated by a bold line in FIG. 65.

FIG. 69 is a diagram illustrating the position of a pixel illustrated in FIG. 63 from which charges of the four photoelectric conversion units 17 are read out using a transistor included in the repeating unit indicated by a bold line in FIG. 65.

As described with reference to FIG. 68, the four photoelectric conversion units 17 to be subjected to readout operation using a transistor included in a repeating unit indicated by a bold line in FIG. 68 are photoelectric conversion units 17 for two pixels in the row direction of the pixel array 111 and two pixels in the column direction thereof, for 2×2 pixels in total, located at (1,2), (1,3), (2,2), and (2,3) in the coordinates illustrated in FIG. 63.

In FIG. 69, a repeating unit at the same position as the repeating unit illustrated in FIG. 68 is described as (1,2)-(2,3), and using a transistor included in this repeating unit, charges of the photoelectric conversion units 17 for 2×2 pixels located at (1,2), (1,3), (2,2), and (2,3) are read out. Moreover, FIG. 69 illustrates the position of a pixel from which charges of the photoelectric conversion units 17 are read out in each repeating unit. In each repeating unit included in the pixel array 111 illustrated in FIG. 69, charge of the photoelectric conversion units 17 for 2×2 pixels located at (2n+1,2n+2), (2n+1,2n+3), (2n+2,2n+2), and (2n+2,2n+3), (where n=0, 1, 2, . . . ) are read out.

Figure 70:
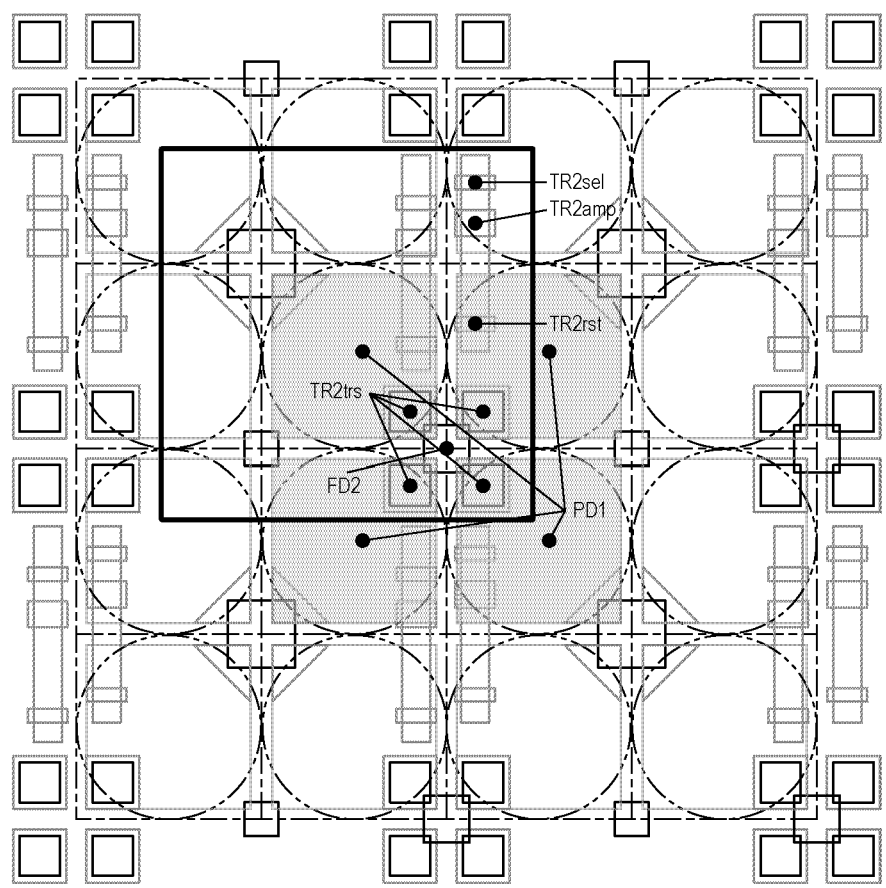
FIG. 70 is a diagram in which the planar shape of a photodiode included in a second imaging element is additionally indicated by a bold line in a diagram similar to FIG. 64.

FIG. 70 is a diagram in which the planar shape of the photodiode PD2 included in the second imaging element is additionally indicated by a bold line in a diagram similar to FIG. 64. In FIG. 70, since the laminated imaging elements 101 for 16 pixels are illustrated, the photodiodes PD2 included therein are also illustrated for 16 pixels.

Moreover, FIG. 70 also illustrates the positions of eight transistors included in one repeating unit indicated by a bold line and used for operation of reading out charges generated in the photodiode PD2 included in the second imaging element, and operation of resetting the second floating diffusion layer FD2 included in the repeating unit, that is, four transfer transistors TR2trs, one reset transistor TR2rst, one amplification transistor TR2amp, and one selection transistor TR2sel.

Moreover, FIG. 70 illustrates four photodiodes PD2 to be subjected to charge readout operation by being connected to a transistor included in one repeating unit indicated by a bold line among the photodiodes PD2 for 16 pixels illustrated in FIG. 70 by shading.

As can be seen with reference to FIGS. 63, 64, and 70, in Example 12, using a transistor included in one repeating unit indicated by a bold line in FIGS. 64 and 70, charges of four photodiodes PD2 included in pixels at positions (2,2), (2,3), (3,2), and (3,3) illustrated in FIG. 63 are read out.

Figure 71:
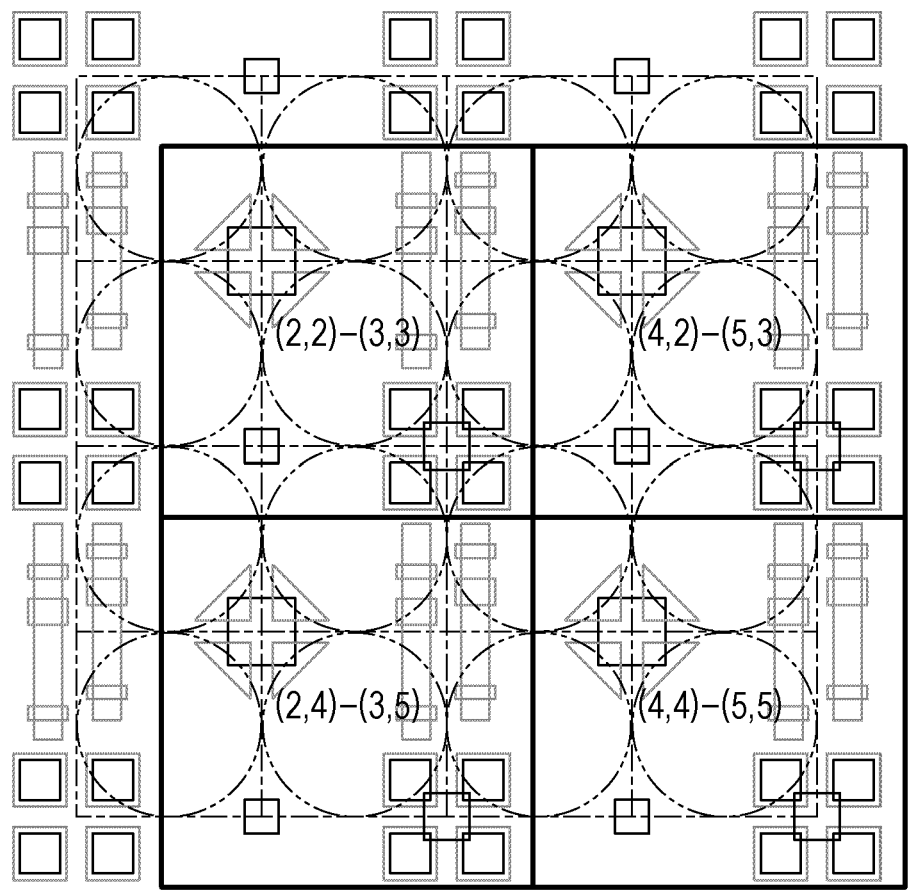
FIG. 71 is a diagram illustrating the position of a pixel illustrated in FIG. 63 from which charges of four photodiodes are read out using a transistor included in the repeating unit indicated by a bold line in FIG. 65.

FIG. 71 is a diagram illustrating the position of a pixel illustrated in FIG. 63 from which charges of four photodiodes PD2 are read out using a transistor included in the repeating unit indicated by a bold line in FIG. 65.

As described with reference to FIG. 70, the four photodiodes PD2 to be subjected to readout operation using a transistor included in a repeating unit indicated by a bold line in FIG. 70 are photodiodes PD2 for two pixels in the row direction of the pixel array 111 and two pixels in the column direction thereof, for 2×2 pixels in total, located at (2,2), (2,3), (3,2), and (3,3) in the coordinates illustrated in FIG. 63.

In FIG. 71, a repeating unit at the same position as the repeating unit illustrated in FIG. 70 is described as (2,2)-

(3,3), and using a transistor included in this repeating unit, charges of the photodiode PD2 for 2×2 pixels located at (2,2), (2,3), (3,2), and (3,3) are read out. Moreover, FIG. 71 illustrates the position of a pixel from which charges of photodiodes PD2 are read out in each repeating unit. In each repeating unit included in the pixel array 111 illustrated in FIG. 71, charge of the photodiode PD2 for 2×2 pixels located at (2n+2,2n+2), (2n+2,2n+3), (2n+3,2n+2), and (2n+3,2n+3), (where n=0, 1, 2, . . . ) are read out.

As described with reference to the cross-sectional view described in FIG. 61, in the solid-state imaging device 100 of Example 12, the laminated imaging element 101 for one pixel is formed by laminating the on-chip micro lens 90, one first imaging element 102, one second imaging element 103, and one third imaging element 104. Furthermore, as described with reference to the equivalent circuit described in FIG. 62, in the solid-state imaging device 100 of Example 12, the laminated imaging elements 101 for four pixels share the one set of first control units and the one set of second control units. In addition, by using the laminated imaging elements 101 for four pixels as one repeating unit and arraying a plurality of the repeating units two-dimensionally on the equivalent circuit described in FIG. 62, a pixel array 111 included in the solid-state imaging device 100 is formed.

However, as can be seen from a comparison among FIGS. 66, 68, and 70 and a comparison among FIGS. 67, 69, and 71, in the solid-state imaging device 100 of Example 12, the four photoelectric conversion units 17, the four photodiodes PD2, and the four photodiodes PD3 that are to be read out by the one set of first control units and the one set of second control units included in the one repeating unit described above are not necessarily included in the same four laminated imaging elements 101 in common. For example, when one repeating unit described in common to FIGS. 66, 68, and 70 is described, the photodiode PD3 to be read out by the one set of first control units and the one set of second control units included in the repeating unit are included in pixels located at (1,1), (1,2), (2,1), and (2,2), the photoelectric conversion unit 17 to be read out by the one set of first control units and the one set of second control units are included in pixels located at (1,2), (1,3), (2,2), and (2,3), and the photodiode PD2 to be read out by the one set of first control units and the one set of second control units are included in pixels located at (2,2), (2,3), (3,2), and (3,3).

Effects brought about by using such a special configuration will be described below. In order to reduce the number of transistors used for reading out charges of the plurality of photodiodes PD3 and to achieve high integration of the laminated imaging element 101 and the solid-state imaging device 100 using the laminated imaging element 101, when a control unit used for the reading out is shared by the plurality of photodiodes PD3, as illustrated in FIG. 66, it is desirable to dispose four transfer transistors TR3trs connected to the respective four photodiodes PD3 close to one another to share the third floating diffusion layer FD3 connected to the transfer transistors TR3tr. Similarly, in order to reduce the number of transistors used for reading out charges of the photoelectric conversion unit 17 and the photodiode PD2, as illustrated in FIG. 68, it is desirable to share one first electrode 11 by four photoelectric conversion units 17, and to dispose four transfer transistors TR2trs connected to the respective four photodiodes PD2 close to one another to share the second floating diffusion layer FD2 connected to the transfer transistors TR2tr.

However, in order to share one third floating diffusion layer FD3 by four photodiodes PD3, to share one first electrode 11 by four photoelectric conversion units 17, to share one second floating diffusion layer FD2 by four photodiodes PD2, and to include the four photodiodes PD3, the four photoelectric conversion units 17, and the four photodiodes PD2 in the same four laminated imaging elements 101 in common, it is necessary to dispose the one third floating diffusion layer FD3, the one first electrode 11, and the one second floating diffusion layer FD2 at substantially the same place. In order to dispose the third floating diffusion layer FD3, the first electrode 11, and the second floating diffusion layer FD2 at substantially the same place, it is necessary to dispose the four laminated imaging elements 101 apart from one another to acquire a place for that in order to secure the place. This hinders high integration of the laminated imaging element 101 and high integration of the solid-state imaging device 100.

In Example 12 of the present disclosure, in order to eliminate factors that hinder the high integration described above, a configuration is intentionally avoided in which the third floating diffusion layer FD3, the first electrode 11, and the second floating diffusion layer FD2 to be shared are disposed at substantially the same place, and the third floating diffusion layer FD3, the first electrode 11, and the second floating diffusion layer FD2 to be shared are separated from one another by one pixel. More specifically, the first electrode 11 and the second floating diffusion layer FD2 are disposed at a position separated by one pixel in the column direction in the pixel array 111 from the third floating diffusion layer FD3, and the second floating diffusion layer FD2 is disposed at a position separated by one pixel in the row direction in the pixel array 111 from the third floating diffusion layer FD3 and the first electrode 11. By using this configuration, there is an effect that high integration of the solid-state imaging device 100 is more easily achieved than a solid-state imaging device not having this configuration.

Figure 72:
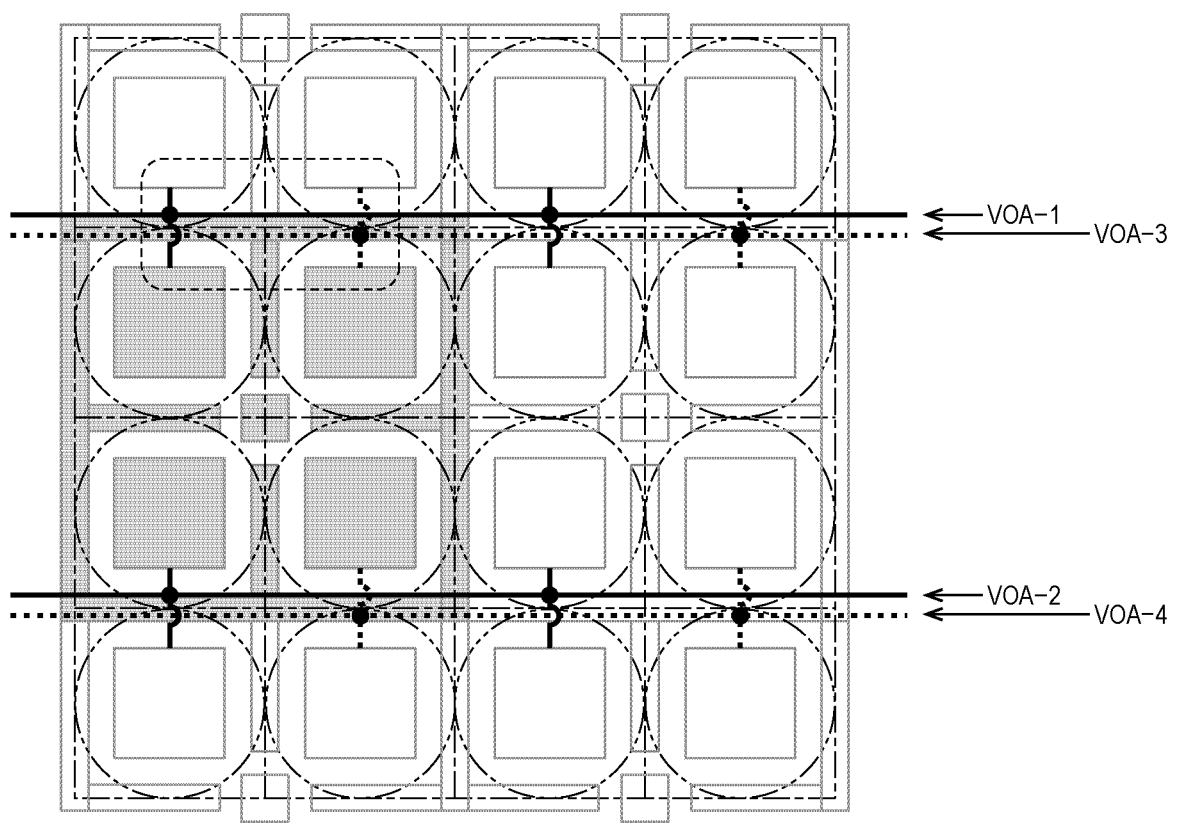
FIG. 72 is a diagram illustrating arrangement of control signal lines VOA to be connected to a charge accumulation electrode included in each pixel for driving the charge accumulation electrode at a similar pixel position to FIG. 63.

FIG. 72 is a diagram illustrating arrangement of a control signal line VOA for being connected to and driving the charge accumulation electrode 12 included in each pixel at a similar pixel position to FIG. 63. More specifically, in FIG. 72, the center line of the control signal line VOA disposed with a width is indicated by a bold solid line and a bold dotted line.

As described with reference to FIG. 61, in Example 12, two sets of a conductor wiring layer that can be used for signal wiring lines or a supply line of a specific voltage and a connection structure thereto are laminated in a lamination direction of the laminated imaging element 101 in the interlayer insulating layer 81 between the one surface 70B of the semiconductor substrate 70 and the photoelectric conversion unit 17. In FIG. 72, two sets of control signal lines VOA indicated by a bold solid line and a bold dotted line are disposed using two wiring layers disposed between one surface 70B of the semiconductor substrate 70 and the photoelectric conversion unit 17, respectively. For this reason, the two sets of control signal lines VOA indicated by a bold solid line and a bold dotted line in FIG. 72 can be disposed such that the center lines thereof are superimposed on a pixel boundary line indicated by a thin one-dot chain line in FIG. 72. However, in FIG. 72, in order to easily understand that two sets of control signal lines VOA of different layers are disposed in a pixel boundary line portion, two sets of control signal lines VOA indicated by a bold solid line and a bold dotted line are illustrated so as to be apart from each other a little.

Figure 73:
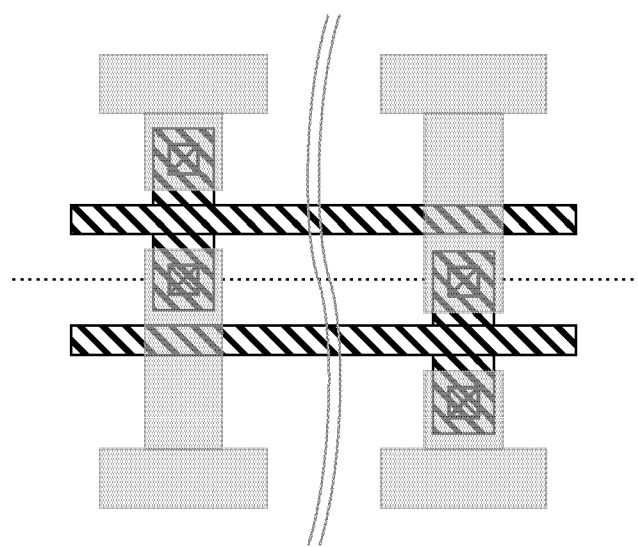
FIG. 73 is a diagram illustrating an example in which two sets of control signal lines VOA in a region surrounded by a thin broken line are disposed with only one wiring layer and a connection structure thereto.

Note that the two sets of control signal lines VOA indicated by a bold solid line and a bold dotted line in FIG. 72 can be disposed using only one wiring layer and a connection structure thereto as long as being disposed apart from each other. In FIG. 73, FIG. 73 illustrates an example in which two sets of control signal lines VOA in a region surrounded by a thin broken line are disposed with only one wiring layer and a connection structure thereto.

Figure 74:
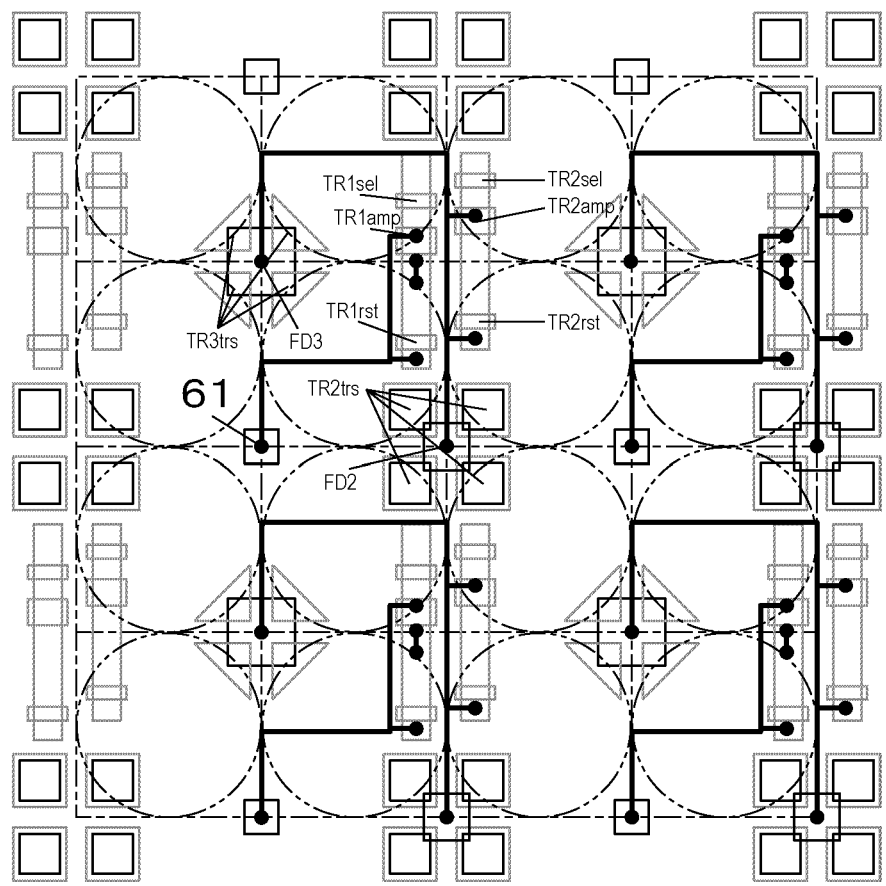
FIG. 74 is a diagram illustrating some of wiring lines connected to each element illustrated in FIG. 64 using wiring lines included in a laminated imaging element at a similar pixel position to FIG. 63 in order to achieve the configuration illustrated in FIG. 62.

FIG. 74 is a diagram illustrating some of wiring lines connected to each element illustrated in FIG. 64 using wiring lines included in the laminated imaging element 101 at a similar pixel position to FIG. 63 in order to achieve the configuration illustrated in FIG. 62.

More specifically, FIG. 74 is a diagram illustrating the arrangement of the wiring layer 62A to be the first wiring layer closest to the one surface 70A of the semiconductor substrate 70 among the plurality of wiring layers 62A to 62C illustrated in FIG. 61, and indicates the center line of the wiring layer 62A disposed with a width by a bold solid line. Furthermore, the center point of a connection structure between the wiring layer 62A and each transistor or the through silicon via 61 formed on the surface 70A is indicated by a black dot.

Figure 75:
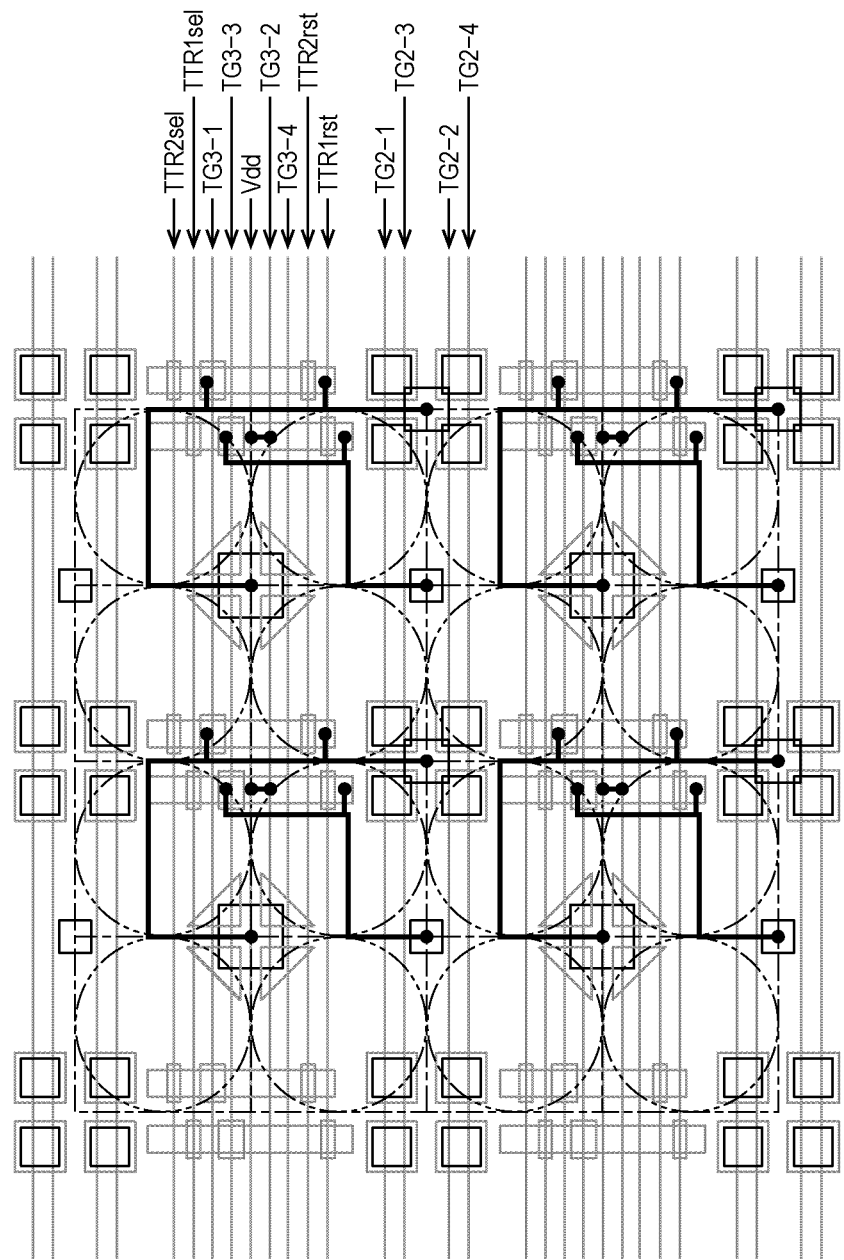
FIG. 75 is a diagram illustrating some of wiring lines connected to each element illustrated in FIG. 64 using wiring lines included in a laminated imaging element at a similar pixel position to FIG. 63 in order to achieve the configuration illustrated in FIG. 62.

FIG. 75 is also a diagram illustrating some of wiring lines connected to each element illustrated in FIG. 64 using wiring lines included in the laminated imaging element 101 at a similar pixel position to FIG. 63 in order to achieve the configuration illustrated in FIG. 62.

More specifically, FIG. 75 is a diagram obtained by adding the arrangement of the wiring layer 62B to be the second wiring layer from the one surface 70A of the semiconductor substrate 70 among the plurality of wiring layers 62A to 62C illustrated in FIG. 61 to FIG. 74, and indicates the center line of the wiring layer 62B disposed with a width by a bold solid line. Furthermore, the center point of a connection structure between the wiring layer 62B and each transistor formed on the surface 70A is indicated by a black dot.

Figure 76:
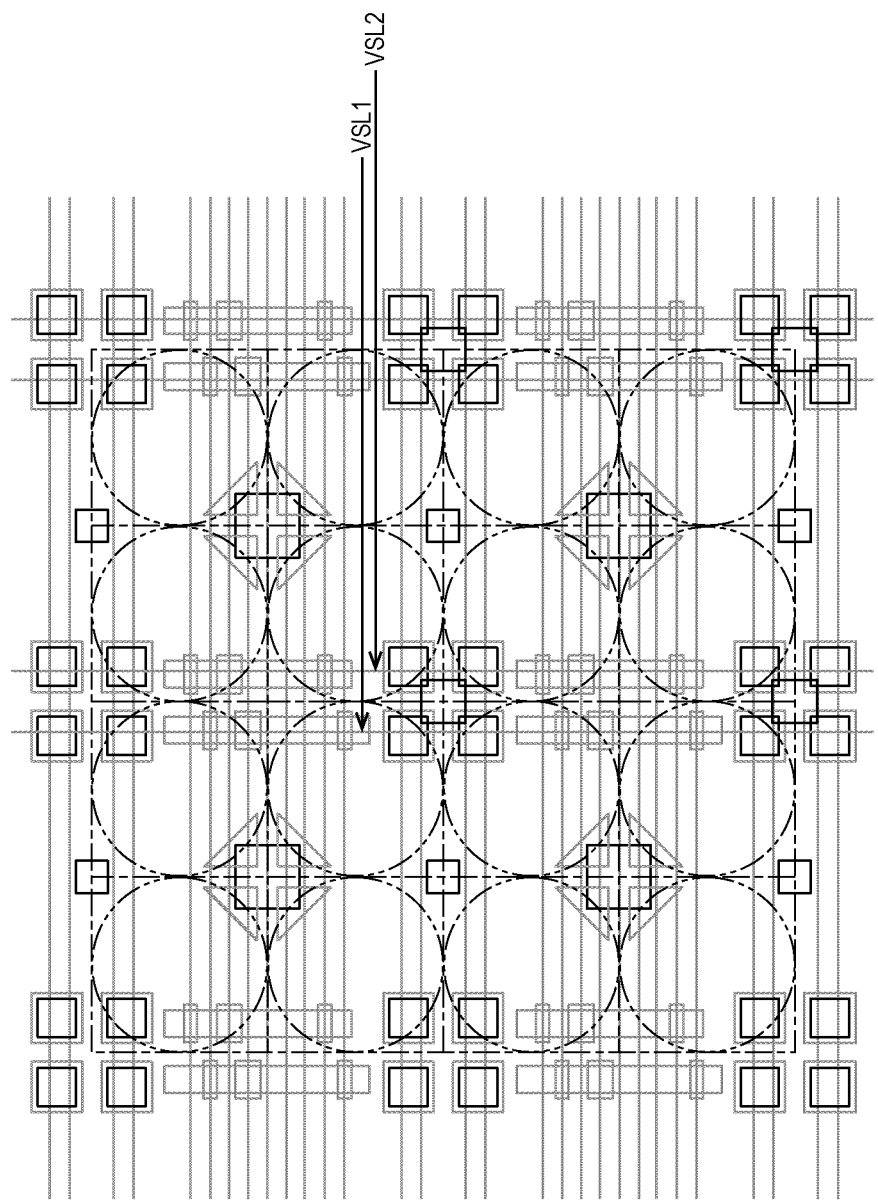
FIG. 76 is a diagram illustrating some of wiring lines connected to each element illustrated in FIG. 64 using wiring lines included in a laminated imaging element at a similar pixel position to FIG. 63 in order to achieve the configuration illustrated in FIG. 62.
Figure 77:
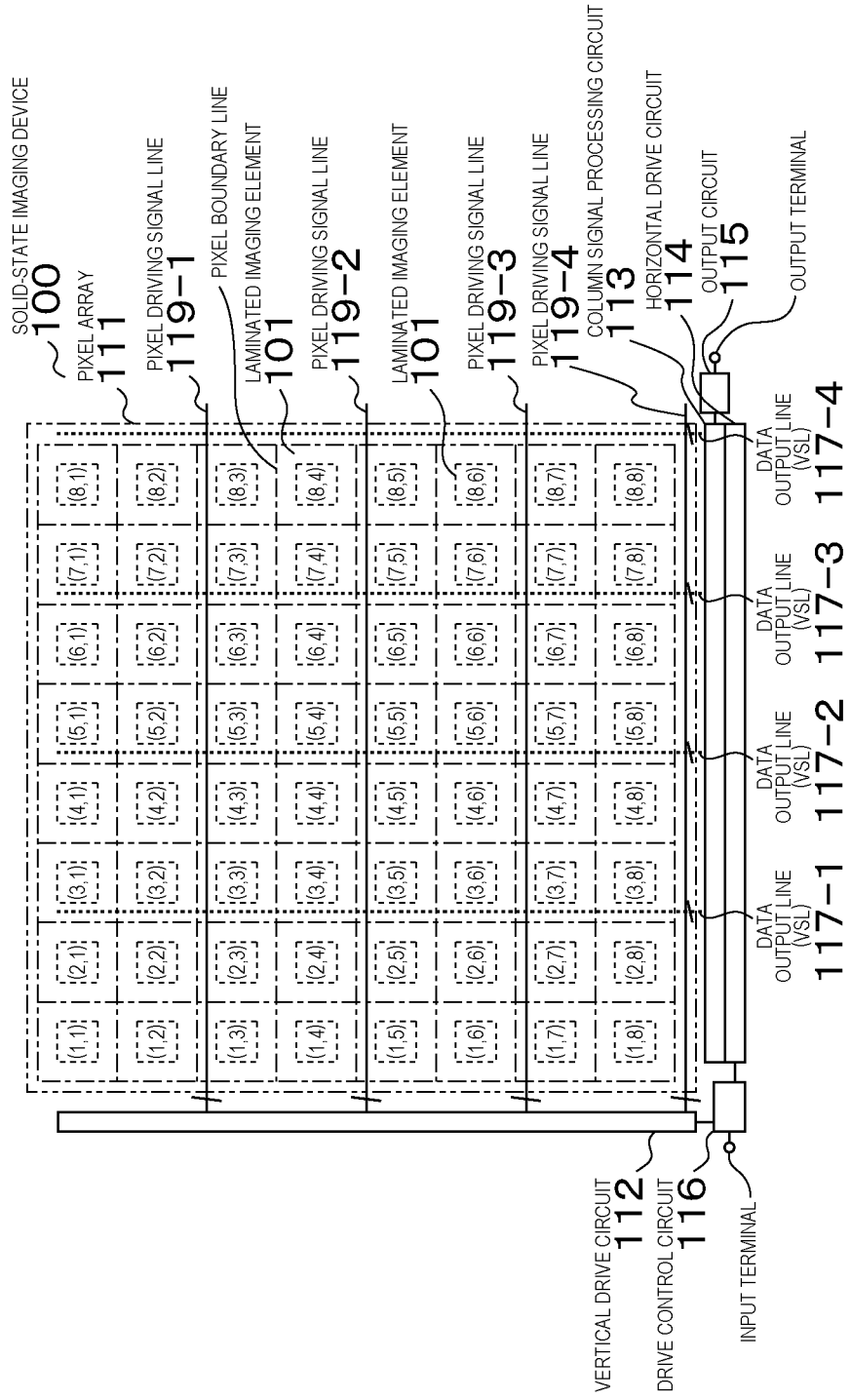
FIG. 77 is a diagram illustrating an outline of a configuration of a solid-state imaging device of Example 12.

FIG. 76 is also a diagram illustrating some of wiring lines connected to each element illustrated in FIG. 64 using wiring lines included in the laminated imaging element 101 at a similar pixel position to FIG. 63 in order to achieve the configuration illustrated in FIG. 62.

More specifically, FIG. 76 is a diagram illustrating the arrangement of the wiring layer 62C to be the third wiring layer from the one surface 70A of the semiconductor substrate 70 among the plurality of wiring layers 62A to 62C illustrated in FIG. 61, and indicates the center line of the wiring layer 62C disposed with a width by a bold solid line. Furthermore, the center point of a connection structure between the wiring layer 62C and each transistor formed on the surface 70A is indicated by a black dot. Note that in FIG. 76, the center line of the wiring layer 62B illustrated in FIG. 75 and the center point of a connection structure thereto are also illustrated.

FIGS. 77 to 80 are diagrams illustrating an outline of the configuration of the solid-state imaging device 100 of Example 12.

The solid-state imaging device 100 illustrated in FIGS. 77 to 80 basically has the same configuration as the solid-state imaging device 100 of Example 1 illustrated in FIG. 9.

That is, the body imaging device 100 includes:
(1) the pixel array (in other words, imaging region) 111 in which the plurality of laminated imaging elements 101 is arrayed two-dimensionally;
(2) the drive control circuit 116, the vertical drive circuit 112, and the horizontal drive circuit 114 as circuits for driving a pixel included in the pixel array 111 described above;
(3) a pixel driving signal line 119 for sending a signal for driving a pixel from a circuit for driving the pixel to each pixel;
(4) the data output line 117 (VSL) for sending a signal read out from each pixel to the column signal processing circuit 113; and
(5) the column signal processing circuit 113 and the output circuit 115 for processing and outputting a signal read out from a pixel included in the pixel array 111 described above.

In FIGS. 77 to 80, the pixel driving signal line 119 indicated by a solid line extends across a plurality of pixels in the row direction of the pixel array 111, and the data output line 117 indicated by a dotted line extends across a plurality of pixels in the column direction of the pixel array 111. The pixel driving signal line 119 includes a plurality of signal lines for sending a signal for driving a pixel. The pixel driving signal line 119 includes control signal lines VOA, signal lines TTR2 and TTR3 connected to the gate electrodes of the transfer transistors TR2rst and TR3trs, signal lines TTRST1, TTRST2, and TTRST3 connected to the gate electrodes of the reset transistors TR1rst, TR2rst, and TR3rst, and signal lines TTRSEL1, TTRSEL2, and TTR-SEL3 connected to the gate electrodes of selection transistors TR1sel, TR2sel, and TR3sel, illustrated in FIG. 62. Moreover, in FIGS. 78 to 80, a branch line of the pixel driving signal line 119 branched from the pixel driving signal line 119 and connected to each laminated imaging element 101 constituting each pixel in the pixel array 111 is indicated by a solid line. Similarly, a branch line of a data connection line 117, one end of which is connected to each laminated imaging element 101 and the other end of which is connected to the data output line 117, is indicated by a dotted line. The branch line of the pixel driving signal line 119 and the branch line of the data connection line 117 represent wiring lines connected to the photoelectric conversion units 17, photodiode PD2, and photodiode PD3 from the first and second control units described with reference to FIG. 62. Note that as described with reference to FIG. 62, in the laminated imaging element 101 included in the solid-state imaging device 100 of Example 12, the first and second control units are shared by the laminated imaging elements 101 for four pixels. However, in FIGS. 78 to 80, these control units are not illustrated for simplicity.

In FIGS. 77 to 80, there is a plurality of pixel driving signal lines 119 connected from a circuit for driving a pixel to each control unit, but these are collectively represented by a bus for simplicity. One set of the pixel driving signal lines 119 represented by a bus is disposed for every two pixels in the row direction of the pixel array 111. Similarly, in FIGS. 77 to 80, there is also a plurality of data output lines 117 connected from each control unit shared by the laminated imaging elements 101 for four pixels to the column signal processing circuit 113, and therefore these are collectively represented by a bus. One set of the data output lines 117 represented by a bus is disposed for every two pixels in the column direction of the pixel array 111. Moreover, in FIGS. 77 to 80, the position (coordinates) of each pixel in the row direction and the column direction in the pixel array is represented in a format (X,Y).

Figure 78:
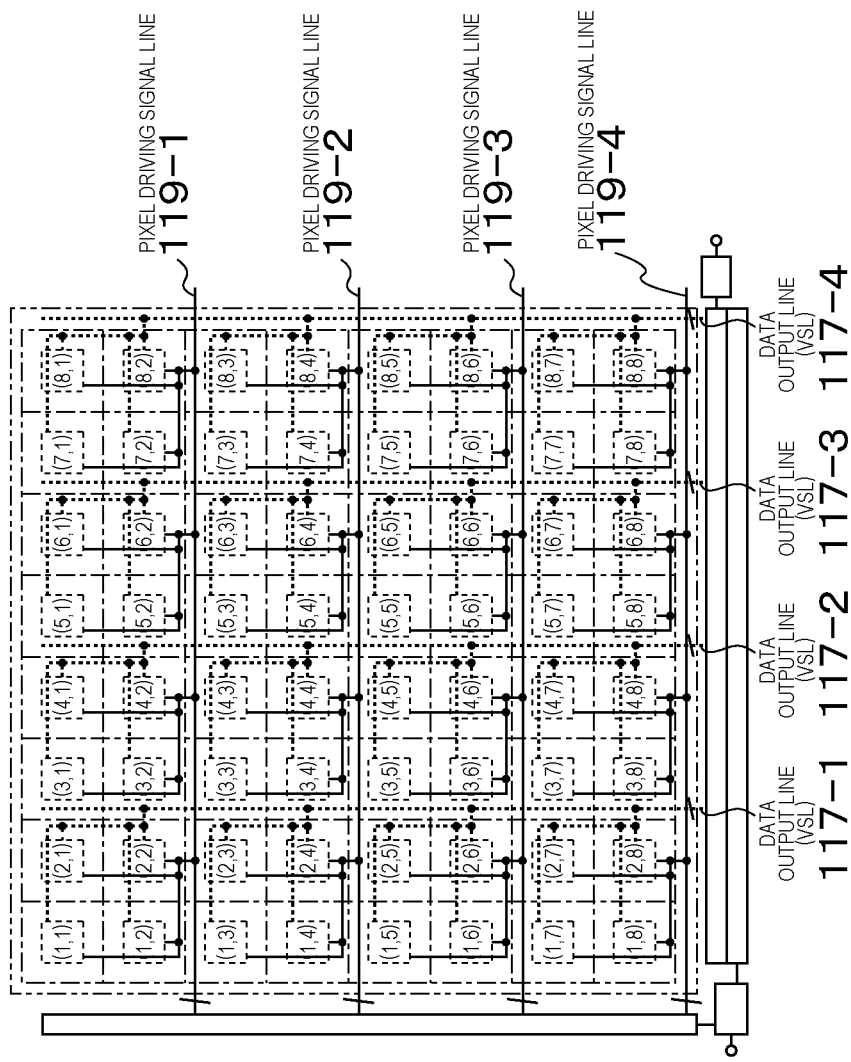
FIG. 78 is a diagram illustrating an outline of the configuration of the solid-state imaging device of Example 12.

As described with reference to FIGS. 66 and 67, FIG. 78 illustrates a state of reading out charges of the four photodiodes PD3 included in the pixels at (1,1), (1,2), (2,1), and (2,2) on a schematic configuration diagram of the solid-state imaging device 100 using the control unit included in the repeating unit indicated by a bold solid line in FIG. 66. More specifically, FIG. 78 illustrates a state of sending a drive signal to the control unit using the pixel driving signal line 119-1 illustrated in FIG. 78, reading out charges of the four photodiodes PD3 included in the pixels at (1,1), (1,2), (2,1), and (2,2), and sending the read out signal to the column signal processing circuit 113 via the data output line (VSL) 117-1.

Figure 79:
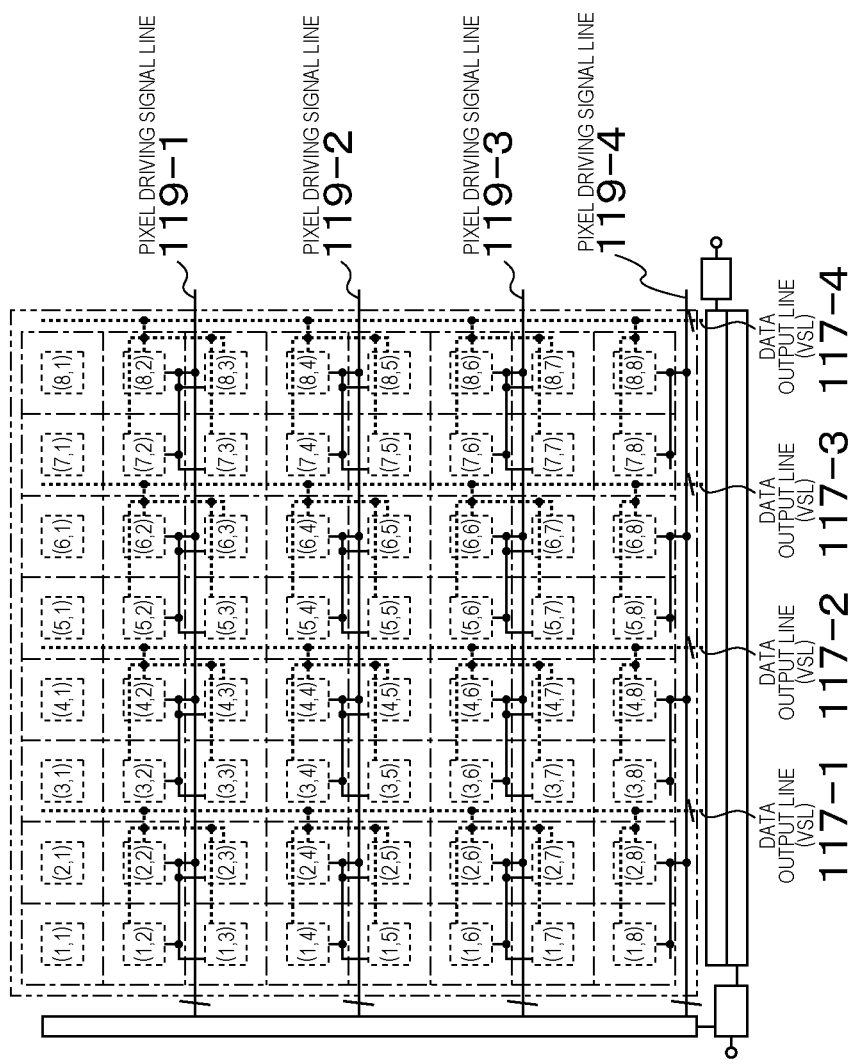
FIG. 79 is a diagram illustrating an outline of the configuration of the solid-state imaging device of Example 12.

As described with reference to FIGS. 68 and 69, FIG. 79 illustrates a state of reading out charges of the four photoelectric conversion units 17 included in the pixels at (1,2), (1,3), (2,2), and (2,3) on a schematic configuration diagram of the solid-state imaging device 100 using the control unit included in the repeating unit indicated by a bold solid line in FIG. 68. More specifically, FIG. 79 illustrates a state of sending a drive signal to the control unit using the pixel driving signal line 119-1 illustrated in FIG. 79, reading out charges of the four photoelectric conversion units 17 included in the pixels at (1,2), (1,3), (2,2), and (2,3), and sending the read out signal to the column signal processing circuit 113 via the data output line (VSL) 117-1.

Figure 80:
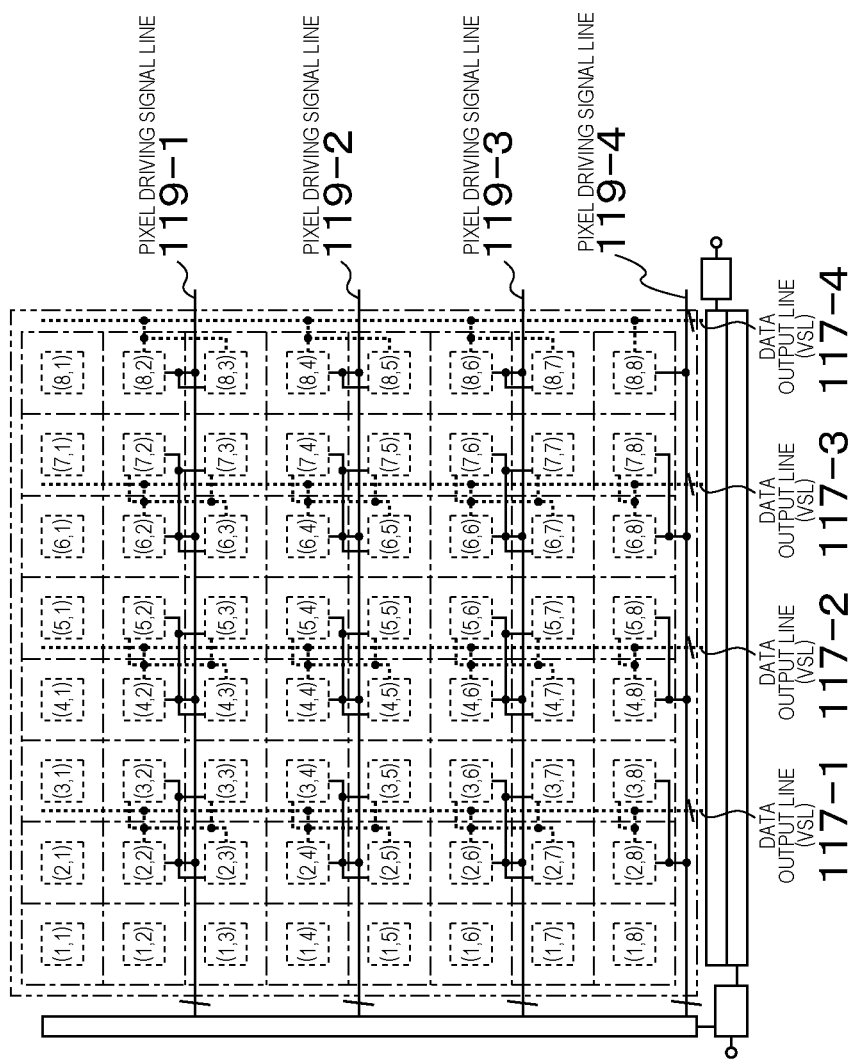
FIG. 80 is a diagram illustrating an outline of the configuration of the solid-state imaging device of Example 12.

As described with reference to FIGS. 70 and 71, FIG. 80 illustrates a state of reading out charges of the four photodiodes PD2 included in the pixels at (2,2), (2,3), (3,2), and (3,3) on a schematic configuration diagram of the solid-state imaging device 100 using the control unit included in the repeating unit indicated by a bold solid line in FIG. 70. More specifically, FIG. 80 illustrates a state of sending a drive signal to the control unit using the pixel driving signal line 119-1 illustrated in FIG. 80, reading out charges of the four photodiodes PD2 included in the pixels at (2,2), (2,3), (3,2), and (3,3), and sending the read out signal to the column signal processing circuit 113 via the data output line (VSL) 117-1.

<Relationship Between First Imaging Element and Second and Third Imaging Elements>

For example, as can be seen from description of the cross-sectional structure with reference to FIG. 61 and description of the planar structure with reference to FIGS. 68, 66, 70, 72, and 75, the structure of the solid-state imaging device 100 of the present disclosure is largely different between the first imaging element and the second and third imaging elements. The laminated imaging element 101 of the present disclosure has a unique configuration in order to laminate the first imaging element and the second and third imaging elements having largely different structures.

Figure 81:
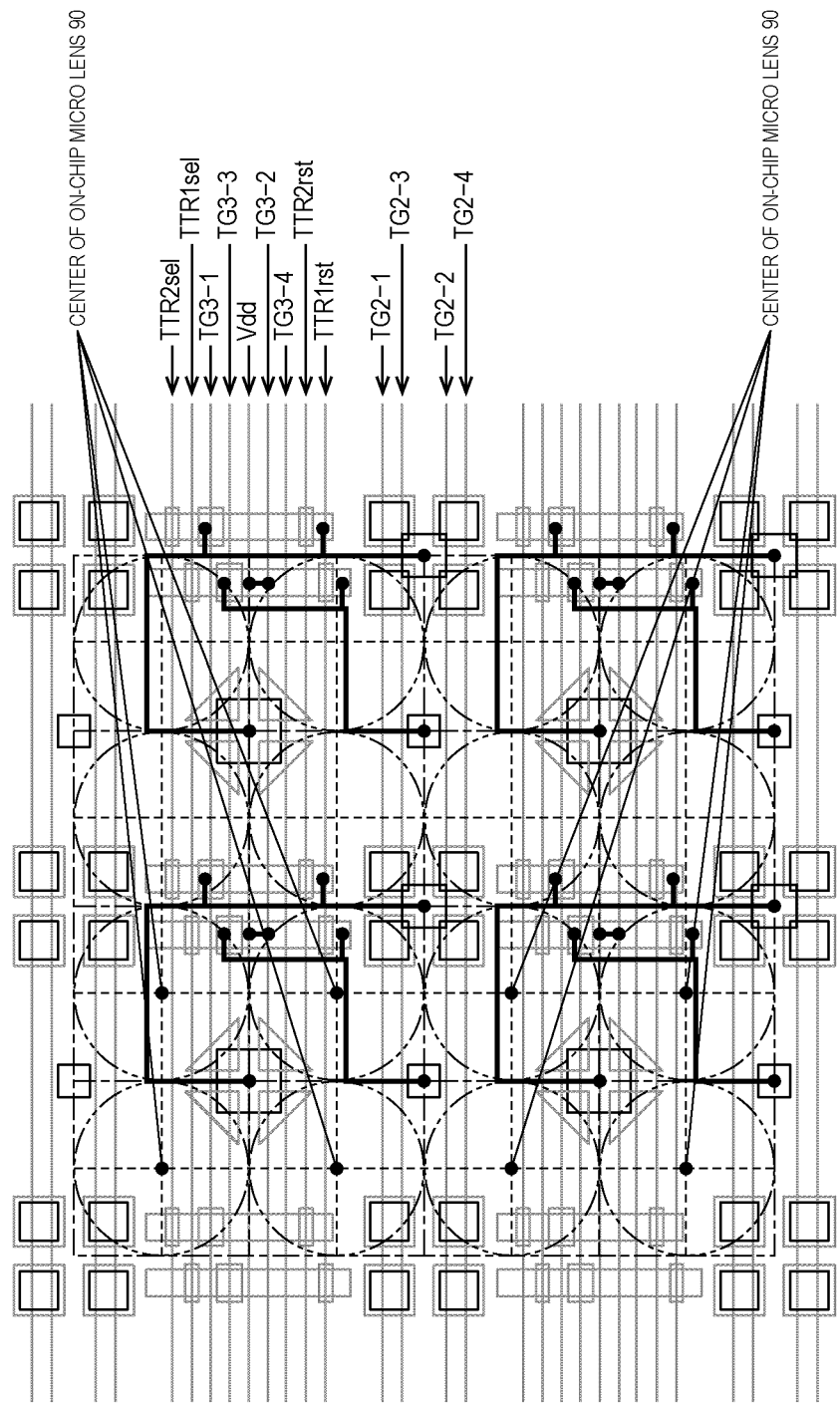
FIG. 81 illustrates FIG. 75 again, and is obtained by leaving only a control wiring line necessary for driving laminated imaging elements for four pixels sharing a control unit with a bold solid line among the control wiring lines indicated by a solid line in FIG. 75, and indicating the remaining control wiring lines by a dotted line.

FIG. 81 illustrates FIG. 75 again, and is obtained by leaving only a control wiring line necessary for driving the laminated imaging elements 101 for four pixels sharing a control unit with a bold solid line among the control wiring lines indicated by a bold solid line in FIG. 75, and indicating the remaining control wiring lines by a bold dotted line. Moreover, in FIG. 81, the center of the on-chip micro lens 90 illustrated in FIG. 75 is also illustrated.

The second and third imaging elements included in the laminated imaging element 101 of the present disclosure are each a so-called backside irradiation type imaging element formed by forming photodiodes PD2 and PD3 which are photoelectric conversion means included in the imaging elements in the semiconductor substrate 70, and disposing a transistor for driving the elements and drive wiring lines on the opposite surface to the light incident surface on the photodiodes out of the two surfaces of the semiconductor substrate 70. Since the drive wiring lines are disposed on the opposite side to the light incident surface, the drive wiring lines do not hinder incidence of light on the photodiodes PD2 and PD3 included in the second and third imaging elements regardless of a region where the drive wiring lines are disposed in a pixel. For this reason, in the laminated imaging element 101 of the present disclosure, a large number of control wiring lines for driving the second and third imaging elements can be disposed over the entire pixel region as illustrated in FIG. 81. (Note that in FIG. 81, since the control wiring lines are superimposed on the pixel boundary line, it is difficult to recognize the pixel boundary line. Refer to FIG. 63 for the position of the pixel boundary line.)

Figure 82:
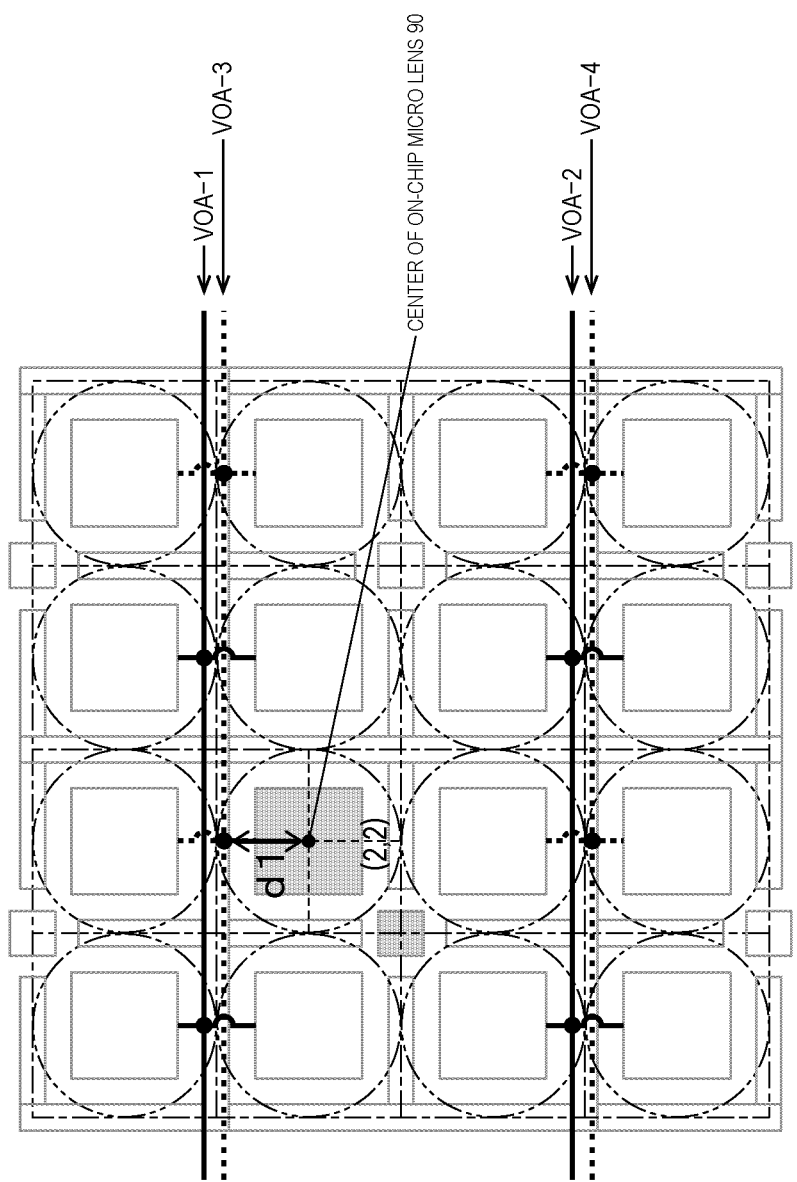
FIG. 82 illustrates FIG. 72 again, and is obtained by adding a distance d1 between the center of the on-chip micro lens illustrated in FIG. 72 and the wiring line VOA for driving a charge accumulation electrode included in the first imaging element illustrated in FIG. 72 to FIG. 72.

FIG. 82 illustrates FIG. 72 again, and is obtained by adding a distance d1 between the center of the on-chip micro lens illustrated 90 in FIG. 72 and the wiring lines VOA for driving the charge accumulation electrode 12 included in the first imaging element illustrated in FIG. 72 to FIG. 72. As described with reference to FIG. 72, in the solid-state imaging device 100 of the present disclosure, the wiring line VOA for driving the charge accumulation electrode 12 included in the first imaging element can be disposed on the pixel boundary line indicated by a thin one-dot chain line in FIG. 82. Therefore, for example, in a case where the center of the on-chip micro lens 90 is disposed at the center of a pixel, the distance d1 between the center of the on-chip micro lens 90 and the drive wiring line VOA of the charge accumulation electrode 12 is a distance from the center of the pixel to the boundary of the pixel.

The first imaging element included in the laminated imaging element 101 of the present disclosure is also a so-called backside irradiation type imaging element formed by disposing a transistor for driving the element and drive wiring lines on the opposite surface to the light incident surface on a photoelectric conversion means (that is, photoelectric conversion unit 17) included in the imaging element out of the two surfaces of the photoelectric conversion means.

However, the laminated imaging element 101 of the present disclosure has a structure in which the first imaging element and the second and third imaging elements are laminated. For this reason, when the wiring line VOA for driving the charge accumulation electrode 12 included in the first imaging element illustrated in FIG. 82 is inadvertently disposed, the wiring line VOA hinders incidence of light on the second and third imaging elements disposed below the first imaging element.

Therefore, in the laminated imaging element 101 of the present disclosure, in order to prevent the wiring line VOA for driving the charge accumulation electrode 12 included in the first imaging element from hindering incidence of light on the second and third imaging elements disposed below the first imaging element, the wiring line VOA is disposed as far away from the center of a pixel as possible, in other words, as close as possible to the pixel boundary line. More preferably, as described with reference to FIG. 72, the center line of the wiring line VOA is disposed on the pixel boundary line. In other words, the distance d1 between the center of the on-chip micro lens 90 and the drive wiring line VOA of the charge accumulation electrode 12, illustrated in FIG. 82 is longer than a distance between a drive wiring line other than the drive wiring line VOA and the center of the on-chip micro lens 90, illustrated in FIG. 81.

For example, the distance d1 between the center of the on-chip micro lens 90 and the drive wiring line VOA of the charge accumulation electrode 12, illustrated in FIG. 82 is longer than a distance between the four drive wiring lines TG2-1 to TG2-4 for driving the four transfer transistors TR2trs included in the second imaging element and the center of the on-chip micro lens 90, and a distance between the four drive wiring lines TG3-1 to TG3-4 for driving the four transfer transistors TR3trs included in the third imaging element and the center of the on-chip micro lens 90, illustrated in FIG. 81. This brings about an effect that the incidence of light on the second and third imaging elements is not hindered unlike a solid-state imaging device not having this configuration.

Figure 83:
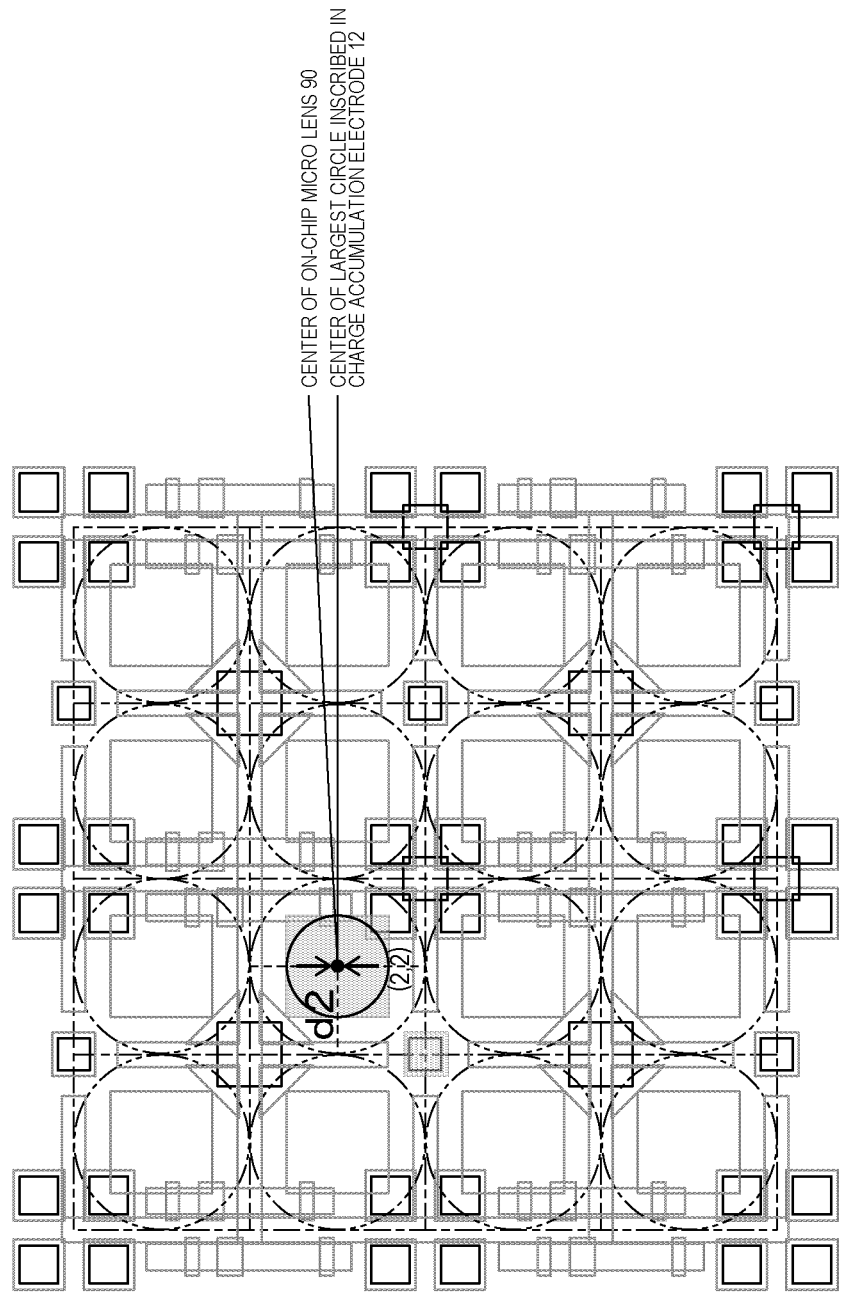
FIG. 83 illustrates FIG. 68 again, and is obtained by adding a distance d2 between the center of the on-chip micro lens illustrated in FIG. 68 and the center of the largest circle inscribed in a charge accumulation electrode included in the first imaging element illustrated in FIG. 68 to FIG. 68.

FIG. 83 illustrates FIG. 68 again, and is obtained by adding a distance d2 between the center of the on-chip micro lens illustrated 90 in FIG. 68 and the center of the largest circle inscribed in the charge accumulation electrode 12 included in the first imaging element illustrated in FIG. 68 to FIG. 68.

Here, "the center of the largest circle inscribed in a target graphic" means the center of a circle inscribed in four sides of a circle in a case where the shape of the graphic is, for example, the square. Meanwhile, in a case where the shape of the graphic is, for example, a rectangle, a circle inscribed in three sides of the rectangle is the largest, but a place where the largest circle can be disposed is not a single point but a line segment. In this way, in a case where the place where "the largest circle inscribed in a target graphic" can be disposed is not limited to one point, the center of the place where the largest circle inscribed in a target graphic can be disposed is defined as "the center of the largest circle inscribed in a target figure". For example, in a case where the target graphic is a rectangle, the midpoint of a line segment where a circle inscribed in three sides of the rectangle can be disposed is defined as "the position of the center of the largest circle inscribed in a target graphic".

Figure 84:
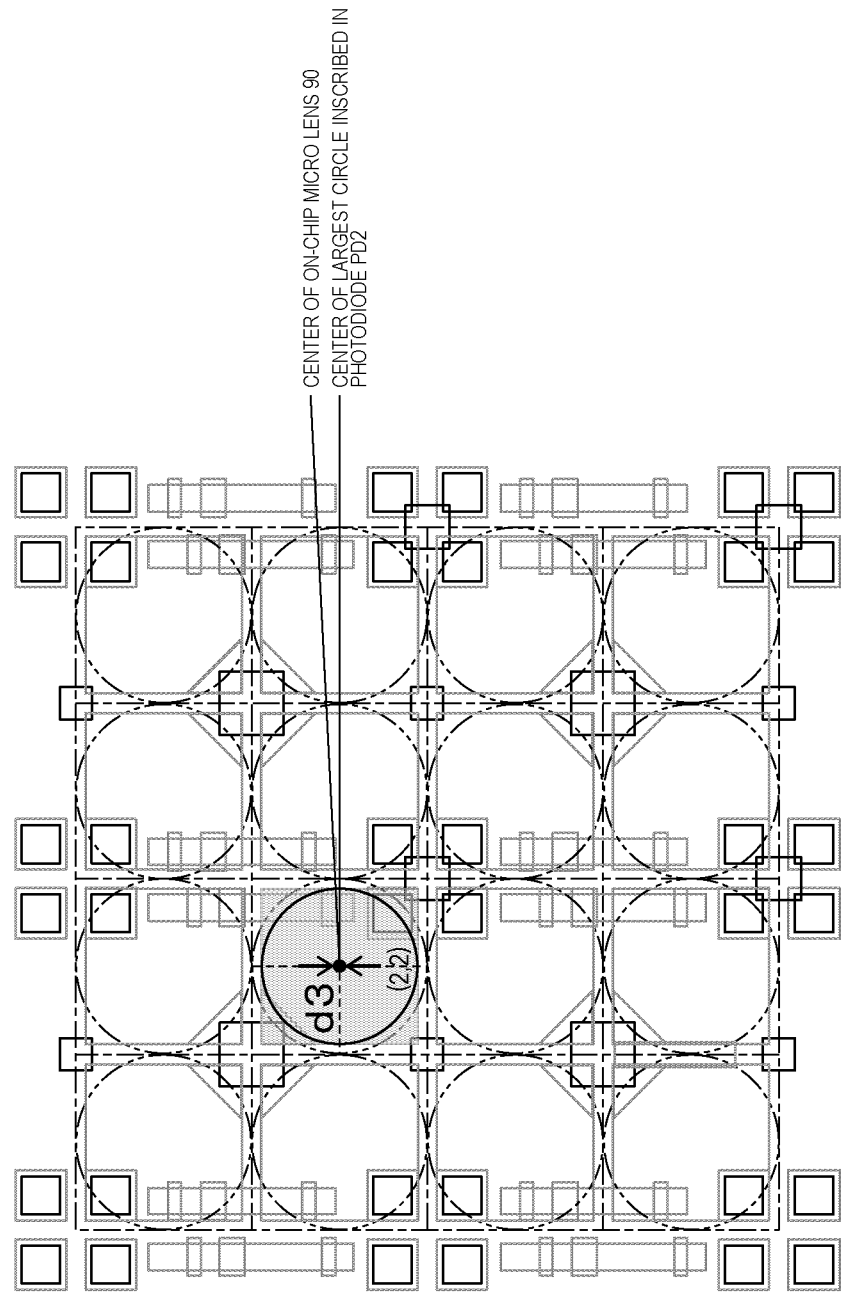
FIG. 84 illustrates FIG. 70 again, and is obtained by adding a distance d3 between the center of the on-chip micro lens illustrated in FIG. 70 and the center of the largest circle inscribed in a photodiode included in the second imaging element illustrated in FIG. 70 to FIG. 70.

FIG. 84 illustrates FIG. 70 again, and is obtained by adding a distance d3 between the center of the on-chip micro lens 90 illustrated in FIG. 70 and the center of the largest circle inscribed in the photodiode PD2 included in the second imaging element illustrated in FIG. 70 to FIG. 70.

Figure 85:
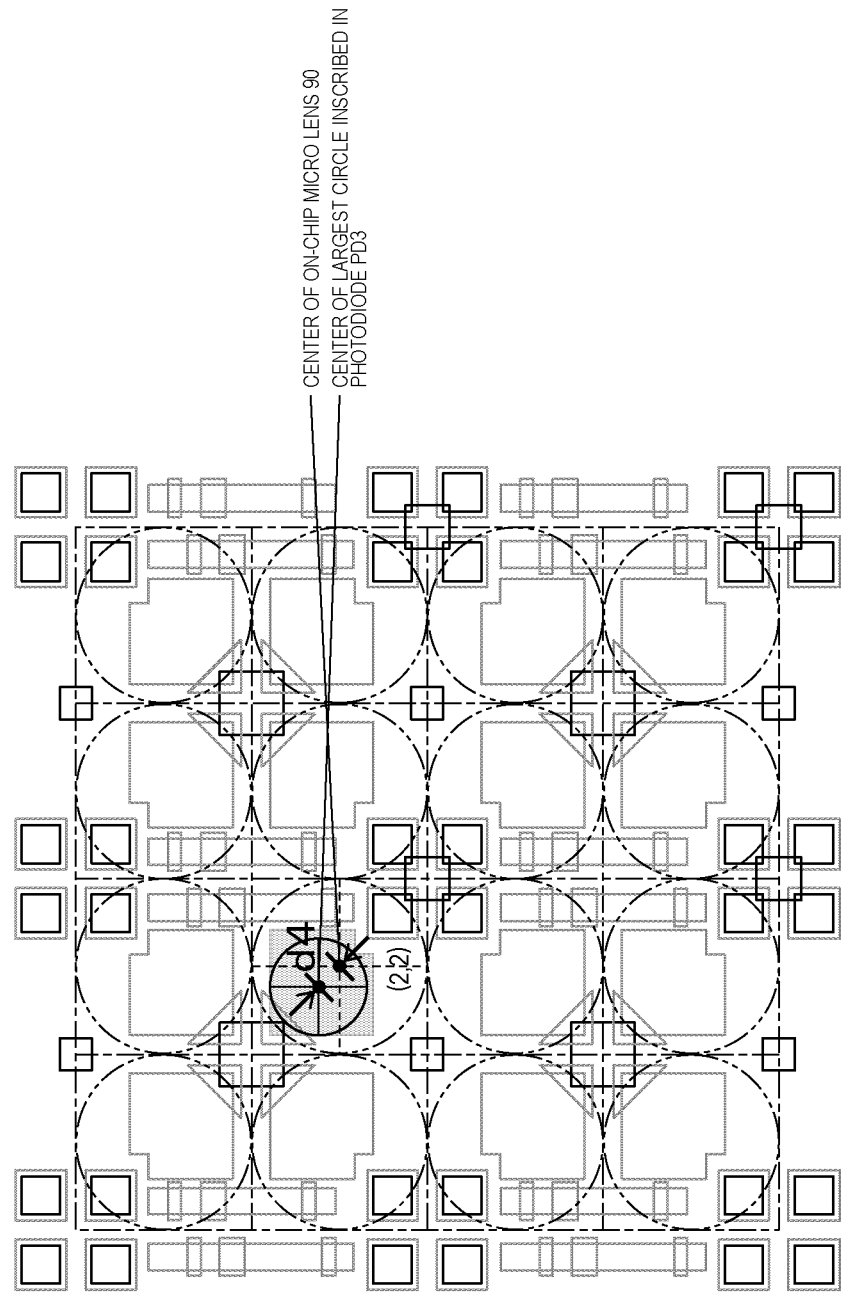
FIG. 85 illustrates FIG. 66 again, and is obtained by adding a distance d4 between the center of the on-chip micro lens illustrated in FIG. 66 and the center of the largest circle inscribed in a photodiode included in the third imaging element illustrated in FIG. 66 to FIG. 66.

FIG. 85 illustrates FIG. 66 again, and is obtained by adding a distance d4 between the center of the on-chip micro lens illustrated 90 in FIG. 66 and the center of the largest circle inscribed in the photodiode PD3 included in the third imaging element illustrated in FIG. 66 to FIG. 66.

Figure 86:
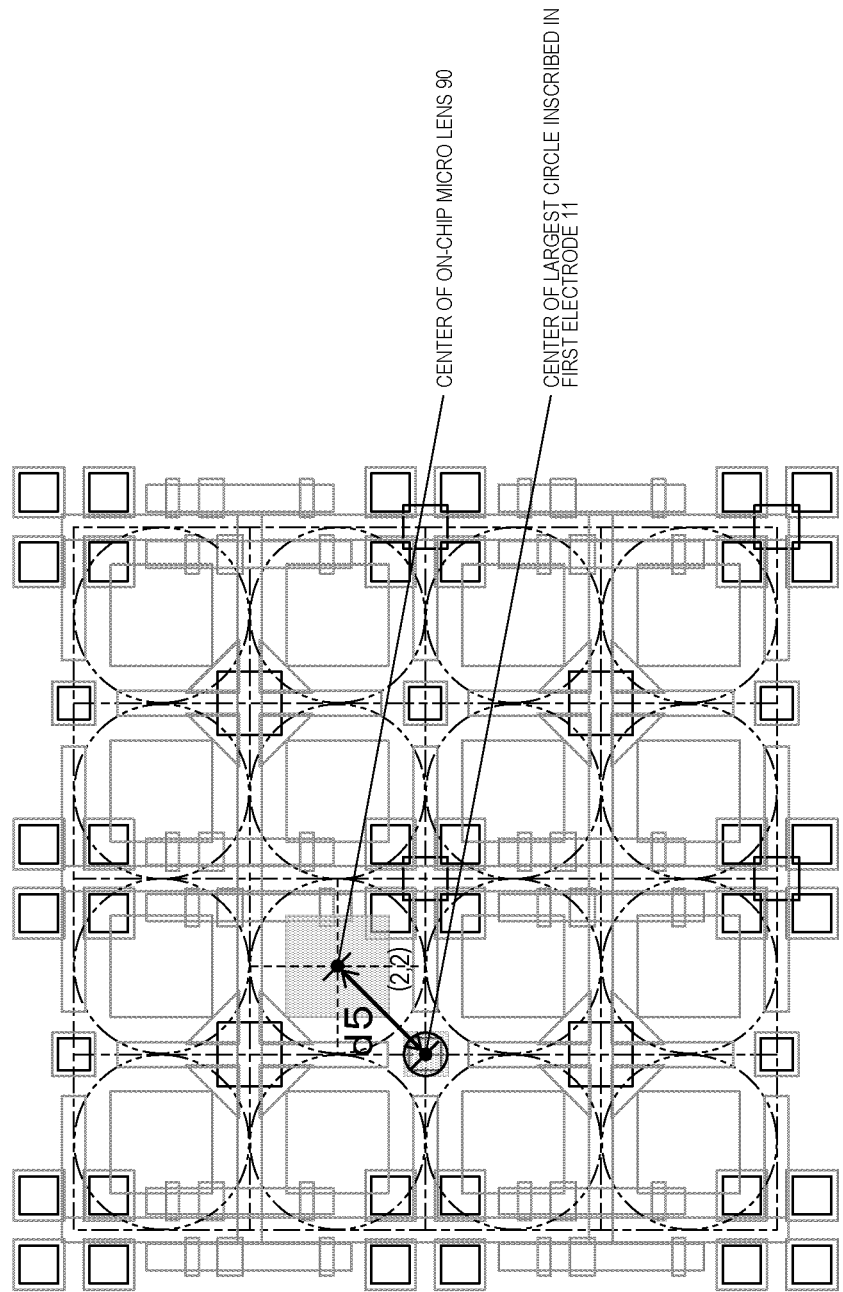
FIG. 86 illustrates FIG. 68 again, and is obtained by adding a distance d2 between the center of the on-chip micro lens illustrated in FIG. 68 and the center of the largest circle inscribed in a first electrode included in the first imaging element illustrated in FIG. 68 to FIG. 68.

FIG. 86 illustrates FIG. 68 again, and is obtained by adding a distance d2 between the center of the on-chip micro lens illustrated 90 in FIG. 68 and the center of the largest circle inscribed in the first electrode 11 included in the first imaging element illustrated in FIG. 68 to FIG. 68.

Figure 87:
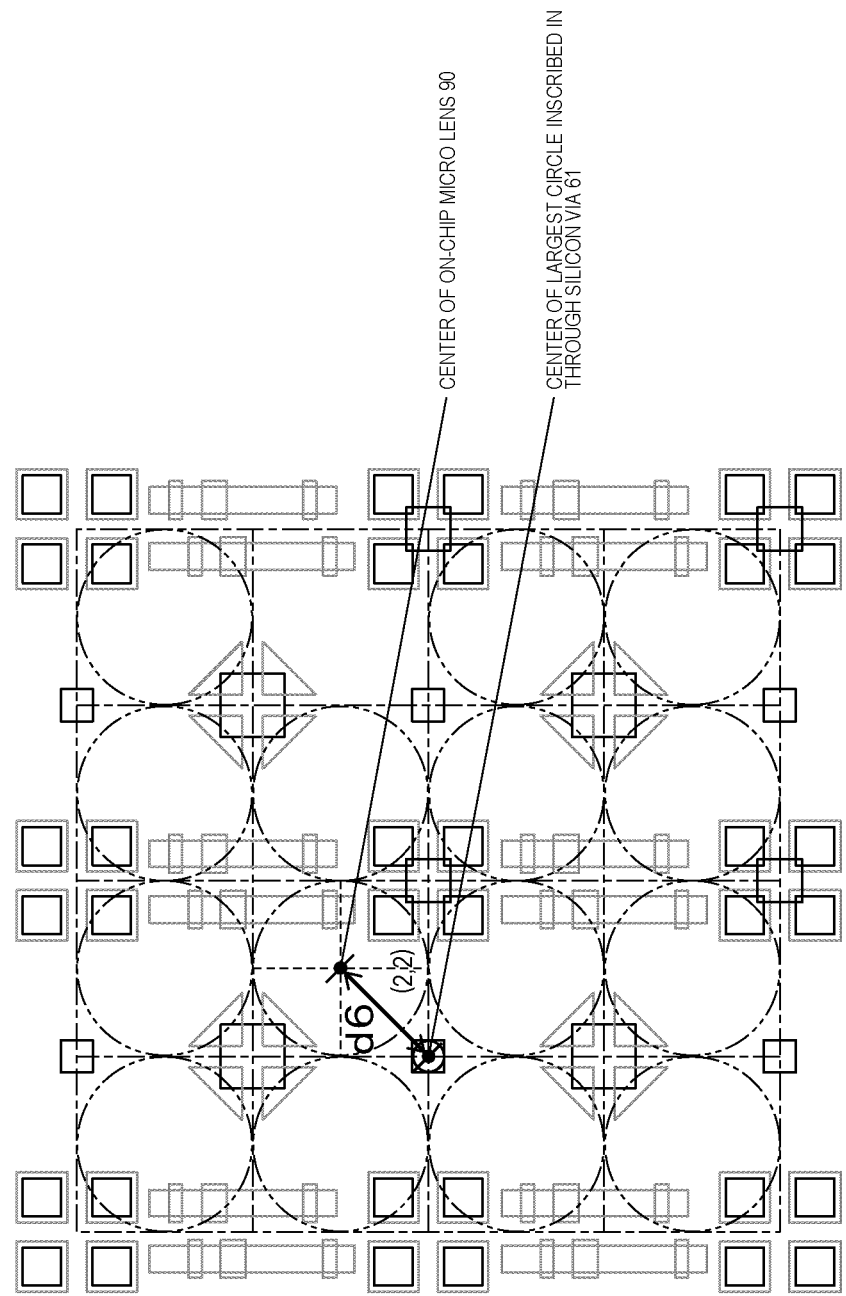
FIG. 87 illustrates FIG. 68 again, and is obtained by deleting the first electrode and the charge accumulation electrode illustrated in FIG. 68, adding the center of the largest circle inscribed in a through silicon via illustrated in FIG. 68 and the center of the on-chip micro lens, and further adding a distance d3 between the center of the largest circle inscribed in the through silicon via and the center of the on-chip micro lens to FIG. 68.

FIG. 87 illustrates FIG. 68 again, and is obtained by deleting the first electrode 11 and the charge accumulation electrode 12 illustrated in FIG. 68, adding the center of the largest circle inscribed in the through silicon via 61 illustrated in FIG. 68 and the center of the on-chip micro lens 90, and further adding a distance d3 between the center of the largest circle inscribed in the through silicon via 61 and the center of the on-chip micro lens 90 to FIG. 68.

The laminated imaging element 101 of the present disclosure has a structure in which the first imaging element and the second and third imaging elements are laminated. Meanwhile, the through silicon via 61 illustrated in FIG. 87 is an electrode formed through the silicon substrate 70 as illustrated in FIG. 61. For this reason, the photodiodes PD2 and PD3 included in the second and third imaging elements of the laminated imaging element 101 need to be disposed avoiding the through silicon via 61. For this reason, when the through silicon via 61 described in FIG. 87 is inadvertently disposed, the photodiodes PD2 and PD3 included in the second and third imaging elements need to be disposed avoiding the through silicon via 61. Therefore, the area where the photodiodes PD2 and PD3 receive light is small.

For this reason, in the laminated imaging element 101 of the present disclosure, the through silicon via 61 and the first electrode 11 that is an electrode connected to the through silicon via and thus determines a place where the through silicon via 61 is disposed are disposed as far from the center of a pixel as possible so as not to hinder the arrangement of the photodiodes PD2 and PD3 included in the second and third imaging elements, disposed below the first imaging element.

More preferably, as described in FIGS. 83 to 87, than (1) the distance d2 between the center of an inscribed circle of the charge accumulation electrode 12 and the center of the on-chip micro lens 90, (2) the distance d3 between the center of an inscribed circle of the photodiode PD2 and the center of the on-chip micro lens 90, and (3) the distance d4 between the center of an inscribed circle of the photodiode PD3 and the center of the on-chip micro lens 90, (4) a distance d6 between the through silicon via 61 and the center of the on-chip micro lens 90 and (5) a distance d5 between the center of an inscribed circle of the first electrode 11 and the center of the on-chip micro lens 90 are longer. This brings about an effect that the arrangement of the photodiodes PD2 and PD3 is not hindered unlike a solid-state imaging device not having this configuration.

Figure 88:
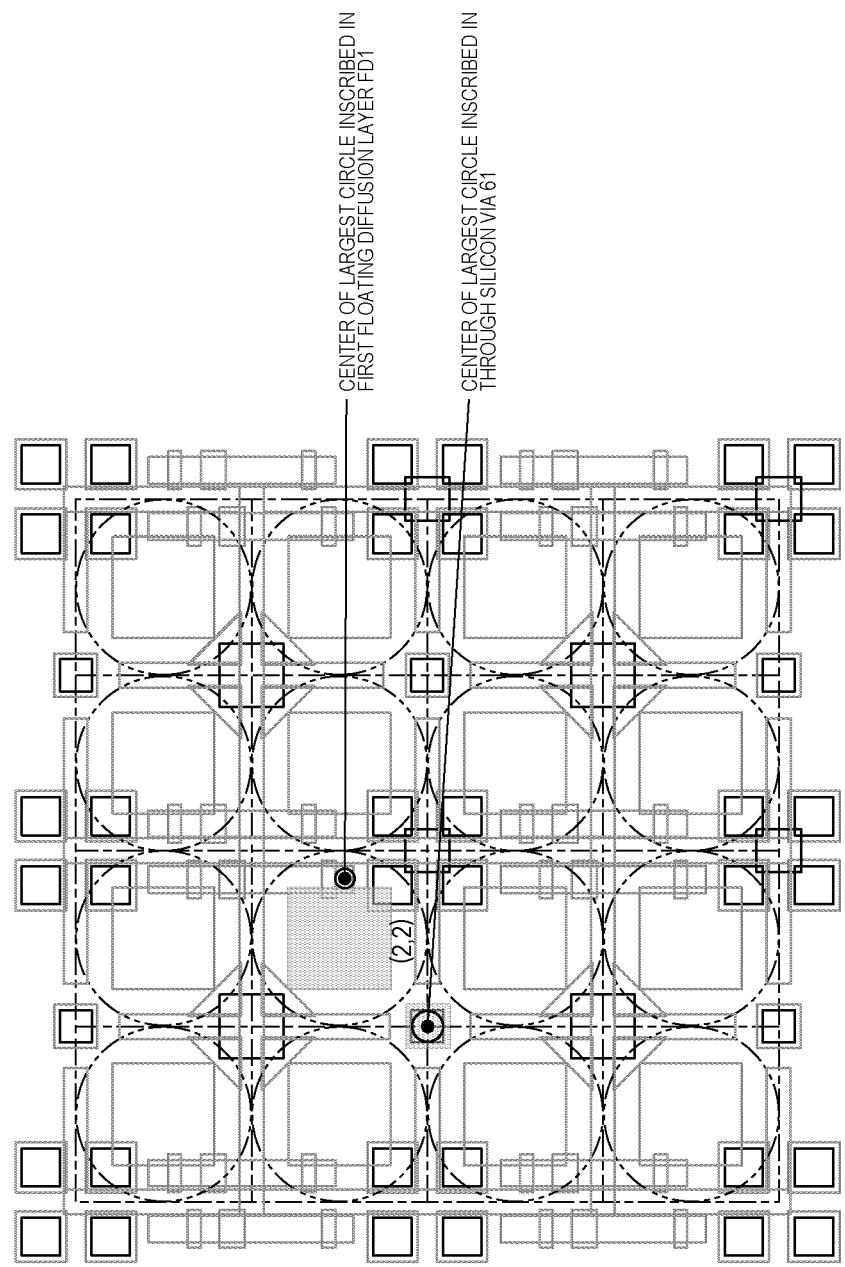
FIG. 88 illustrates FIG. 68 again, and is obtained by deleting reference numerals of components other than the through silicon via and the first floating diffusion layer included in the first imaging element.

FIG. 88 illustrates FIG. 68 again, and is obtained by deleting reference numerals of components other than the through silicon via 61 and the first floating diffusion layer FD1 included in the first imaging element.

Figure 89:
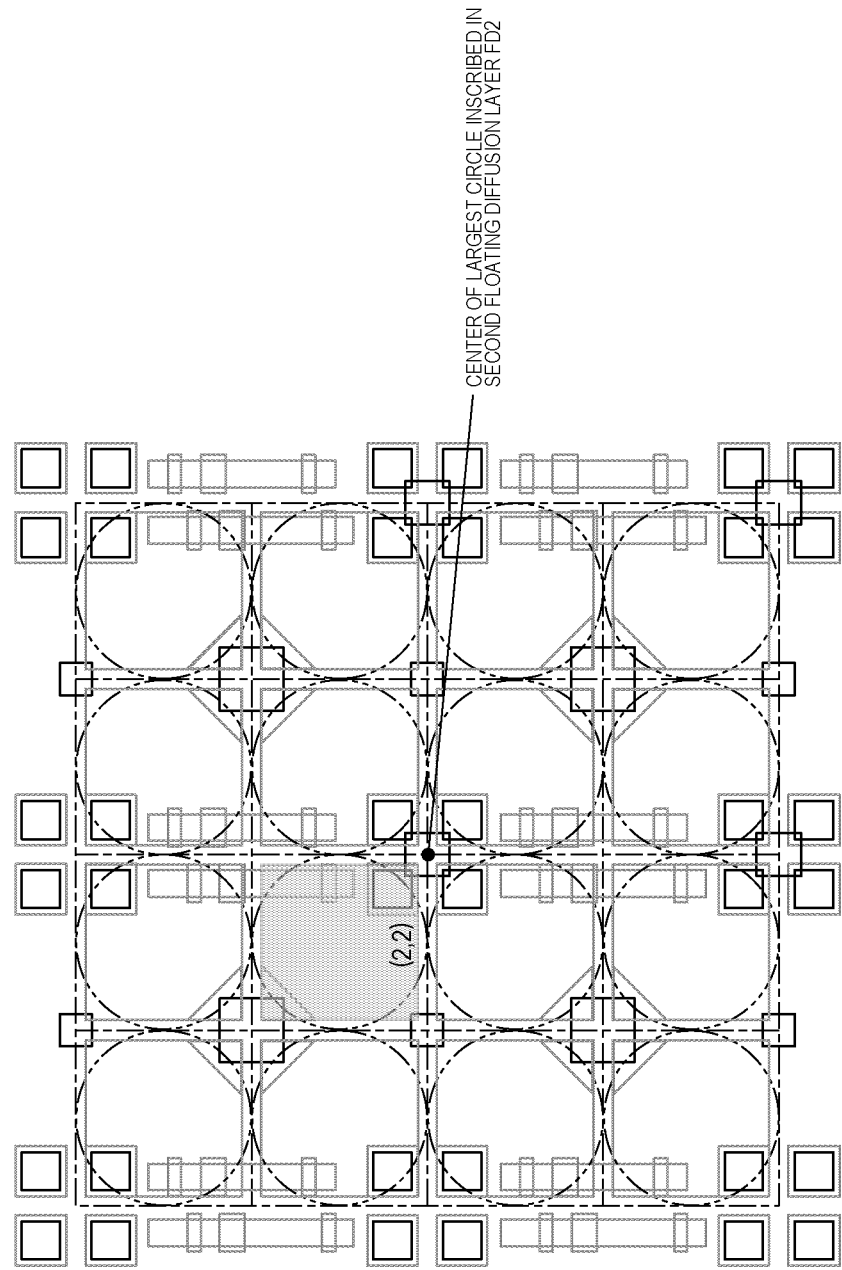
FIG. 89 illustrates FIG. 70 again, and is obtained by deleting reference numerals of components other than the second floating diffusion layer included in the second imaging element.

FIG. 89 illustrates FIG. 70 again, and is obtained by deleting reference numerals of components other than the second floating diffusion layer FD2 included in the second imaging element.

Figure 90:
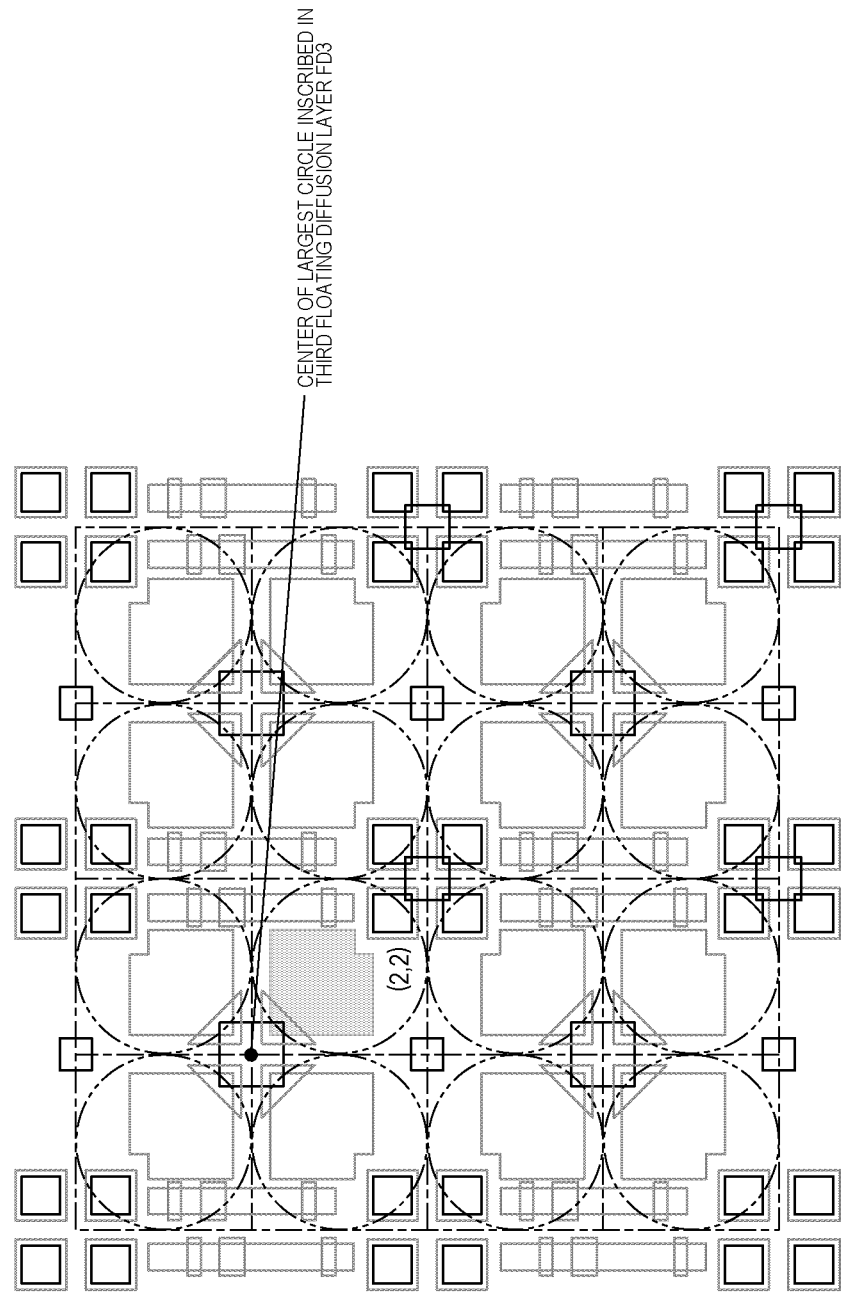
FIG. 90 illustrates FIG. 66 again, and is obtained by deleting reference numerals of components other than the third floating diffusion layer 3 included in the third imaging element.

FIG. 90 illustrates FIG. 66 again, and is obtained by deleting reference numerals of components other than the third floating diffusion layer FD3 included in the third imaging element.

Figure 91:
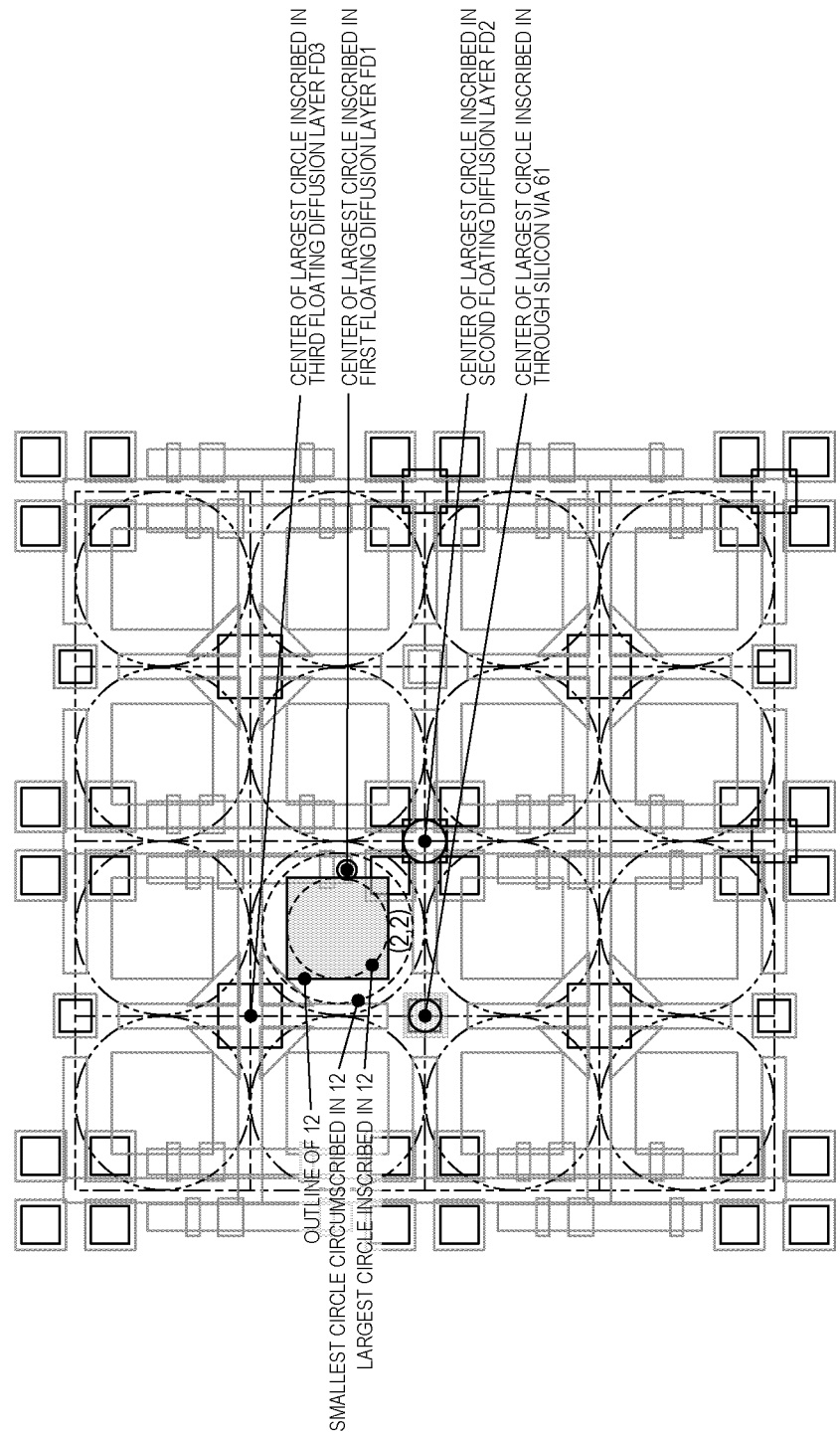
FIG. 91 illustrates FIG. 68 again, and is a diagram illustrating a positional relationship between a charge accumulation electrode included in the first imaging element, and the through silicon via, the first floating diffusion layer, the second floating diffusion layer, and the third floating diffusion layer illustrated in FIGS. 88 to 91.

FIG. 91 illustrates FIG. 68 again, and is a diagram illustrating a positional relationship between the charge accumulation electrode 12 included in the first imaging element, and the through silicon via 61, the first floating diffusion layer FD1, the second floating diffusion layer FD2, and the third floating diffusion layer FD3 illustrated in FIGS. 88 to 91.

The laminated imaging element 101 of the present disclosure has a structure in which the first imaging element and the second and third imaging elements are laminated. Meanwhile, the charge accumulation electrode 12 included in the first imaging element, the photodiode PD2 included in the second imaging element, and the photodiode PD3 included in the third imaging element need to be disposed avoiding the through silicon via 61, the second floating diffusion layer FD2, and the third floating diffusion layer FD3 illustrated in FIGS. 88 to 91. For this reason, when the latter (that is, the through silicon via 61, the second floating diffusion layer FD2, and the third floating diffusion layer FD3) are disposed inadvertently, the former (that is, the charge accumulation electrode 12, the photodiode PD2, and the photodiode PD3) need to be disposed avoiding the latter. Therefore, the area where the former receives light is small.

Therefore, in the laminated imaging element 101 of the present disclosure, the latter (that is, the through silicon via 61, the second floating diffusion layer FD2, and the third floating diffusion layer FD3) is disposed as far away from the center of a pixel as possible, in other words, as close as possible to the pixel boundary line so as not to hinder the arrangement of the former (that is, the charge accumulation electrode 12, the photodiode PD2, and the photodiode PD3).

More preferably, as described in FIG. 91, (1) the center of the largest circle inscribed in the through silicon via 61, (2) the center of the largest circle inscribed in the first electrode 11 through silicon via that is an electrode connected to the through silicon via and thus determines a place where the through silicon via 61 is disposed, (3) the center of the largest circle inscribed in the second floating diffusion layer FD2, and (4) the center of the largest circle inscribed in the third floating diffusion layer FD3 are disposed outside the center of the largest circle inscribed in the charge accumulation electrode 12 included in the first imaging device.

More preferably, the above (1) to (4) are disposed outside the outline of the charge accumulation electrode 12 included in the first imaging device.

More preferably, the above (1) to (4) are disposed outside a circumscribed circle of the charge accumulation electrode 12 included in the first imaging device.

Alternatively, the above (1) to (4) are disposed outside the largest circle inscribed in the photodiode PD3 included in the third imaging device.

Alternatively, the above (1) to (4) are disposed outside the outline of the photodiode PD3 included in the third imaging device.

Alternatively, the above (1) to (4) are disposed outside the largest circle inscribed in the photodiode PD2 included in the third imaging device.

Alternatively, the above (1) to (4) are disposed outside the outline of the photodiode PD2 included in the third imaging device.

Figure 92:
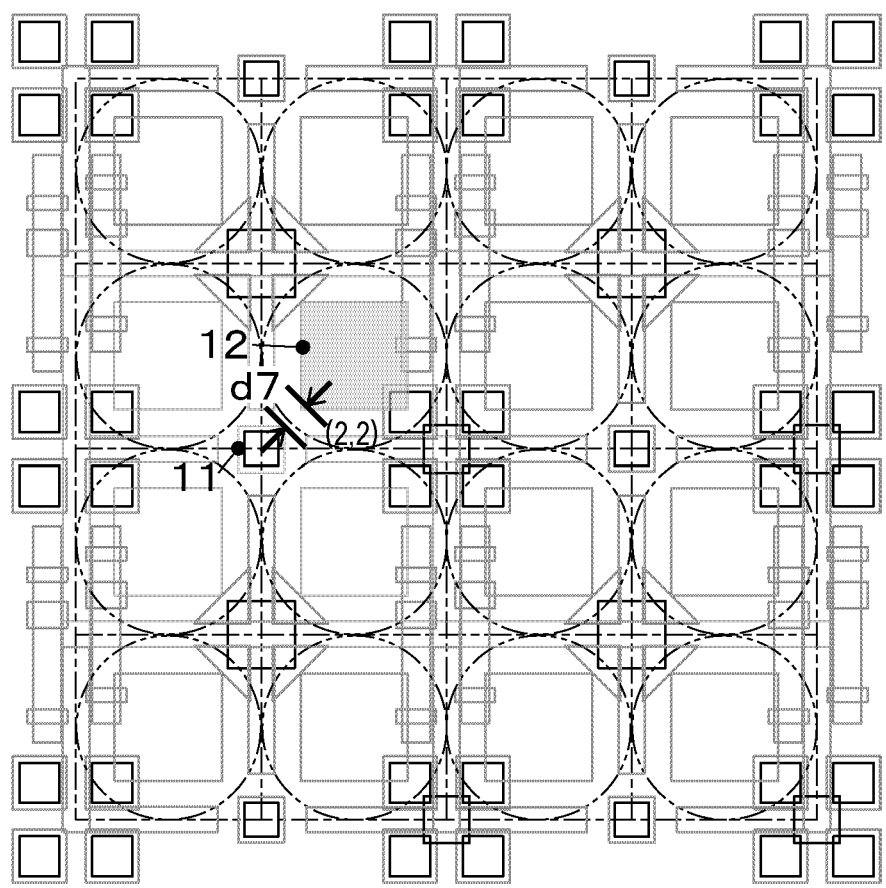
FIG. 92 illustrates FIG. 68 again, and is obtained by deleting a frame line indicating a repeating arrangement unit of a transistor constituting a control unit, and adding a distance d7 which is a minimum distance between the first electrode 11 and a charge accumulation electrode.

FIG. 92 illustrates FIG. 68 again, and is obtained by deleting a frame line indicating a repeating arrangement unit of a transistor constituting a control unit, and adding a distance d7 which is a minimum distance between the first electrode 11 and the charge accumulation electrode 12.

Figure 93:
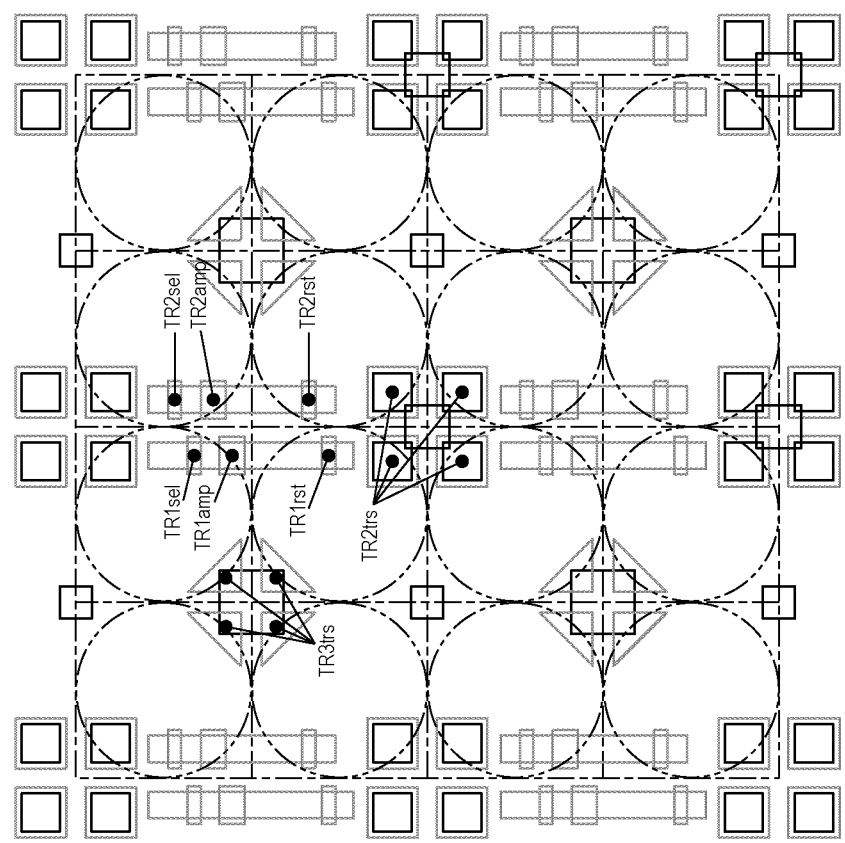
FIG. 93 illustrates FIG. 64 again, and is obtained by deleting a frame line indicating a repeating arrangement unit of a transistor constituting a control unit.

FIG. 93 illustrates FIG. 64 again, and is obtained by deleting a frame line indicating a repeating arrangement unit of a transistor constituting a control unit As described with reference to FIG. 6, in the photoelectric conversion unit 17 included in the first imaging element of Examples of the present disclosure, by applying a first voltage for charge accumulation to the charge accumulation electrode, charges generated in the photoelectric conversion layer 17 are accumulated in the lower semiconductor layer 15A, and by applying a second voltage for charge transfer (in other words, for charge readout) to the charge accumulation electrode, charges accumulated in the lower semiconductor layer 15A are transferred to the first electrode 11 and read out. In this case, the lower semiconductor layer 15A, the charge accumulation electrode 12, and the first electrode 11 perform functions similar to a channel, a gate electrode, and a drain electrode in a MOS transistor, respectively. However, in the MOS transistor, a conductivity type is different between source and drain regions and a channel region (for example, in a case of NMOS, the source and drain regions are N-type and the channel region is P-type). This causes a potential barrier between the two regions. This potential barrier suppresses carrier transfer (in other words, leakage current) from the source region to the drain region when the transistor is turned off. In contrast, in the case of the photoelectric conversion unit 17 included in the first imaging element, there is no potential barrier such as a potential barrier between the channel region and the drain region in the lower semiconductor layer 15A. Therefore, in order to suppress a leakage current in the photoelectric conversion unit 17 included in the first imaging element, the charge accumulation electrode 12 for accumulating charges is preferably separated from the first electrode 11 as a charge transfer destination to some extent. For example, the distance between the charge accumulation electrode 12 for accumulating charges and the first electrode 11 as a charge transfer destination is preferably longer than a minimum gate length in a normal MOS transistor. Alternatively, the distance between the charge accumulation electrode 12 for accumulating charges and the first electrode 11 as a charge transfer destination is preferably larger than a minimum L length included in the MOS transistor formed on one surface 70A of the semiconductor substrate 70 of the laminated imaging element 101. With such a configuration, compared with the solid-state imaging device 100 not having such a configuration, there is an effect that a leakage current flowing from a region included in the lower semiconductor layer 15A and disposed above the charge accumulation electrode 12 to a region included in the lower semiconductor layer 15A and disposed above the first electrode 11 can be reduced.

Modification of Example 12

Each of the relationships described with reference to FIGS. 81 to 93 holds not only in the solid-state imaging device 100 having a pixel sharing structure described in FIGS. 62 to 80 but also in the solid-state imaging device 100 in which the laminated imaging elements 101 not having a pixel sharing structure but having a so-called single pixel structure are arrayed in a pixel array.

Figure 94:
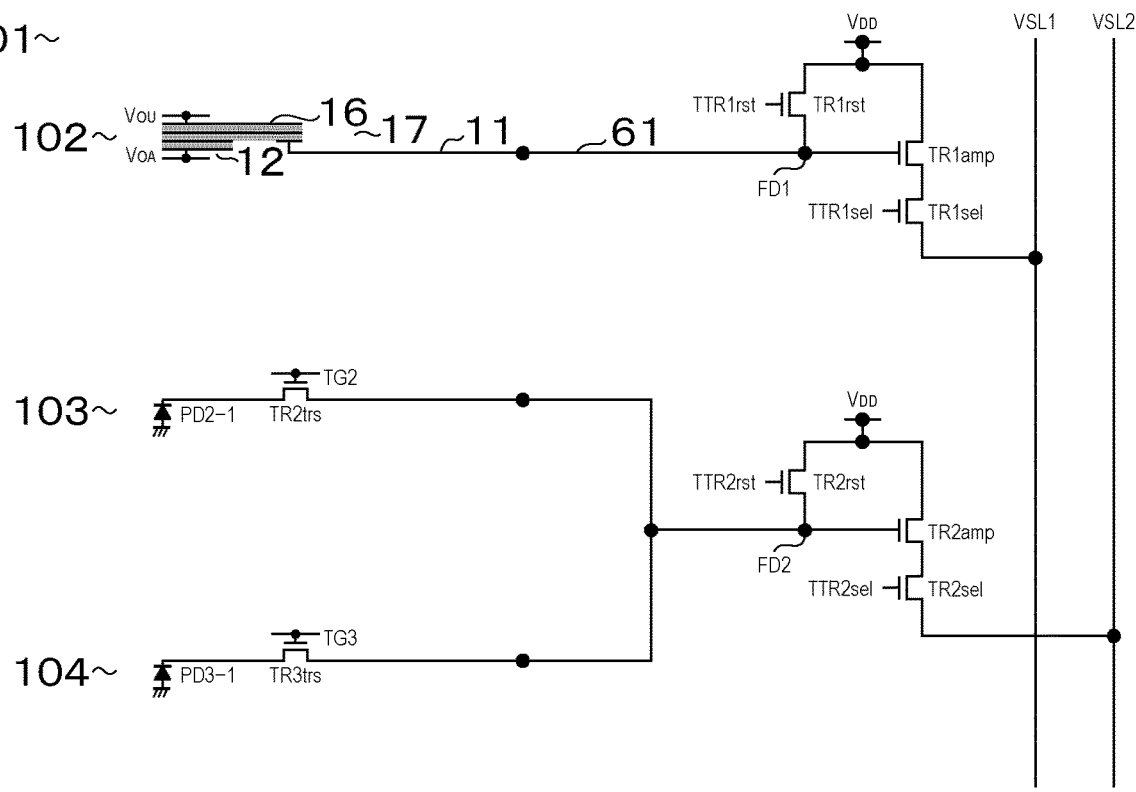
FIG. 94 is a diagram similar to FIG. 62 for a single pixel structure.
Figure 95:
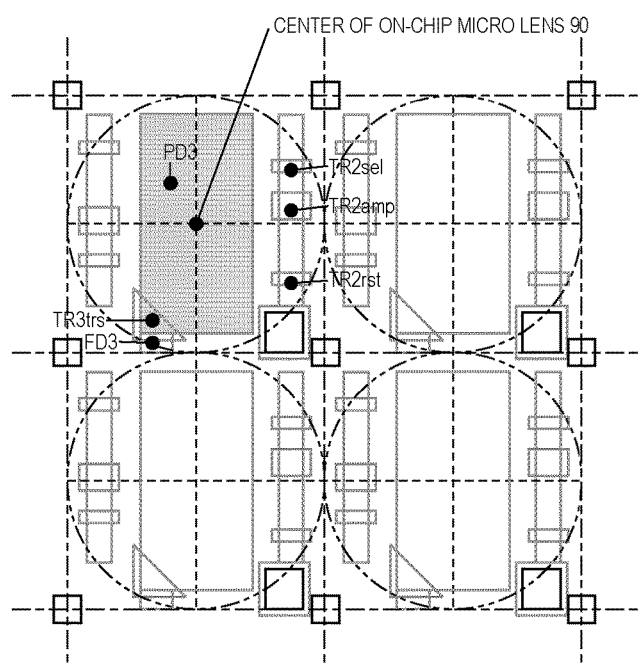
FIG. 95 is a diagram similar to FIG. 66 for a single pixel structure.
Figure 96:
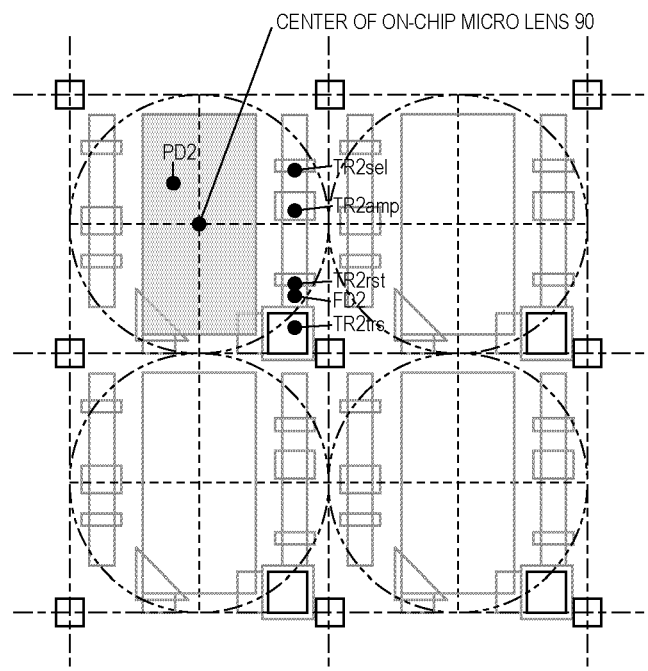
FIG. 96 is a diagram similar to FIG. 70 for a single pixel structure.
Figure 97:
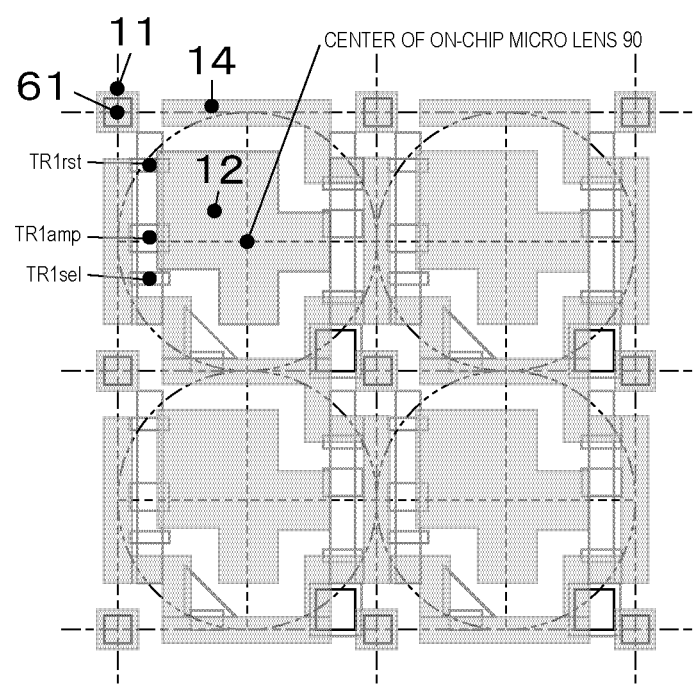
FIG. 97 is a diagram similar to FIG. 68 for a single pixel structure.
Figure 98:
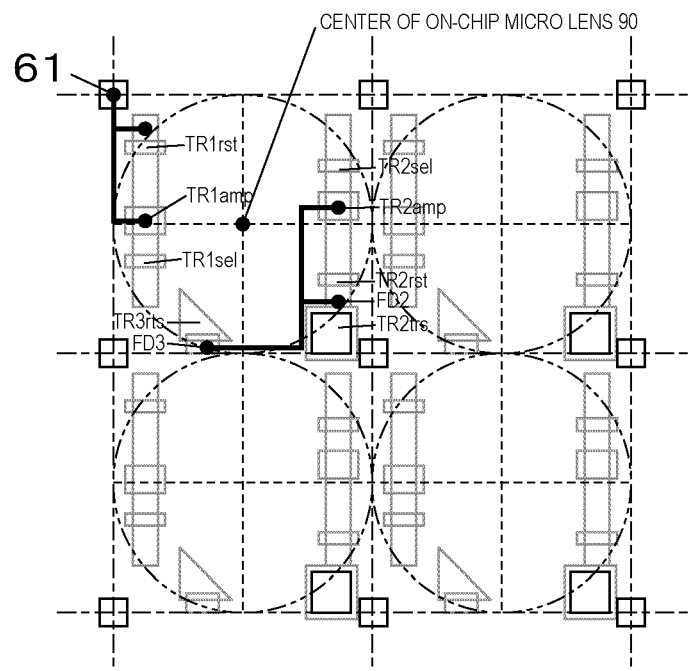
FIG. 98 is a diagram similar to FIG. 74 for a single pixel structure.
Figure 99:
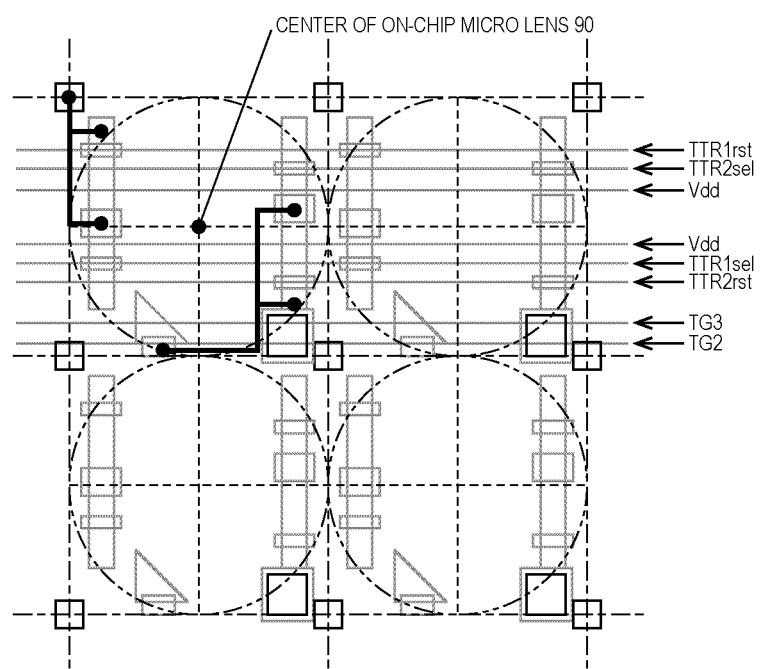
FIG. 99 is a diagram similar to FIG. 75 for a single pixel structure.
Figure 100:
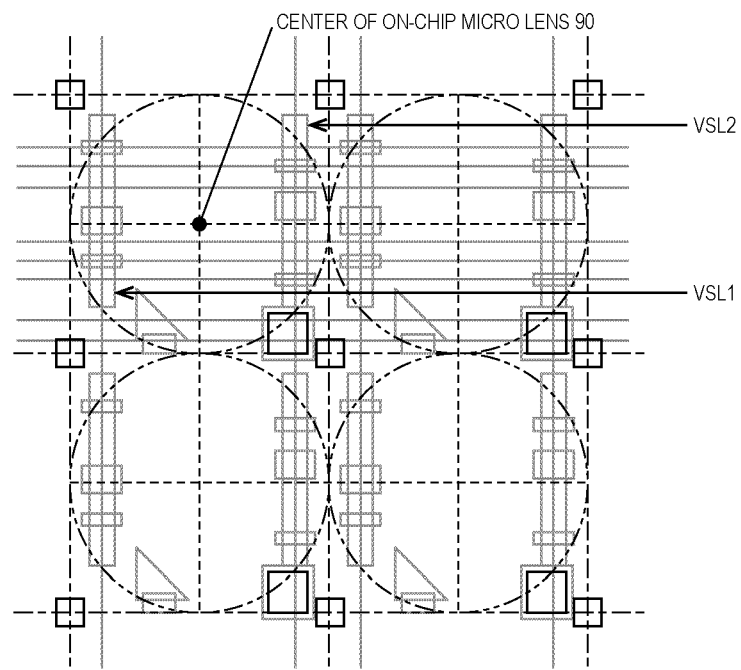
FIG. 100 is a diagram similar to FIG. 76 for a single pixel structure.
Figure 101:
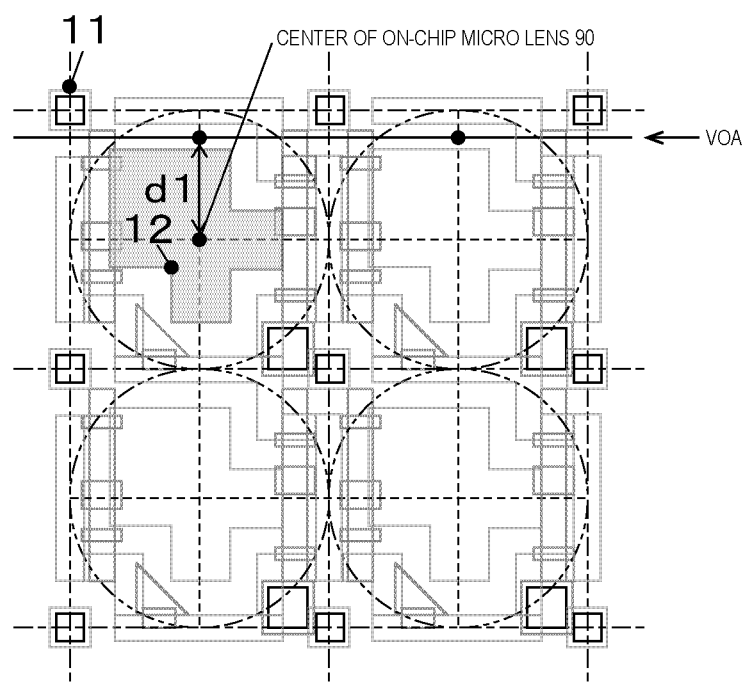
FIG. 101 is a diagram similar to FIG. 82 for a single pixel structure.
Figure 102:
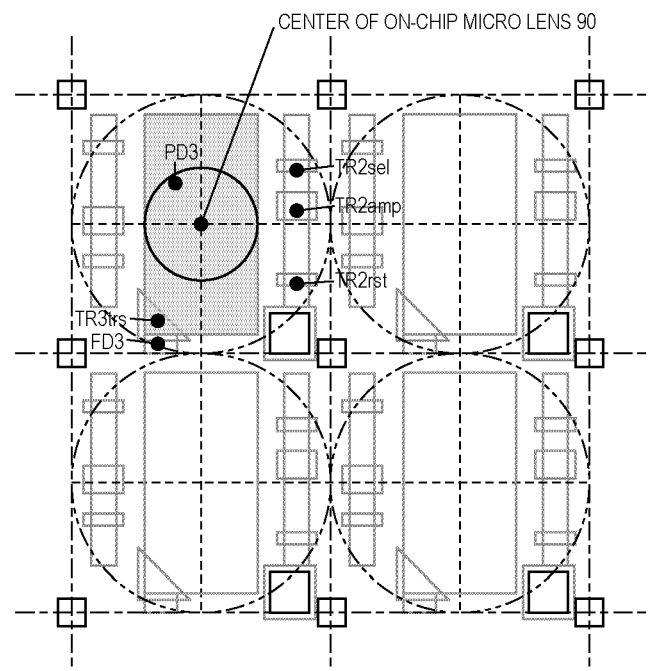
FIG. 102 is a diagram similar to FIG. 85 for a single pixel structure.
Figure 103:
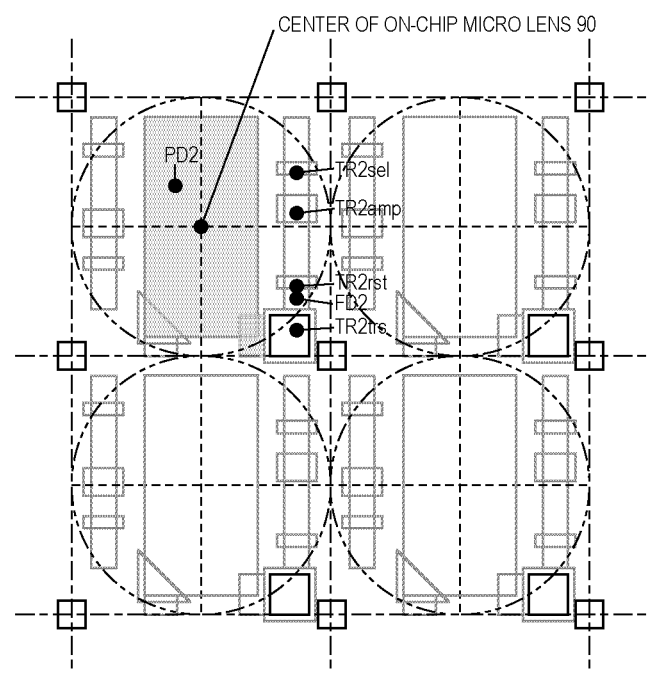
FIG. 103 is a diagram similar to FIG. 84 for a single pixel structure.
Figure 104:
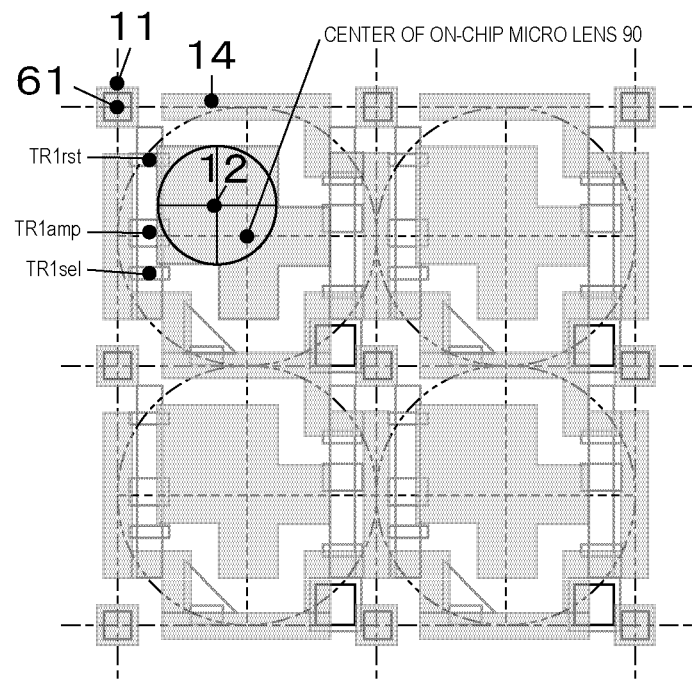
FIG. 104 is a diagram similar to FIG. 83 for a single pixel structure.
Figure 105:
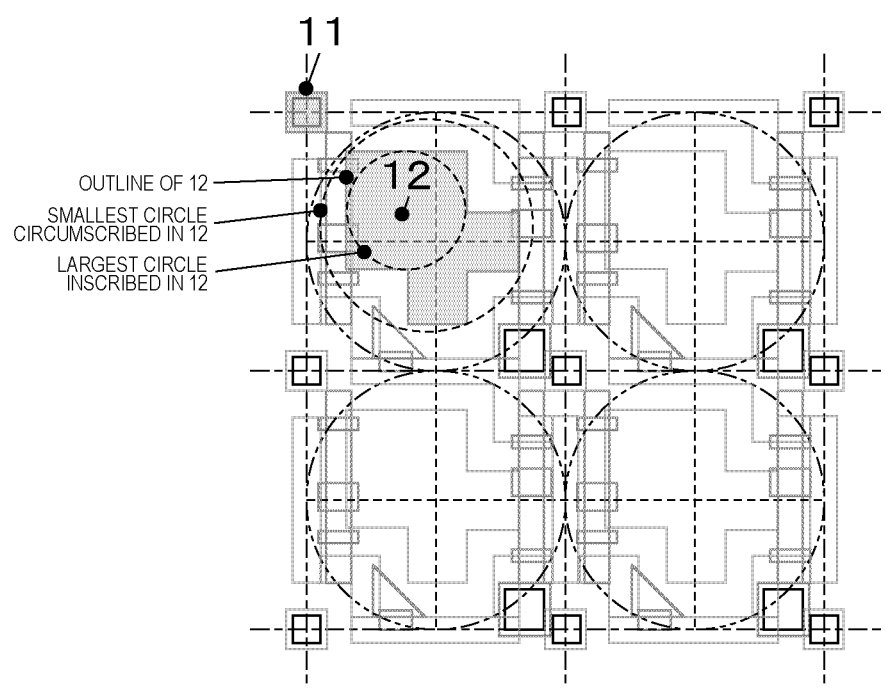
FIG. 105 is a diagram similar to FIG. 91 for a single pixel structure.
Figure 106:
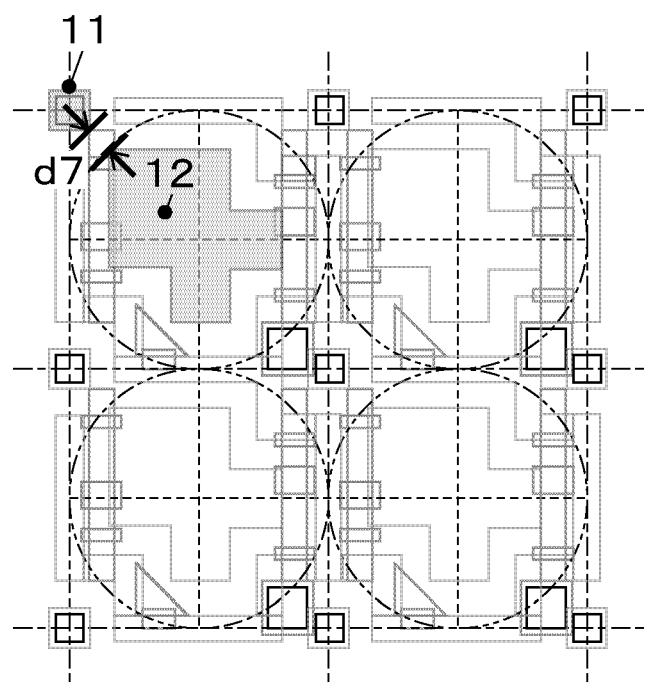
FIG. 106 is a diagram similar to FIG. 92 for a single pixel structure.
Figure 107:
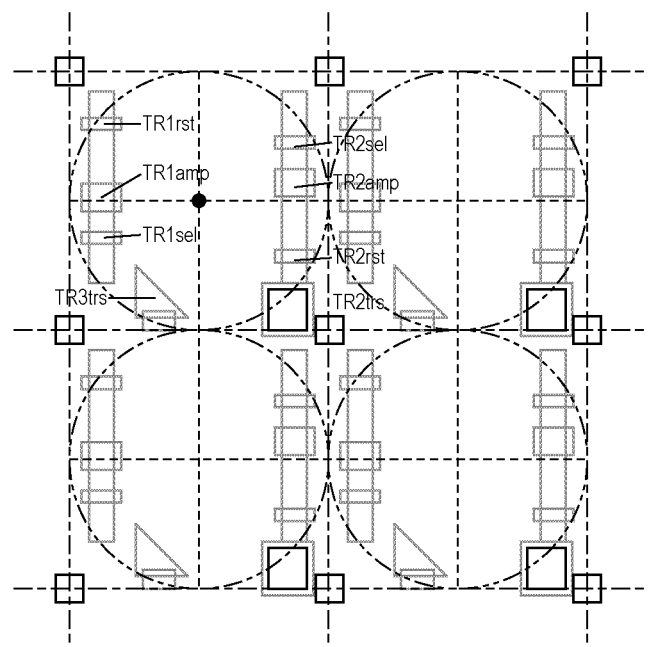
FIG. 107 is a diagram similar to FIG. 93 for a single pixel structure.

As for the single pixel structure, FIG. 94 illustrates a diagram similar to FIG. 62, FIG. 95 illustrates a diagram similar to FIG. 66, FIG. 96 illustrates a diagram similar to FIG. 70, FIG. 97 illustrates a diagram similar to FIG. 68, FIG. 98 illustrates a diagram similar to FIG. 74, FIG. 99 illustrates a diagram similar to FIG. 75, FIG. 100 illustrates a diagram similar to FIG. 76, FIG. 101 illustrates a diagram similar to FIG. 82, FIG. 102 illustrates a diagram similar to FIG. 85, FIG. 103 illustrates a diagram similar to FIG. 84, FIG. 104 illustrates a diagram similar to FIG. 83, FIG. 105 illustrates a diagram similar to FIG. 91, FIG. 106 illustrates a diagram similar to FIG. 92, and FIG. 107 illustrates a diagram similar to FIG. 93.

Each of the relationships described with reference to FIGS. 81 to 93 also holds in the solid-state imaging device 100 in which the laminated imaging elements 101 each having a so-called single pixel structure are arrayed in a pixel array described in FIGS. 94 to 107. How the relationship described above holds also in FIGS. 94 to 107 is similar to the description with reference to FIGS. 81 to 93, and therefore description thereof will be omitted.

Hitherto, the present disclosure has been described on the basis of preferable Examples. However, the present disclosure is not limited to these Examples. The structures and configurations, the manufacturing conditions, the manufacturing methods, and the used materials of the imaging element, the laminated imaging element, and the solid-state imaging device described in Examples are illustrative and can be modified appropriately. The imaging element of Example 1, the imaging element of Example 2, the imaging element of Example 3, the imaging element of Example 4, and the imaging element of Example 5 can be arbitrarily combined. The imaging element of Example 1, the imaging element of Example 2, the imaging element of Example 3, the imaging element of Example 4, and the imaging element of Example 6 can be arbitrarily combined.

In some cases, the floating diffusion layers $FD_1$, $FD_{21}$, $FD_3$, 51C, 45C, and 46C can be shared.

Figure 48:
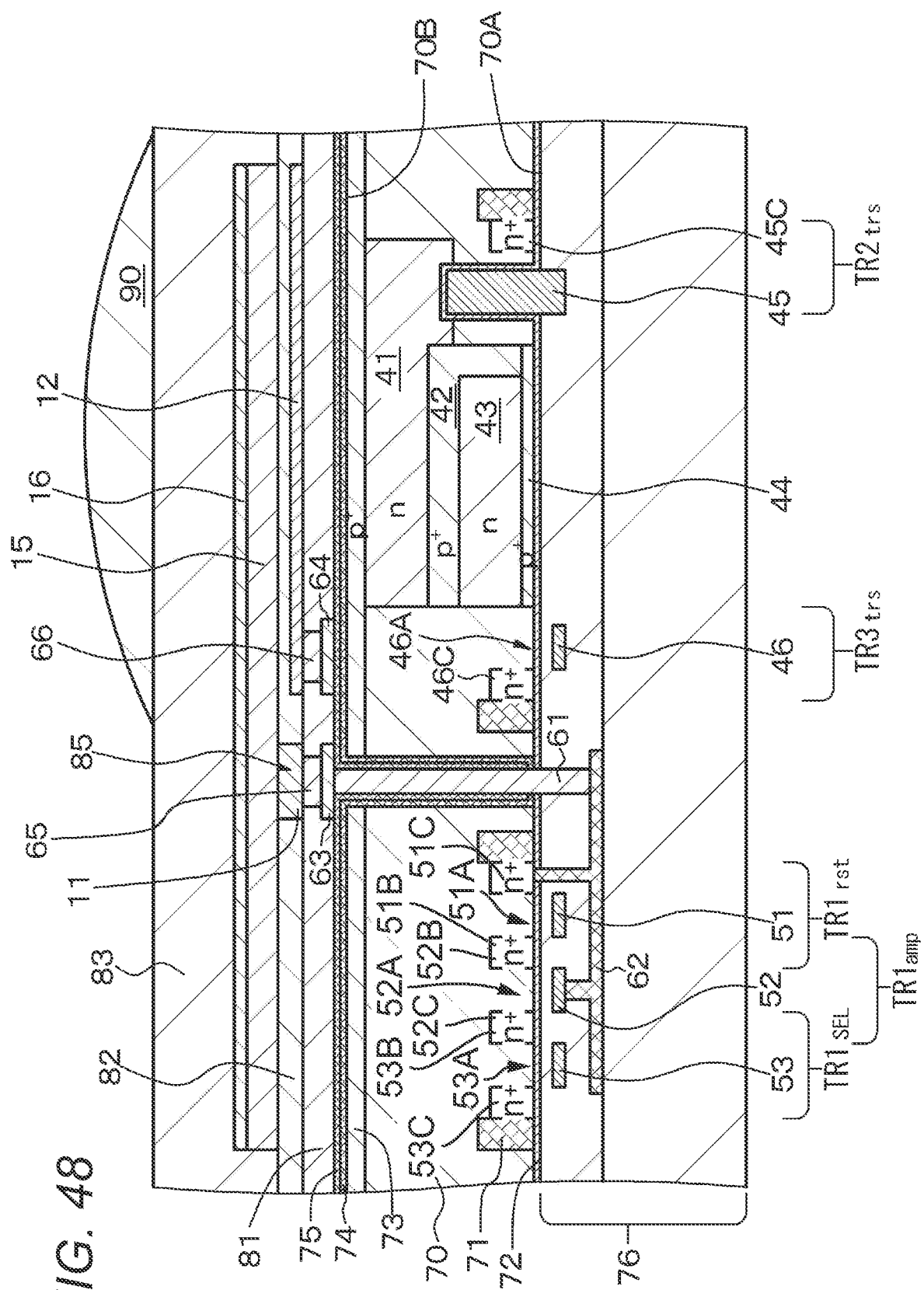
FIG. 48 is a schematic partial cross-sectional view of another modification of the imaging element and the laminated imaging element of Example 1.

For example, as FIG. 48 illustrates a modification of the imaging element and the laminated imaging element described in Example 1, the first electrode 11 can extend in an opening 84A formed in the insulating layer 82 to be connected to the photoelectric conversion layer 15.

Figure 49:
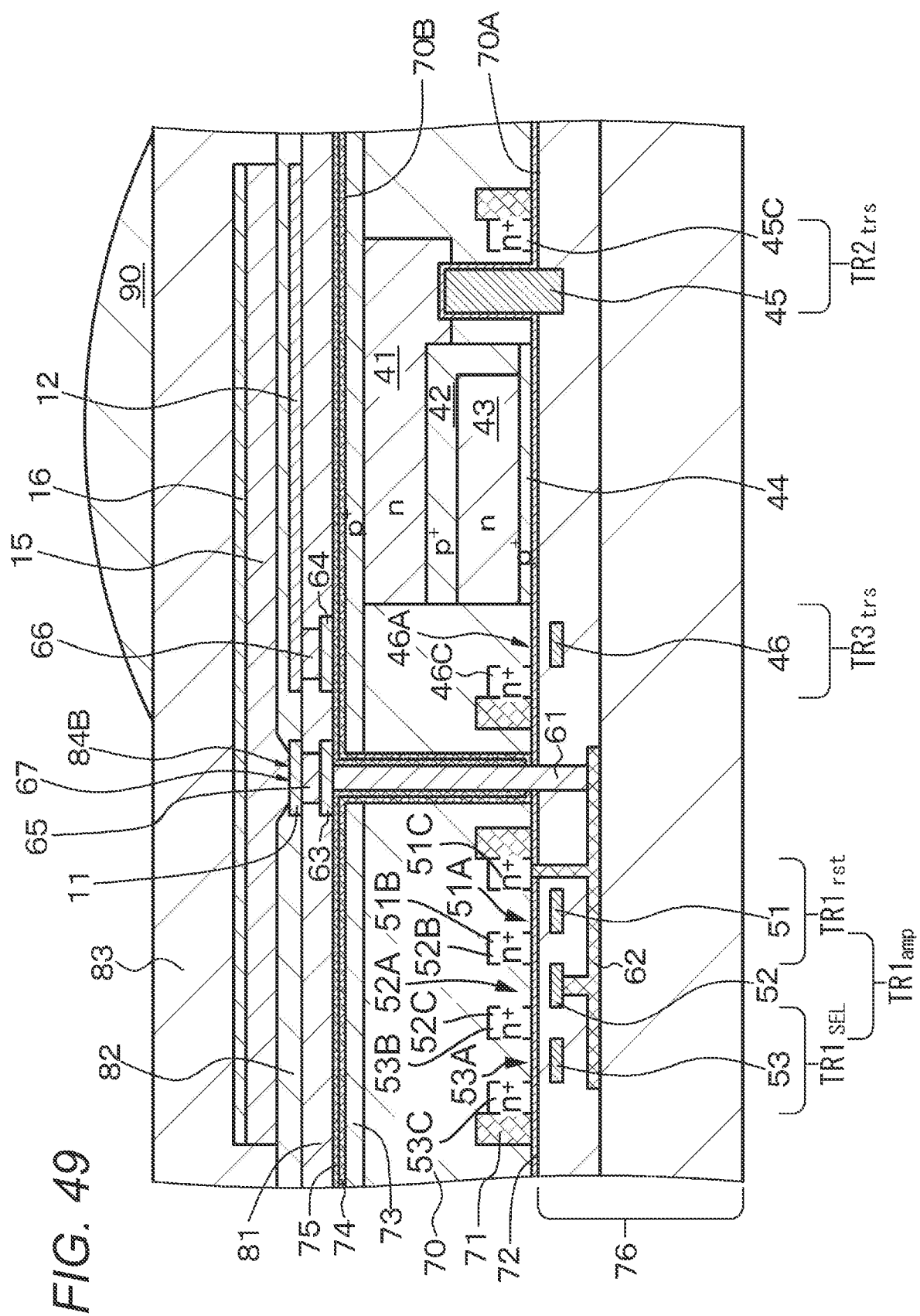
FIG. 49 is a schematic partial cross-sectional view of still another modification of the imaging element and the laminated imaging element of Example 1.
Figure 50A:
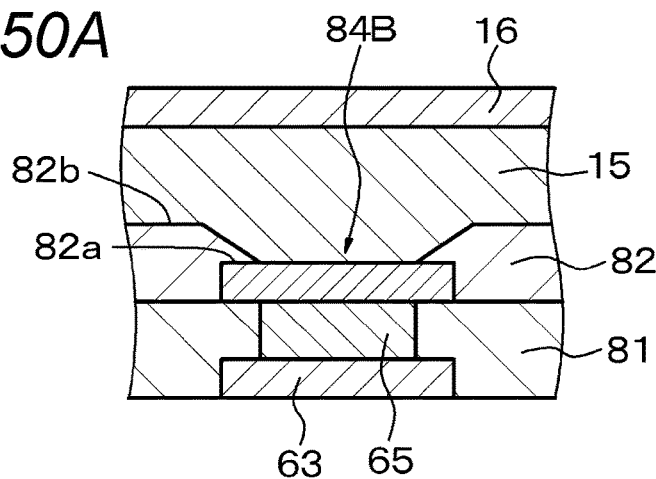
FIGS. 50A, 50B, and 50C are each an enlarged schematic partial cross-sectional view of a portion of a first electrode and the like of still another modification of the imaging element and the laminated imaging element of Example 1.
Figure 50B:
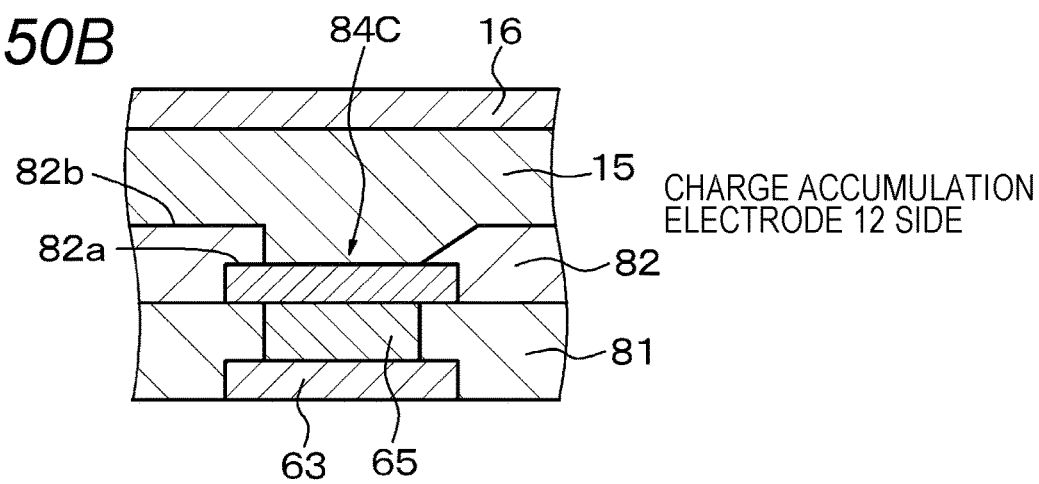
Figure 50C:
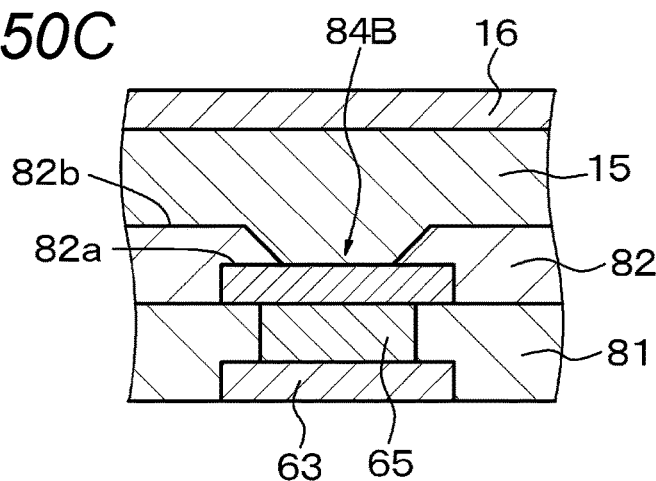

Alternatively, for example, as FIG. 49 illustrates a modification of the imaging element and the laminated imaging element described in Example 1, and FIG. 50A illustrates an enlarged schematic partial cross-sectional view of a portion of the first electrode and the like, an edge of a top surface of the first electrode 11 is covered with the insulating layer 82, the first electrode 11 is exposed on a bottom surface of an opening 84B, and when a surface of the insulating layer 82 in contact with the top surface of the first electrode 11 is referred to as a first surface 82a and a surface of the insulating layer 82 in contact with a portion of the photoelectric conversion layer 15 facing the charge accumulation electrode 12 is referred to as a second surface 82b, a side surface of the opening 84B has an inclination widening from the first surface 82a toward the second surface 82b. In this way, by inclining the side surface of the opening 84B, transfer of charges from the photoelectric conversion layer 15 to the first electrode 11 becomes smoother. Note that in the example illustrated in FIG. 50A, side surfaces of the opening 84B are rotationally symmetric with each other about the axis of the opening 84B. However, as illustrated in FIG. 50B, an opening 84C may be formed such that a side surface of the opening 84C having an inclination widening from the first surface 82a toward the second surface 82b is located on the charge accumulation electrode 12 side. As a result, transfer of charges from a portion of the photoelectric conversion layer 15 opposite to the charge accumulation electrode 12 across the opening 84C is difficult. Furthermore, the side surface of the opening 84B has an inclination widening from the first surface 82a toward the second surface 82b. However, an edge of the side surface of the opening 84B in the second surface 82b may be located outside an edge of the first electrode 11 as illustrated in FIG. 50A, or may be located inside the edge of the first electrode 11 as illustrated in FIG. 50C. By adopting the former configuration, transfer of charges is further facilitated. By adopting the latter configuration, variation in shape at the time of forming an opening can be reduced.

These openings 84B and 84C can be formed by reflowing an etching mask containing a resist material to be formed when an opening is formed in the insulating layer on the basis of an etching method to incline the opening side surface of the etching mask, and etching the insulating layer 82 using the etching mask.

Alternatively, regarding the charge discharge electrode 14 described in Example 11, as illustrated in FIG. 51, a form can be adopted in which the photoelectric conversion layer 15 extends in the second opening 85A formed in the insulating layer 82 to be connected to the charge discharge electrode 14, an edge of atop surface of the charge discharge electrode 14 is covered with the insulating layer 82, the charge discharge electrode 14 is exposed on a bottom surface of the second opening 85A, and when a surface of the insulating layer 82 in contact with the top surface of the charge discharge electrode 14 is referred to as a third surface 82c and a surface of the insulating layer 82 in contact with a portion of the photoelectric conversion layer 15 facing the charge accumulation electrode 12 is referred to as a second surface 82b, a side surface of the second opening 85A has an inclination widening from the third surface 82c toward the second surface 82b.

Figure 52:
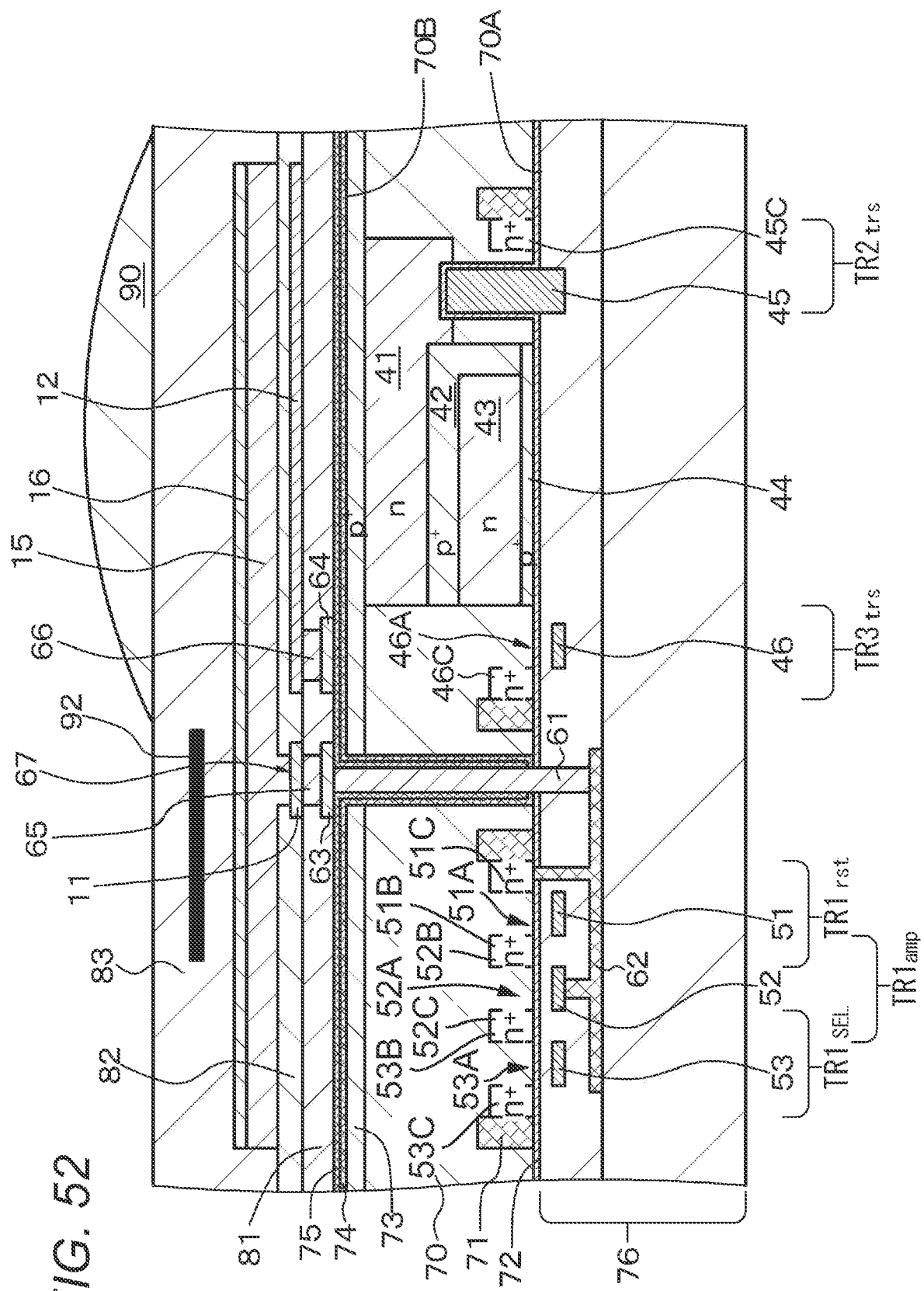
FIG. 52 is a schematic partial cross-sectional view of still another modification of the imaging element and the laminated imaging element of Example 1.

Furthermore, for example, as FIG. 52 illustrates a modification of the imaging element and the laminated imaging element described in Example 1, a configuration can be adopted in which light is incident from the second electrode 16 side, and a light shielding layer 92 is formed on the light incident side of the second electrode 16. Note that various wiring lines disposed on the light incident side of the photoelectric conversion layer can function as a light shielding layer.

Figure 53:
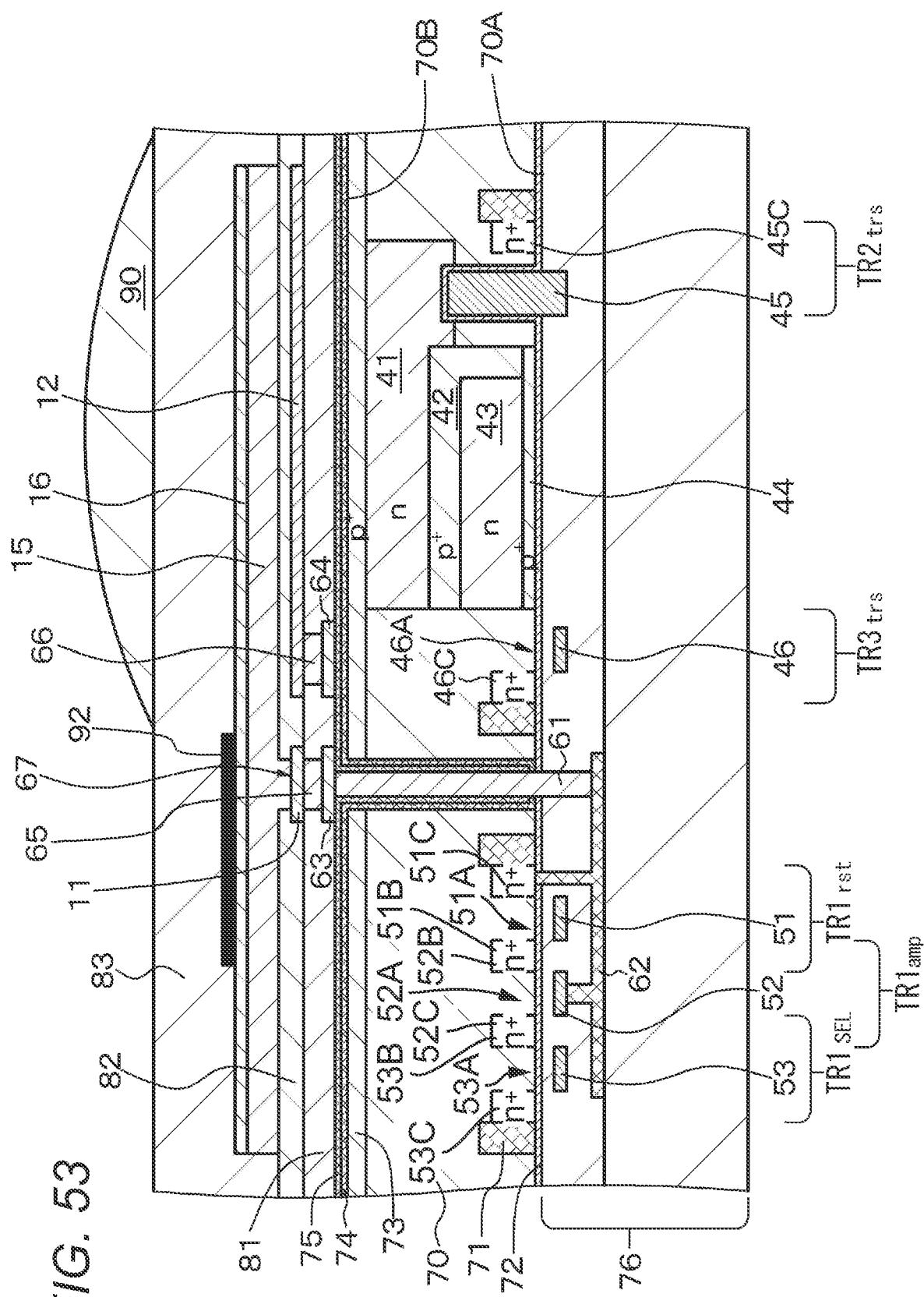
FIG. 53 is a schematic partial cross-sectional view of still another modification of the imaging element and the laminated imaging element of Example 1.
Figure 54:
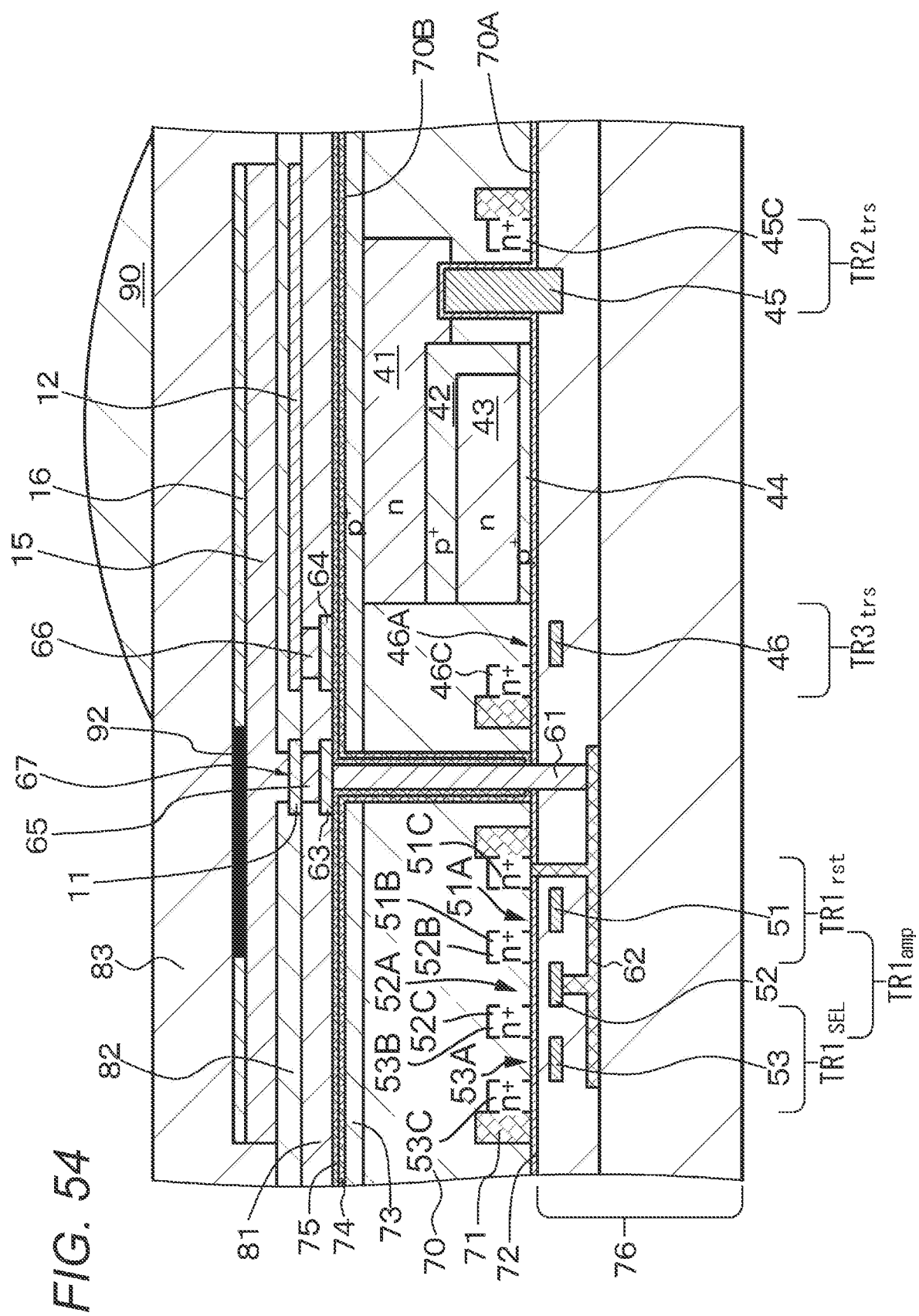
FIG. 54 is a schematic partial cross-sectional view of still another modification of the imaging element and the laminated imaging element of Example 1.

Note that in the example illustrated in FIG. 52, the light shielding layer 92 is formed above the second electrode 16, that is, the light shielding layer 92 is formed on the light incident side of the second electrode 16 and above the first electrode 11. However, as illustrated in FIG. 53, the light shielding layer 92 may be disposed on the light incident side surface of the second electrode 16. Furthermore, in some cases, the light shielding layer 92 may be formed in the second electrode 16 as illustrated in FIG. 54.

Figure 55:
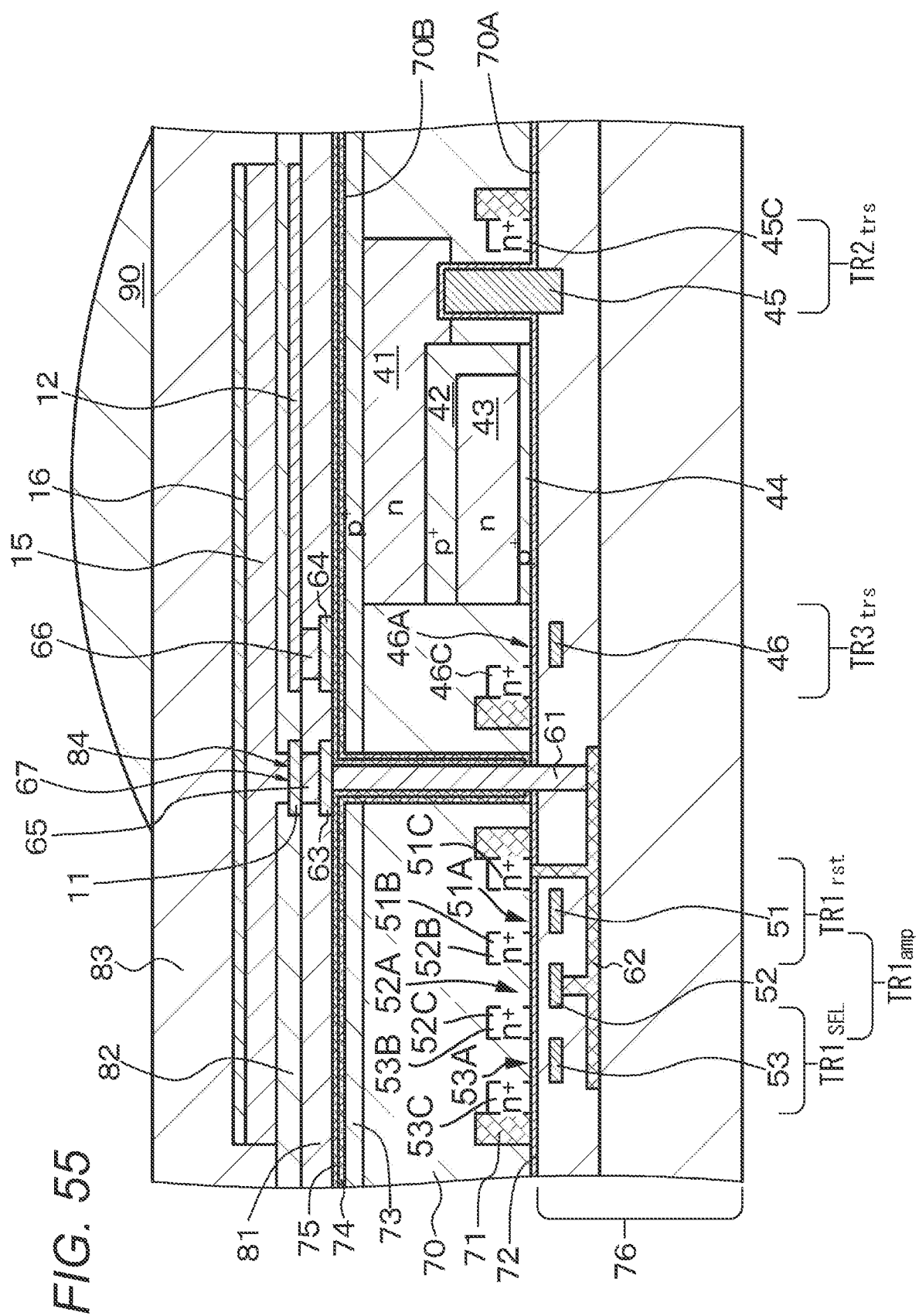
FIG. 55 is a schematic partial cross-sectional view of still another modification of the imaging element and the laminated imaging element of Example 1.

Alternatively, a structure can be adopted in which light is incident from the second electrode 16 side and light is not incident on the first electrode 11. Specifically, as illustrated in FIG. 52, the light shielding layer 92 is formed on the light incident side of the second electrode 16 and above the first electrode 11. Alternatively, as illustrated in FIG. 55, a structure can be adopted in which the on-chip micro lens 90 is disposed above the charge accumulation electrode 12 and the second electrode 16, and light incident on the on-chip micro lens 90 is collected by the charge accumulation electrode 12 and does not reach the first electrode 11. Alternatively, a structure can be adopted in which light incident on the on-chip micro lens 90 does not reach the first electrode 11.

By adopting these configurations and structures, or alternatively by disposing the light shielding layer 92 such that light is incident only on a portion of the photoelectric conversion layer 15 located above the charge accumulation electrode 12, or alternatively by designing the on-chip micro lens 90, a portion of the photoelectric conversion layer 15 located above the first electrode 11 does not contribute to photoelectric conversion. Therefore, all the pixels can be reset more reliably all at once, and a global shutter function can be achieved more easily. That is, a method for driving a solid-state imaging device including the plurality of imaging elements having these configurations and structures repeats, discharging charges in the first electrode 11 out of the system while charges are accumulated in the photoelectric conversion layer 15 all at once in all the imaging elements, and then transferring the charges accumulated in the photoelectric conversion layer 15 to the first electrode 11 all at once in all the imaging elements, and sequentially reading out the charges transferred to the first electrode 11 in each of the imaging elements after completion of the transfer.

In such a method for driving a solid-state imaging device, each of the imaging elements has a structure in which light incident from the second electrode side is not incident on the first electrode, and the charges in the first electrode are discharged out of the system while the charges are accumulated in the photoelectric conversion layer all at once in all the imaging elements. Therefore, the first electrode can be reliably reset simultaneously in all the imaging elements. Then, thereafter, the charges accumulated in the photoelectric conversion layer are transferred to the first electrode all at once in all the imaging elements, and after completion of the transfer, the charges transferred to the first electrode are sequentially read out in each of the imaging elements. Therefore, a so-called global shutter function can be easily implemented.

The photoelectric conversion layer is not limited to a single layer configuration. For example, as FIG. 56 illustrates a modification of the imaging element and the laminated imaging element described in Example 1, the photoelectric conversion layer 15 can also have a laminated structure of the lower semiconductor layer 15A, for example, containing IGZO, and the upper photoelectric conversion layer 15B containing the material constituting the photoelectric conversion layer 15 described in Example 1. In this way, by disposing the lower semiconductor layer 15A, recombination during charge accumulation can be prevented, transfer efficiency of charges accumulated in the photoelectric conversion layer 15 to the first electrode 11 can be increased, and generation of a dark current can be suppressed.

Figure 57:
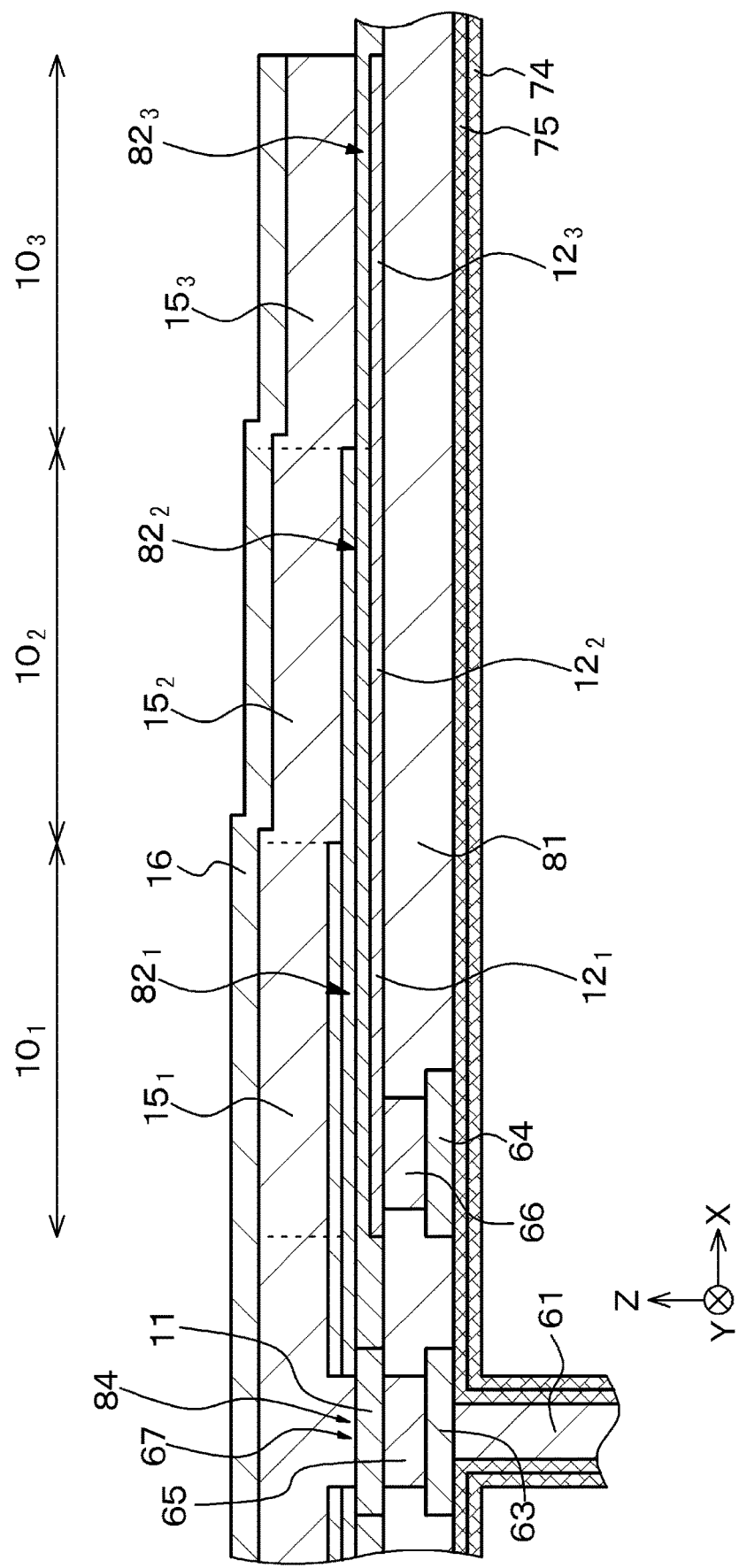
FIG. 57 is a schematic partial cross-sectional view obtained by enlarging a portion where a charge accumulation electrode, a photoelectric conversion layer, and a second electrode are laminated in a modification of the imaging element of Example 1.

In Example 1 illustrated in FIGS. 1 and 2, by gradually reducing the thicknesses of the charge accumulation electrode segments $12_1$, $12_2$, and $12_3$, the thicknesses of the insulating layer segments $82_1$, $82_2$, and $82_3$ are gradually increased. Meanwhile, as FIG. 57 illustrates a schematic partial cross-sectional view obtained by enlarging a portion where a charge accumulation electrode, a photoelectric conversion layer, and a second electrode are laminated in a modification of the of Example 1, the thicknesses of the charge accumulation electrode segments $12_1$, $12_2$, and $12_3$ may be constant, and the thicknesses of the insulating layer segments $82_1$, $82_2$, and $82_3$ may be gradually increased. Note that the thicknesses of the photoelectric conversion layer segments $15_1$, $15_2$, and $15_3$ are constant.

Figure 58:
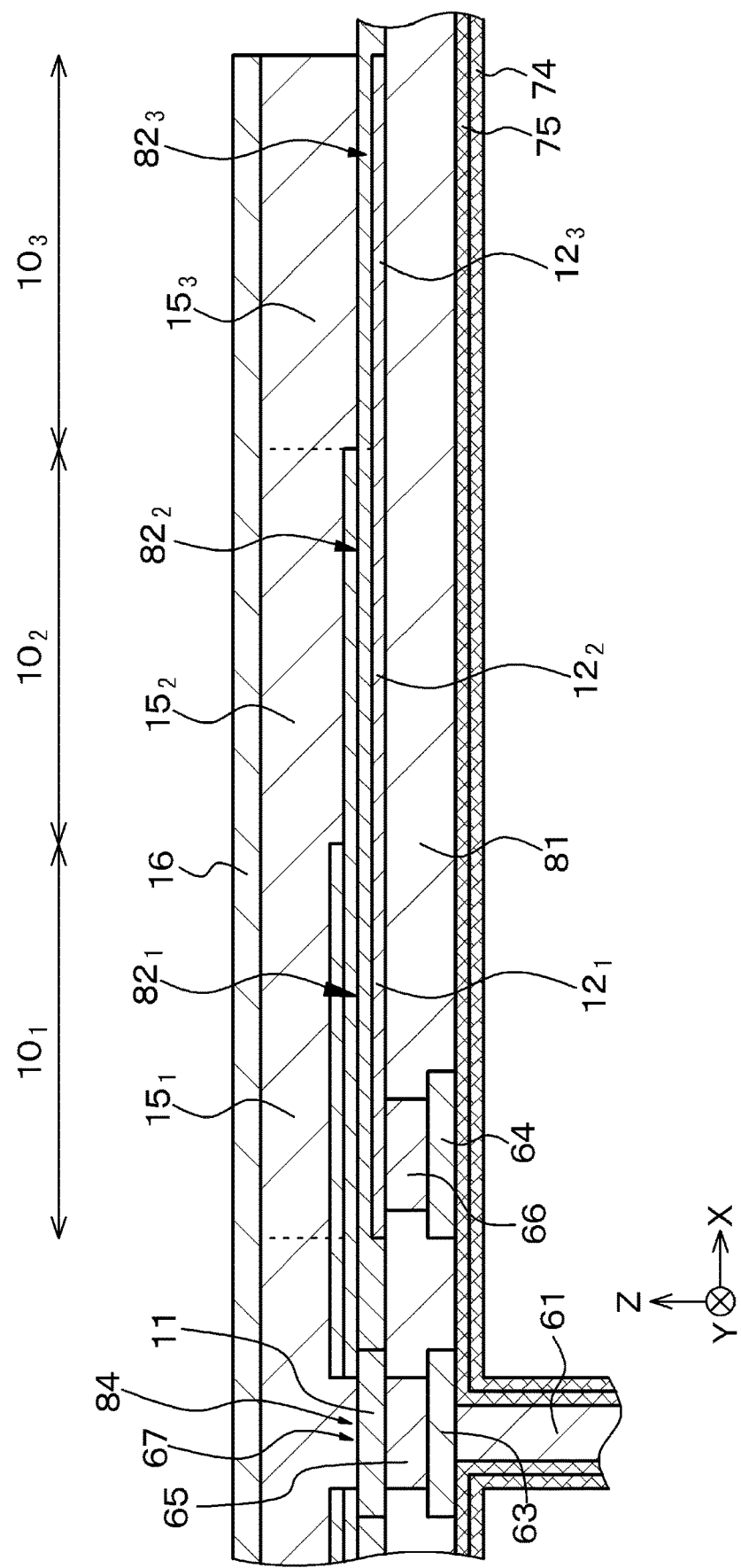
FIG. 58 is a schematic partial cross-sectional view obtained by enlarging a portion where a charge accumulation electrode, a photoelectric conversion layer, and a second electrode are laminated in a modification of the imaging element of Example 2.

Furthermore, in Example 2 illustrated in FIG. 12, by gradually reducing the thicknesses of the charge accumulation electrode segments $12_1$, $12_2$, and $12_3$, the thicknesses of the photoelectric conversion layer segments $15_1$, $15_2$, and $15_3$ are gradually increased. Meanwhile, as FIG. 58 illustrates a schematic partial cross-sectional view obtained by enlarging a portion where a charge accumulation electrode, a photoelectric conversion layer, and a second electrode are laminated in a modification of the of Example 2, by making the thicknesses of the charge accumulation electrode segments $12_1$, $12_2$, and $12_3$ constant, and gradually reducing the thicknesses of the insulating layer segments $82_1$, $82_2$, and $82_3$, the thicknesses of the photoelectric conversion layer segments $15_1$, $15_2$, and $15_3$ may be gradually increased.

It goes without saying that the various modifications described above can also be applied to the other Examples.

In Examples, electrons are used as signal charges, and the conductivity type of the photoelectric conversion layer formed on the semiconductor substrate is n-type. However, the present disclosure can also be applied to a solid-state imaging device using holes as signal charges. In this case, each semiconductor region only needs to be constituted by a semiconductor region having the opposite conductivity type, and the conductivity type of the photoelectric conversion layer formed on the semiconductor substrate only needs to be p-type.

Furthermore, in Examples, the case where the present disclosure is applied to a CMOS type solid-state imaging device in which unit pixels that detect signal charges corresponding to the amount of incident light as physical quantities are arranged in a matrix has been described as an example. However, the present disclosure is not limited to application to the CMOS type solid-state imaging device, and can also be applied to a CCD type solid-state imaging device. In the latter case, signal charges are transferred in the vertical direction by a vertical transfer register having a CCD type structure, transferred in the horizontal direction by a horizontal transfer register, and amplified to output a pixel signal (image signal). Furthermore, the present disclosure is not limited to a general column type solid-state imaging device in which pixels are formed in a two-dimensional matrix and a column signal processing circuit is disposed for each pixel column. Moreover, in some cases, the selection transistor can be omitted.

Moreover, the imaging element and the laminated imaging element of the present disclosure are not limited to application to a solid-state imaging device that detects distribution of the amount of incident visible light and images the distribution as an image, but can also be applied to a solid-state imaging device that images distribution of the incident amount of infrared rays, X-rays, particles, and the like as an image. Furthermore, in a broad sense, the present disclosure can be applied to a general solid-state imaging device (physical quantity distribution detection device) such as a fingerprint detection sensor that detects distribution of other physical quantities such as pressure and capacitance, and images the distribution as an image.

Moreover, the present disclosure is not limited to a solid-state imaging device that sequentially scans each unit pixel of an imaging region in row units and reads out a pixel signal from each unit pixel. The present disclosure can also be applied to an X-Y address type solid-state imaging device that selects an arbitrary pixel in pixel units and reads out a pixel signal in pixel units from a selected pixel. The solid-state imaging device may be formed as one chip, or may be a modular form having an imaging function in which an imaging region and a drive circuit or an optical system are packaged collectively.

Furthermore, the present disclosure is not limited to application to a solid-state imaging device, but can also be applied to an imaging device. Here, the imaging device refers to a camera system such as a digital still camera or a digital video camera, or an electronic device having an imaging function, such as a mobile phone. There is a case where a module form mounted on an electronic device, that is, a camera module is used as an imaging device.

Figure 59:
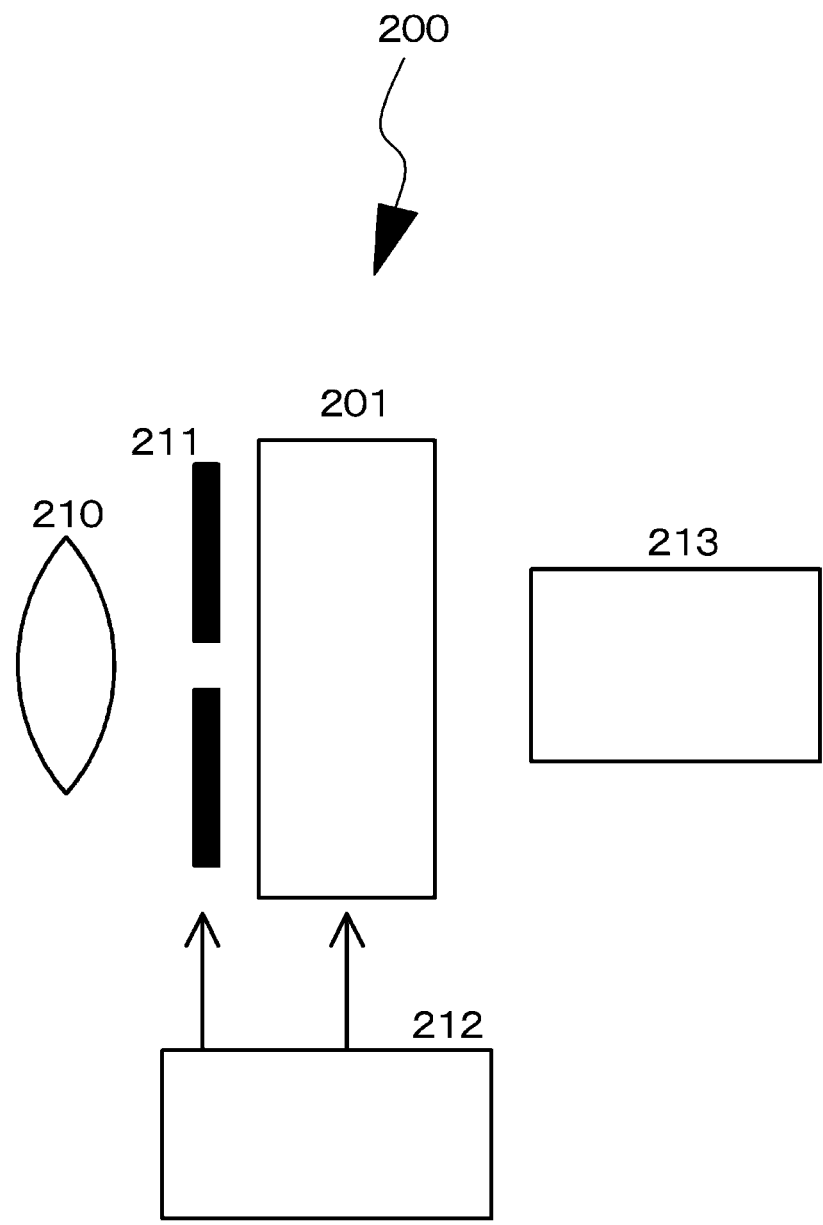
FIG. 59 is a conceptual diagram of an example in which a solid-state imaging device including the imaging element and the laminated imaging element of the present disclosure is used for an electronic device (camera).
Figure 60:
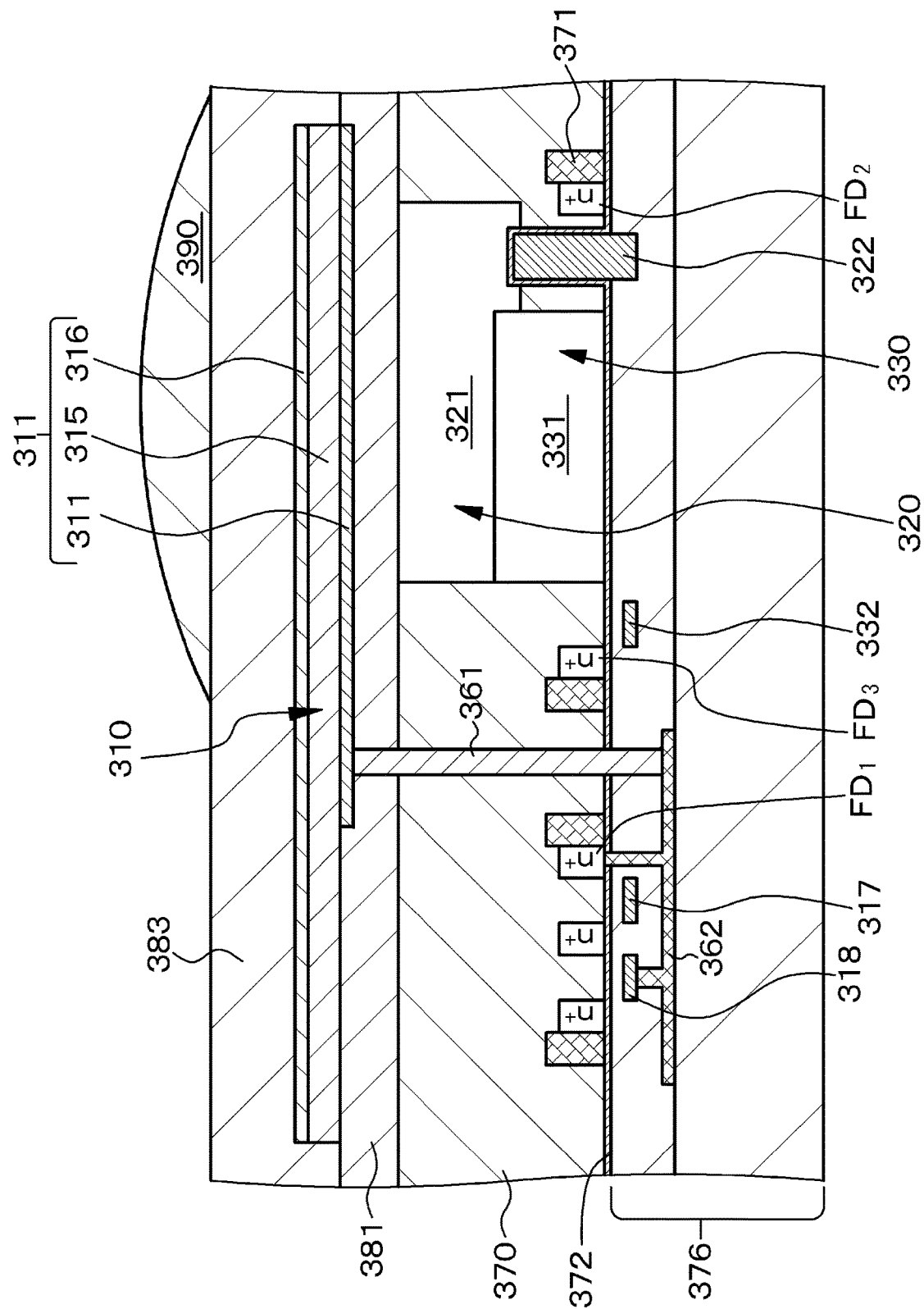
FIG. 60 is a conceptual diagram of a conventional laminated imaging element (laminated solid-state imaging device).

FIG. 59 illustrates an example in which a solid-state imaging device 201 including the imaging element and the laminated imaging element of the present disclosure is used for an electronic device (camera) 200 as a conceptual diagram. The electronic device 200 includes the solid-state imaging device 201, an optical lens 210, a shutter device 211, a drive circuit 212, and a signal processing circuit 213. The optical lens 210 forms an image of image light (incident light) from a subject on an imaging surface of the solid-state imaging device 201. As a result, signal charges are accumulated in the solid-state imaging device 201 for a certain period of time. The shutter device 211 controls a light irradiation period and alight shielding period for the solid-state imaging device 201. The drive circuit 212 supplies a driving signal for controlling a transfer operation and the like of the solid-state imaging device 201 and a shutter operation of the shutter device 211. The solid-state imaging device 201 transfers a signal by a driving signal (timing signal) supplied from the drive circuit 212. The signal processing circuit 213 performs various signal processes. A video signal that has been subjected to signal processing is stored in a storage medium such as a memory or is output to a monitor. In such an electronic device 200, the pixel size in the solid-state imaging device 201 can be reduced and the transfer efficiency can be improved, and therefore the electronic device 200 with improved pixel characteristics can be obtained. The electronic device 200 to which the solid-state imaging device 201 can be applied is not limited to a camera, and can be applied to an imaging device such as a digital still camera or a camera module for a mobile device such as a mobile phone.

Note that the present disclosure can have the following configurations.

[A01] <<Imaging element: first aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, the photoelectric conversion unit includes N (where N≥2) photoelectric conversion unit segments, the photoelectric conversion layer includes N photoelectric conversion layer segments, the insulating layer includes N insulating layer segments, the charge accumulation electrode includes N charge accumulation electrode segments, the n-th (where n=1, 2, 3 . . . N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and the thickness of an insulating layer segment gradually changes from the first photoelectric conversion unit segment to the N-th photoelectric conversion unit segment.

[A02] <<Imaging element: second aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, the photoelectric conversion unit includes N (where N≥2) photoelectric conversion unit segments, the photoelectric conversion layer includes N photoelectric conversion layer segments, the insulating layer includes N insulating layer segments, the charge accumulation electrode includes N charge accumulation electrode segments, the n-th (where n=1, 2, 3 . . . N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and the thickness of a photoelectric conversion layer segment gradually changes from the first photoelectric conversion unit segment to the N-th photoelectric conversion unit segment.

[A03] <<Imaging element: third aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, the photoelectric conversion unit includes N (where N≥2) photoelectric conversion unit segments, the photoelectric conversion layer includes N photoelectric conversion layer segments, the insulating layer includes N insulating layer segments, the charge accumulation electrode includes N charge accumulation electrode segments, the n-th (where n=1, 2, 3 . . . N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and materials constituting an insulating layer segment are different between adjacent photoelectric conversion unit segments.

[A04] <<Imaging element: fourth aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, the photoelectric conversion unit includes N (where N≥2) photoelectric conversion unit segments, the photoelectric conversion layer includes N photoelectric conversion layer segments, the insulating layer includes N insulating layer segments, the charge accumulation electrode includes N charge accumulation electrode segments disposed apart from one another, the n-th (where n=1, 2, 3 . . . N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and materials constituting a charge accumulation electrode segment are different between adjacent photoelectric conversion unit segments.

[A05] <<Imaging element: fifth aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, the photoelectric conversion unit includes N (where N≥2) photoelectric conversion unit segments, the photoelectric conversion layer includes N photoelectric conversion layer segments, the insulating layer includes N insulating layer segments, the charge accumulation electrode includes N charge accumulation electrode segments disposed apart from one another, the n-th (where n=1, 2, 3 . . . N) photoelectric conversion unit segment includes the n-th charge accumulation electrode segment, the n-th insulating layer segment, and the n-th photoelectric conversion layer segment, a photoelectric conversion unit segment with a larger value of n is located farther from the first electrode, and the area of a charge accumulation electrode segment is gradually reduced from the first photoelectric conversion unit segment to the N-th photoelectric conversion unit segment.

[A06] <<Imaging element: sixth aspect>>

An imaging element including a photoelectric conversion unit formed by laminating a first electrode, a photoelectric conversion layer, and a second electrode, in which the photoelectric conversion unit further includes a charge accumulation electrode disposed apart from the first electrode so as to face the photoelectric conversion layer via an insulating layer, and if a lamination direction of the charge accumulation electrode, the insulating layer, and the photoelectric conversion layer is defined as a Z direction, and a direction of separating from the first electrode is defined as an X direction, when a laminated portion where the charge accumulation electrode, the insulating layer, and the photoelectric conversion layer are laminated is cut with a YZ virtual plane, the cross-sectional area of the laminated portion changes depending on a distance from the first electrode.

[B01] The imaging element according to any one of [A01] to [A06], further including a semiconductor substrate, in which the photoelectric conversion unit is disposed above the semiconductor substrate.

[B02] The imaging element according to any one of [A01] to [B01], in which the first electrode extends in an opening formed in the insulating layer to be connected to the photoelectric conversion layer.

[B03] The imaging element according to any one of [A01] to [B01], in which the photoelectric conversion layer extends in an opening formed in the insulating layer to be connected to the first electrode.

[B04] The imaging element according to [B03], in which an edge of a top surface of the first electrode is covered with the insulating layer, the first electrode is exposed on a bottom surface of the opening, and when a surface of the insulating layer in contact with the top surface of the first electrode is referred to as a first surface, and a surface of the insulating layer in contact with a portion of the photoelectric conversion layer facing the charge accumulation electrode is referred to as a second surface, a side surface of the opening has an inclination widening from the first surface toward the second surface.

[B05] The imaging element according to [B04], in which the side surface of the opening having an inclination widening from the first surface toward the second surface is located on the charge accumulation electrode side.

[B06] <<Control of potentials of first electrode and charge accumulation electrode>>

The imaging element according to any one of [A01] to [B05], further including a control unit disposed on a semiconductor substrate and having a drive circuit, in which the first electrode and the charge accumulation electrode are connected to the drive circuit, in a charge accumulation period, the drive circuit applies a potential $V_{11}$ to the first electrode and applies a potential $V_{12}$ to the charge accumulation electrode, and charges are accumulated in the photoelectric conversion layer, and in a charge transfer period, the drive circuit applies a potential $V_{21}$ to the first electrode and applies a potential $V_{22}$ to the charge accumulation electrode, and the charges accumulated in the photoelectric conversion layer are read out to the control unit via the first electrode. However, in a case where the potential of the first electrode is higher than that of the second electrode, $V_{12} \geq V_{11}$ and $V_{22} < V_{21}$ are satisfied, and in a case where the potential of the first electrode is lower than that of the second electrode, $V_{12} \leq V_{11}$ and $V_{22} > V_{21}$ are satisfied.

[B07] <<Charge discharge electrode>>

The imaging element according to any one of [A01] to [B06], further including a charge discharge electrode connected to the photoelectric conversion layer and disposed apart from the first electrode and the charge accumulation electrode.

[B08] The imaging element according to [B07], in which the charge discharge electrode is disposed so as to surround the first electrode and the charge accumulation electrode.

[B09] The imaging element according to [B07] or [B08], in which the photoelectric conversion layer extends in a second opening formed in the insulating layer to be connected to the charge discharge electrode, an edge of a top surface of the charge discharge electrode is covered with the insulating layer, the charge discharge electrode is exposed on a bottom surface of the second opening, and when a surface of the insulating layer in contact with the top surface of the charge discharge electrode is referred to as a third surface, and a surface of the insulating layer in contact with a portion of the photoelectric conversion layer facing the charge accumulation electrode is referred to as a second surface, a side surface of the second opening has an inclination widening from the third surface toward the second surface.

[B10] <<Control of potentials of first electrode, charge accumulation electrode, and charge discharge electrode>>

The imaging element according to any one of [B07] to [B09], further including a control unit disposed on a semiconductor substrate and having a drive circuit, in which the first electrode, the charge accumulation electrode, and the charge discharge electrode are connected to the drive circuit, in a charge accumulation period, the drive circuit applies a potential $V_{11}$ to the first electrode, applies a potential $V_{12}$ to the charge accumulation electrode, and applies a potential $V_{14}$ to the charge discharge electrode, and charges are accumulated in the photoelectric conversion layer, and in a charge transfer period, the drive circuit applies a potential $V_{21}$ to the first electrode, applies a potential $V_{22}$ to the charge accumulation electrode, and applies a potential $V_{24}$ to the charge discharge electrode, and the charges accumulated in the photoelectric conversion layer are read out to the control unit via the first electrode.

However, in a case where the potential of the first electrode is higher than that of the second electrode, $V_{14} > V_{11}$ and $V_{24} < V_{21}$ are satisfied, and in a case where the potential of the first electrode is lower than that of the second electrode, $V_{14} < V_{11}$ and $V_{24} > V_{21}$ are satisfied.

[B11] The imaging element according to any one of [A01] to [B10], in which in a case where the potential of the first electrode is higher than that of the second electrode, in a charge transfer period, a potential applied to a charge accumulation electrode segment located closest to the first electrode is higher than a potential applied to a charge accumulation electrode segment located farthest from the first electrode, and in a case where the potential of the first electrode is lower than that of the second electrode, in the charge transfer period, the potential applied to the charge accumulation electrode segment located closest to the first electrode is lower than the potential applied to the charge accumulation electrode segment located farthest from the first electrode.

[B12] The imaging element according to any one of [A01] to [B11], in which on a semiconductor substrate, at least a floating diffusion layer and an amplification transistor constituting a control unit are disposed, and the first electrode is connected to the floating diffusion layer and a gate portion of the amplification transistor.

[B13] The imaging element according to [B12], in which on the semiconductor substrate, a reset transistor and a selection transistor constituting the control unit are further disposed, the floating diffusion layer is connected to one source/drain region of the reset transistor, and one source/drain region of the amplification transistor is connected to one source/drain region of the selection transistor, and the other source/drain region of the selection transistor is connected to a signal line.

[B14] The imaging element according to any one of [A01] to [B13], in which the charge accumulation electrode is larger than the first electrode.

[B15] The imaging element according to any one of [A01] to [B14], in which light is incident from the second electrode side, and a light shielding layer is formed on a light incident side of the second electrode.

[B16] The imaging element according to any one of [A01] to [B14], in which light is incident from the second electrode side, and light is not incident on the first electrode.

[B17] The imaging element according to [B16], in which a light shielding layer is formed on the light incident side of the second electrode and above the first electrode.

[B18] The imaging element according to [B16], in which an on-chip micro lens is disposed above the charge accumulation electrode and the second electrode, and light incident on the on-chip micro lens is collected by the charge accumulation electrode.

[C01] <<Laminated imaging element>>

A laminated imaging element including at least one of the imaging elements according to any one of [A01] to [B18].

[D01] <<Solid-state imaging device: first aspect>>

A solid-state imaging device including a photoelectric conversion unit formed by laminating a first electrode, a photoelectric conversion layer, and a second electrode, in which the solid-state imaging device includes a plurality of imaging elements in each of which the photoelectric conversion unit further includes a charge accumulation electrode disposed apart from the first electrode so as to face the photoelectric conversion layer via an insulating layer, the plurality of imaging elements constitutes an imaging element block, and the first electrode is shared by the plurality of imaging elements constituting the imaging element block.

[D02] <<Solid-state imaging device: second aspect>>

A solid-state imaging device including a plurality of the imaging elements according to any one of [A01] to [B17], in which the plurality of imaging elements constitutes an imaging element block, and the first electrode is shared by the plurality of imaging elements constituting the imaging element block.

[D03] The solid-state imaging device according to [D01] or [D02], in which a transfer control electrode is disposed among the plurality of imaging elements constituting the imaging element block.

[D04] The solid-state imaging device according to any one of [D01] to [D03], in which one on-chip micro lens is disposed above one of the imaging elements.

[D05] The solid-state imaging device according to any one of [D01] to [D04], in which two of the imaging elements constitute the imaging element block, and one on-chip micro lens is disposed above the imaging element block.

[D06] The solid-state imaging device according to any one of [D01] to [D05], in which one floating diffusion layer is disposed for the plurality of imaging elements.

[D07] The solid-state imaging device according to any one of [D01] to [D06], in which the first electrode is disposed adjacent to the charge accumulation electrode of each of the imaging elements.

[D08] The solid-state imaging device according to any one of [D01] to [D07], in which the first electrode is disposed adjacent to some of the charge accumulation electrodes of the plurality of imaging elements, and is not disposed adjacent to the remaining charge accumulation electrodes of the plurality of imaging elements.

[D09] The solid-state imaging device according to [D08], in which a distance between a charge accumulation electrode constituting an imaging element and a charge accumulation electrode constituting an imaging element is longer than a distance between a first electrode and a charge accumulation electrode in an imaging element adjacent to the first electrode.

[E01] <<Solid-state imaging device: third aspect>>

A solid-state imaging device including a plurality of the imaging elements according to any one of [A01] to [A06].

[E02] <<Solid-state imaging device: fourth aspect>>

A solid-state imaging device including a plurality of the laminated imaging elements according to [C01].

[F01] <<Method for driving solid-state imaging device>>

A method for driving a solid-state imaging device including a photoelectric conversion unit formed by laminating a first electrode, a photoelectric conversion layer, and a second electrode, the photoelectric conversion unit further including a charge accumulation electrode disposed apart from the first electrode so as to face the photoelectric conversion layer via an insulating layer, the solid-state imaging device including a plurality of imaging elements each having a structure in which light is incident from the second electrode side, and light is not incident on the first electrode, the method including:

discharging charges in the first electrode out of the system while charges are accumulated in the photoelectric conversion layer all at once in all the imaging elements; and then transferring the charges accumulated in the photoelectric conversion layer to the first electrode all at once in all the imaging elements, and sequentially reading out the charges transferred to the first electrode in each of the imaging elements after completion of the transfer.

REFERENCE SIGNS LIST $10_1, 10_2, 10_3$ Photoelectric conversion unit segment
11, 11' First electrode
12, 12' Charge accumulation electrode
$12_1, 12_2, 12_3$ Charge accumulation electrode segment
13' Transfer control electrode
14 Charge discharge electrode
15 Photoelectric conversion layer
$15_1, 15_2, 15_3$ Photoelectric conversion layer segment
16 Second electrode 41 n-type semiconductor region constituting second imaging element
43 n-type semiconductor region constituting third imaging element
42, 44, 73 p$^+$ layer
$FD_1$, $FD_{21}$, $FD_3$, 45C, 46C Floating diffusion layer
$TR1_{amp}$ Amplification transistor
$TR1_{rst}$ Reset transistor
$TR1_{sel}$ Selection transistor
51 Gate portion of reset transistor $TR1_{rst}$
51A Channel formation region of reset transistor $TR1_{rst}$
51B, 51C Source/drain region of reset transistor $TR1_{rst}$
52 Gate portion of amplification transistor $TR1_{amp}$
52A Amplification transistor $TR1_{amp}$ channel formation region
52B, 52C Source/drain region of amplification transistor $TR1_{amp}$
53 Gate portion of selection transistor $TR1_{sel}$
53A Channel formation region of selection transistor $TR1_{sel}$
53B, 53C Source/drain region of selection transistor $TR1_{sel}$
$TR2_{trs}$ Transfer transistor
45 Gate portion of transfer transistor
$TR2_{rst}$ Reset transistor
$TR2_{amp}$ Amplification transistor
$TR2_{sel}$ Selection transistor
$TR3_{trs}$ Transfer transistor
46 Gate portion of transfer transistor
$TR3_{rst}$ Reset transistor
$TR3_{amp}$ Amplification transistor
$TR3_{sel}$ Selection transistor
$V_{DD}$ Power source
$RST_1$, $RST_2$, $RST_3$ Reset line
$SEL_1$, $SEL_2$, $SEL_3$ Selection line
117, $VSL_1$, $VSL_2$, $VSL_3$ Signal line
$TG_2$, $TG_3$ Transfer gate line
VOA, $V_{OT}$, $V_{OU}$ Wiring line
61 Contact hole portion
62 Wiring layer
63, 64, 68A Pad portion
65, 68B Connection hole
66, 67, 69 Connection portion
70 Semiconductor substrate
70A First surface (front surface) of semiconductor substrate
70B Second side (back surface) of semiconductor substrate
71 Element isolation region
72 Oxide film
74 HfO$_2$ film
75 Insulating film
76 Interlayer insulating layer
77, 78, 81 Interlayer insulating layer
82 Insulating layer
$82_1$, $82_2$, $82_3$ Insulating layer segment
82a First surface of insulating layer
82b Second surface of insulating layer
82c Third surface of insulating layer
83 Protective layer
84, 84A, 84B, 84C Opening
85, 85A Second opening
90 On-chip micro lens
91 Various imaging element components located below interlayer insulating layer
92 Light shielding layer
100 Solid-state imaging device
101 Laminated imaging element
111 Imaging region
112 Vertical drive circuit
113 Column signal processing circuit
114 Horizontal drive circuit
115 Output circuit
116 Drive control circuit
118 Horizontal signal line
200 Electronic device (camera)
201 Solid-state imaging device
210 Optical lens
211 Shutter apparatus
212 Drive circuit
213 Signal processing circuit

The invention claimed is:

1. A solid-state imaging element comprising a pixel including:
a first imaging element;
a second imaging element;
a first transfer transistor, a first reset transistor, and a first selection transistor electrically connected to the second imaging element;
a third imaging element;
a second transfer transistor, a second reset transistor, and a second selection transistor electrically connected to the third imaging element; and
an on-chip micro lens, wherein
the first imaging element includes a first electrode, a second electrode, a third electrode, a photoelectric conversion layer provided between the first electrode and the second electrode, and an insulating layer, the second electrode facing the first and third electrodes, and the third electrode being located apart from the first electrode and facing the photoelectric conversion layer via the insulating layer without contacting the photoelectric conversion layer,
the pixel further includes:
a third electrode control line connected to the third electrode; and
a plurality of control lines connected to the first transfer transistor, the first reset transistor, the first selection transistor, the second transfer transistor, the second reset transistor, and the second selection transistor, and different from the third electrode control line, and
in the pixel,
a distance between a center of the on-chip micro lens included in the pixel and any one of the plurality of control lines included in the pixel is shorter than a distance between the center of the on-chip micro lens included in the pixel and the third electrode control line included in the pixel.

2. A solid-state imaging device comprising a pixel including:
a first imaging element;
a second imaging element;
a third imaging element; and
an on-chip micro lens, wherein
the first imaging element includes a first electrode, a second electrode, a third electrode, a photoelectric conversion layer provided between the first electrode and the second electrode, and an insulating layer, the second electrode facing the first and third electrodes, and the third electrode being located apart from the first electrode and facing the photoelectric conversion layer via the insulating layer without contacting the photoelectric conversion layer,
each of a distance d2 between a center of an inscribed circle of a charge accumulation electrode and a center of the on-chip micro lens, a distance d3 between a center of an inscribed circle of the second imaging element and the center of the on-chip micro lens, and a distance d4 between a center of an inscribed circle of the third imaging element and the center of the on-chip micro lens is shorter than a distance d5 between a center of an inscribed circle of a first electrode and the center of the on-chip micro lens or a distance between a center of an inscribed circle of a floating diffusion region and the center of the on-chip micro lens.

3. A solid-state imaging element comprising a pixel including:
- a first imaging element;
- a first floating diffusion region electrically connected to the first imaging element;
- a second imaging element;
- a second floating diffusion region electrically connected to the second imaging element;
- a third imaging element;
- a third floating diffusion region electrically connected to the third imaging element; and
- an on-chip micro lens, wherein
- the first imaging element includes a first electrode, a second electrode, a third electrode, a photoelectric conversion layer provided between the first electrode and the second electrode, and an insulating layer, the second electrode facing the first and third electrodes, and the third electrode being located apart from the first electrode and facing the photoelectric conversion layer via the insulating layer without contacting the photoelectric conversion layer, and
- each of centers of the first to third floating diffusion regions is disposed outside an inscribed circle of the third electrode, outside an outline of the third electrode, or outside a circumscribed circle of the third electrode.

4. The solid-state imaging element according to claim 1, wherein
a minimum channel length in the first and second transfer transistors, the first and second reset transistors, and the first and second selection transistors is shorter than a minimum distance between the third electrode and the first electrode.

5. A solid-state imaging device comprising a pixel including:
- a first imaging element;
- a second imaging element;
- a third imaging element; and
- an on-chip micro lens, wherein
- the first imaging element includes
- a first electrode, a second electrode, a third electrode, a photoelectric conversion layer provided between the first electrode and the second electrode, and an insulating layer, the second electrode facing the first and third electrodes, and the third electrode being located apart from the first electrode and facing the photoelectric conversion layer via the insulating layer without contacting the photoelectric conversion layer, and
- the third electrode has an area larger than the third imaging element.

6. The solid-state imaging device according to claim 5, wherein the third electrode has an area smaller than the second imaging element.

* * * * *